US012410200B2

(12) United States Patent
Kim et al.

(10) Patent No.: US 12,410,200 B2
(45) Date of Patent: Sep. 9, 2025

(54) COMPOSITION FOR ORGANIC OPTOELECTRONIC DEVICE, ORGANIC OPTOELECTRONIC DEVICE, AND DISPLAY DEVICE

(71) Applicant: SAMSUNG SDI CO., LTD., Yongin-si (KR)

(72) Inventors: Byungku Kim, Suwon-si (KR); Dong Wan Ryu, Suwon-si (KR); Dongyeong Kim, Suwon-si (KR); Junmo Park, Suwon-si (KR); Sung-Hyun Jung, Suwon-si (KR); Eunjeong Choi, Suwon-si (KR); Ji hun Shin, Suwon-si (KR); Jinseok Jang, Suwon-si (KR); Ho Kuk Jung, Suwon-si (KR)

(73) Assignee: SAMSUNG SDI CO., LTD., Yongin-si (KR)

(*) Notice: Subject to any disclaimer, the term of this patent is extended or adjusted under 35 U.S.C. 154(b) by 904 days.

(21) Appl. No.: 17/336,527

(22) Filed: Jun. 2, 2021

(65) Prior Publication Data

US 2021/0395277 A1 Dec. 23, 2021

(30) Foreign Application Priority Data

Jun. 2, 2020 (KR) ........................ 10-2020-0066668

(51) Int. Cl.

*C07D 251/24* (2006.01)
*C07D 403/04* (2006.01)

(Continued)

(52) U.S. Cl.

CPC ........... *C07F 7/0807* (2013.01); *H10K 85/40* (2023.02); *H10K 85/622* (2023.02);

(Continued)

(58) Field of Classification Search

CPC .. H10K 85/631; H10K 85/633; H10K 85/636; H10K 85/40; C07F 7/0807; C07F 7/0816

See application file for complete search history.

(56) References Cited

U.S. PATENT DOCUMENTS

| | | | | |
|---|---|---|---|---|
| 5,061,569 | A | 10/1991 | Vanslyke et al. | |
| 2011/0049481 | A1* | 3/2011 | Xavier .................. | H10K 30/30 257/E51.026 |

(Continued)

FOREIGN PATENT DOCUMENTS

| | | | |
|---|---|---|---|
| CN | 107652189 | A | 2/2018 |
| CN | 107698597 | A | 2/2018 |

(Continued)

OTHER PUBLICATIONS

CN111196822A—translation (Year: 2020).*

(Continued)

*Primary Examiner* — Jennifer A Boyd
*Assistant Examiner* — Rachel Simbana
(74) *Attorney, Agent, or Firm* — Lee IP Law, P.C.

(57) ABSTRACT

A composition for an organic optoelectronic device, an organic optoelectronic device, and a display device, the composition including a first compound represented by Chemical Formula 1 and a second compound represented by Chemical Formula 2, (Continued)

100

[Chemical Formula 1]

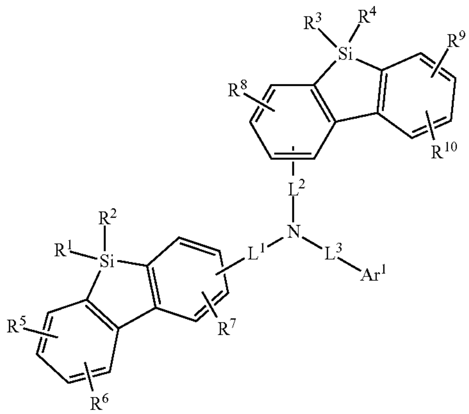

[Chemical Formula 2]

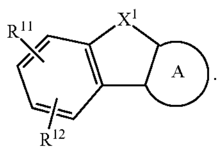

15 Claims, 1 Drawing Sheet

(51) Int. Cl.

| | |
|---|---|
| *C07D 403/10* | (2006.01) |
| *C07D 405/04* | (2006.01) |
| *C07D 405/10* | (2006.01) |
| *C07D 405/14* | (2006.01) |
| *C07D 409/04* | (2006.01) |
| *C07D 409/10* | (2006.01) |
| *C07D 409/14* | (2006.01) |
| *C07F 7/08* | (2006.01) |
| *H10K 50/11* | (2023.01) |
| *H10K 50/12* | (2023.01) |
| *H10K 85/40* | (2023.01) |
| *H10K 85/60* | (2023.01) |
| *H10K 101/00* | (2023.01) |

(52) U.S. Cl.

CPC ....... *H10K 85/654* (2023.02); *H10K 85/6572* (2023.02); *H10K 85/6574* (2023.02); *H10K 85/6576* (2023.02); *H10K 50/11* (2023.02)

(56) References Cited

U.S. PATENT DOCUMENTS

| | | | | |
|---|---|---|---|---|
| 2016/0155961 | A1* | 6/2016 | Ueno | H10K 85/636 257/40 |
| 2016/0244605 | A1 | 8/2016 | Kim et al. | |
| 2018/0053898 | A1* | 2/2018 | Kim | H10K 85/631 |
| 2019/0378981 | A1* | 12/2019 | Yoo | C07C 211/54 |
| 2020/0075866 | A1 | 3/2020 | Lee et al. | |
| 2021/0359216 | A1 | 11/2021 | Kim et al. | |
| 2022/0384744 | A1 | 12/2022 | Lee et al. | |

FOREIGN PATENT DOCUMENTS

| | | | | | |
|---|---|---|---|---|---|
| CN | 107739377 | A | | 2/2018 | |
| CN | 107986975 | A | | 5/2018 | |
| CN | 110156611 | A | * | 8/2019 | C07C 211/54 |
| CN | 110294703 | A | | 10/2019 | |
| CN | 110872511 | A | | 3/2020 | |
| CN | 111196822 | A | * | 5/2020 | |
| JP | 1993-009471 | A | | 1/1993 | |
| JP | 1995-126615 | A | | 5/1995 | |
| JP | 1998-095973 | A | | 4/1998 | |
| JP | 3817632 | B2 | | 6/2006 | |
| JP | 4144987 | B2 | | 9/2008 | |
| JP | 4978003 | B2 | | 7/2012 | |
| KR | 10-2013-0113263 | A | | 10/2013 | |
| KR | 10-1468087 | B1 | | 12/2014 | |
| KR | 10-2016-0047379 | A | | 5/2016 | |
| KR | 10-2016-0064948 | A | | 6/2016 | |
| KR | 10-2016-0079606 | A | | 7/2016 | |
| KR | 2016102734 | A | * | 8/2016 | C08K 3/36 |
| KR | 10-2017-0052733 | A | | 5/2017 | |
| KR | 10-2017-0056425 | A | | 5/2017 | |
| KR | 10-2017-0134264 | A | | 12/2017 | |
| KR | 10-2018-0129656 | A | | 12/2018 | |
| KR | 10-2019-0007706 | A | | 1/2019 | |
| KR | 10-2019-0038109 | A | | 4/2019 | |
| KR | 10-2001425 | B1 | | 7/2019 | |
| KR | 10-2020-0026079 | A | | 3/2020 | |
| KR | 10-2020-0026083 | A | | 3/2020 | |
| WO | WO 1995-009147 | A1 | | 4/1995 | |
| WO | WO 2005/047363 | A1 | | 5/2005 | |
| WO | WO 2011/055912 | A1 | | 5/2011 | |
| WO | WO 2018/087020 | A1 | | 5/2018 | |
| WO | WO 2018/164511 | A1 | | 9/2018 | |

OTHER PUBLICATIONS

CN-110156611-A—translation (Year: 2019).*
KR-2016102734-A—translation (Year: 2016).*
Korean Office action dated Jun. 21, 2024.
Chinese Office action dated Jun. 28, 2024.
Chinese Office Action (including a search report) dated Feb. 6, 2024, of the corresponding Chinese Patent Application No. 202110610885.7.

* cited by examiner

COMPOSITION FOR ORGANIC OPTOELECTRONIC DEVICE, ORGANIC OPTOELECTRONIC DEVICE, AND DISPLAY DEVICE

CROSS-REFERENCE TO RELATED APPLICATION

Korean Patent Application No. 10-2020-0066668, filed on Jun. 2, 2020, in the Korean Intellectual Property Office, and entitled: "Composition for Organic Optoelectronic Device, Organic Optoelectronic Device, and Display Device," is incorporated by reference herein in its entirety.

BACKGROUND

1. Field

Embodiments relate to a composition for an organic optoelectronic device, an organic optoelectronic device, and a display device.

2. Description of the Related Art

An organic optoelectronic device (e.g., organic optoelectronic diode) is a device capable of converting electrical energy and optical energy to each other.

Organic optoelectronic devices may be divided into two types according to a principle of operation. One is a photoelectric device that generates electrical energy by separating excitons formed by light energy into electrons and holes, and transferring the electrons and holes to different electrodes, respectively and another is light emitting device that generates light energy from electrical energy by supplying voltage or current to the electrodes.

Examples of the organic optoelectronic device may include an organic photoelectric device, an organic light emitting diode, an organic solar cell, and an organic photoconductor drum.

SUMMARY

The embodiments may be realized by providing a composition for an organic optoelectronic device, the composition including a first compound represented by Chemical Formula 1; and a second compound represented by Chemical Formula 2,

[Chemical Formula 1]

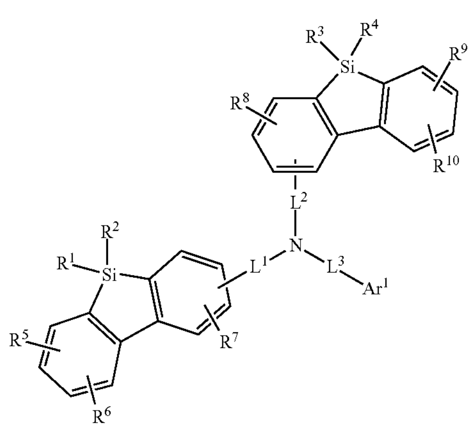

wherein, in Chemical Formula 1, $Ar^1$ is a substituted or unsubstituted C6 to C30 aryl group, $L^1$ to $L^3$ are each independently a single bond or a substituted or unsubstituted C6 to C30 arylene group, $R^1$ to $R^4$ are each independently a substituted or unsubstituted C1 to C30 alkyl group or a substituted or unsubstituted C6 to C30 aryl group, and $R^5$ to $R^{10}$ are each independently hydrogen, deuterium, a cyano group, a halogen, a substituted or unsubstituted amine group, a substituted or unsubstituted C1 to C30 alkyl group, a substituted or unsubstituted C6 to C30 aryl group, or a substituted or unsubstituted C2 to C30 heterocyclic group;

[Chemical Formula 2]

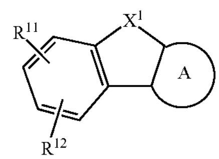

wherein, in Chemical Formula 2, $X^1$ is O, S, N-$L^a$-$R^a$, $CR^bR^c$, or $SiR^dR^e$, $L^a$ is a single bond or a substituted or unsubstituted C6 to C12 arylene group, $R^a$ is a substituted or unsubstituted C6 to C20 aryl group or a substituted or unsubstituted C2 to C30 heterocyclic group, $R^b$, $R^c$, $R^d$, and $R^e$ are each independently a substituted or unsubstituted C1 to C30 alkyl group or a substituted or unsubstituted C6 to C30 aryl group, $R^{11}$ and $R^{12}$ are each independently hydrogen, deuterium, a cyano group, a halogen, a substituted or unsubstituted amine group, a substituted or unsubstituted C1 to C30 alkyl group, a substituted or unsubstituted C6 to C30 aryl group, or a substituted or unsubstituted C2 to C30 heterocyclic group, and A is a ring of Group I,

[Group I]

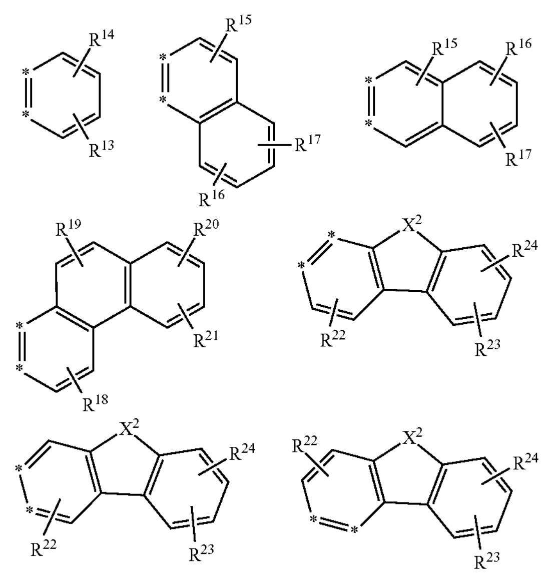

wherein, in Group I, * is a linking carbon, $X^2$ is O or S, $R^{13}$ to $R^{24}$ are each independently hydrogen, deuterium, a substituted or unsubstituted C6 to C20 aryl group, or a substituted or unsubstituted C2 to C30 heterocyclic group, and at least one of $R^a$ and $R^{11}$ to $R^{24}$ is a group represented by Chemical Formula a,

[Chemical Formula a]

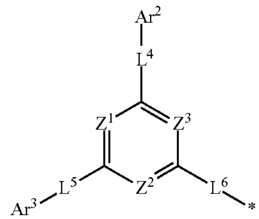

wherein, in Chemical Formula a, $Z^1$ to $Z^3$ are each independently N or CRC at least two of $Z^1$ to $Z^3$ being N, $R^f$ is hydrogen, deuterium, a substituted or unsubstituted C1 to C30 alkyl group, or a substituted or unsubstituted C6 to C30 aryl group, $L^4$ to $L^6$ are each independently a single bond or a substituted or unsubstituted C6 to C30 arylene group, $Ar^2$ and $Ar^3$ are each independently a substituted or unsubstituted C6 to C30 aryl group or a substituted or unsubstituted C2 to C30 heteroaryl group, and * is a linking point.

The embodiments may be realized by providing an organic optoelectronic device including an anode and a cathode facing each other, and at least one organic layer between the anode and the cathode, wherein the at least one organic layer includes a light emitting layer, and the light emitting layer includes the composition for an organic optoelectronic device according to an embodiment.

The embodiments may be realized by providing a display device including the organic optoelectronic device according to an embodiment.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
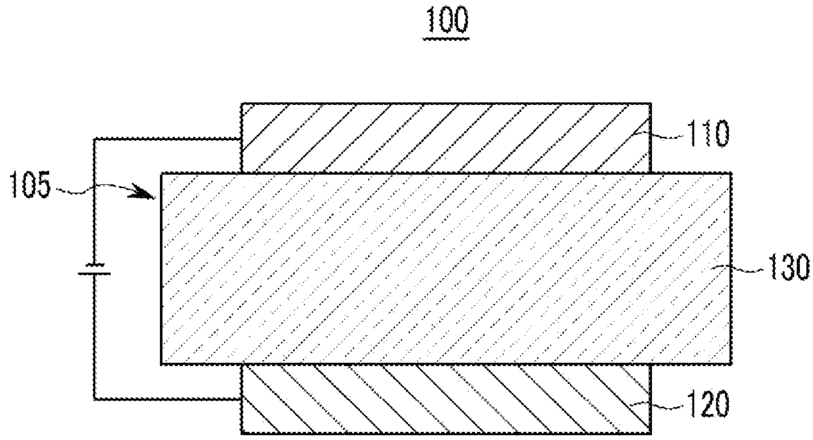
FIGS. 1 and 2 are cross-sectional views of an organic light emitting diode according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art In the drawing figures, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. Like reference numerals refer to like elements throughout.

As used herein, when a definition is not otherwise provided, "substituted" refers to replacement of at least one hydrogen of a substituent or a compound by deuterium, a halogen, a hydroxyl group, an amino group, a substituted or unsubstituted C1 to C30 amine group, a nitro group, a substituted or unsubstituted C1 to C40 silyl group, a C1 to C30 alkyl group, a C1 to C10 alkylsilyl group, a C6 to C30 arylsilyl group, a C3 to C30 cycloalkyl group, a C3 to C30 heterocycloalkyl group, a C6 to C30 aryl group, a C2 to C30 heteroaryl group, a C1 to C20 alkoxy group, a C1 to C10 trifluoroalkyl group, a cyano group, or a combination thereof. As used herein, the term "or" is not an exclusive term, e.g., "A or B" would include A, B, or A and B.

In one example of the present disclosure, the "substituted" refers to replacement of at least one hydrogen of a substituent or a compound by deuterium, a C1 to C30 alkyl group, a C1 to C10 alkylsilyl group, a C6 to C30 arylsilyl group, a C3 to C30 cycloalkyl group, a C3 to C30 heterocycloalkyl group, a C6 to C30 aryl group, a C2 to C30 heteroaryl group, or a cyano group. In specific example of the present disclosure, the "substituted" refers to replacement of at least one hydrogen of a substituent or a compound by deuterium, a C1 to C20 alkyl group, a C6 to C30 aryl group, or a cyano group. In specific example of the present disclosure, the "substituted" refers to replacement of at least one hydrogen of a substituent or a compound by deuterium, a C1 to C5 alkyl group, a C6 to C18 aryl group, or a cyano group. In specific example of the present disclosure, the "substituted" refers to replacement of at least one hydrogen of a substituent or a compound by deuterium, a cyano group, a methyl group, an ethyl group, a propyl group, a butyl group, a phenyl group, a biphenyl group, a terphenyl group, or a naphthyl group.

As used herein, when a definition is not otherwise provided, "hetero" refers to one including one to three heteroatoms selected from N, O, S, P, and Si, and remaining carbons in one functional group.

As used herein, "an aryl group" refers to a group including at least one hydrocarbon aromatic moiety, and all elements of the hydrocarbon aromatic moiety have p-orbitals which form conjugation, for example a phenyl group, a naphthyl group, and the like, two or more hydrocarbon aromatic moieties may be linked by a sigma bond and may be, for example a biphenyl group, a terphenyl group, a quarterphenyl group, and the like, and two or more hydrocarbon aromatic moieties are fused directly or indirectly to provide a non-aromatic fused ring, for example a fluorenyl group.

The aryl group may include a monocyclic, polycyclic, or fused ring polycyclic (i.e., rings sharing adjacent pairs of carbon atoms) functional group.

As used herein, "a heterocyclic group" is a generic concept of a heteroaryl group, and may include at least one heteroatom selected from N, O, S, P, and Si instead of carbon (C) in a cyclic compound such as an aryl group, a cycloalkyl group, a fused ring thereof, or a combination thereof. When the heterocyclic group is a fused ring, the entire ring or each ring of the heterocyclic group may include one or more heteroatoms.

For example, "a heteroaryl group" may refer to an aryl group including at least one heteroatom selected from N, O, S, P, and Si. Two or more heteroaryl groups are linked by a sigma bond directly, or when the heteroaryl group includes two or more rings, the two or more rings may be fused.

When the heteroaryl group is a fused ring, each ring may include one to three heteroatoms.

More specifically, the substituted or unsubstituted C6 to C30 aryl group may be a substituted or unsubstituted phenyl group, a substituted or unsubstituted naphthyl group, a substituted or unsubstituted anthracenyl group, a substituted or unsubstituted phenanthrenyl group, a substituted or unsubstituted naphthacenyl group, a substituted or unsubstituted pyrenyl group, a substituted or unsubstituted biphenyl group, a substituted or unsubstituted p-terphenyl group, a substituted or unsubstituted m-terphenyl group, a substituted or unsubstituted o-terphenyl group, a substituted or unsubstituted chrysenyl group, a substituted or unsubstituted triphenylene group, a substituted or unsubstituted perylenyl group, a substituted or unsubstituted fluorenyl group, a substituted or unsubstituted indenyl group, a substituted or unsubstituted furanyl group, or a combination thereof.

More specifically, the substituted or unsubstituted C2 to C30 heterocyclic group may be a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, a substituted or unsubstituted carbazolyl group, a substituted or unsubstituted dibenzofuranyl group, a substituted or unsubstituted dibenzothiophenyl group, or a combination thereof.

In the present specification, hole characteristics refer to an ability to donate an electron to form a hole when an electric field is applied and that a hole formed in the anode may be easily injected into the light emitting layer and transported in the light emitting layer due to conductive characteristics according to a highest occupied molecular orbital (HOMO) level.

In addition, electron characteristics refer to an ability to accept an electron when an electric field is applied and that electron formed in the cathode may be easily injected into the light emitting layer and transported in the light emitting layer due to conductive characteristics according to a lowest unoccupied molecular orbital (LUMO) level.

Hereinafter, a composition for an organic optoelectronic device according to an embodiment is described.

A composition for an organic optoelectronic device according to an embodiment may include a first compound represented by Chemical Formula 1 and a second compound represented by Chemical Formula 2 (e.g., a mixture of the first compound and the second compound).

[Chemical Formula 1]

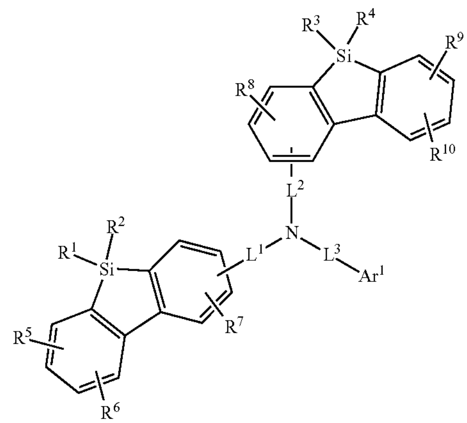

In Chemical Formula 1, $Ar^1$ may be or may include, e.g., a substituted or unsubstituted C6 to C30 aryl group.

$L^1$ to $L^3$ may each independently be or include, e.g., a single bond or a substituted or unsubstituted C6 to C30 arylene group.

$R^1$ to $R^4$ may each independently be or include, e.g., a substituted or unsubstituted C1 to C30 alkyl group or a substituted or unsubstituted C6 to C30 aryl group, and $R^5$ to $R^{10}$ may each independently be or include, e.g., hydrogen, deuterium, a cyano group, a halogen, a substituted or unsubstituted amine group, a substituted or unsubstituted C1 to C30 alkyl group, a substituted or unsubstituted C6 to C30 aryl group, or a substituted or unsubstituted C2 to C30 heterocyclic group.

[Chemical Formula 2]

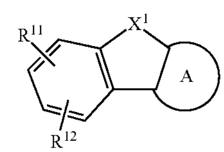

In Chemical Formula 2, $X^1$ may be, e.g., O, S, N-$L^a$-$R^a$, $CR^bR^c$, or $SiR^dR^e$.

$L^a$ may be or may include, e.g., a single bond or a substituted or unsubstituted C6 to C12 arylene group.

IV may be or may include, e.g., a substituted or unsubstituted C6 to C20 aryl group or a substituted or unsubstituted C2 to C30 heterocyclic group.

$R^bR^c$, $R^d$, and $R^e$ may each independently be or include, e.g., a substituted or unsubstituted C1 to C30 alkyl group or a substituted or unsubstituted C6 to C30 aryl group.

$R^{11}$ and $R^{12}$ may each independently be or include, e.g., hydrogen, deuterium, a cyano group, a halogen, a substituted or unsubstituted amine group, a substituted or unsubstituted C1 to C30 alkyl group, a substituted or unsubstituted C6 to C30 aryl group, or a substituted or unsubstituted C2 to C30 heterocyclic group.

A may be, e.g., a ring of Group I. [Group I]

[Group I]

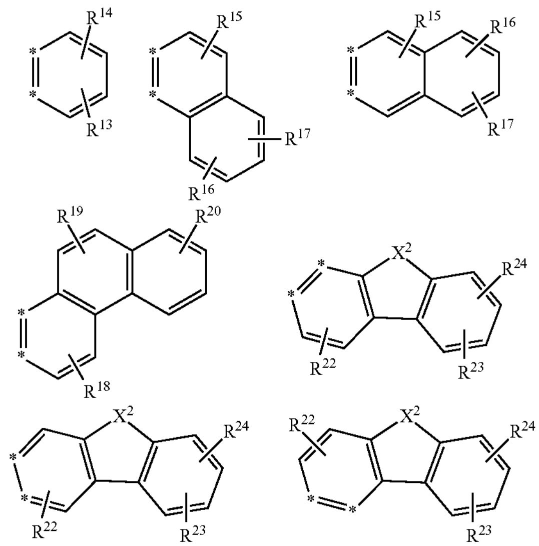

In Group I, * is a linking carbon. As used herein, the linking carbons are carbons of ring A that are shared with the $X^1$-containing ring of Chemical Formula 2, e.g., shared carbons at which fused rings are linked.

$X^2$ may be, e.g., O or S.

$R^{13}$ to $R^{24}$ may each independently be or include, e.g., hydrogen, deuterium, a substituted or unsubstituted C6 to C20 aryl group, or a substituted or unsubstituted C2 to C30 heterocyclic group.

In an implementation, at least one of $R^a$ and $R^{11}$ to $R^{24}$ may be, e.g., a group represented by Chemical Formula a.

[Chemical Formula a]

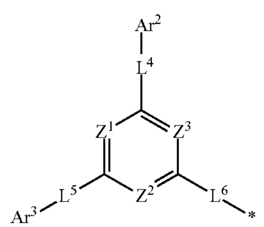

In Chemical Formula a, $Z^1$ to $Z^3$ may each independently be, e.g., N or $CR^f$. In an implementation, at least two of $Z^1$ to $Z^3$ may be N.

$R^f$ may be or may include, e.g., hydrogen, deuterium, a substituted or unsubstituted C1 to C30 alkyl group, or a substituted or unsubstituted C6 to C30 aryl group.

$L^4$ to $L^6$ may each independently be or include, e.g., a single bond or a substituted or unsubstituted C6 to C30 arylene group, $Ar^2$ and $Ar^3$ may each independently be or include, e.g., a substituted or unsubstituted C6 to C30 aryl group or a substituted or unsubstituted C2 to C30 heteroaryl group.

* is a linking point.

The first compound represented by Chemical Formula 1 may have a structure including two dibenzosilole groups bonded to a center or core of an amine.

Hole transport characteristics may be further improved due to the two dibenzosilole groups, and low driving and high efficiency performance of an organic optoelectronic device including the same may be realized.

The second compound has a structure substituted with or including a nitrogen-containing 6-membered ring.

The second compound may effectively expand the LUMO energy band by being substituted with or including a nitrogen-containing 6-membered ring, and when used in the light emitting layer together with the aforementioned first compound, mobility of charges and stability may increase, thereby increasing a balance between holes and electrons and improving luminous efficiency and life-span characteristics of the device and lowering a driving voltage.

In an implementation, the first compound may be represented by, e.g., one of Chemical Formula 1A to Chemical Formula 1D, depending on the substitution position of one of the two dibenzosilolyl groups.

[Chemical Formula 1A]

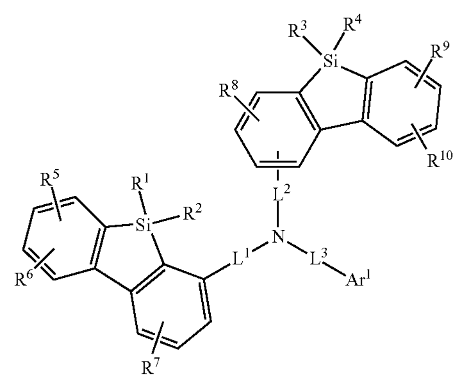

[Chemical Formula 1B]

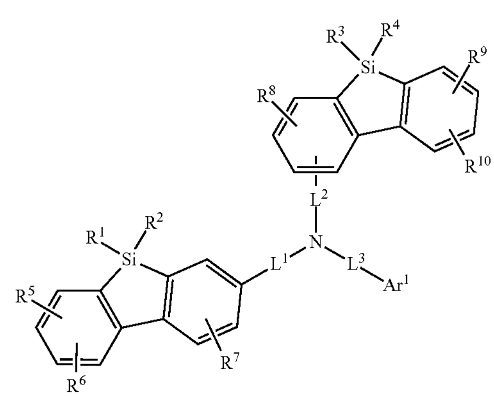

-continued

[Chemical Formula 1C]

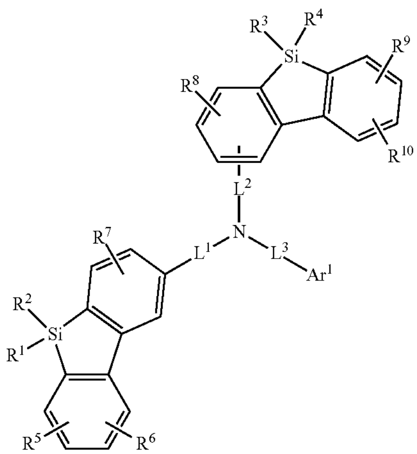

[Chemical Formula 1D]

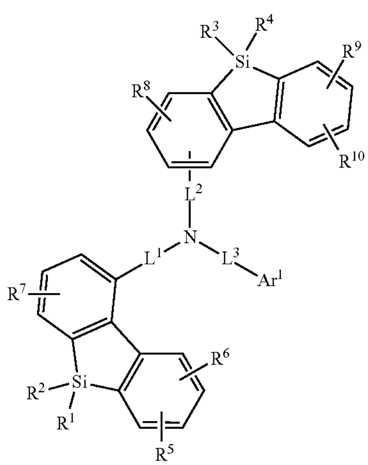

In Chemical Formula 1A to Chemical Formula 1D, $Ar^1$, $L^1$ to $L^3$, and $R^1$ to $R^{10}$ may be defined the same as those described above.

In an implementation, the first compound may be represented by, e.g., one of Chemical Formula 1A-1, Chemical Formula 1A-2, Chemical Formula 1A-3, Chemical Formula 1A-4, Chemical Formula 1B-1 to Chemical Formula 1B-3, Chemical Formula 1C-1, Chemical Formula 1C-2, and Chemical Formula 1D-1.

[Chemical Formula 1A-1]

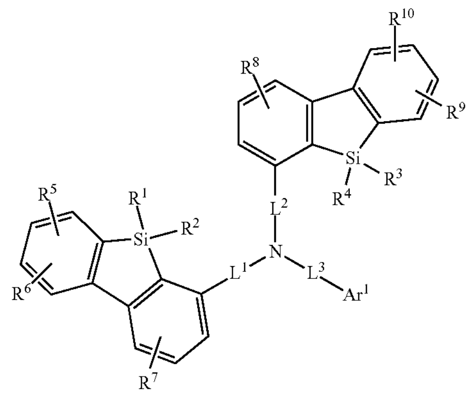

[Chemical Formula 1A-2]

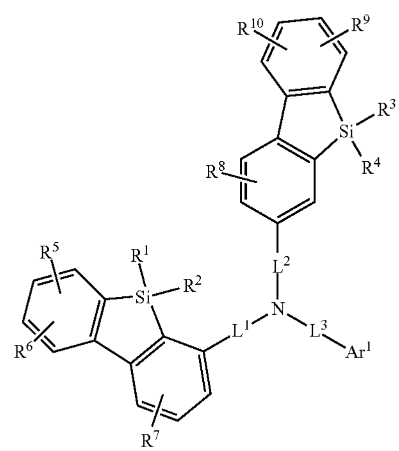

[Chemical Formula 1A-3]

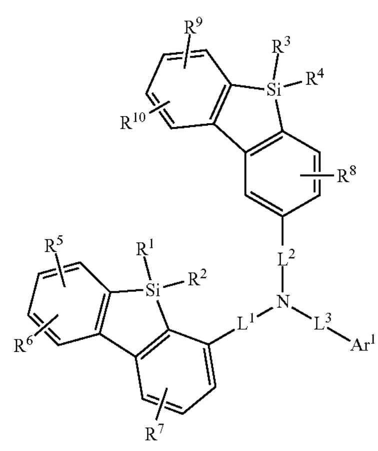

-continued
[Chemical Formula 1A-4]
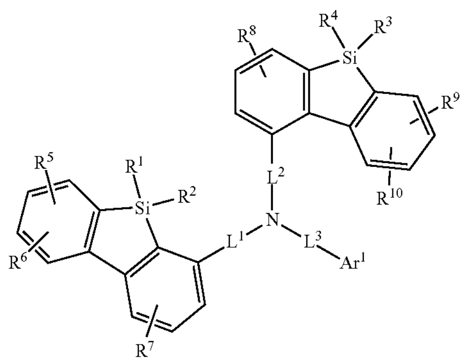
[Chemical Formula 1B-1]
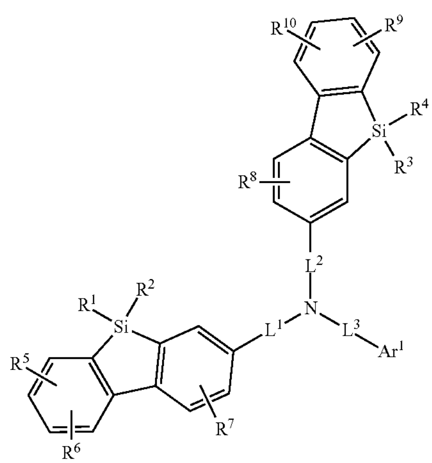
[Chemical Formula 1B-2]
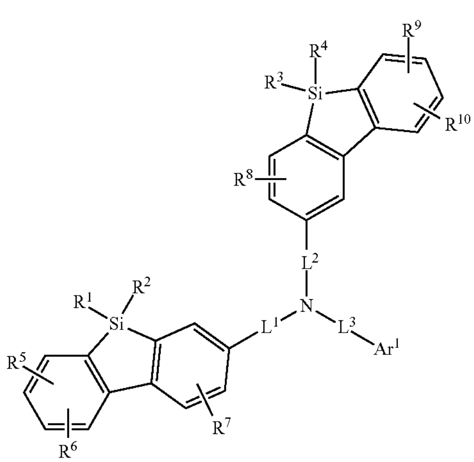
-continued
[Chemical Formula 1B-3]
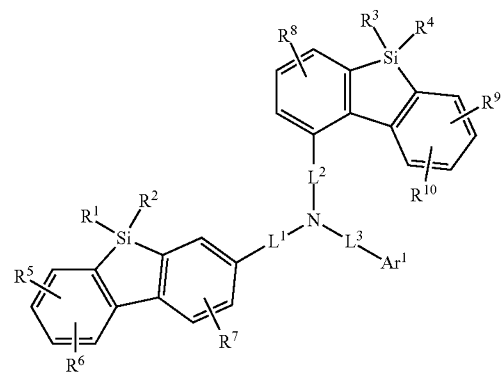
[Chemical Formula 1C-1]
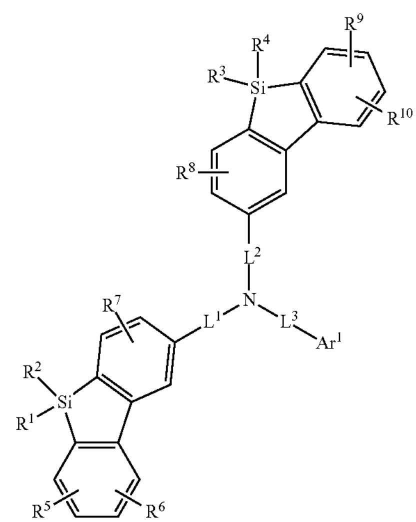
[Chemical Formula 1C-2]
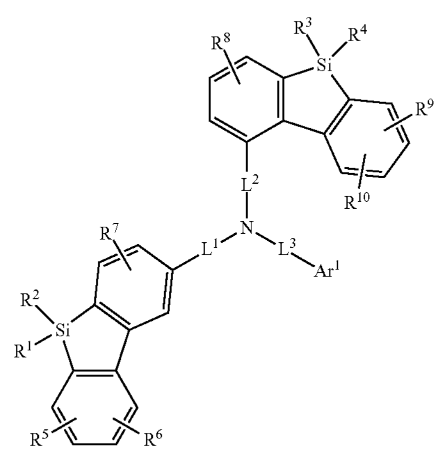

-continued

[Chemical Formula 1D-1]

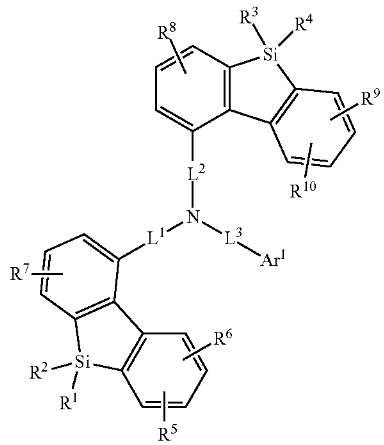

In Chemical Formula 1A-1, Chemical Formula 1A-2, Chemical Formula 1A-3, Chemical Formula 1A-4, Chemical Formula 1B-1 to Chemical Formula 1B-3, Chemical Formula 1C-1, Chemical Formula 1C-2, and Chemical Formula 1D-1, $Ar^1$, $L^1$ to $L^3$, and $R^1$ to $R^{10}$ may be defined the same as those described above.

In an implementation, the first compound may be represented by, e.g., Chemical Formula 1A-2a, Chemical Formula 1B-1a, Chemical Formula 1B-2a, or Chemical Formula 1B-3a.

[Chemical Formula 1A-2a]

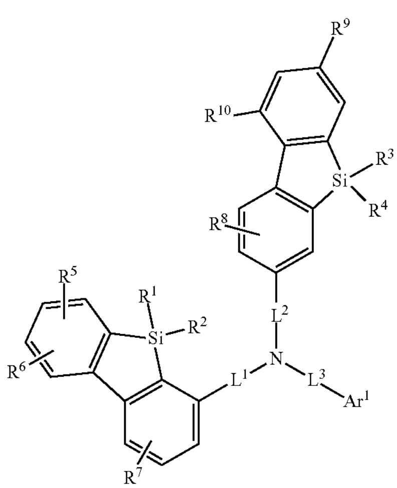

-continued

[Chemical Formula 1B-1a]

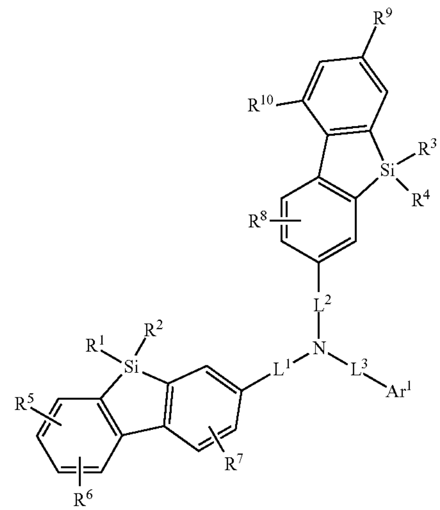

[Chemical Formula 1B-2a]

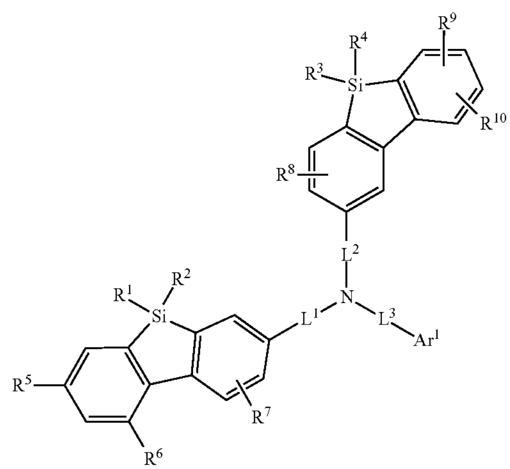

[Chemical Formula 1B-3a]

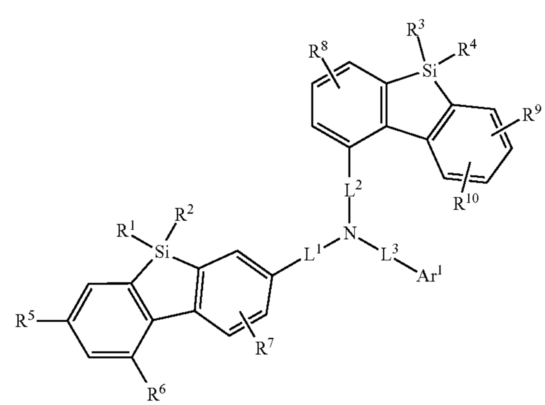

In Chemical Formula 1A-2a, Chemical Formula 1B-1a, Chemical Formula 1B-2a, and Chemical Formula 1B-3a, $AR^1$, $L^1$ to $L^3$, and $R^1$ to $R^{10}$ may be defined the same as those described above.

In an implementation, $Ar^1$ may be, e.g., a substituted or unsubstituted phenyl group, a substituted or unsubstituted biphenyl group, or a substituted or unsubstituted naphthyl group.

In an implementation, $Ar^1$ may be, e.g., substituted with a C6 to C12 aryl group.

In an implementation, $Ar^1$ may be, e.g., an unsubstituted phenyl group, a phenyl group substituted with a C6 to C12 aryl group, an unsubstituted biphenyl group, a biphenyl group substituted with a C6 to C12 aryl group, an unsubstituted naphthyl group or a naphthyl group substituted with a C6 to C12 aryl group.

In an implementation, $L^3$ may be, e.g., a single bond or a substituted or unsubstituted phenylene group, and $Ar^1$ may be a group of Group II.

[Group II]

[Group II]

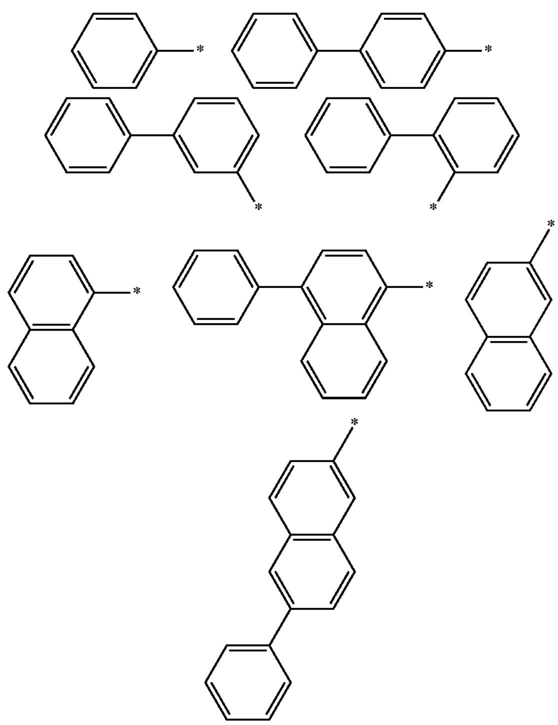

In Group II, * is a linking point.

In an implementation, $R^1$ to $R^4$ may each independently be, e.g., a substituted or unsubstituted C1 to C10 alkyl group or a substituted or unsubstituted C6 to C20 aryl group.

In an implementation, $R^1$ to $R^4$ may each independently be, e.g., a substituted or unsubstituted methyl group, a substituted or unsubstituted phenyl group, or a substituted or unsubstituted biphenyl group.

In an implementation, $R^5$ to $R^{10}$ may each independently be, e.g., hydrogen, a cyano group, a substituted or unsubstituted C1 to C10 alkyl group, a substituted or unsubstituted C6 to C12 aryl group, or a substituted or unsubstituted C2 to C18 heterocyclic group.

In an implementation, $R^5$ to $R^{10}$ may each independently be hydrogen, deuterium, a substituted or unsubstituted phenyl group, or a substituted or unsubstituted naphthyl group.

In an implementation, $L^1$ to $L^3$ may each independently be a single bond or a substituted or unsubstituted phenylene group.

In an implementation, the first compound may be a compound of Group 1.

[Group 1]

1

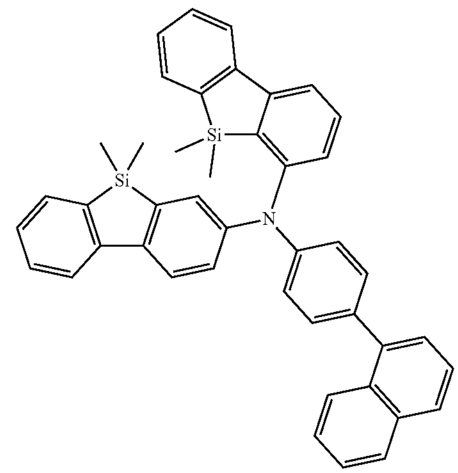

2

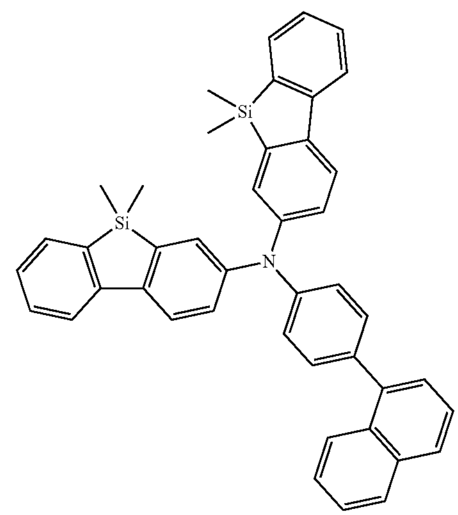

3

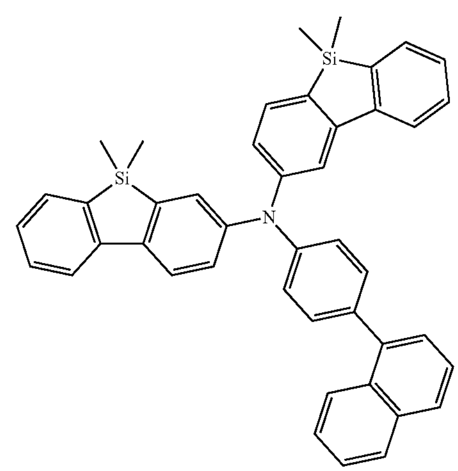

-continued
4
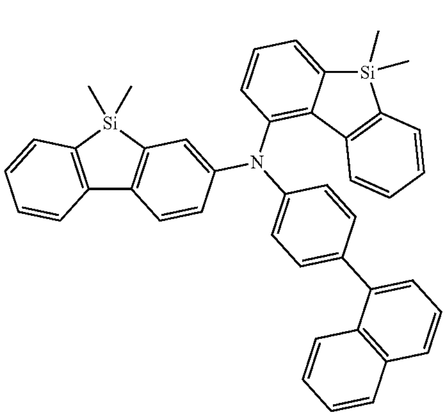
5
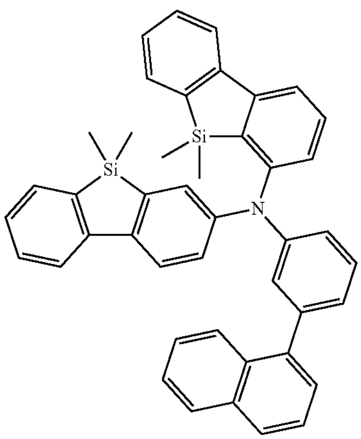
6
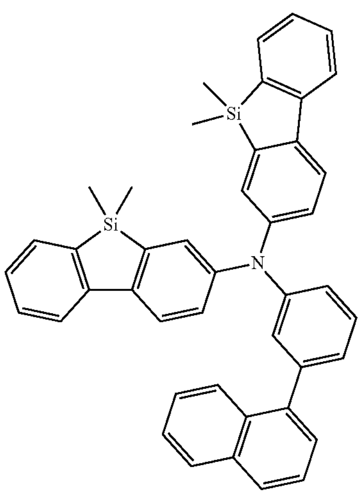
-continued
7
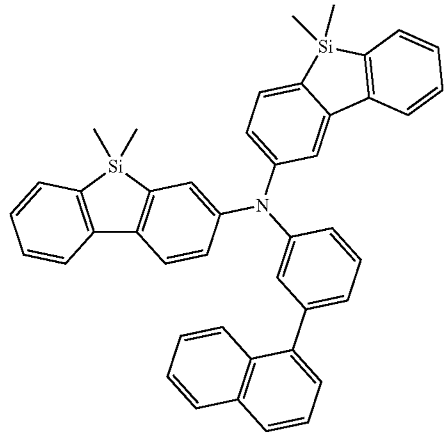
8
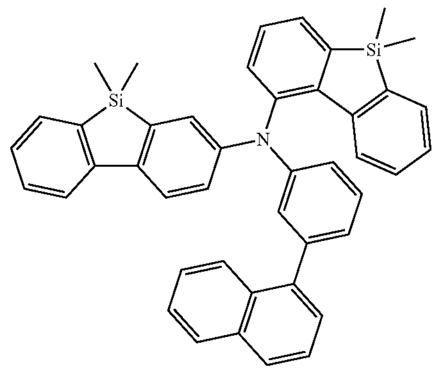
9
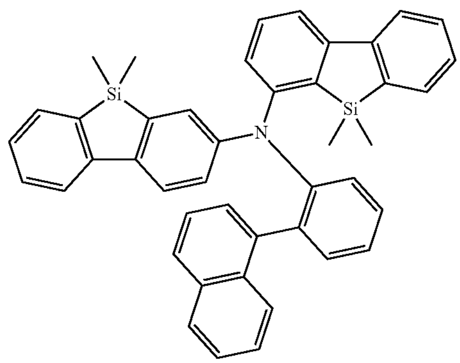
10
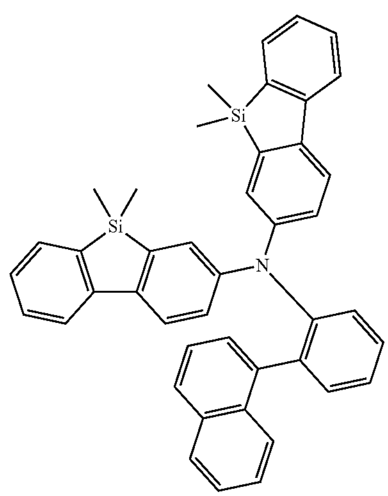

-continued
11
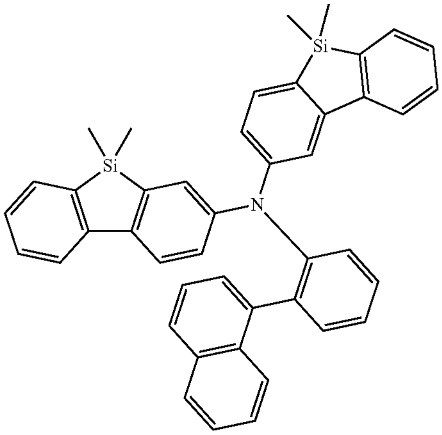
12
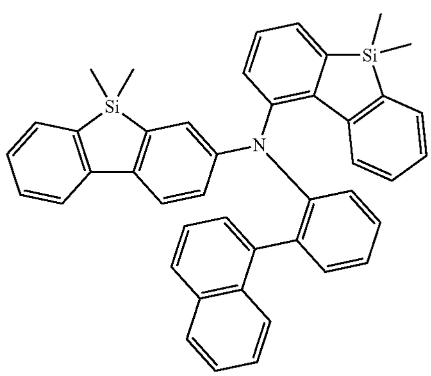
13
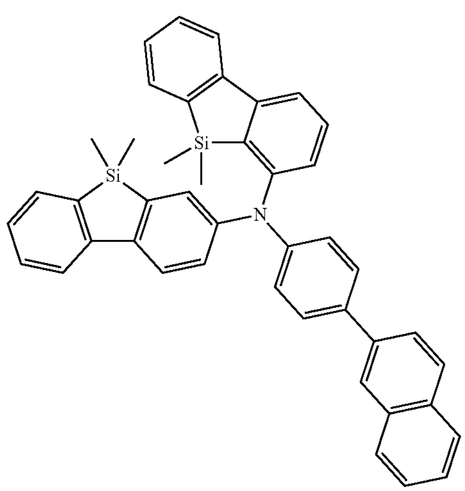
-continued
14
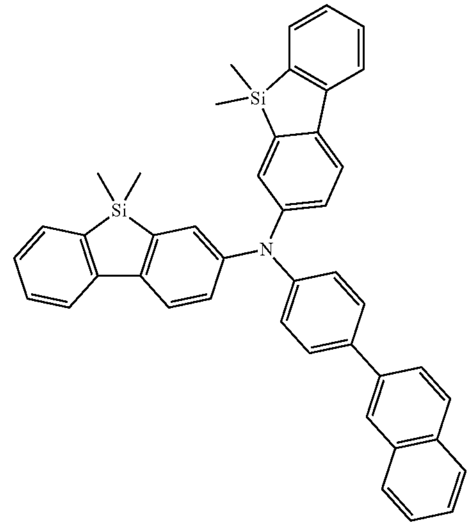
15
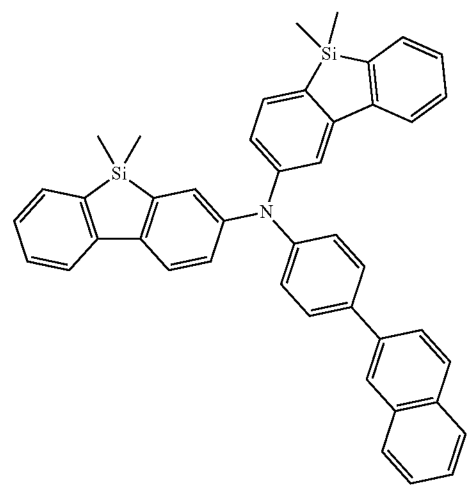
16
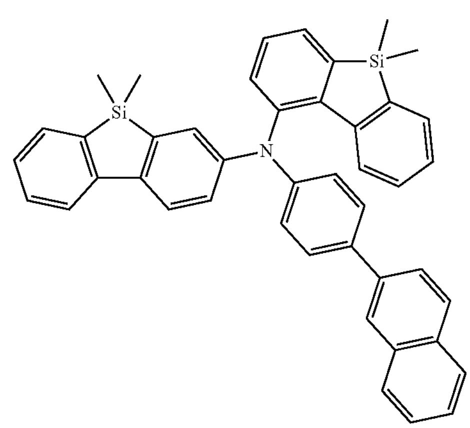

-continued
17
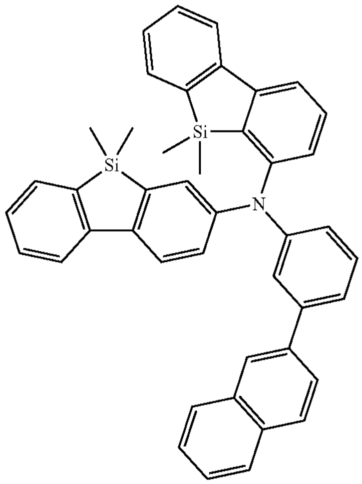
18
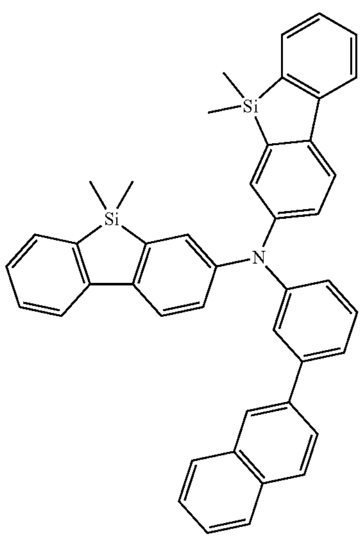
19
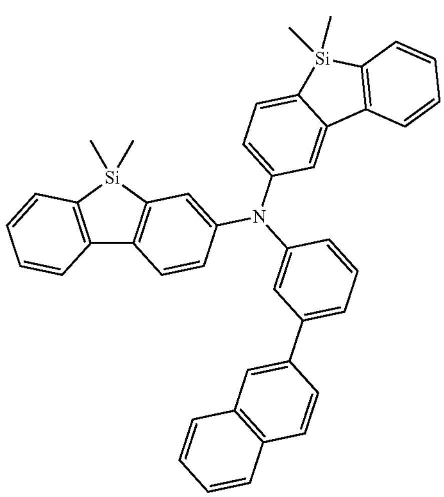
-continued
20
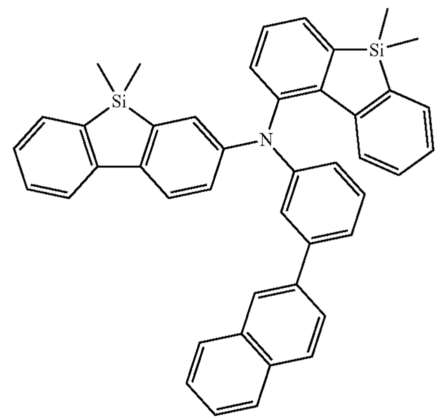
21
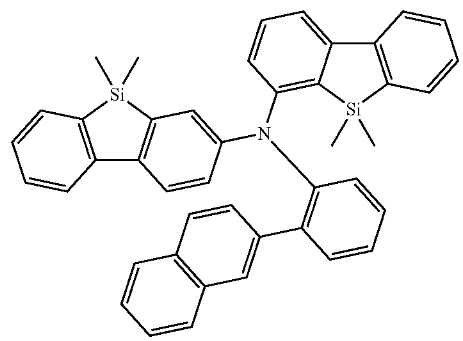
22
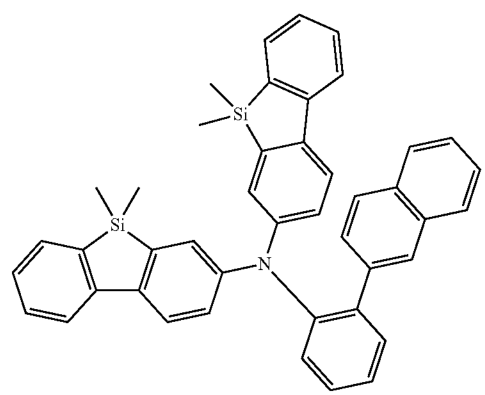
23
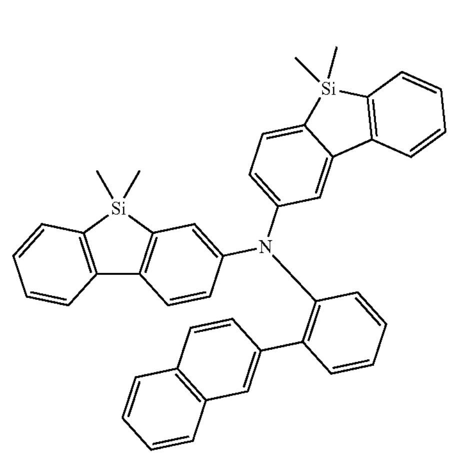

-continued
24
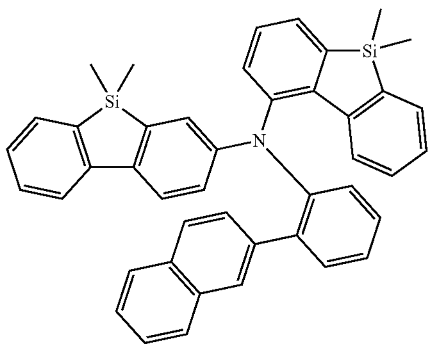
25
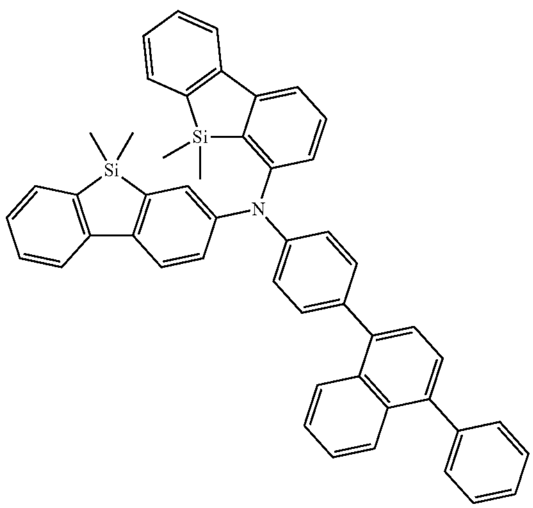
26
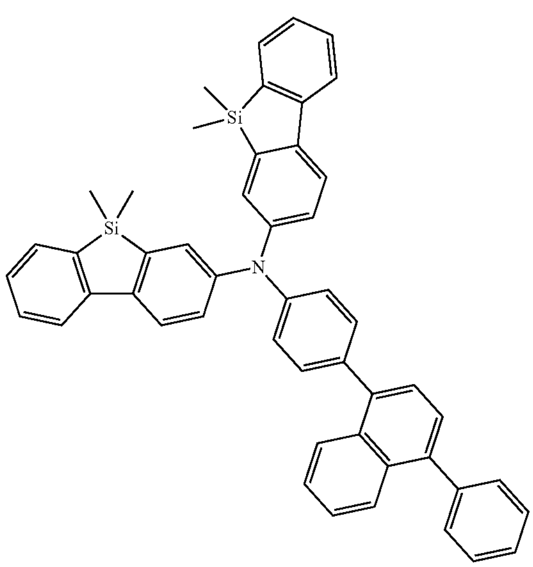
-continued
27
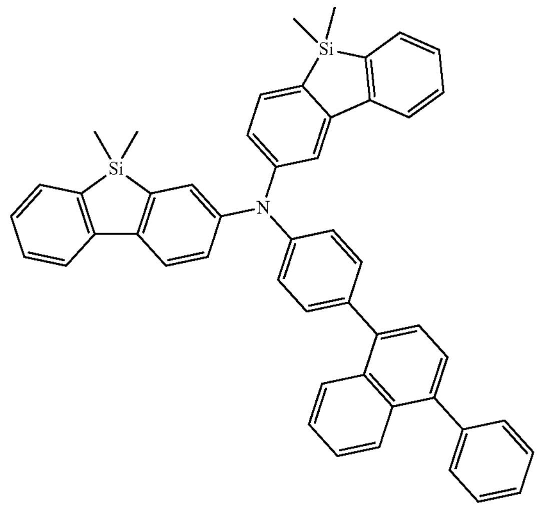
28
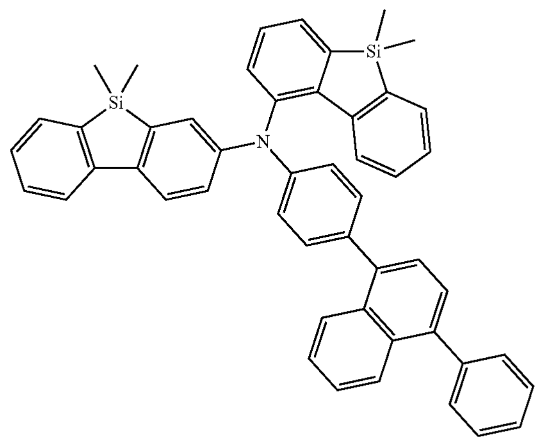
29
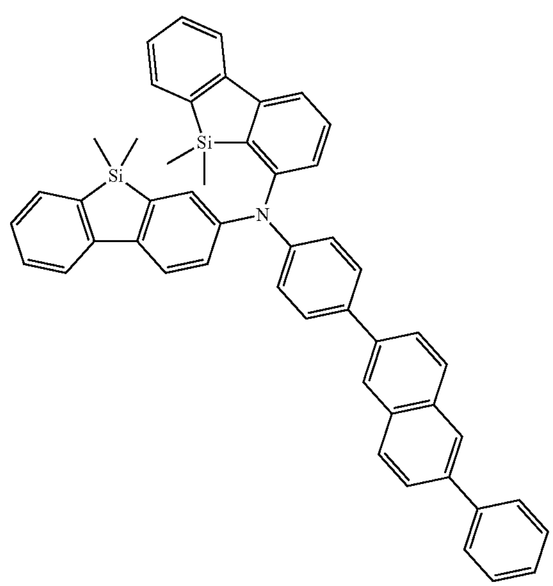

-continued
30
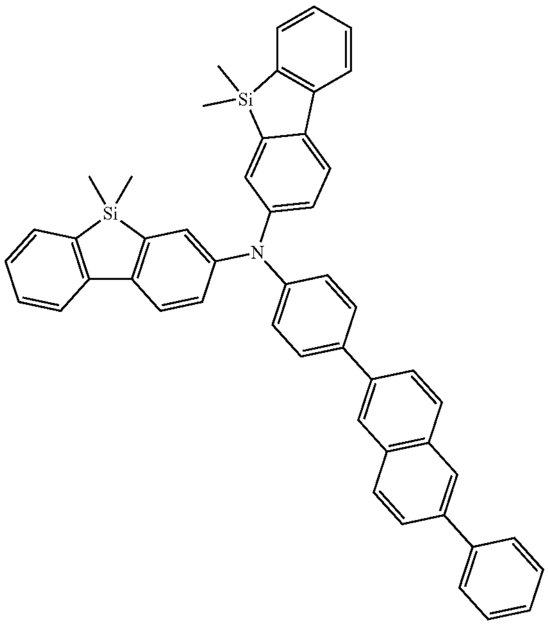
31
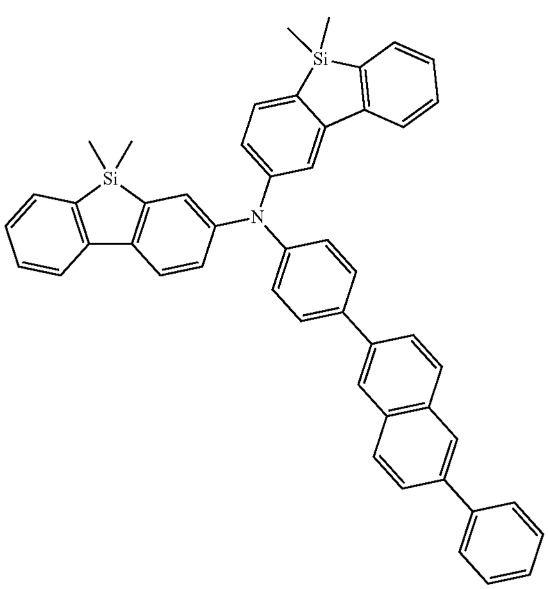
-continued
32
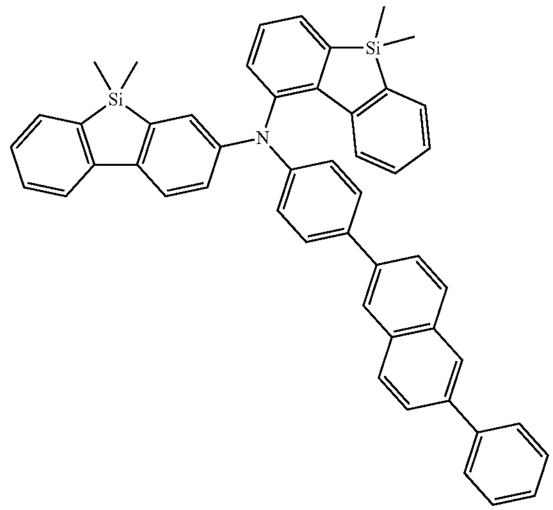
33
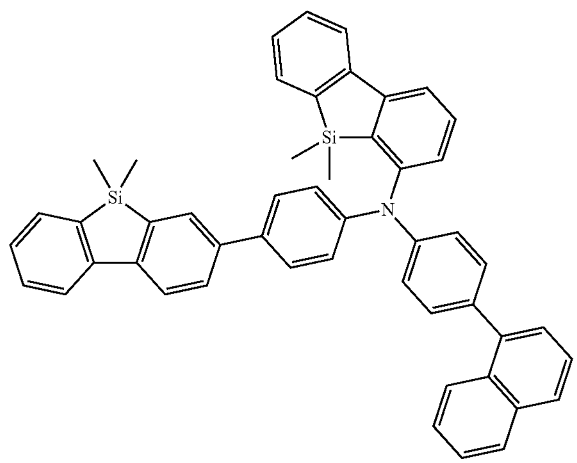
34
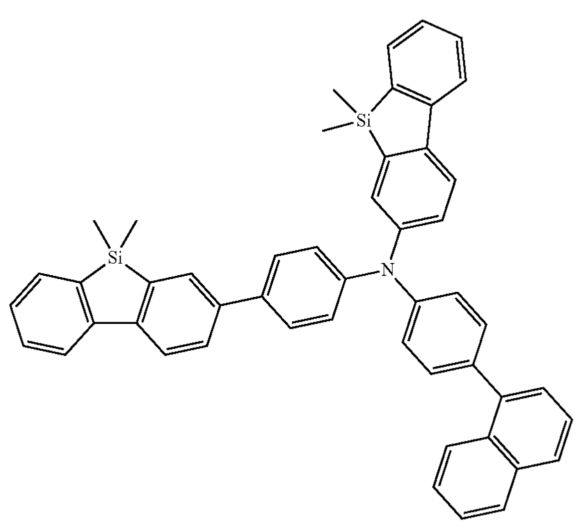

-continued
35
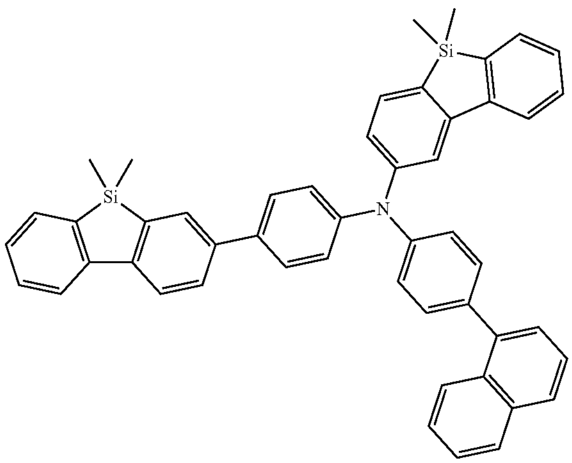
36
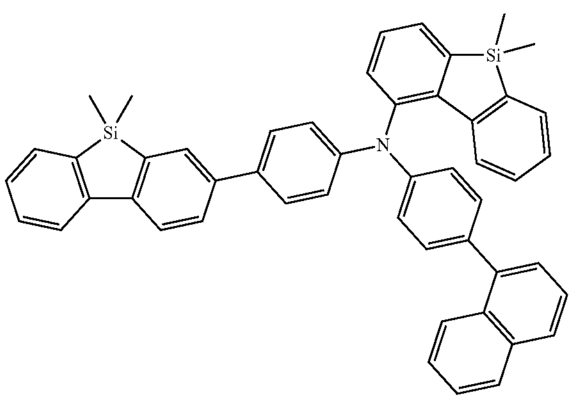
37
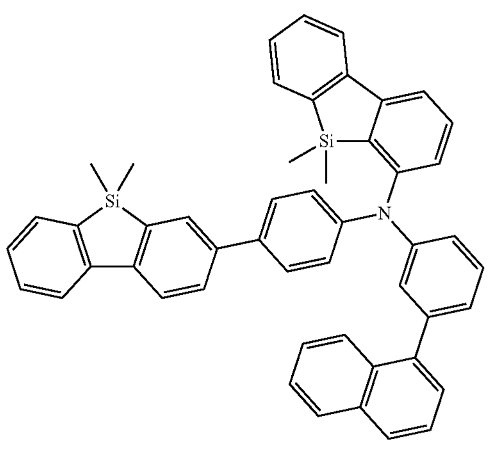
-continued
38
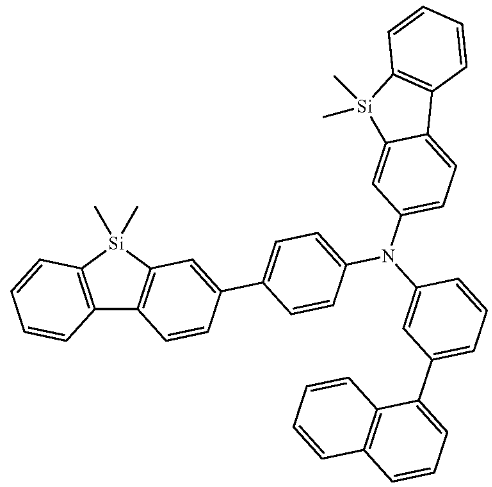
39
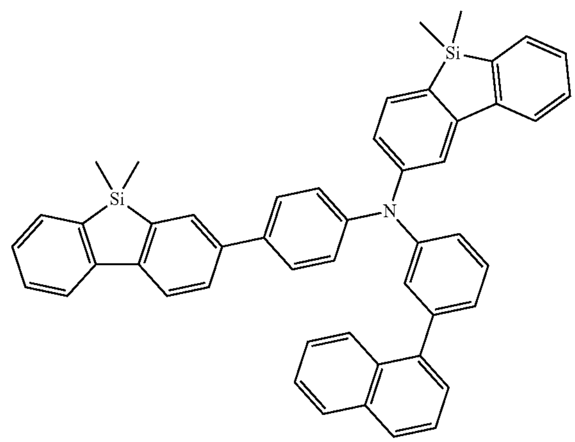
40
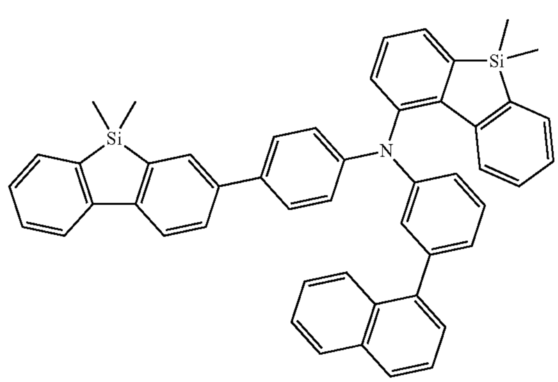

-continued
41
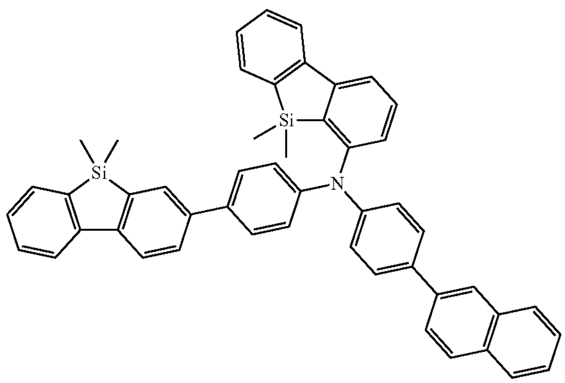
42
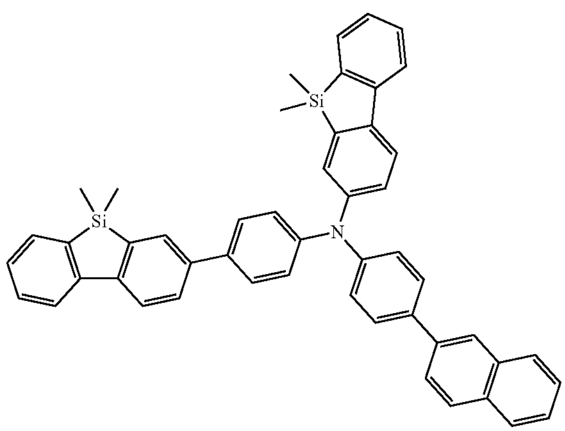
43
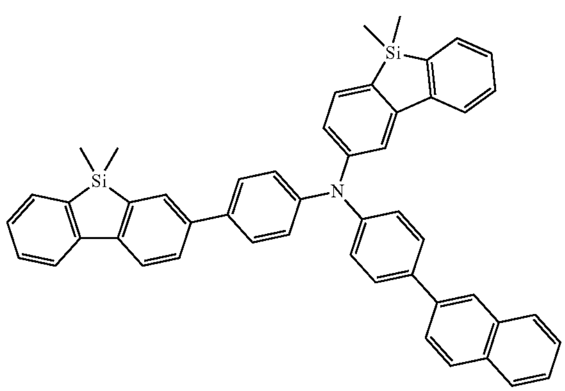
44
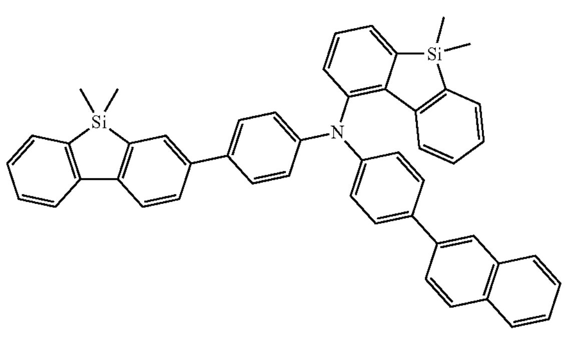
-continued
45
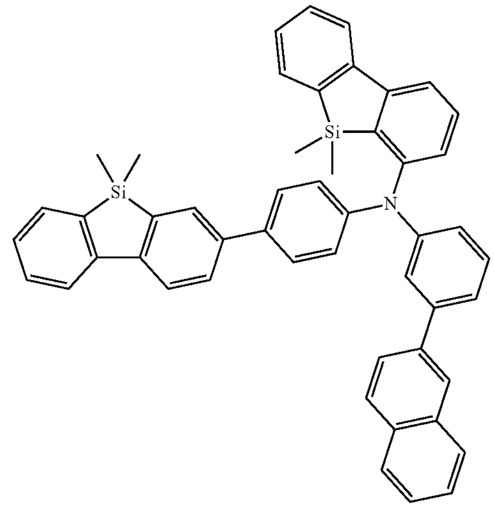
46
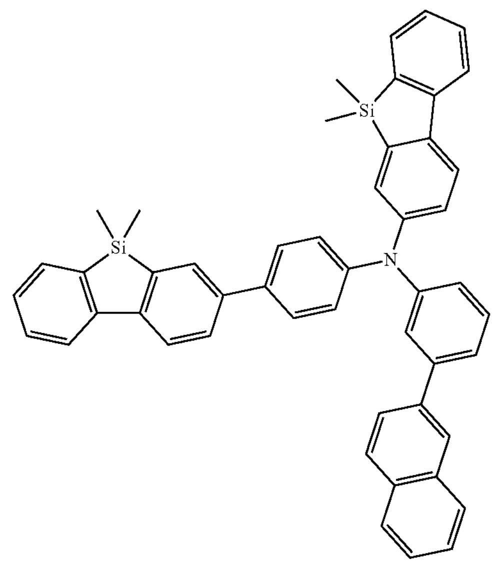
47
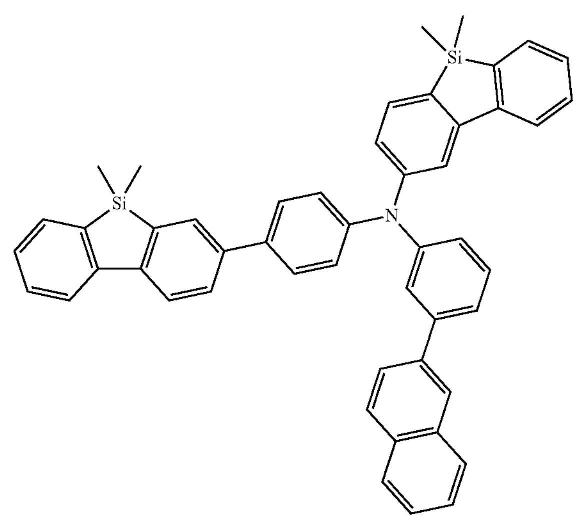

-continued
48
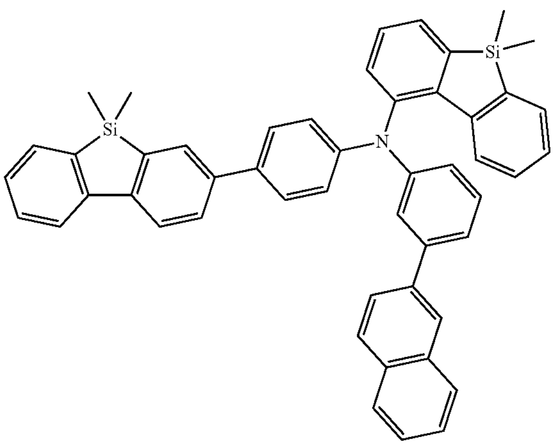
49
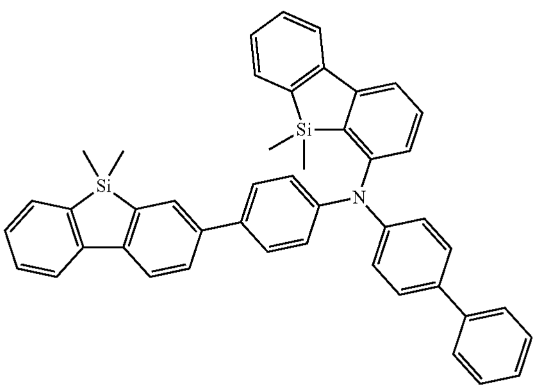
50
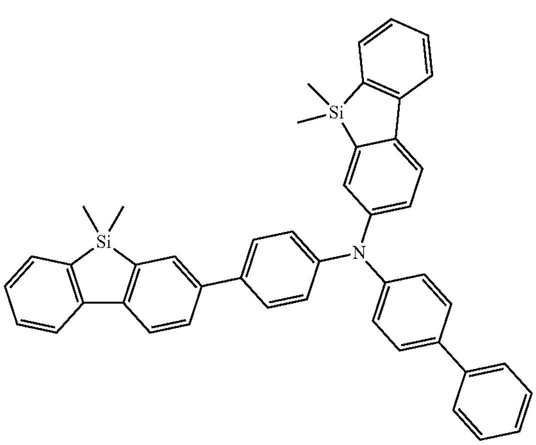
-continued
51
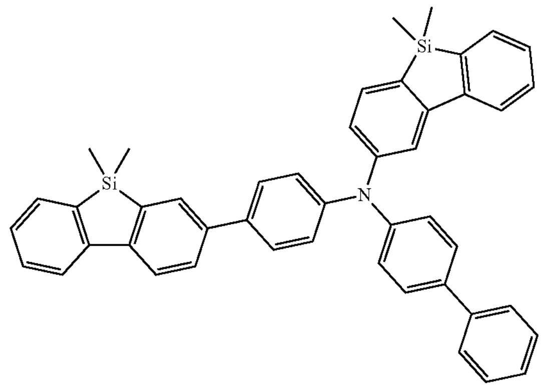
52
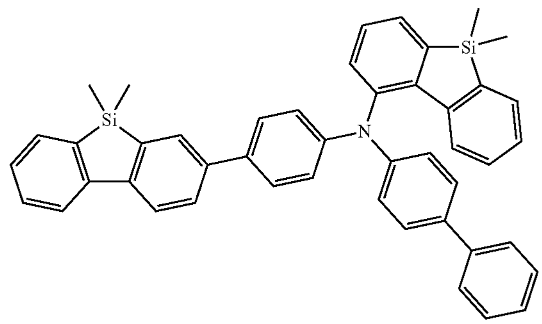
53
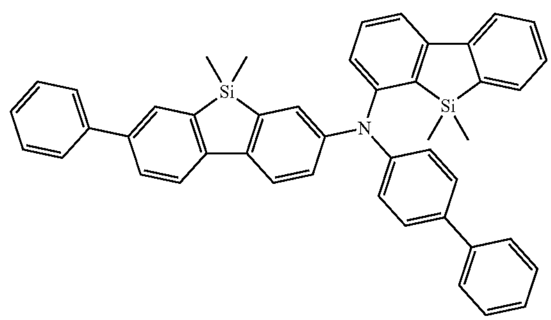
54
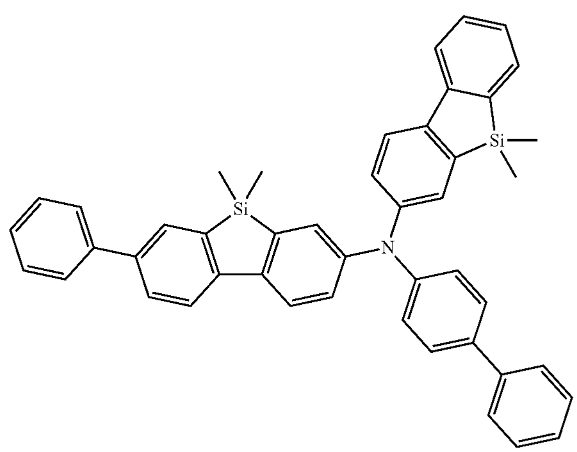

-continued
55
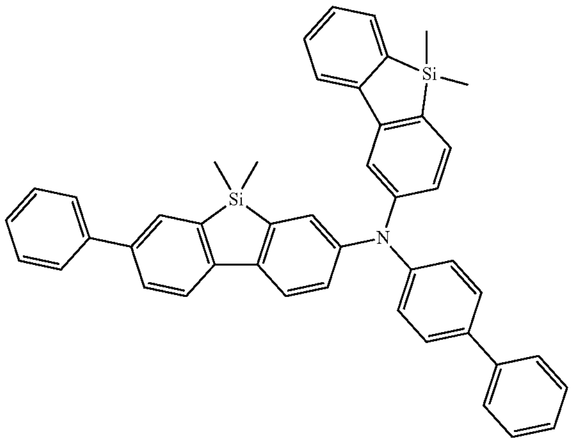
56
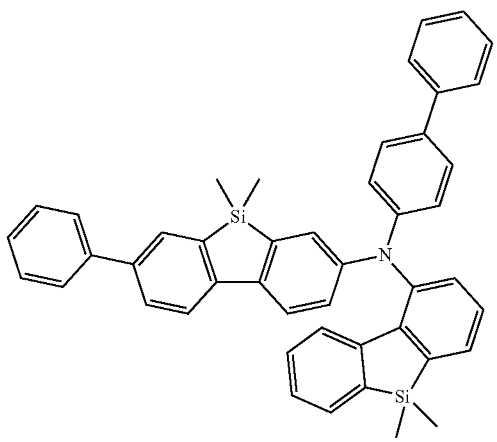
57
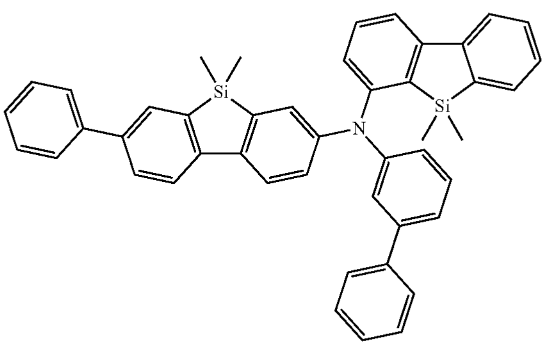
-continued
58
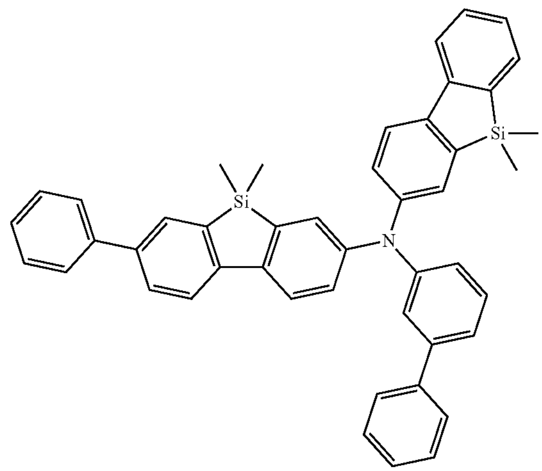
59
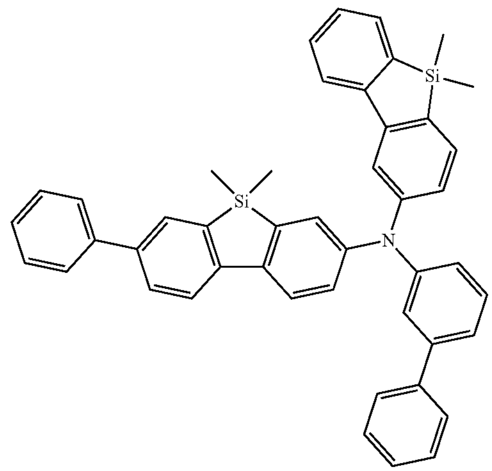
60
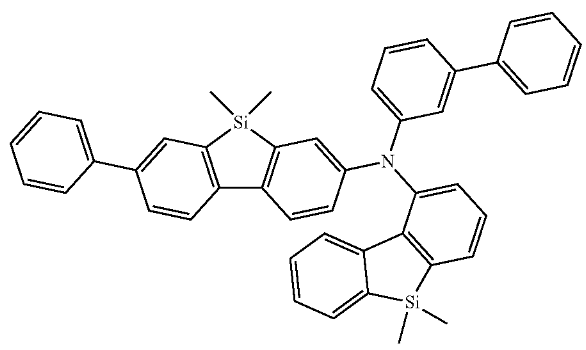
61
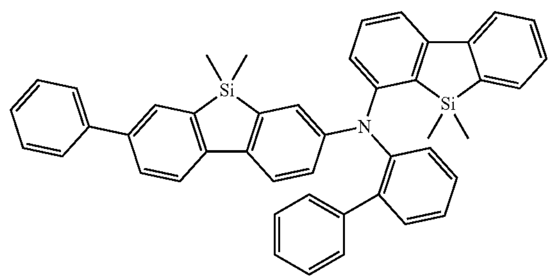

-continued
62
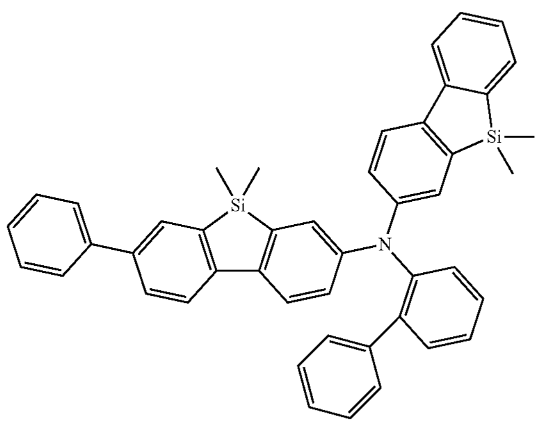
63
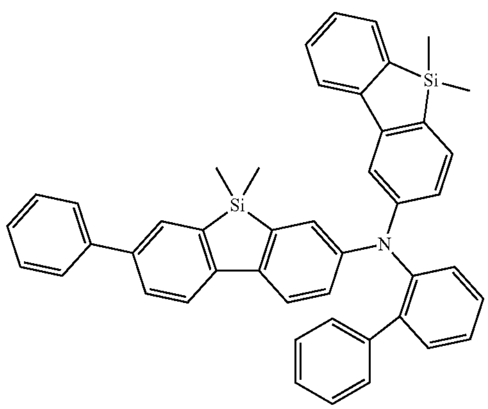
64
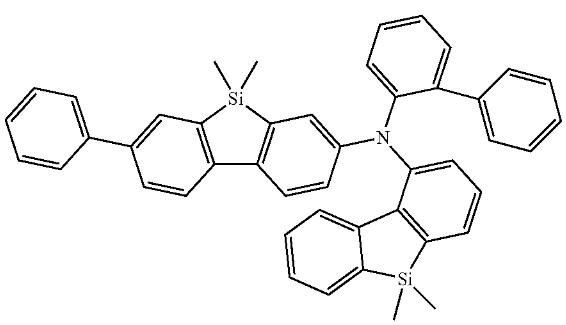
65
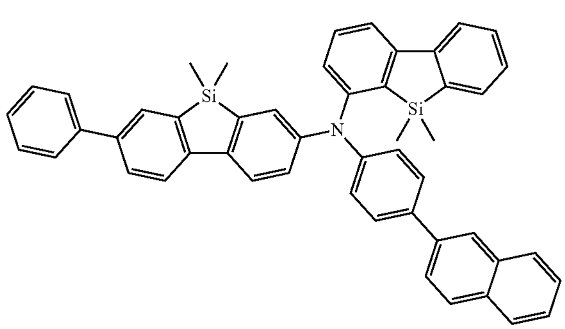
-continued
66
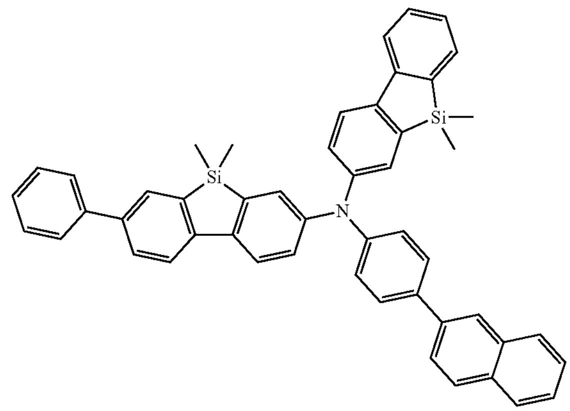
67
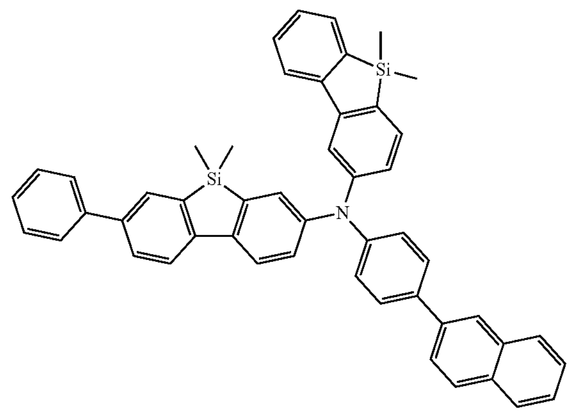
68
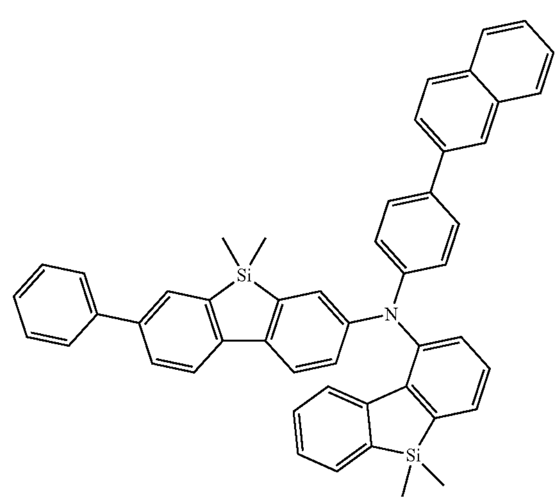

-continued
69
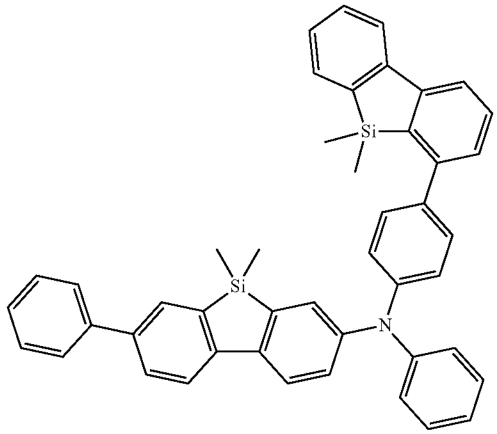
70
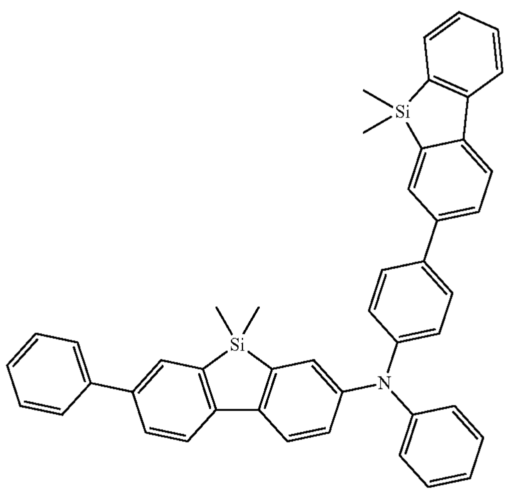
71
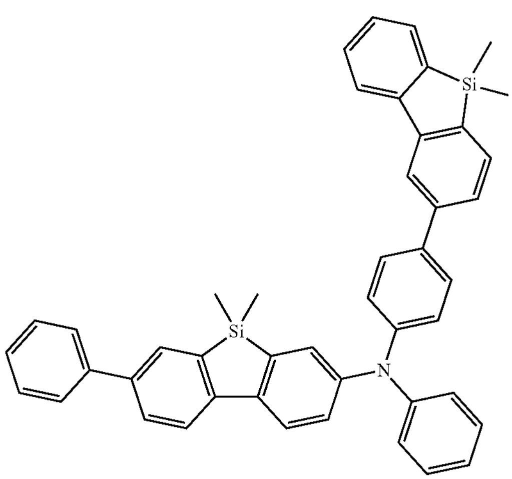
-continued
72
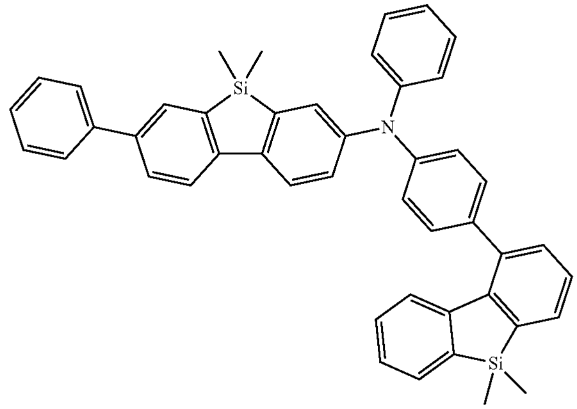
77
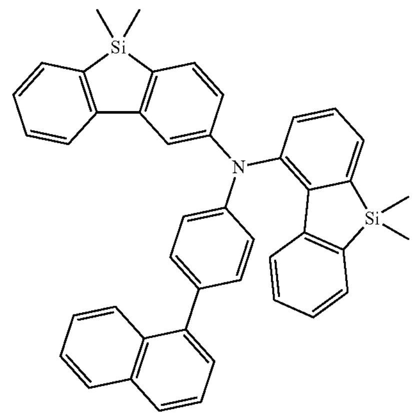
78
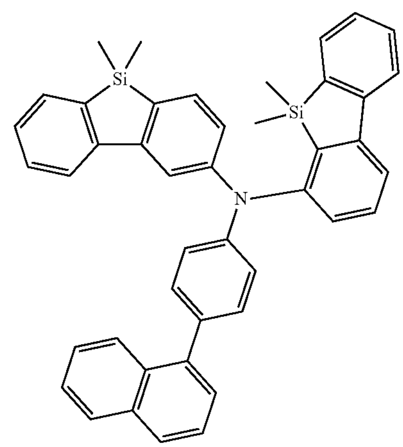
79
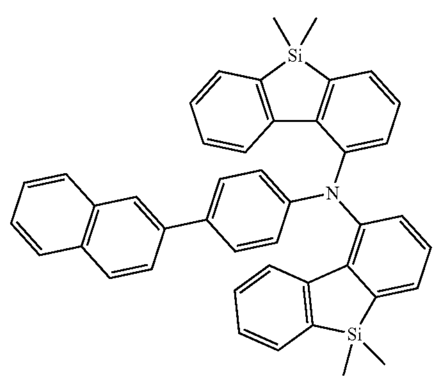

80
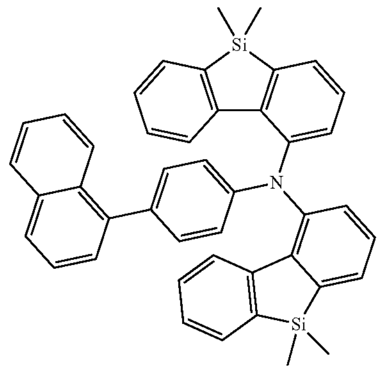
81
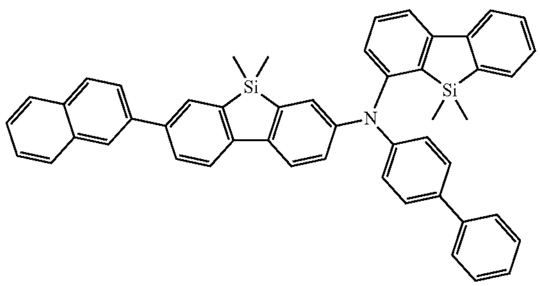
82
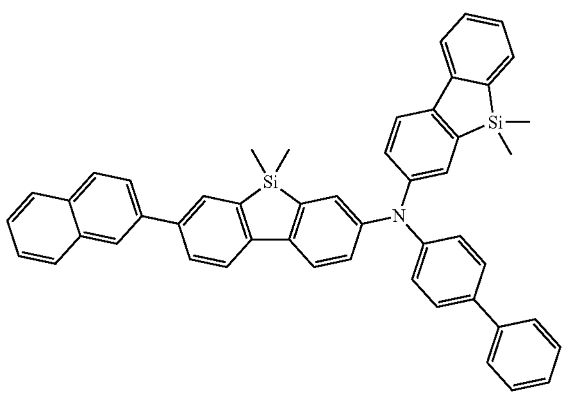
83
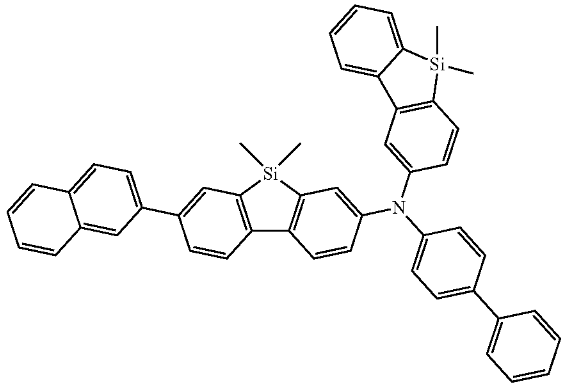
84
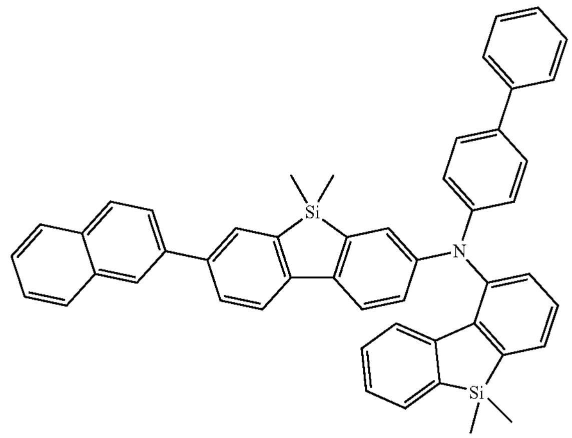
85
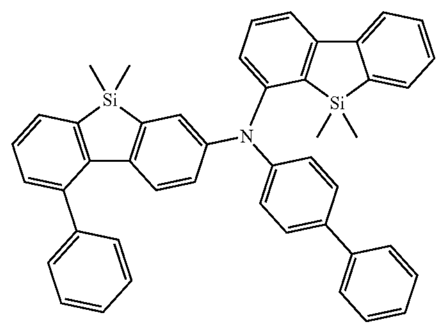
86
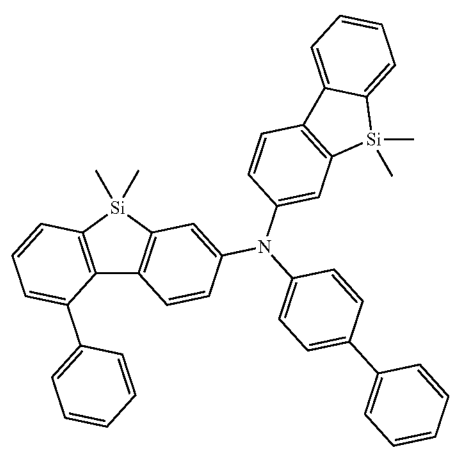

-continued
87
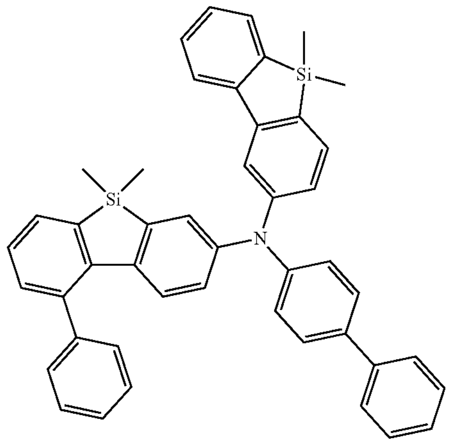
88
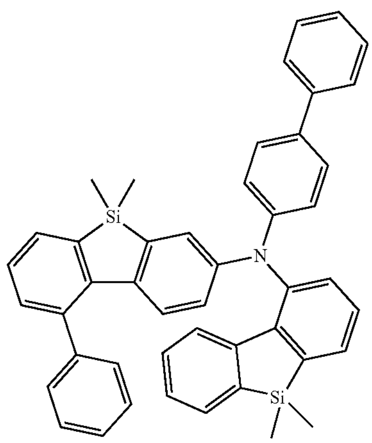
89
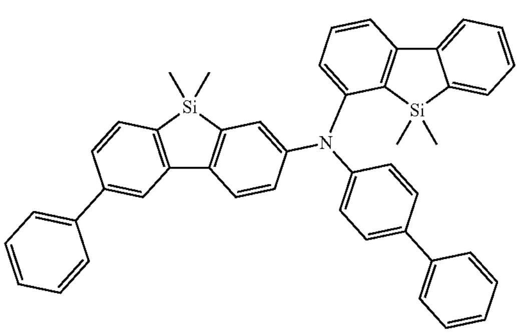
-continued
90
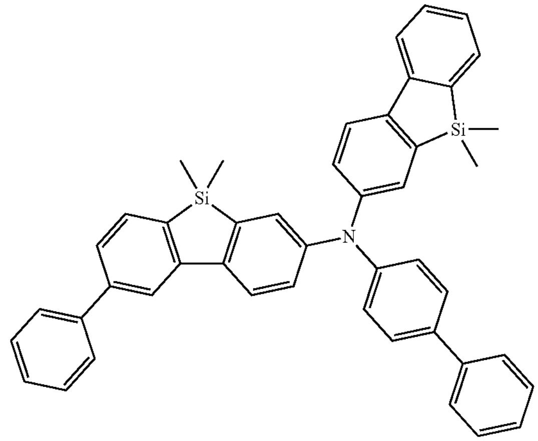
91
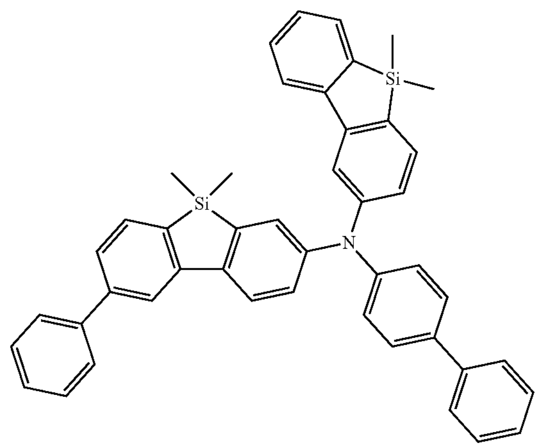
92
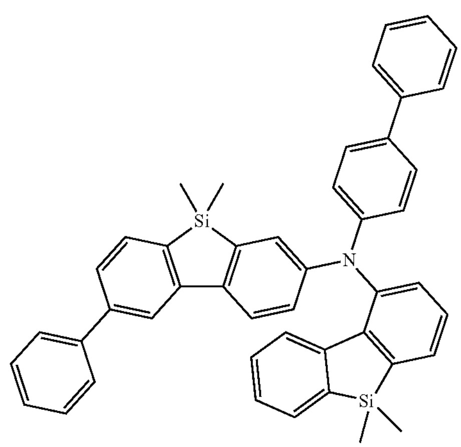

-continued
93
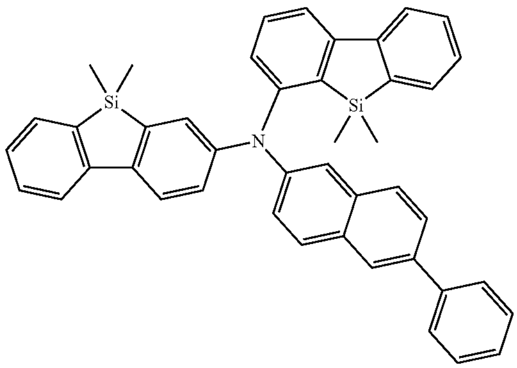
94
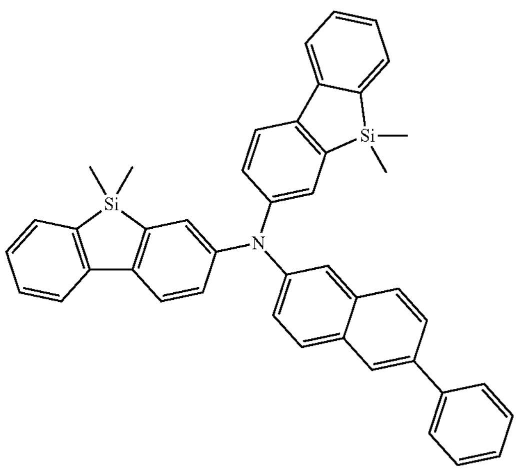
95
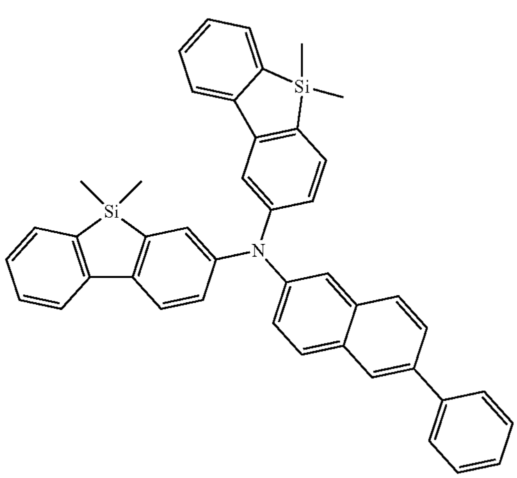
-continued
96
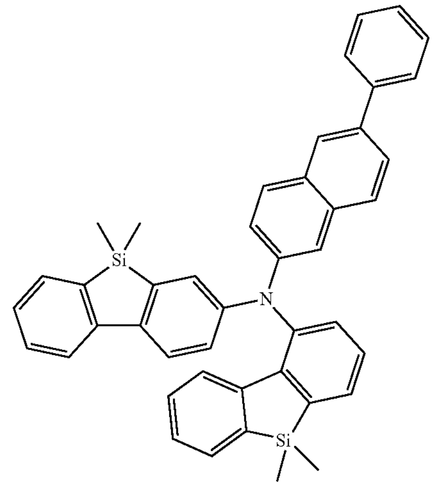
97
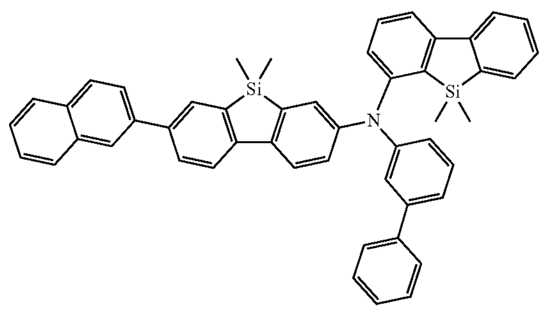
98
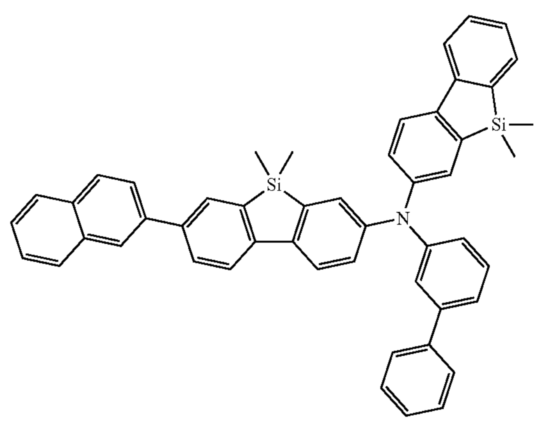

-continued
99
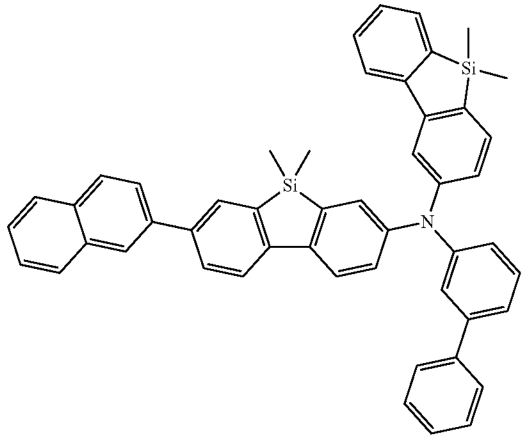
100
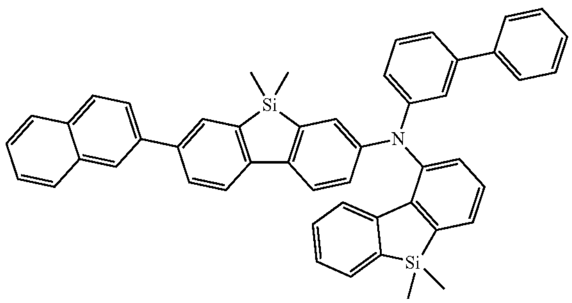
101
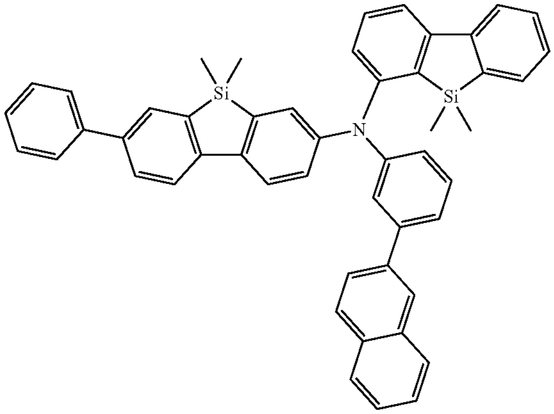
-continued
102
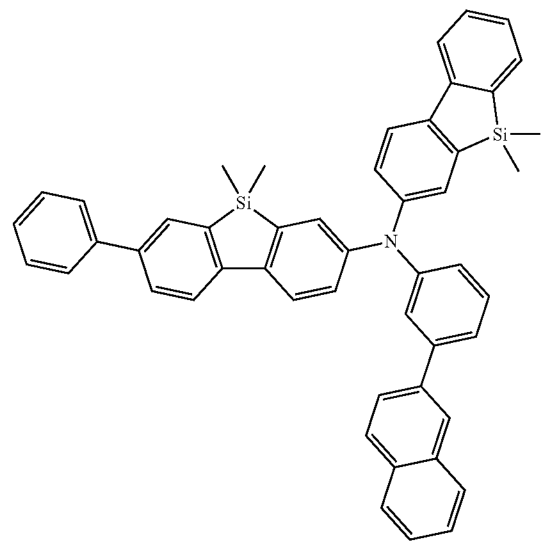
103
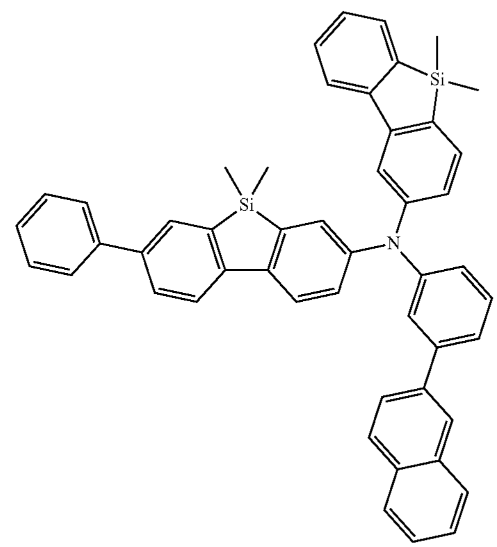
104
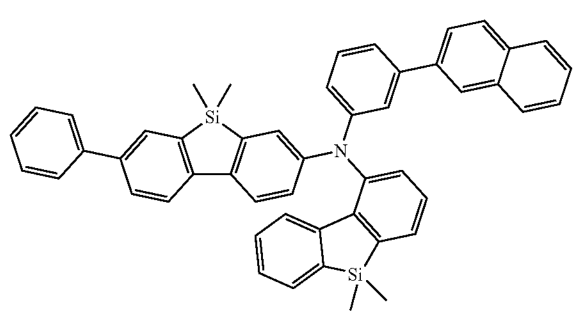

-continued
105
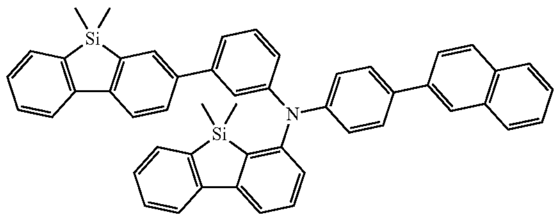
106
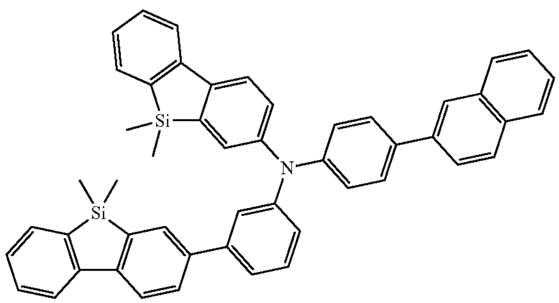
107
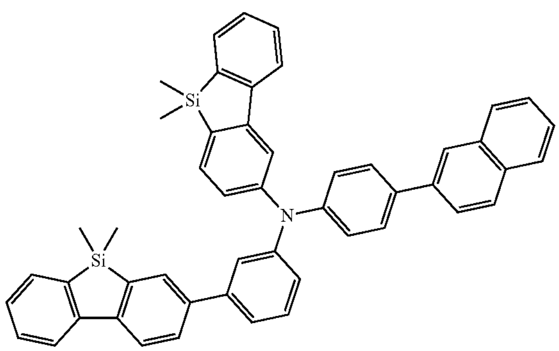
108
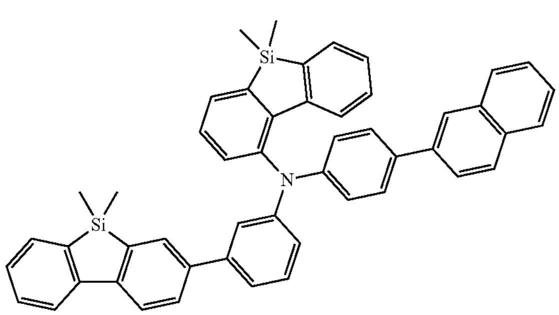
In an implementation, A of the second compound may be a ring of Group I, and the second compound may be, e.g., represented by one of Chemical Formula 2A to Chemical Formula 2J.
[Chemical Formula 2A]
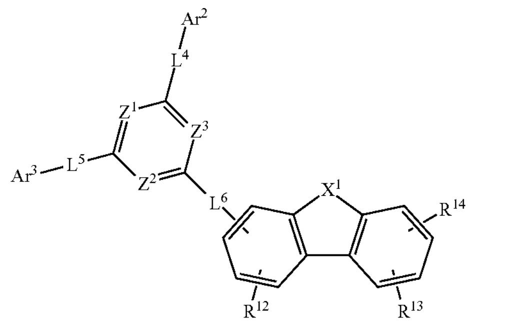
[Chemical Formula 2B]
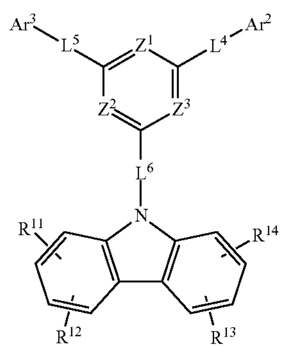
[Chemical Formula 2C]
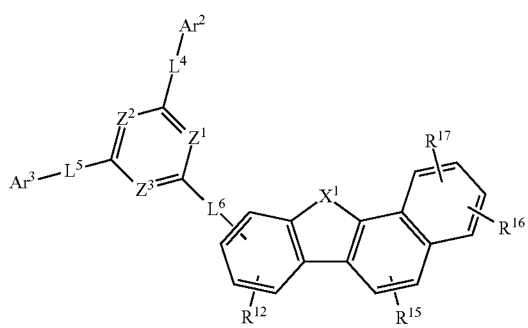
[Chemical Formula 2D]
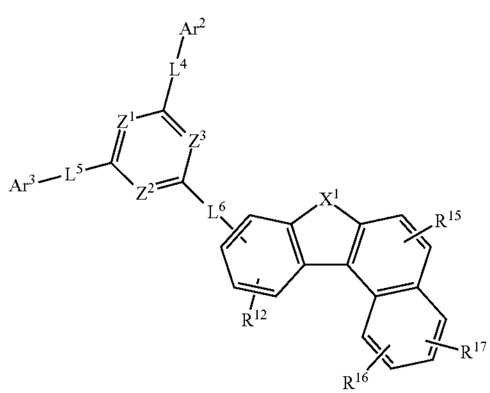

-continued

[Chemical Formula 2E]

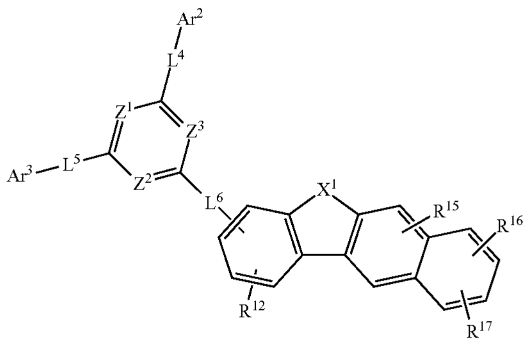

[Chemical Formula 2F]

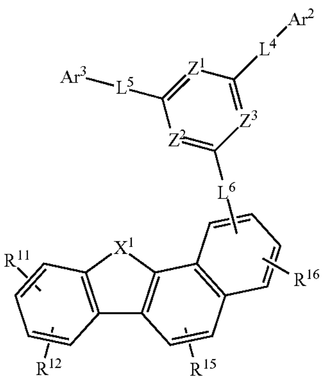

[Chemical Formula 2G]

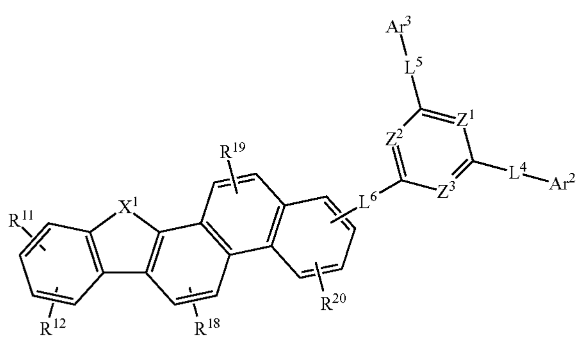

[Chemical Formula 2H]

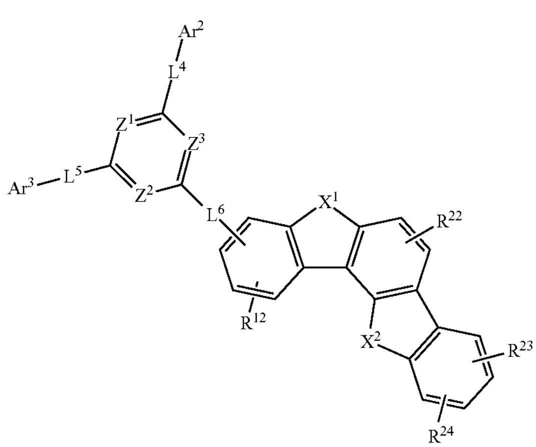

-continued

[Chemical Formula 2I]

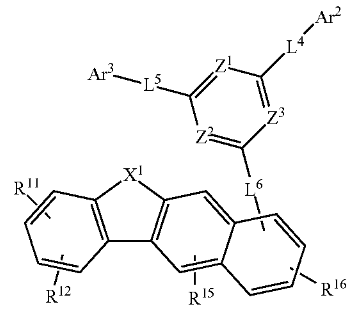

[Chemical Formula 2J]

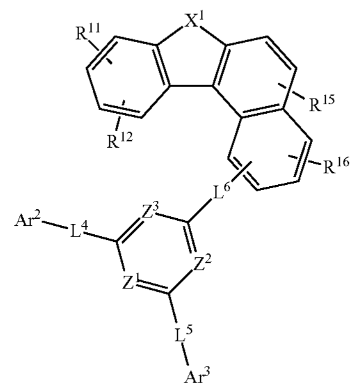

In Chemical Formula 2A to Chemical Formula 2J, $X^1$, $X^2$, $Z^1$ to $Z^3$, $R^{11}$ to $R^{24}$, $L^4$ to $L^6$, $Ar^2$, and $Ar^3$ may be defined the same as those described above.

In an implementation, the second compound may be represented by Chemical Formula 2A, Chemical Formula 2C, or Chemical Formula 2F.

In an implementation, the second compound may be represented by Chemical Formula 2A-3, Chemical Formula 2C-1, Chemical Formula 2F-1, or Chemical Formula 2F-3.

[Chemical Formula 2A-3]

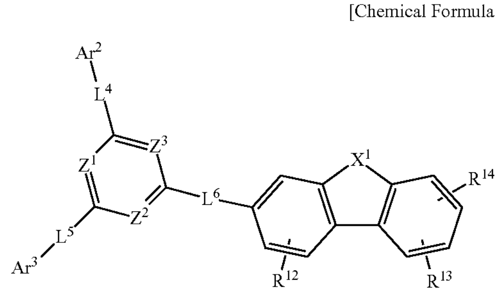

-continued

[Chemical Formula 2C-1]

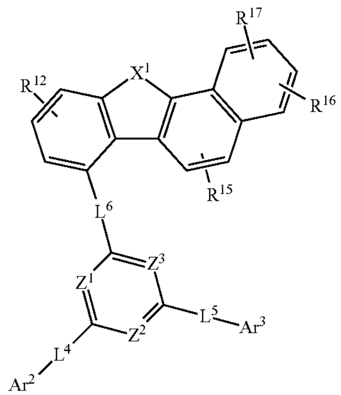

[Chemical Formula 2F-1]

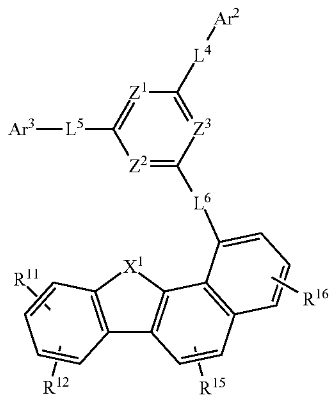

[Chemical Formula 2F-3]

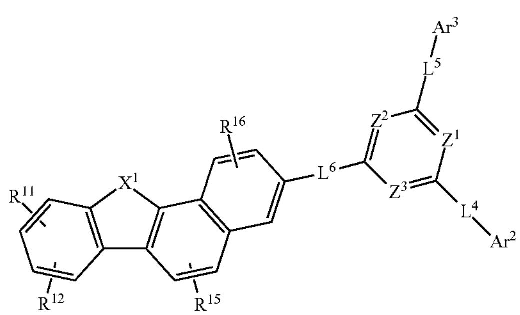

In Chemical Formula 2A-3, Chemical Formula 2C-1, Chemical Formula 2F-1, and Chemical Formula 2F-3, $X^1$, $Z^1$ to $Z^3$, $R^{11}$ to $R^{17}$, $L^4$ to $L^6$, $Ar^2$, and $Ar^3$ may be defined the same as those described above.

In an implementation, $Ar^2$ and $Ar^3$ may each independently be, e.g., a substituted or unsubstituted phenyl group, a substituted or unsubstituted biphenyl group, a substituted or unsubstituted terphenyl group, a substituted or unsubstituted naphthyl group, a substituted or unsubstituted phenanthrenyl group, a substituted or unsubstituted triphenylene group, a substituted or unsubstituted carbazolyl group, a substituted or unsubstituted dibenzofuranyl group, a substituted or unsubstituted dibenzothiophenyl group, or a substituted or unsubstituted dibenzosilolyl group.

In an implementation, $Ar^2$ and $Ar^3$ may each independently be, e.g., a substituted or unsubstituted phenyl group, a substituted or unsubstituted biphenyl group, or a substituted or unsubstituted naphthyl group.

In an implementation, $L^4$ to $L^6$ may each independently be a single bond or a substituted or unsubstituted phenylene group.

In an implementation, $R^{11}$ to $R^{16}$ may each independently be, e.g., hydrogen, a cyano group, a substituted or unsubstituted C1 to C10 alkyl group, a substituted or unsubstituted C6 to C12 aryl group, or a substituted or unsubstituted C2 to C18 heterocyclic group.

In an implementation, $R^{11}$ to $R^{16}$ may each independently be, e.g., hydrogen, deuterium, a substituted or unsubstituted phenyl group, or a substituted or unsubstituted naphthyl group.

In an implementation, $X^1$ may be, e.g., O, S, $CR^bR^c$, or $SiR^dR^e$, and $R^b$, $R^c$, $R^d$, and $R^e$ may each independently be, e.g., a substituted or unsubstituted C1 to C10 alkyl group or a substituted or unsubstituted C6 to C20 aryl group.

In an implementation, $R^b$, $R^c$, $R^d$, and $R^e$ may each independently be, e.g., a substituted or unsubstituted methyl group, a substituted or unsubstituted phenyl group, or a substituted or unsubstituted biphenyl group.

In an implementation, the second compound may be a compound of Group 2.

[Group 2]

A-1

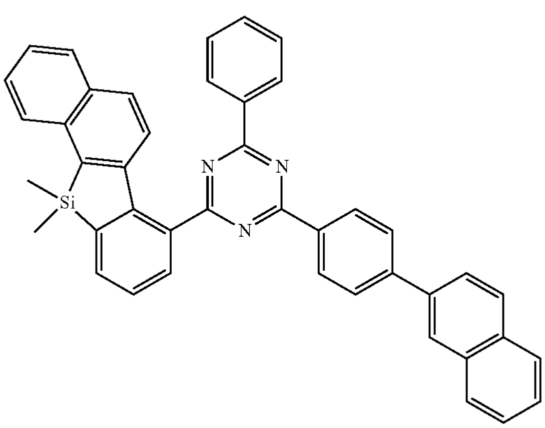

A-2

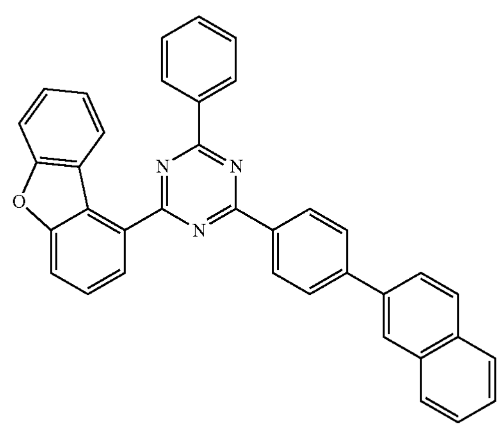

-continued
A-3
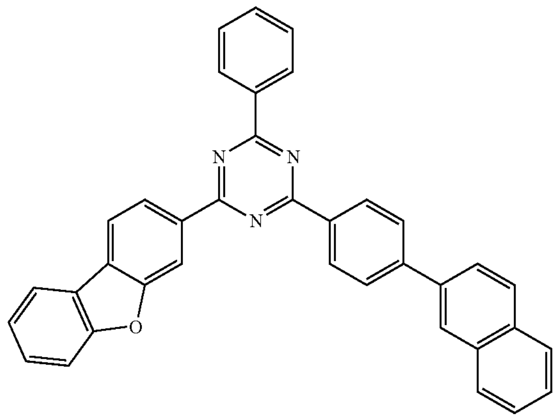
A-4
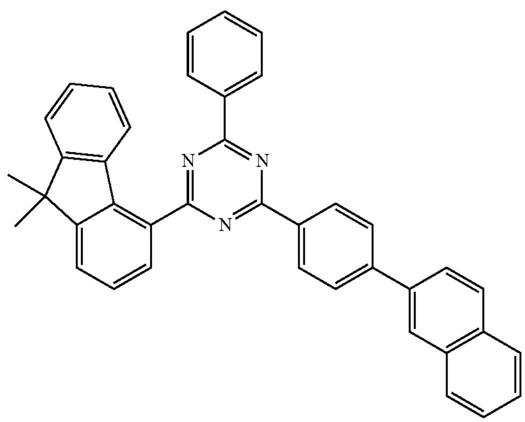
A-5
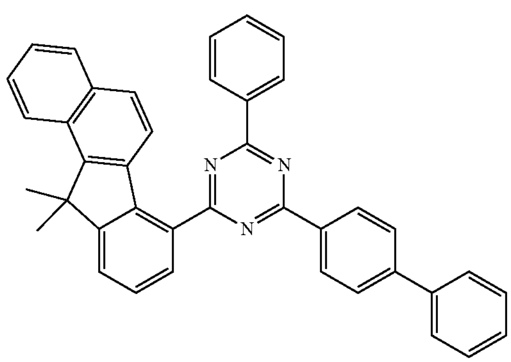
A-6
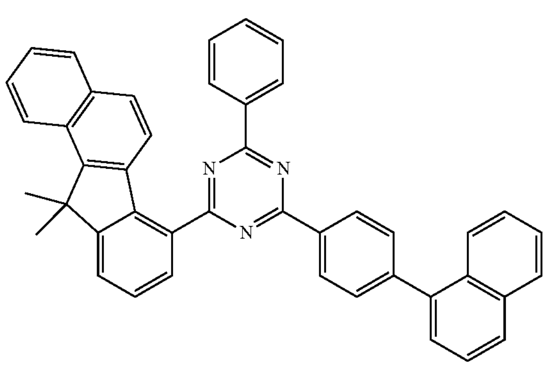
-continued
A-7
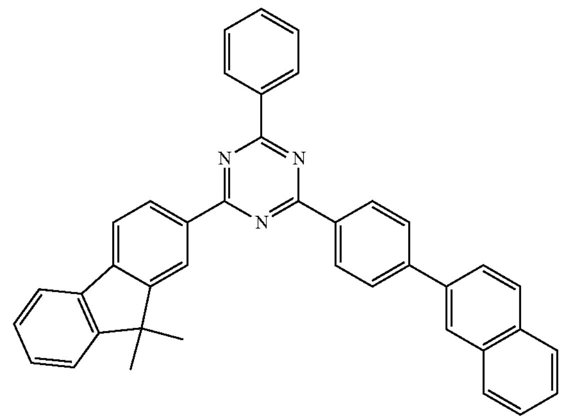
A-8
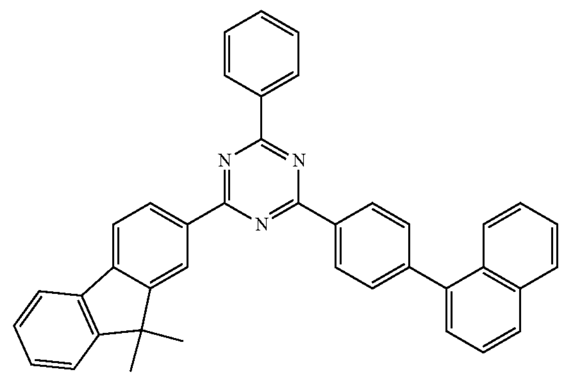
A-9
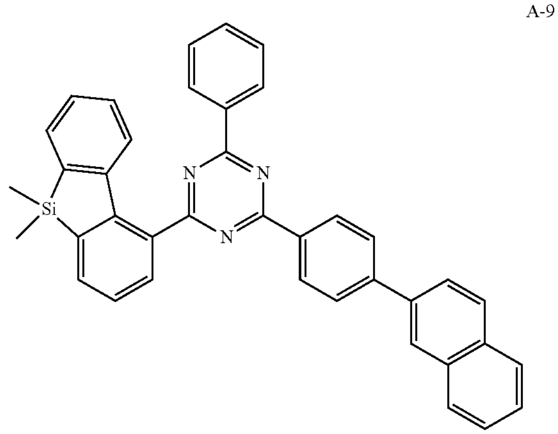
A-10
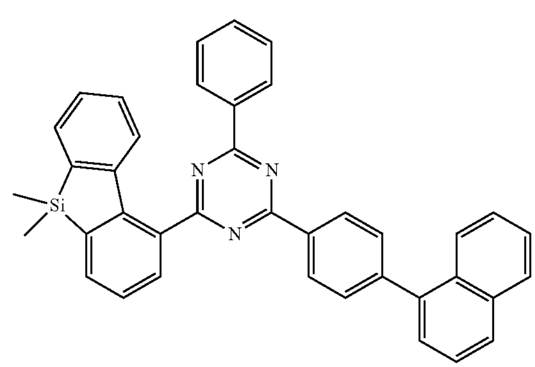

-continued
A-11
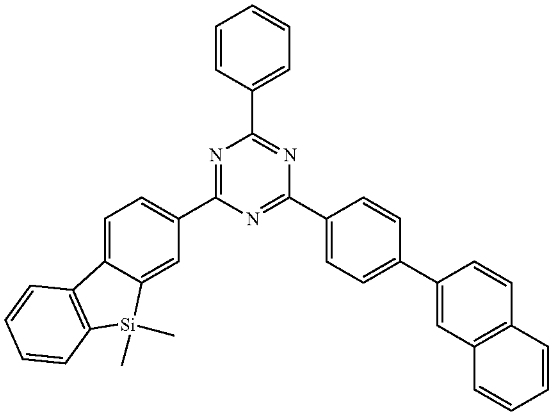
A-12
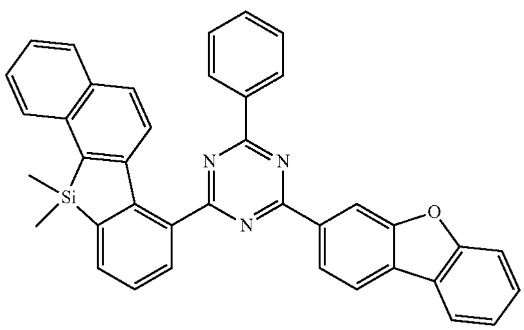
A-13
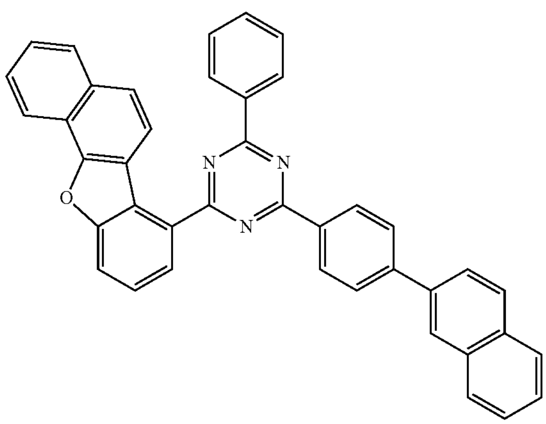
-continued
A-14
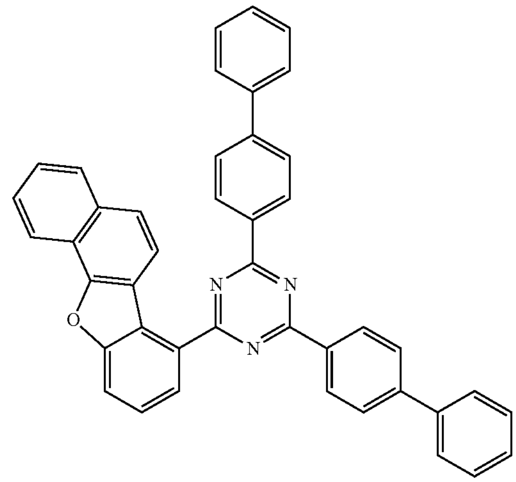
A-15
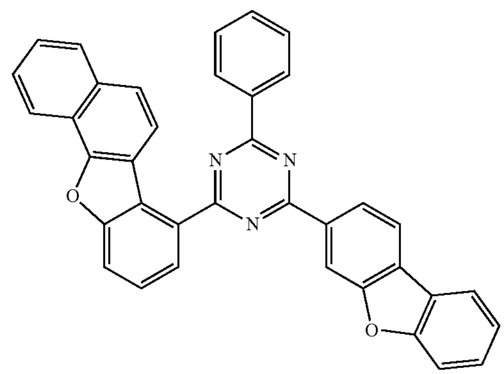
A-16
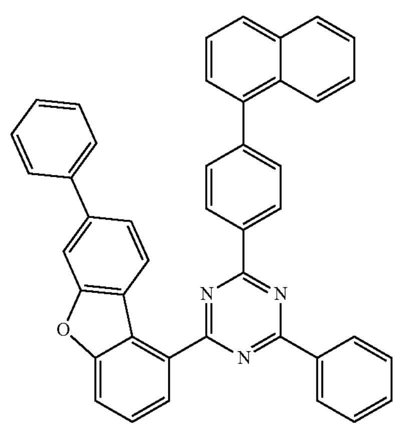

-continued
A-17
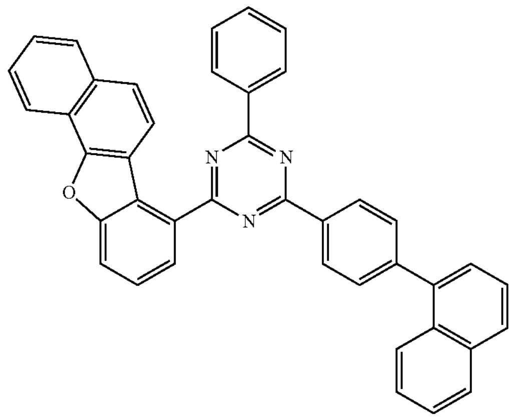
A-18
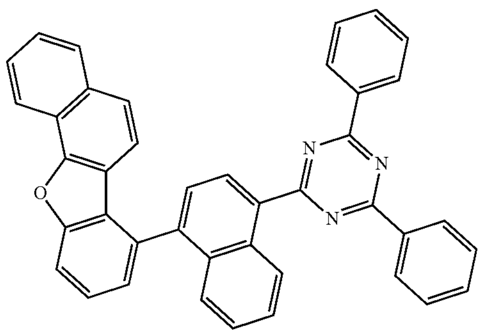
A-19
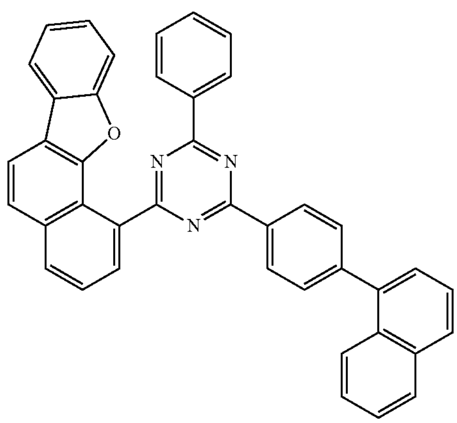
A-20
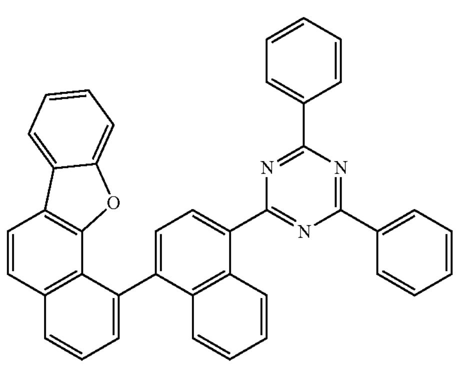
-continued
A-21
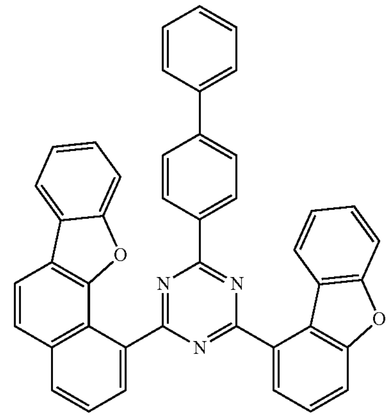
A-22
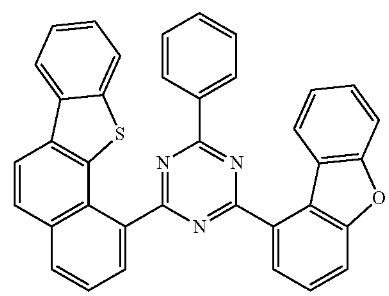
A-23
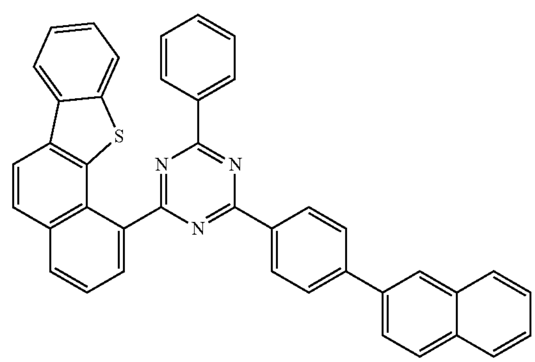
A-24
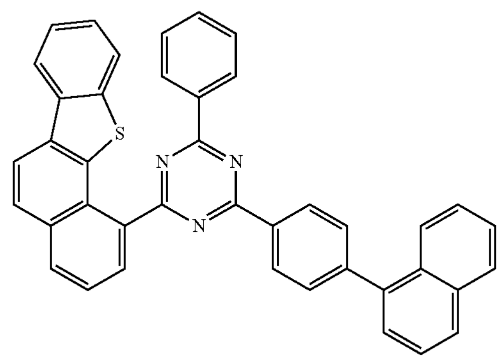

-continued
A-25
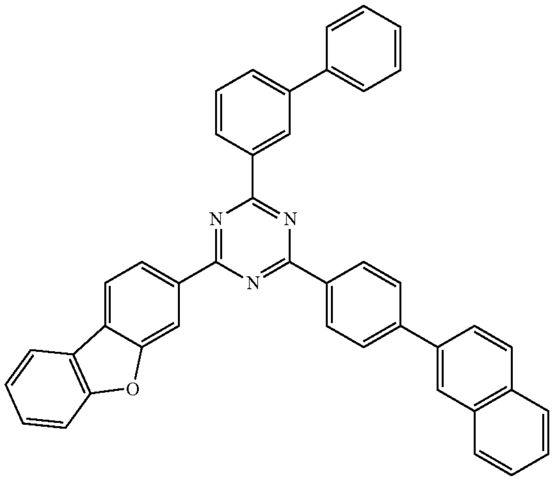
A-26
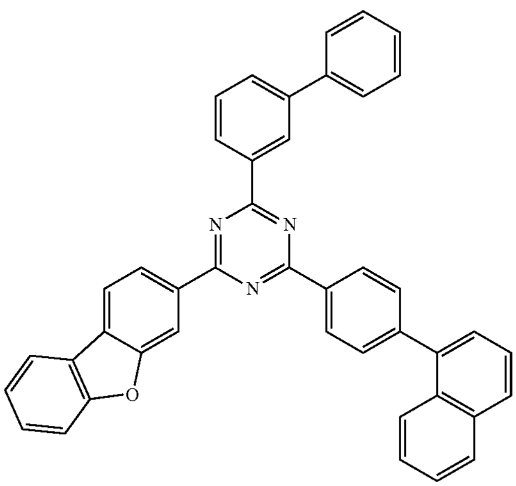
A-27
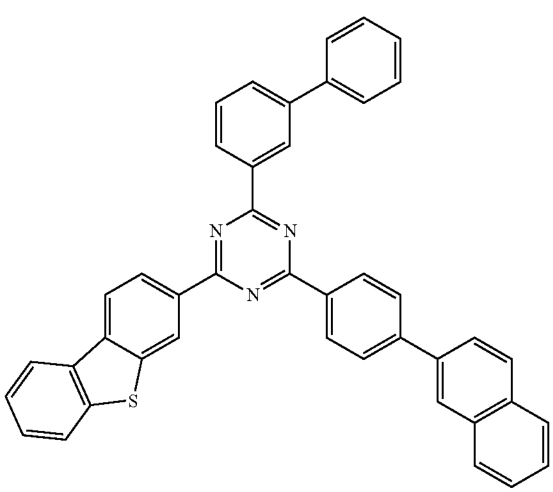
-continued
A-28
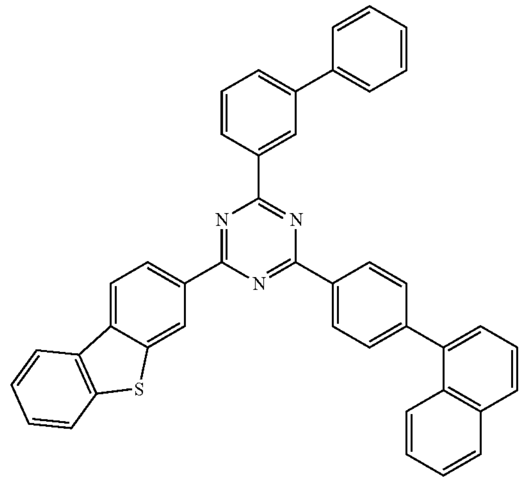
A-29
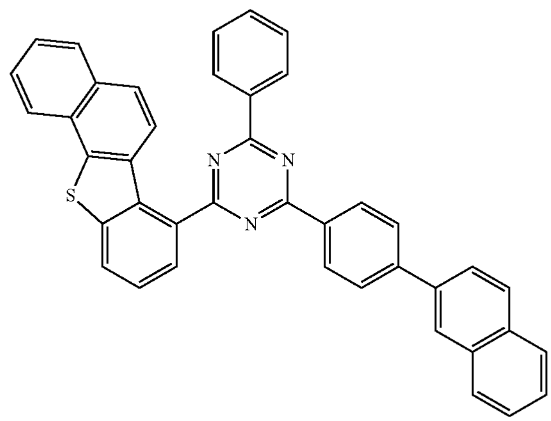
A-30
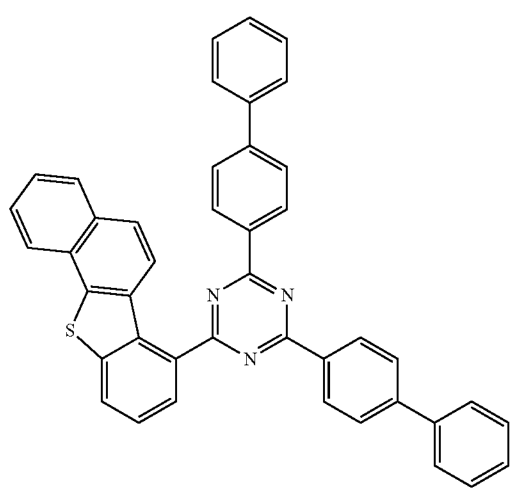

-continued
A-31
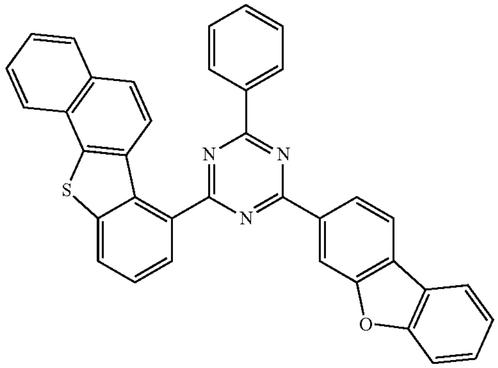
A-32
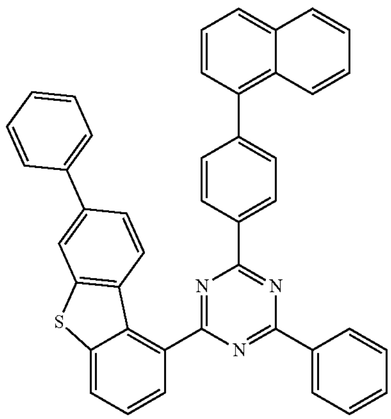
A-33
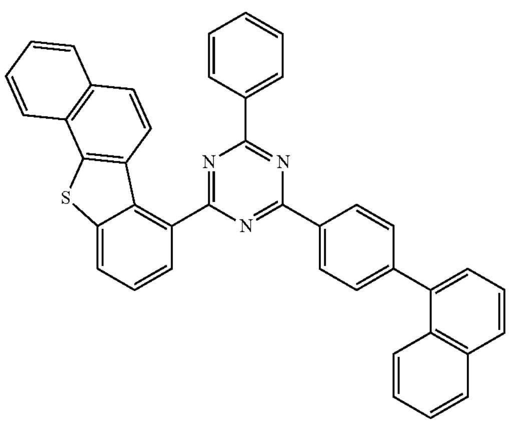
A-34
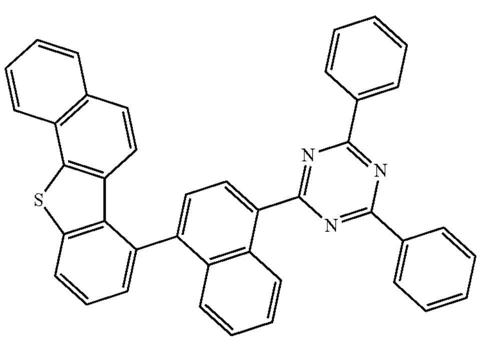
-continued
A-35
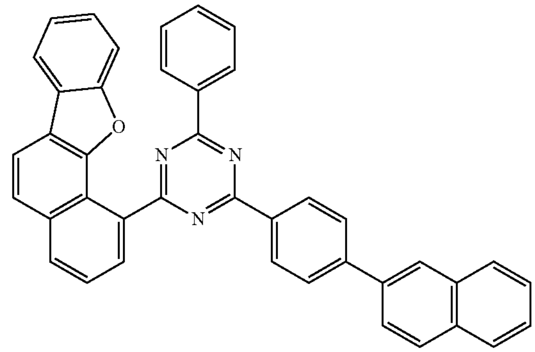
A-36
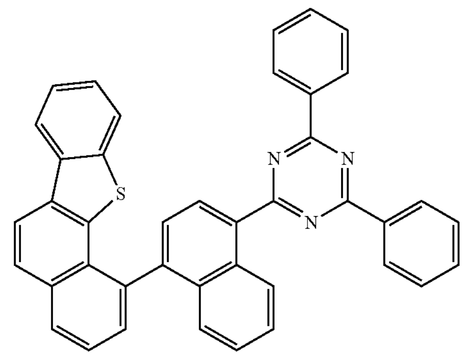
A-37
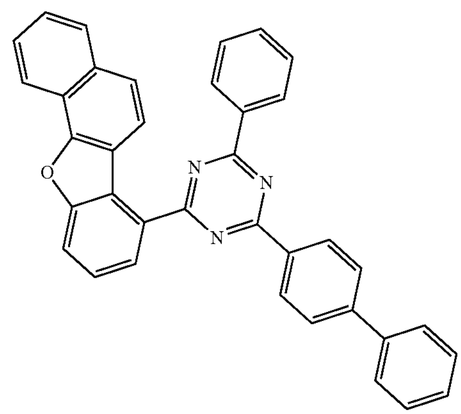
A-38
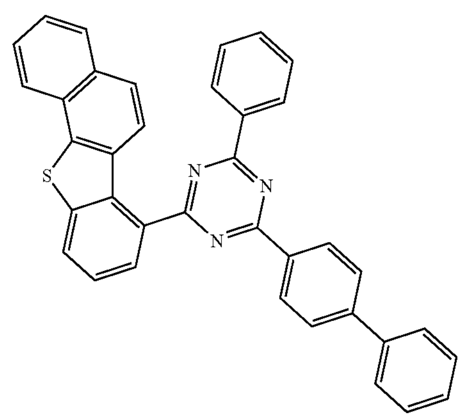

-continued
A-39
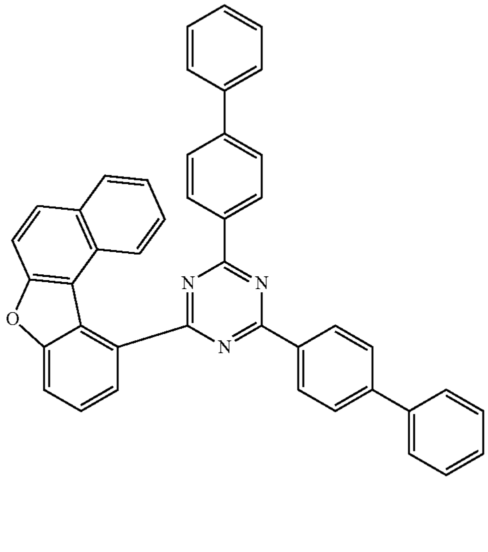
A-40
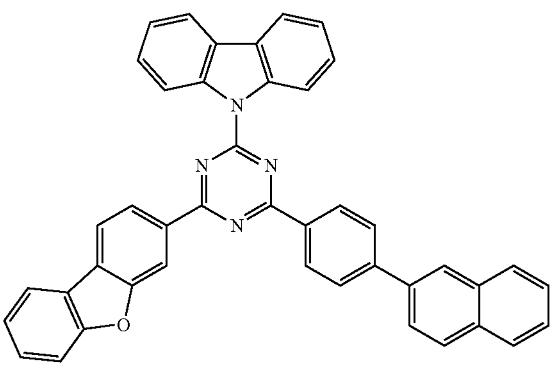
A-41
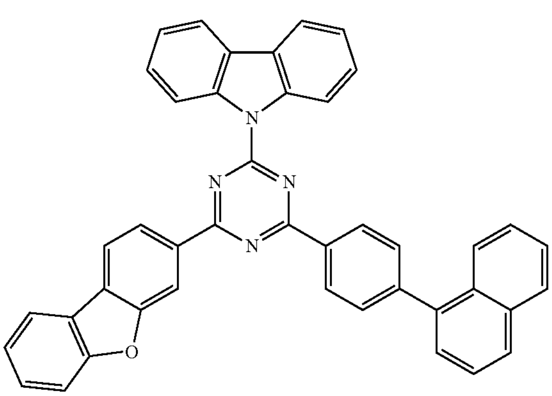
-continued
A-42
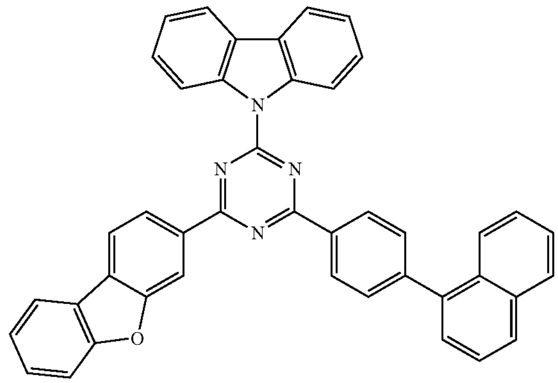
A-43
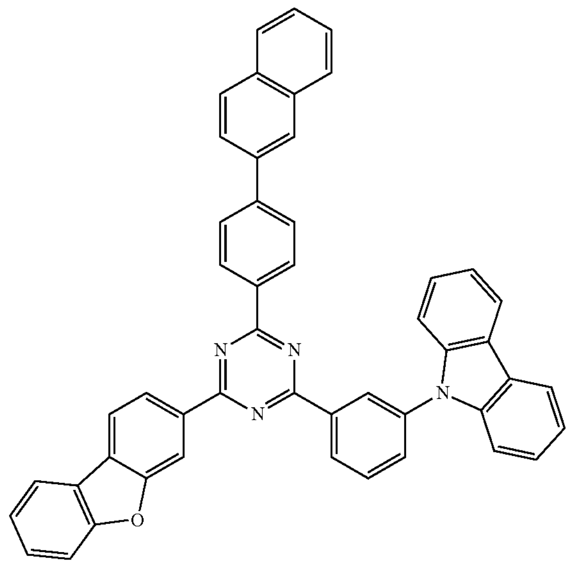
A-44
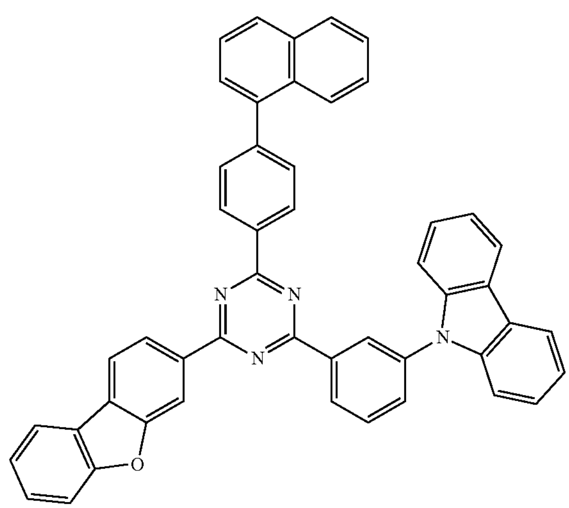

-continued
A-45
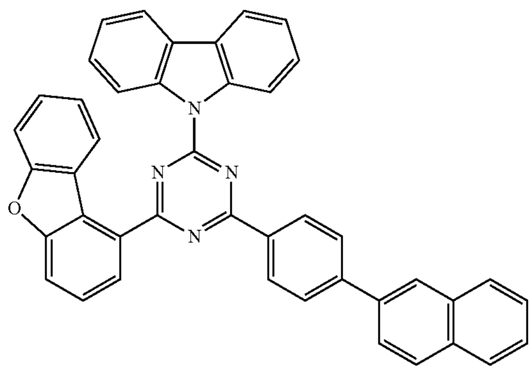
A-46
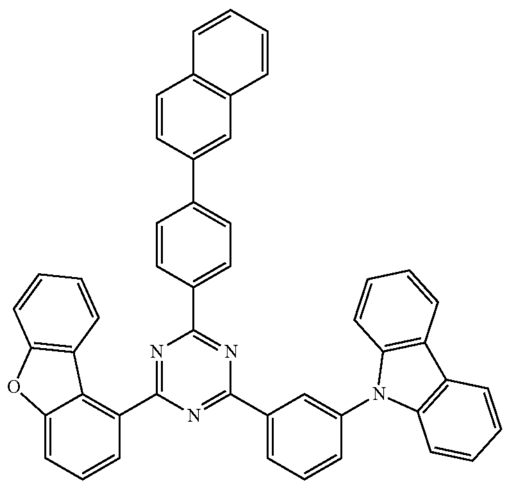
A-47
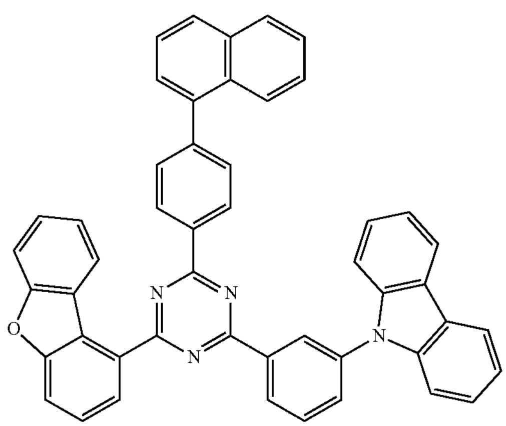
-continued
A-48
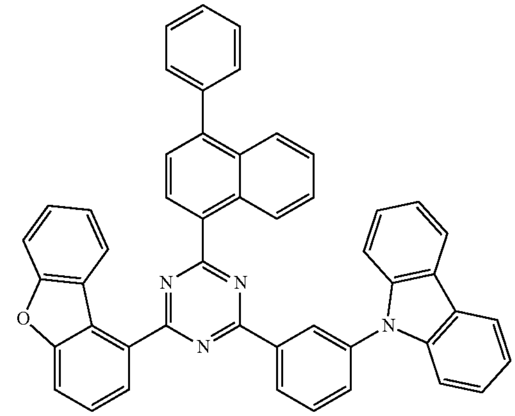
A-49
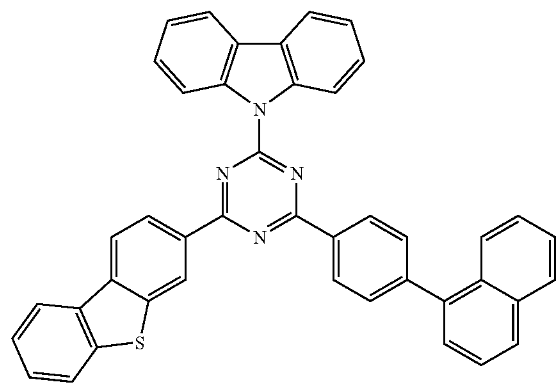
A-50
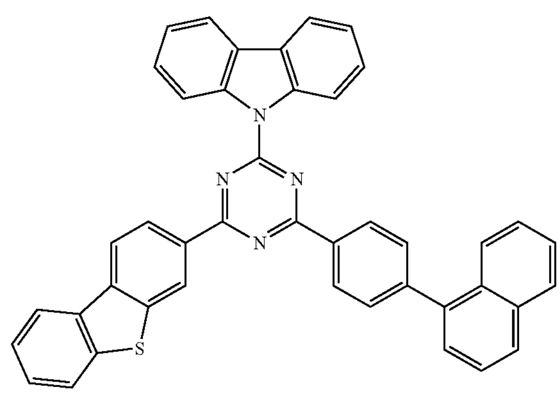

-continued
A-51
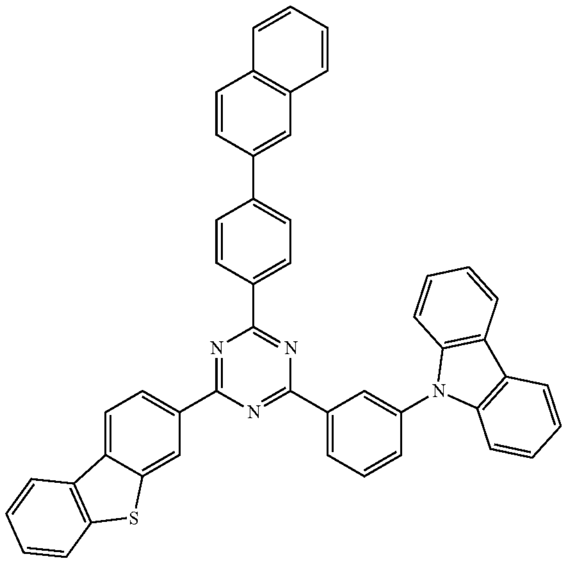
A-52
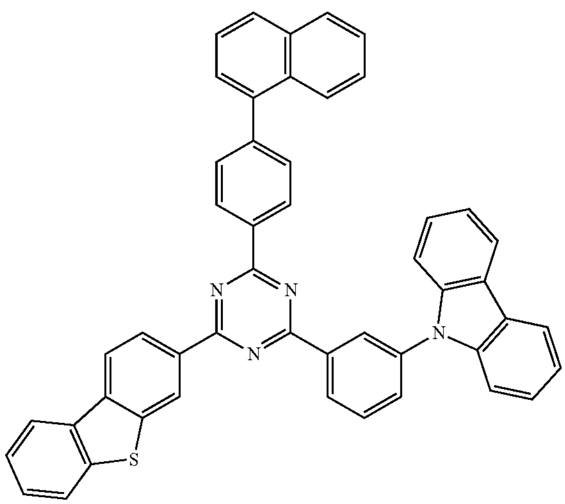
A-53
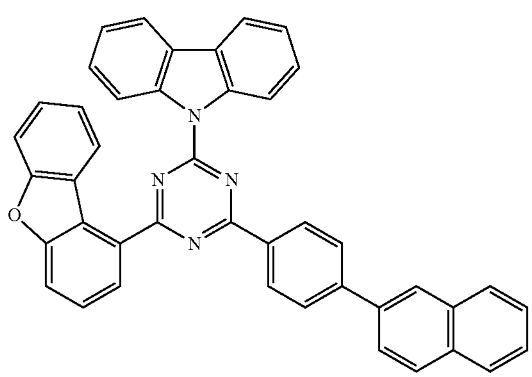
-continued
A-54
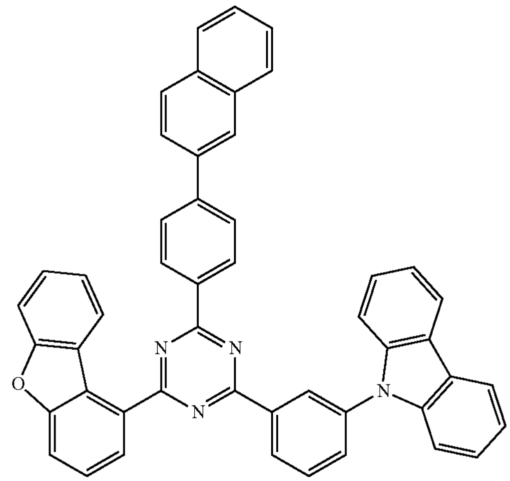
A-55
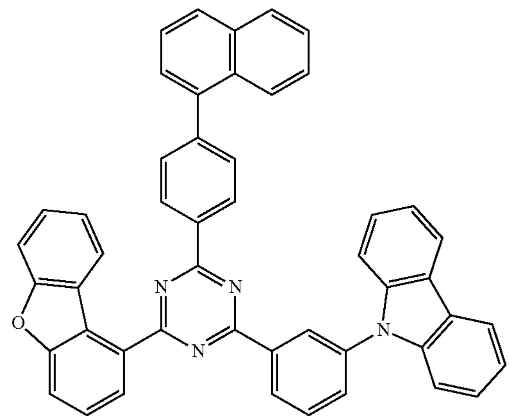
A-56
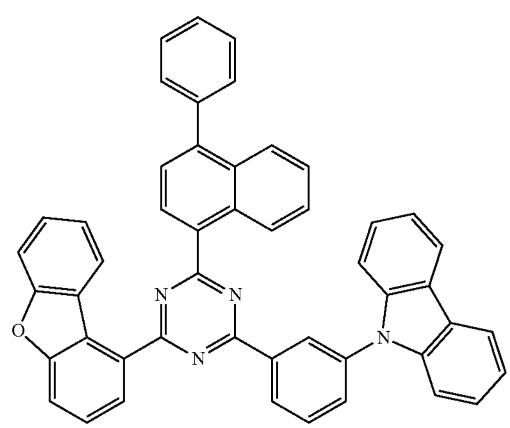

-continued
A-57
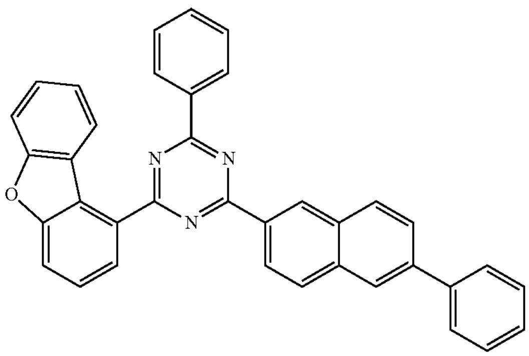
A-58
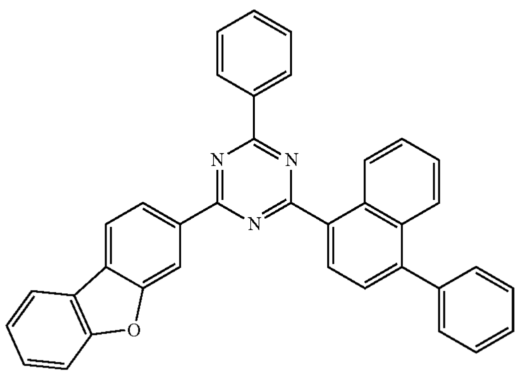
A-59
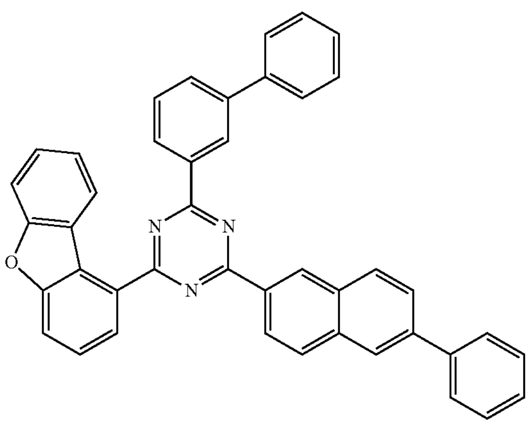
A-60
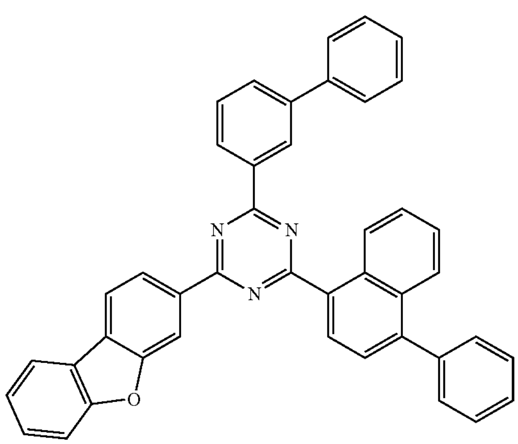
-continued
A-61
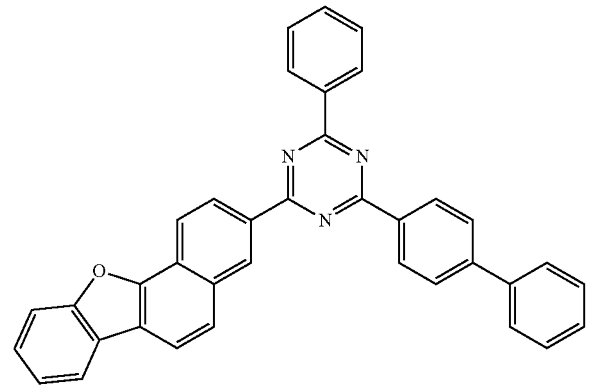
A-62
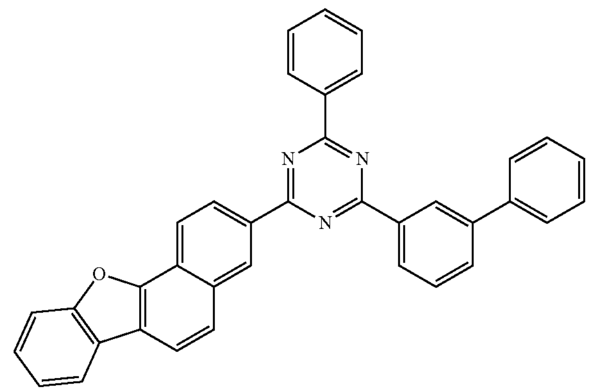
A-63
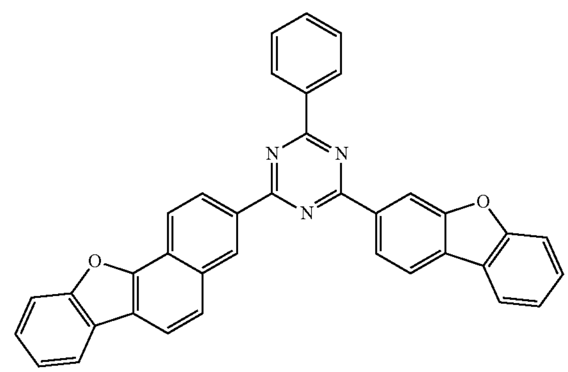
A-64
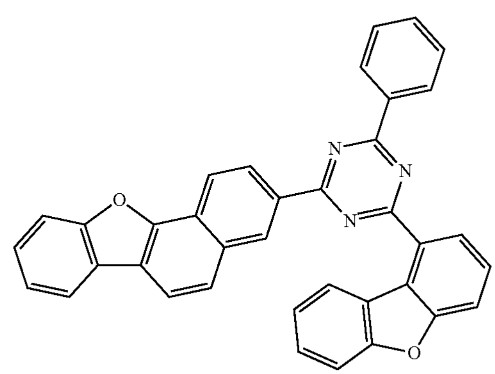

-continued
A-65
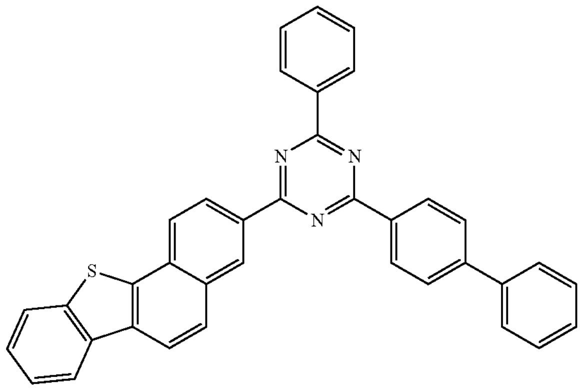
A-66
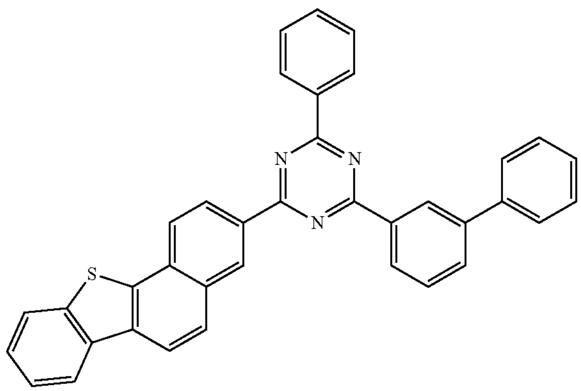
A-67
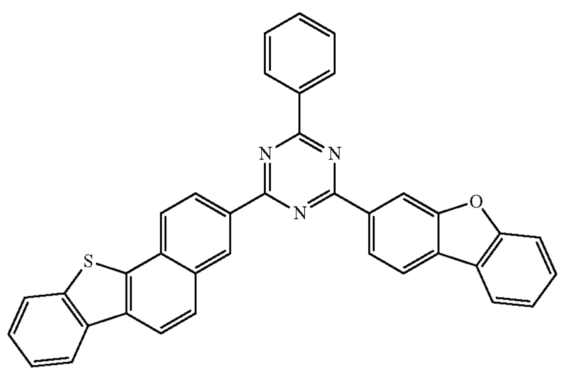
A-68
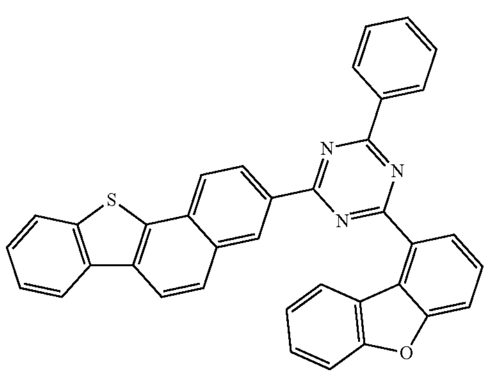
-continued
A-69
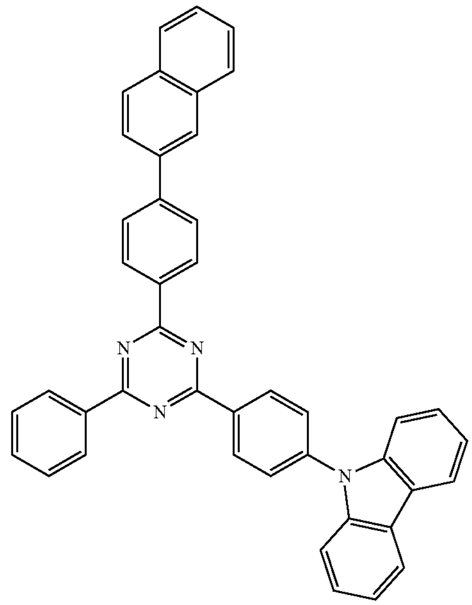
A-70
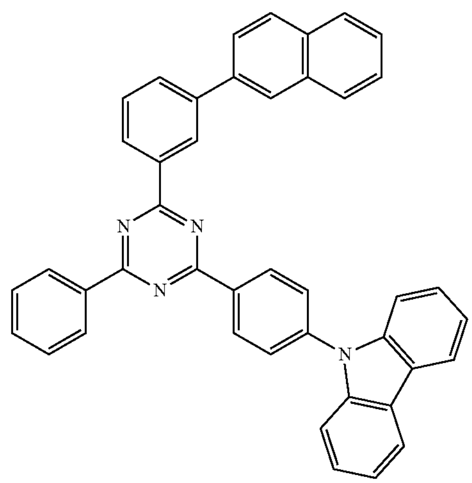
A-71
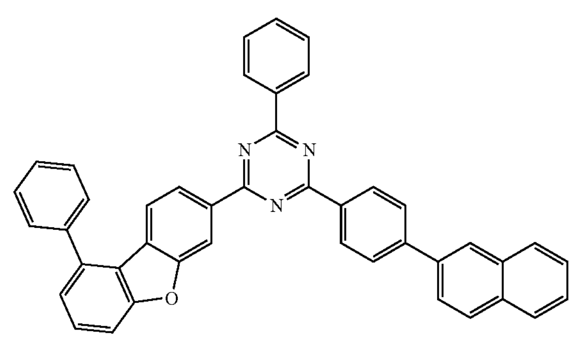

-continued
A-72
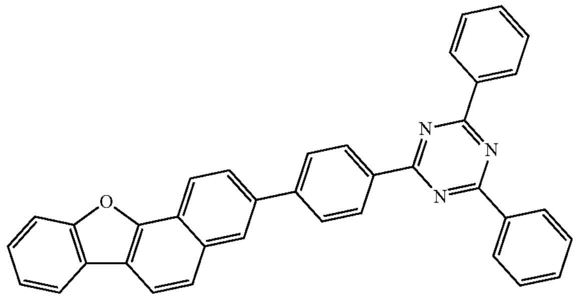
A-73
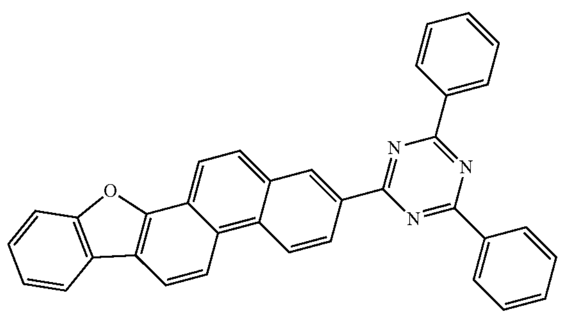
A-74
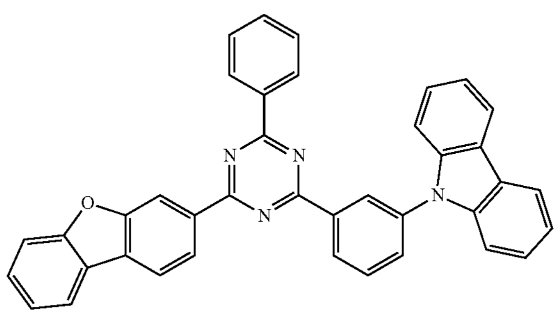
A-75
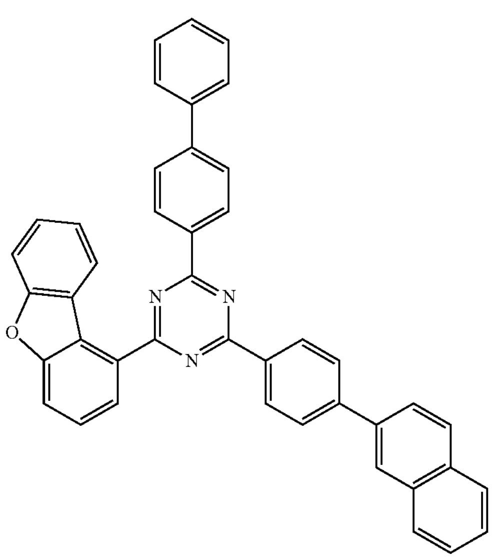
-continued
A-76
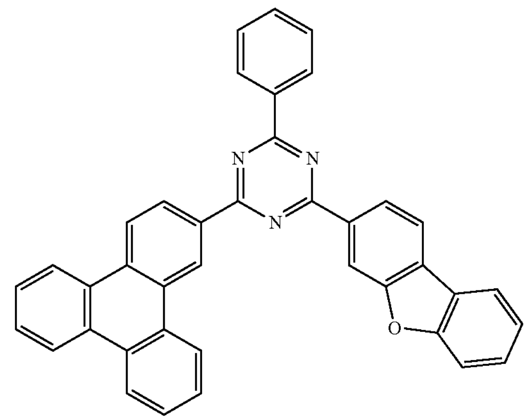
A-77
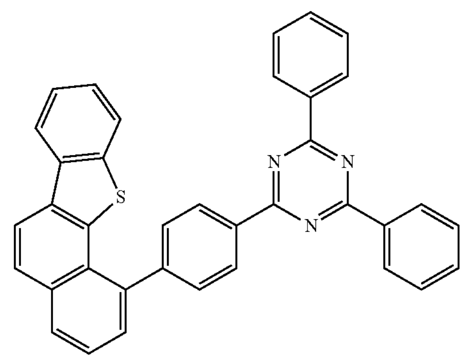
A-78
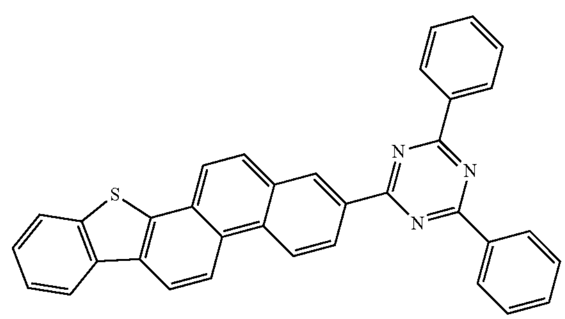
A-79
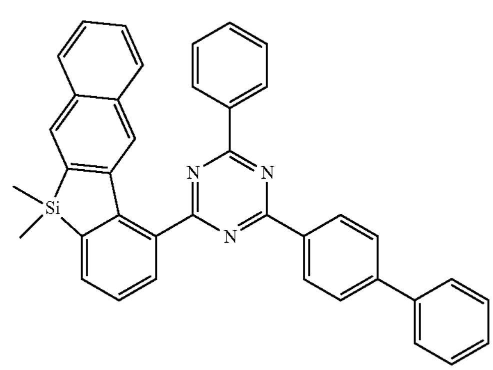

-continued
A-80
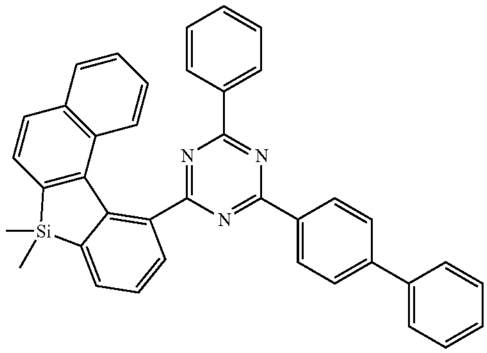
A-81
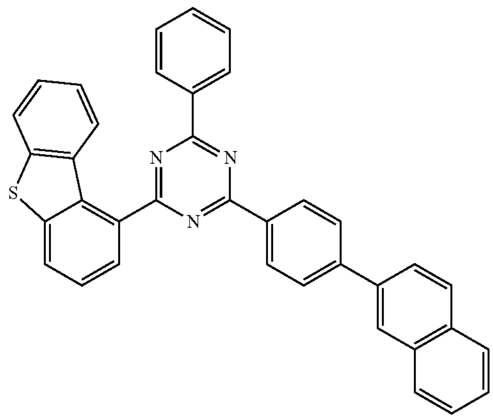
A-82
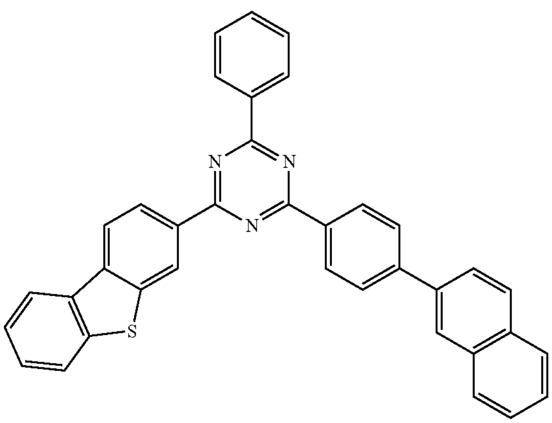
A-83
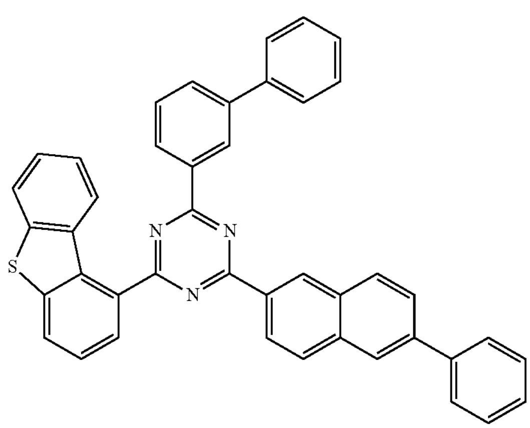
-continued
A-84
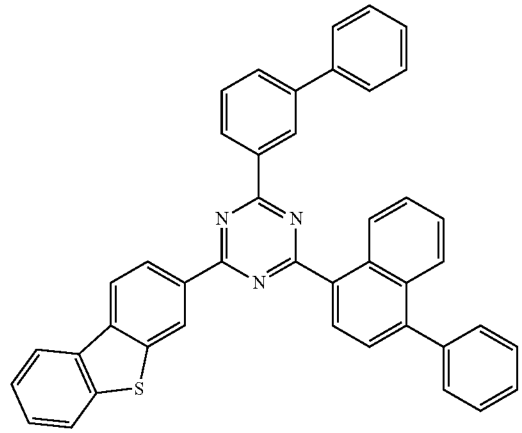
A-85
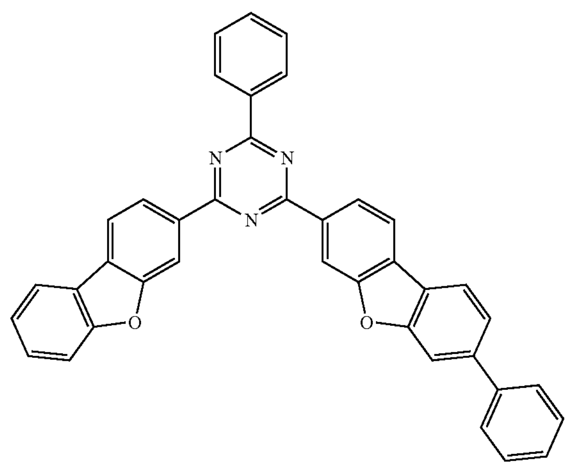
A-86
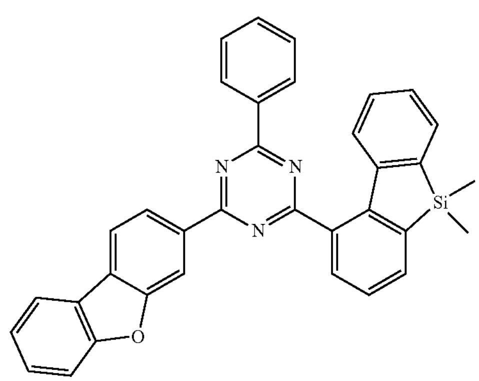

-continued
A-87
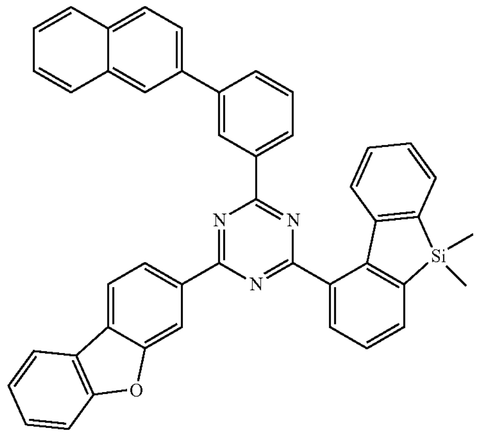
A-88
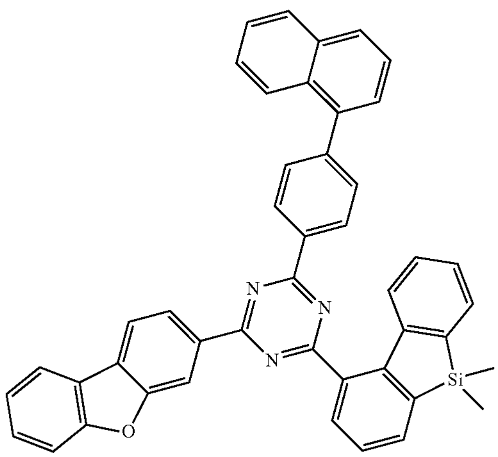
A-89
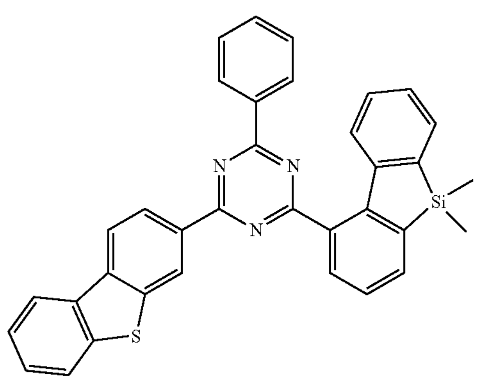
-continued
A-90
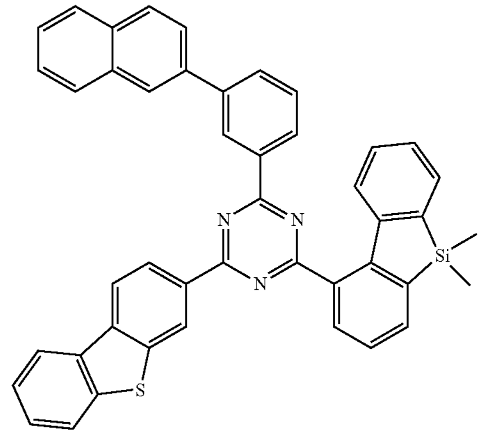
A-91
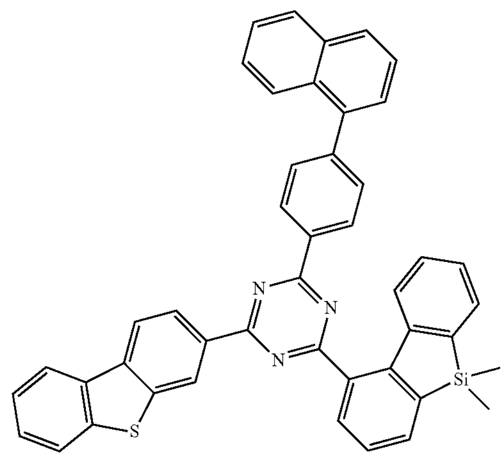
A-92
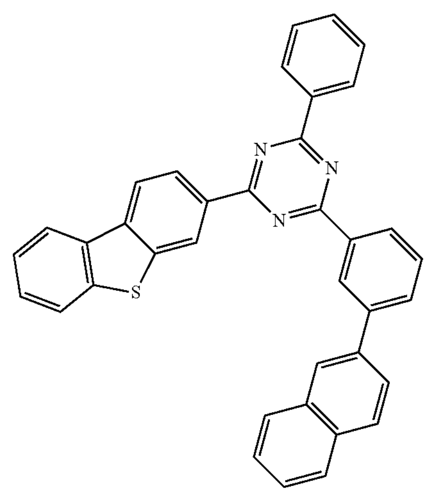

-continued
A-93
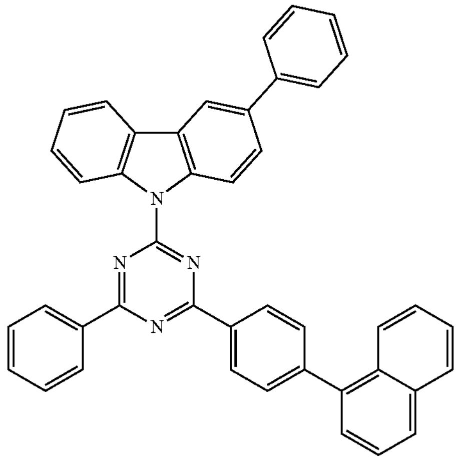
A-94
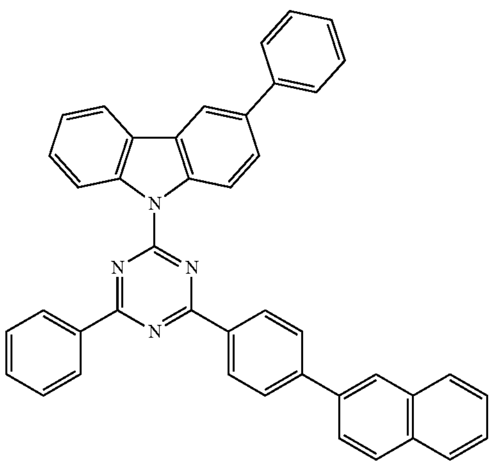
A-95
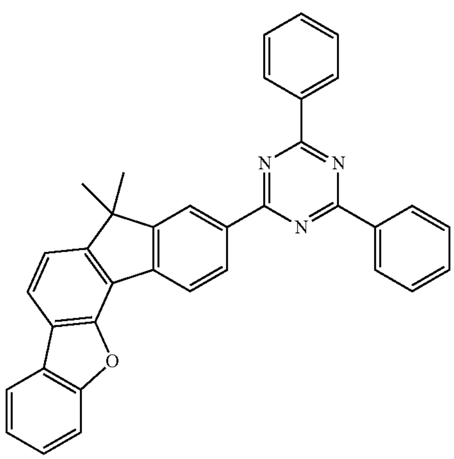
-continued
A-96
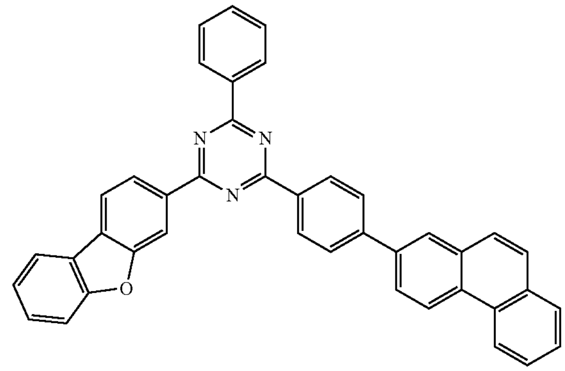
A-97
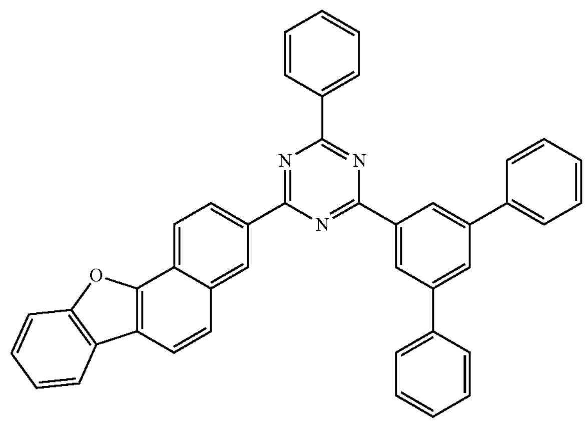
A-98
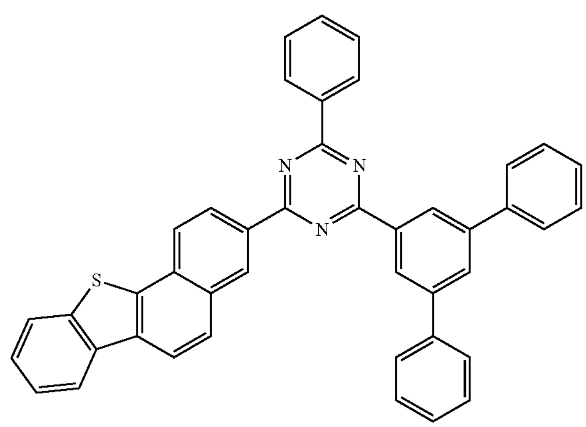

-continued
A-99
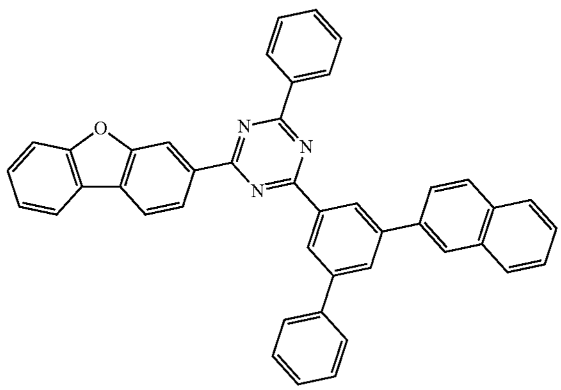
A-100
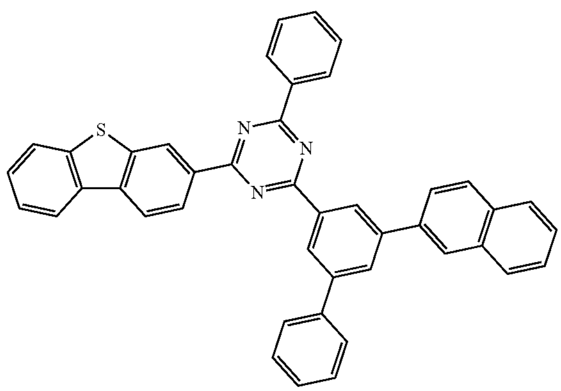
A-101
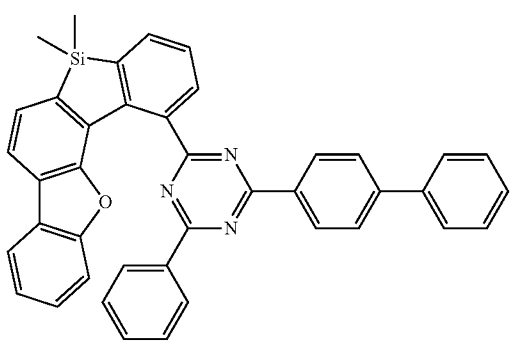
A-102
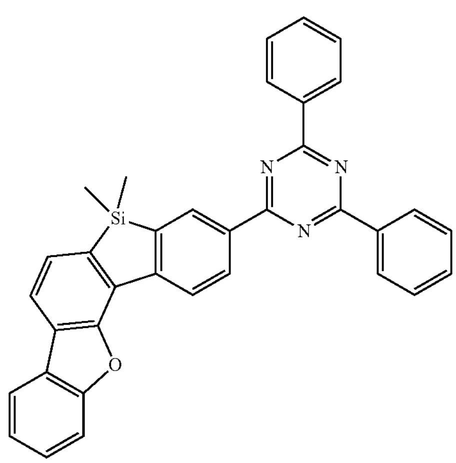
-continued
A-103
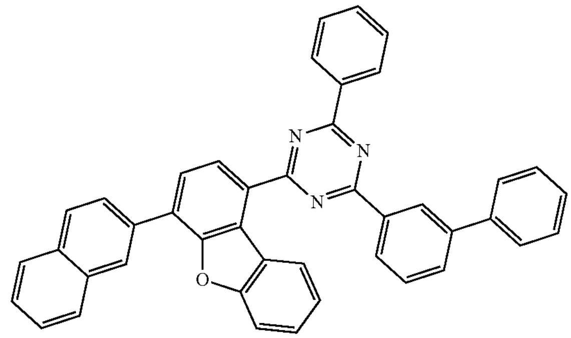
A-104
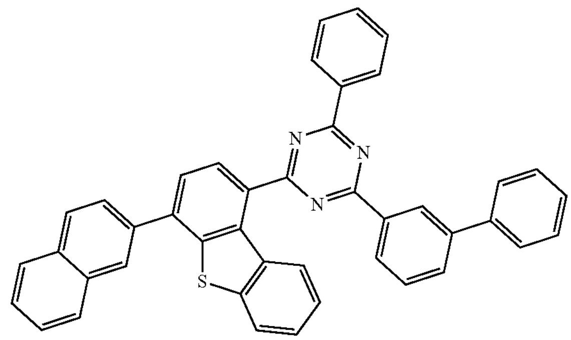
A-105
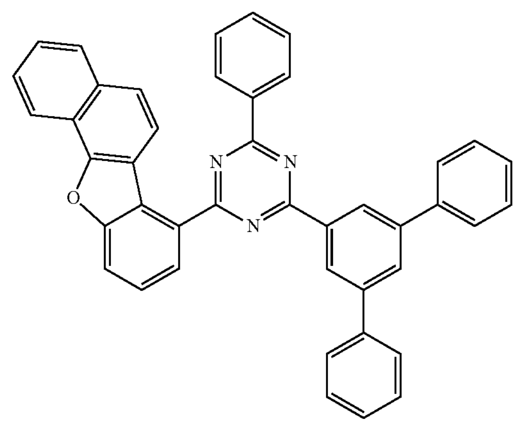
A-106
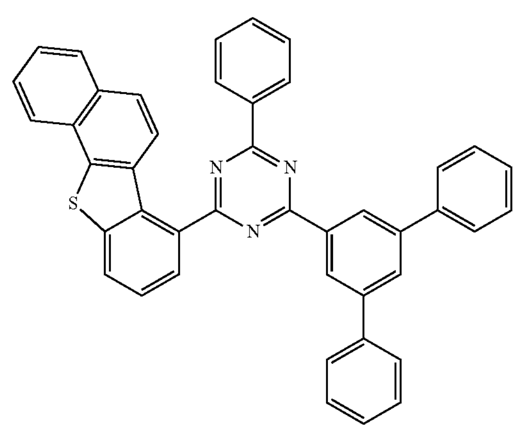

-continued

A-107

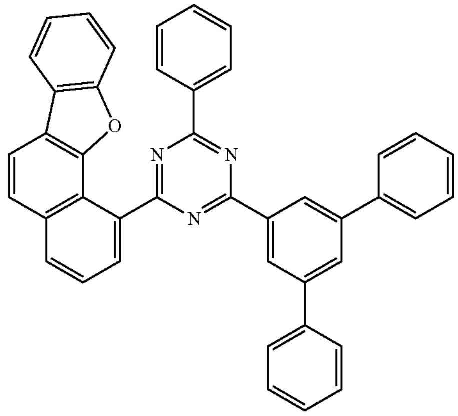

A-108

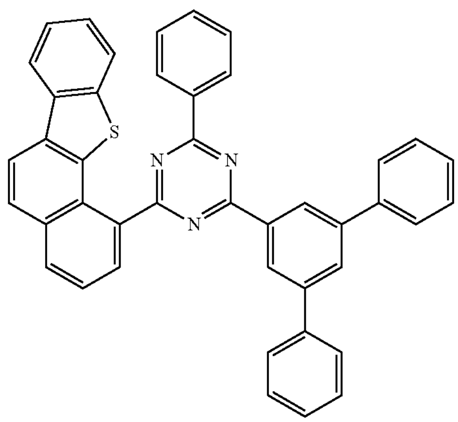

In an implementation, the composition for an organic optoelectronic device may include the first compound represented by one of Chemical Formula 1A-2a, and Chemical Formula 1B-1a to Chemical Formula 1B-3a and the second compound represented by one of Chemical Formula 2A-3a, Chemical Formula 2C-1a, and Chemical Formula 2F-1a.

In an implementation, $Ar^1$ of Chemical Formula 1A-2a, and Chemical Formula 1B-1a to Chemical Formula 1B-3a may be, e.g., an unsubstituted phenyl group, a phenyl group substituted with a C6 to C12 aryl group, an unsubstituted biphenyl group, a biphenyl group substituted with a C6 to C12 aryl group, an unsubstituted naphthyl group or a naphthyl group substituted with a C6 to C12 aryl group, $L^1$ to $L^3$ may each independently be, e.g., a single bond or a substituted or unsubstituted phenylene group, $R^1$ to $R^4$ may each independently be, e.g., a substituted or unsubstituted C1 to C10 alkyl group or a substituted or unsubstituted C6 to C12 aryl group, and $R^5$ to $R^{10}$ may each independently be, e.g., hydrogen, deuterium, a substituted or unsubstituted phenyl group, or a substituted or unsubstituted naphthyl group.

In an implementation, Chemical Formula 2A-3a, Chemical Formula 2C-1a, and Chemical Formula 2F-1a may be represented as follows.

[Chemical Formula 2A-3a]

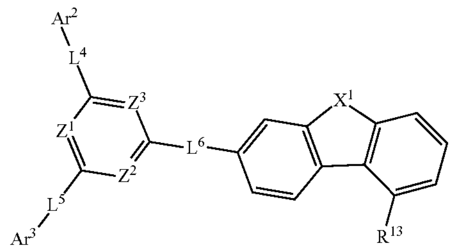

[Chemical Formula 2C-1a]

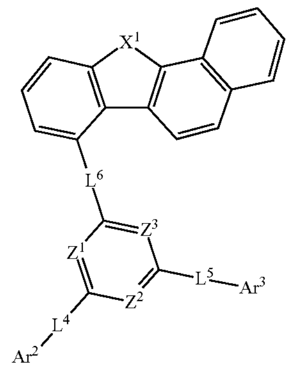

[Chemical Formula 2F-1a]

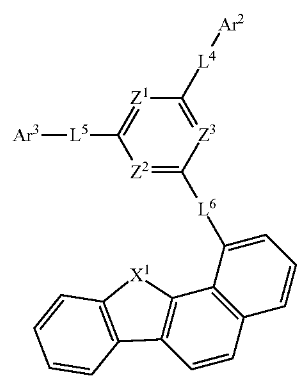

In Chemical Formula 2A-3a, Chemical Formula 2C-1a, and Chemical Formula 2F-1a $X^1$ may be, e.g., O, S, $CR^bR^c$, or $SiR^dR^e$.

$Z^1$ to $Z^3$ may each be N.

$R^b$, $R^c$, $R^d$, and $R^e$ may each independently be, e.g., a substituted or unsubstituted C1 to C10 alkyl group or a substituted or unsubstituted C6 to C12 aryl group.

$R^{13}$ may be, e.g., hydrogen, deuterium, or a substituted or unsubstituted phenyl group.

$L^4$ to $L^6$ may each independently be, e.g., a single bond or a substituted or unsubstituted phenylene group.

$Ar^2$ and $Ar^3$ may each independently be, e.g., a substituted or unsubstituted phenyl group, a substituted or unsubstituted biphenyl group, or a substituted or unsubstituted naphthyl group.

In an implementation, the composition for an organic optoelectronic device may include a first compound of Group 1-1 and a second compound of Group 2-1.

[Group 1-1]
1
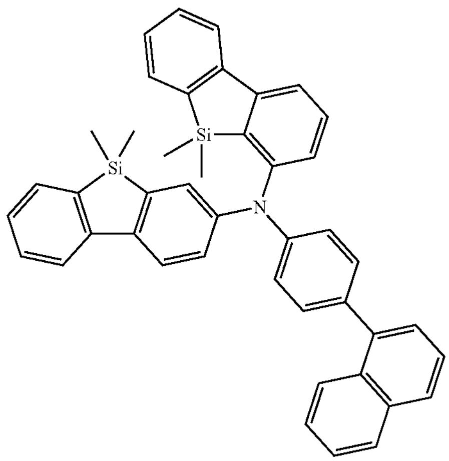
2
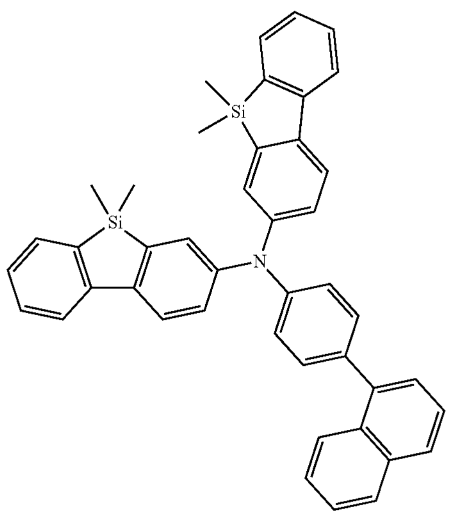
3
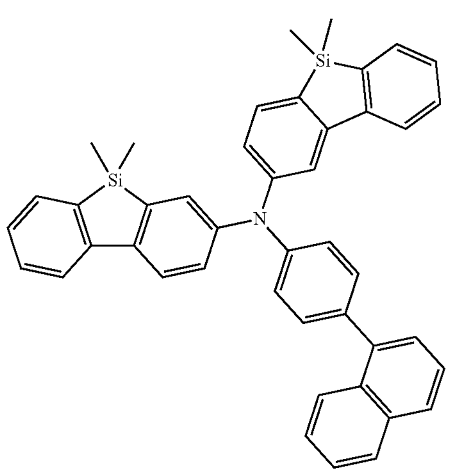
-continued
4
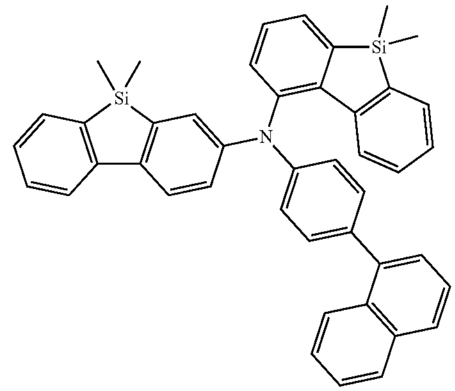
7
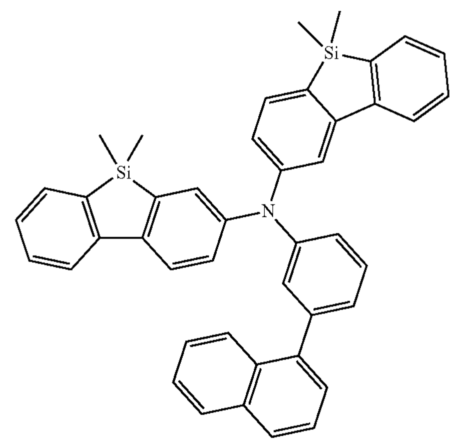
14
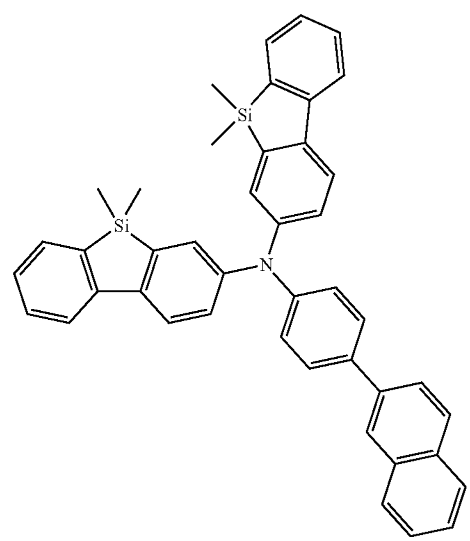

-continued
15
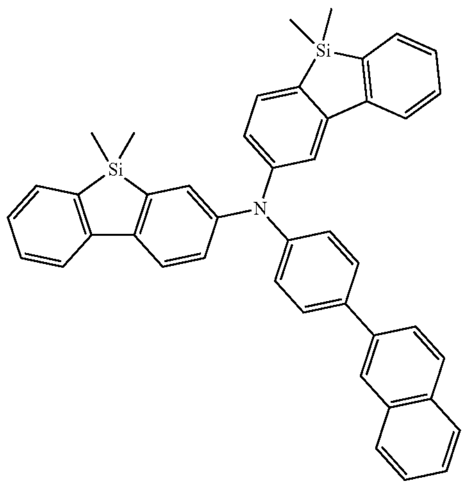
16
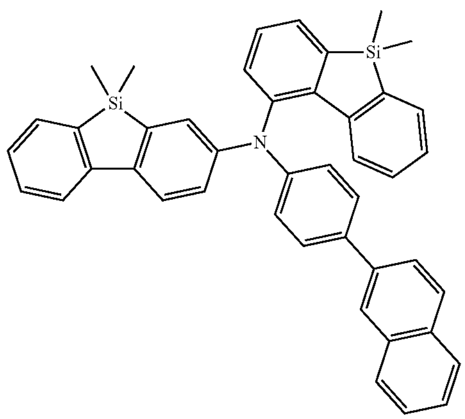
19
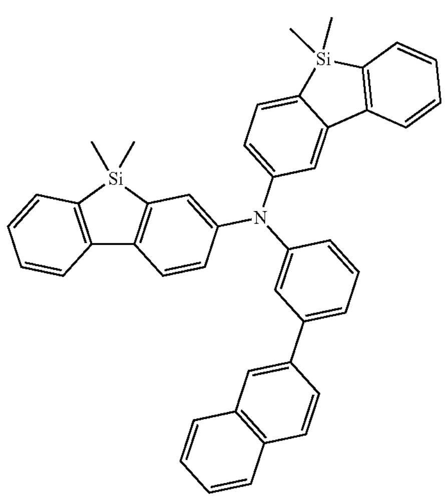
-continued
42
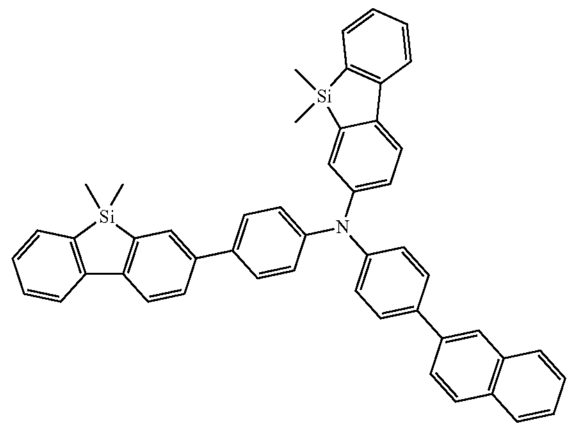
43
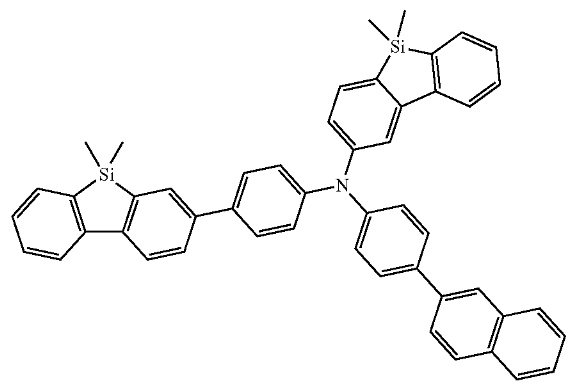
44
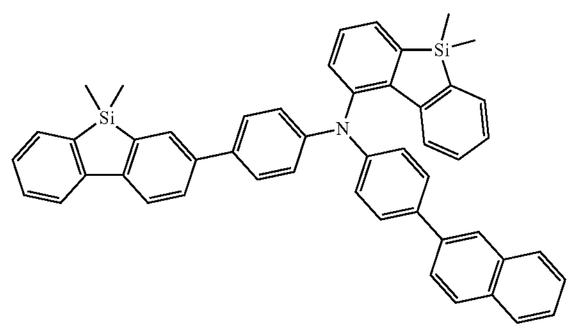
54
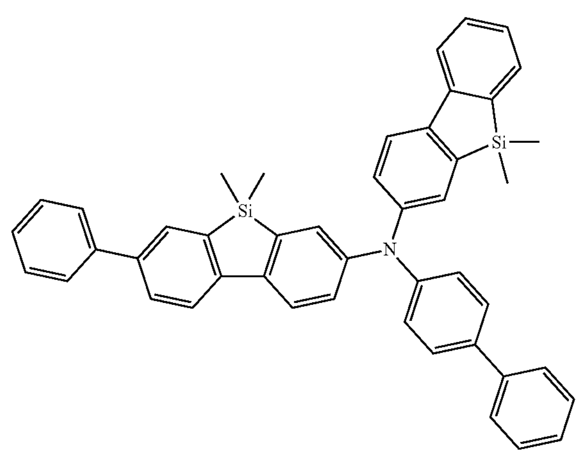

-continued
55
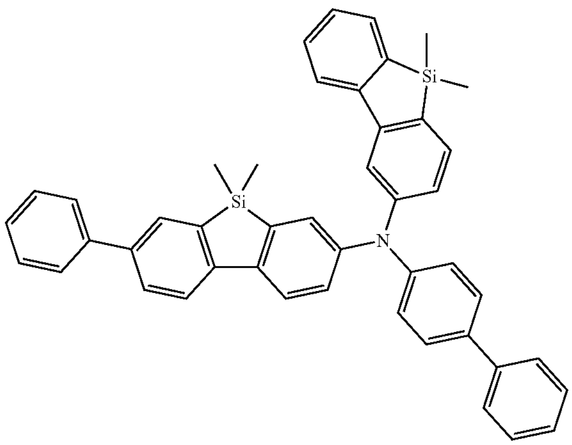
66
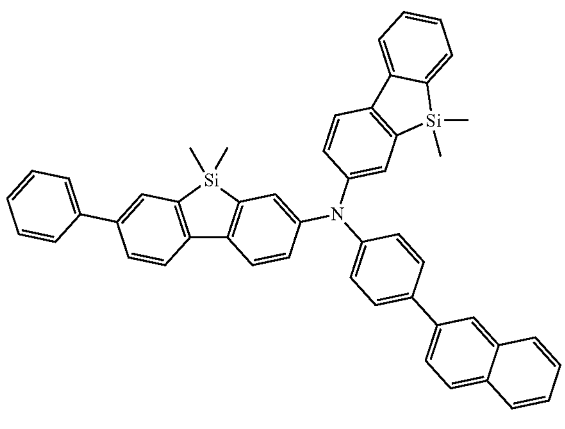
67
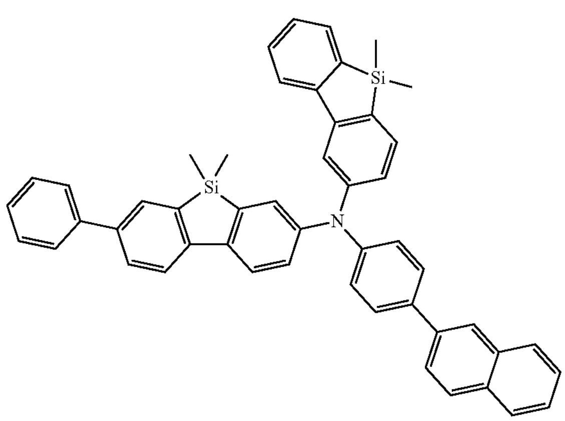
-continued
68
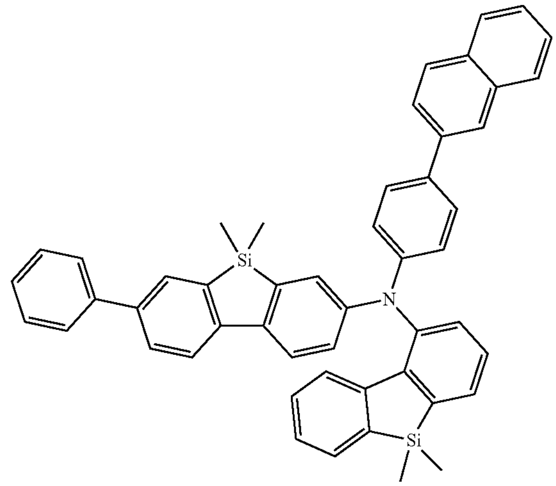
83
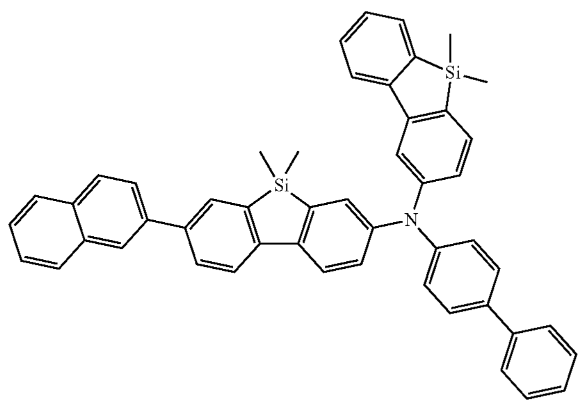
[Group 2-1]
A-3
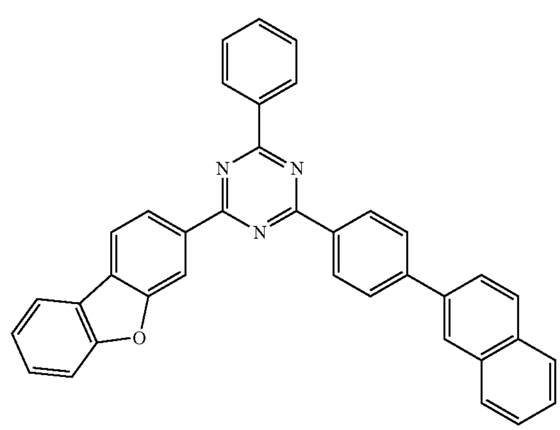

-continued

A-17

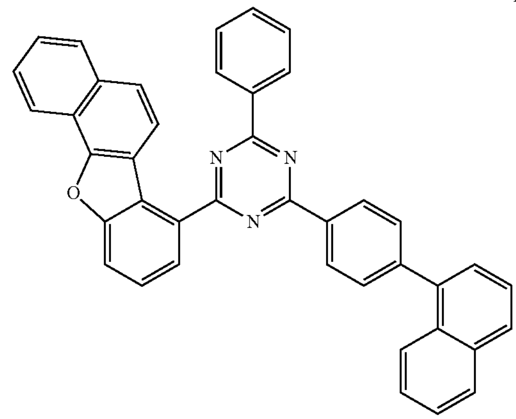

A-24

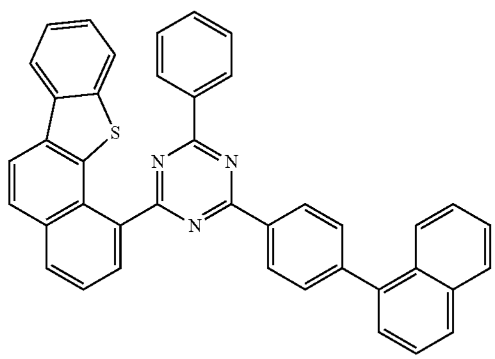

A-35

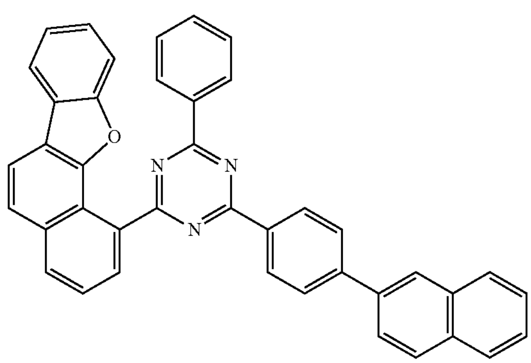

A-37

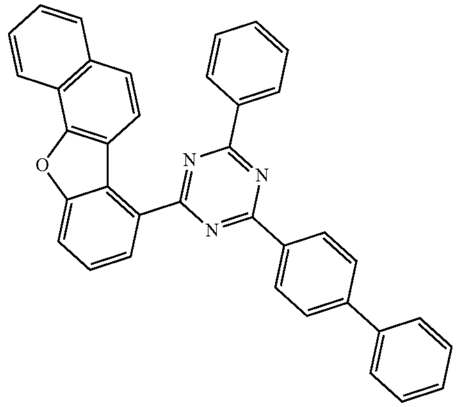

-continued

A-61

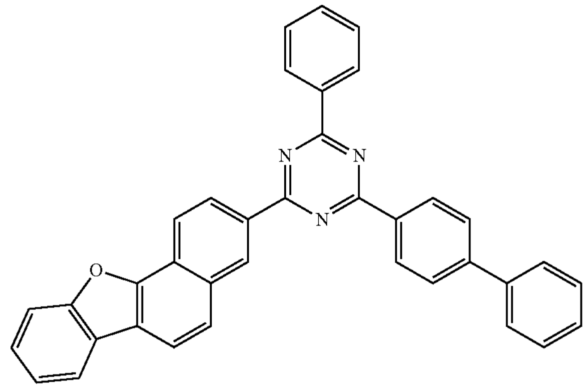

A-71

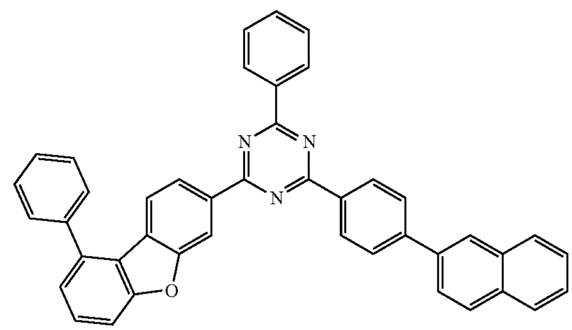

A-77

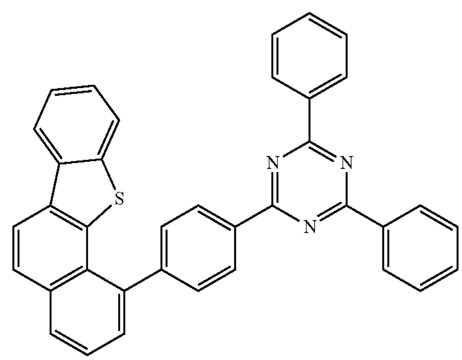

The first compound and the second compound may be included (e.g., mixed) in a weight ratio of, e.g., about 1:99 to about 99:1. When they are included in the above range, an appropriate weight ratio using the hole transport capability of the first compound and the electron transport capability of the second compound may be adjusted to implement bipolar characteristics and thus efficiency and life-span may be improved. Within the above range, e.g., they may be included in a weight ratio of about 90:10 to about 10:90, about 80:20 to about 10:90, about 70:30 to about 10:90, or about 60:40 to about 10:90. In an implementation, they may be included in a weight ratio of about 60:40 to about 20:80, e.g., about 60:40 to about 30:70.

In an implementation, they may be included in a weight ratio of about 60:40 to about 40:60.

In an implementation, the first compound and the second compound may each be included as a host of a light emitting layer, e.g., a phosphorescent host.

Hereinafter, an organic optoelectronic device including the aforementioned composition for an organic optoelectronic device is described.

The organic optoelectronic device may be a suitable device to convert electrical energy into photoenergy and vice versa, and may include, e.g., an organic photoelectric device, an organic light emitting diode, an organic solar cell, or an organic photoconductor drum.

Herein, an organic light emitting diode as one example of an organic optoelectronic device is described referring to drawings.

Figure 2:
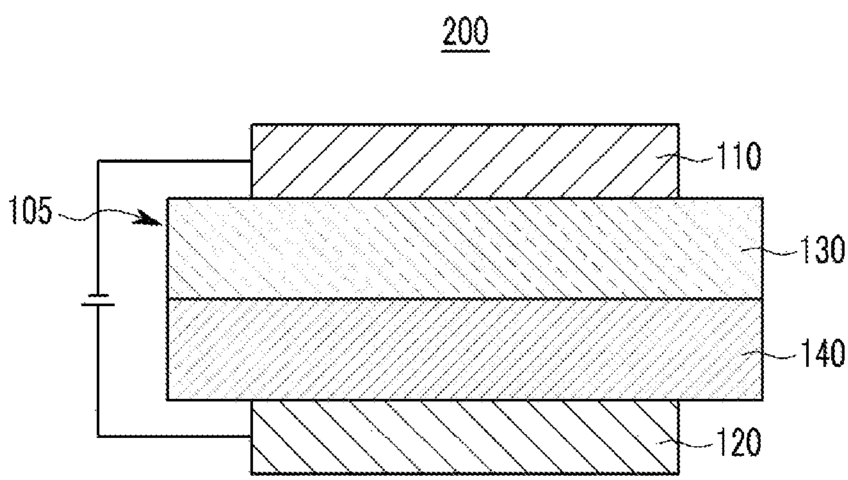

FIGS. 1 and 2 are cross-sectional views showing organic light emitting diodes according to embodiments.

Referring to FIG. 1, an organic light emitting diode 100 according to an embodiment may include an anode 120 and a cathode 110 facing each other and an organic layer 105 between the anode 120 and cathode 110.

The anode 120 may be made of a conductor having a large work function to help hole injection, and may be, e.g., a metal, a metal oxide, or a conductive polymer. The anode 120 may be, e.g., a metal such as nickel, platinum, vanadium, chromium, copper, zinc, gold, or the like, or an alloy thereof; a metal oxide such as zinc oxide, indium oxide, indium tin oxide (ITO), indium zinc oxide (IZO), or the like; a combination of a metal and an oxide such as ZnO and Al or $SnO_2$ and Sb; or a conductive polymer such as poly(3-methylthiophene), poly(3,4-(ethylene-1,2-dioxy)thiophene) (PEDOT), polypyrrole, or polyaniline.

The cathode 110 may be made of a conductor having a small work function to help electron injection, and may be, e.g., a metal, a metal oxide, or a conductive polymer. The cathode 110 may be, e.g., a metal such as magnesium, calcium, sodium, potassium, titanium, indium, yttrium, lithium, gadolinium, aluminum, silver, tin, lead, cesium, barium, or the like, or an alloy thereof; or a multi-layer structure material such as LiF/Al, $LiO_2$/Al, LiF/Ca, or $BaF_2$/Ca.

The organic layer 105 may include the aforementioned composition for an organic optoelectronic device.

The organic layer 105 may include the light emitting layer 130, and the light emitting layer 130 may include the aforementioned composition for an organic optoelectronic device.

The light emitting layer 130 may include, e.g., the aforementioned composition for an organic optoelectronic device as a phosphorescent host.

In addition to the aforementioned host, the light emitting layer may further include one or more other compounds.

The light emitting layer may further include a dopant. The dopant may be, e.g., a phosphorescent dopant, e.g., a red, green, or blue phosphorescent dopant. In an implementation, the dopant may be a red or green phosphorescent dopant.

The composition for an organic optoelectronic device further including a dopant may be, e.g., a red light emitting composition.

The dopant may be a material mixed with a compound for an organic optoelectronic device or a composition for an organic optoelectronic device in a small amount to facilitate light emission and may be a material such as a metal complex that emits light by multiple excitation into a triplet or more. The dopant may be, e.g., an inorganic, organic, or organic-inorganic compound, and one or more types thereof may be used.

Examples of the dopant may be a phosphorescent dopant and examples of the phosphorescent dopant may be an organometallic compound including Ir, Pt, Os, Ti, Zr, Hf, Eu, Tb, Tm, Fe, Co, Ni, Ru, Rh, Pd, or a combination thereof. The phosphorescent dopant may be, e.g., a compound represented by Chemical Formula Z.

[Chemical Formula Z]

$L^7MX^3$

In Chemical Formula Z, M may be a metal, $L^7$ and $X^3$ may each independently be ligands forming a complex compound with M.

The M may be, e.g., Ir, Pt, Os, Ti, Zr, Hf, Eu, Tb, Tm, Fe, Co, Ni, Ru, Rh, Pd, or a combination thereof, and $L^7$ and $X^3$ may be, e.g., bidentate ligands.

The organic layer may further include an auxiliary layer in addition to the light emitting layer.

The auxiliary layer may be, e.g., a hole auxiliary layer 140.

Referring to FIG. 2, an organic light emitting diode 200 further includes a hole auxiliary layer 140 in addition to the light emitting layer 130. The hole auxiliary layer 140 further increases hole injection and/or hole mobility and blocks electrons between the anode 120 and the light emitting layer 130.

The hole auxiliary layer 140 may include, e.g., a compound of Group A.

In an implementation, the hole auxiliary layer 140 may include a hole transport layer between the anode 120 and the light emitting layer 130 and a hole transport auxiliary layer between the light emitting layer 130 and the hole transport layer, and a compound of Group A may be included in the hole transport auxiliary layer.

[Group A]

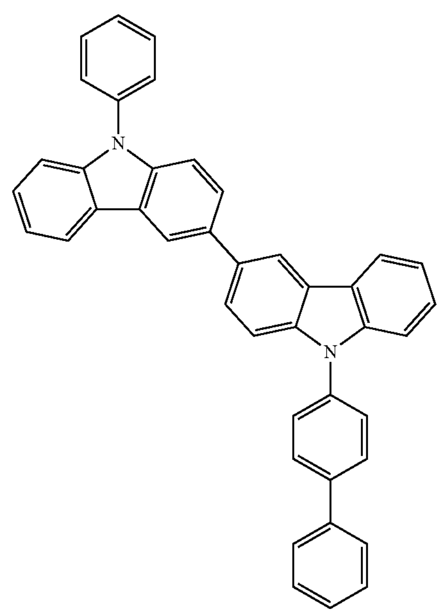

-continued
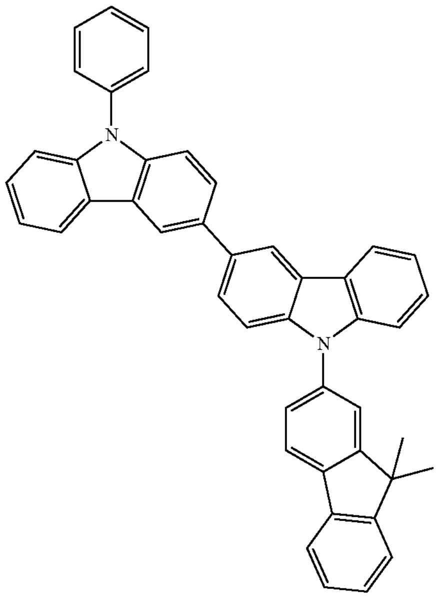
-continued
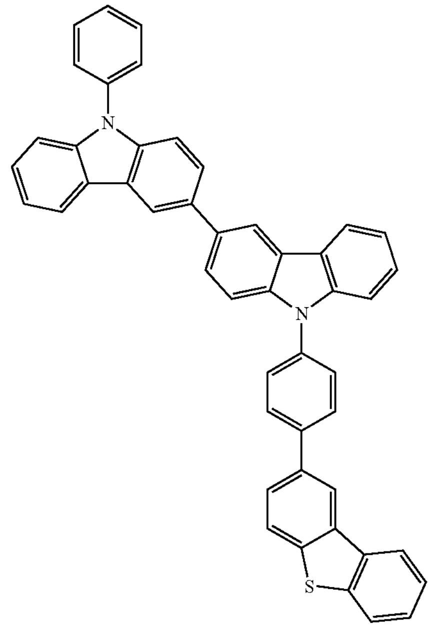
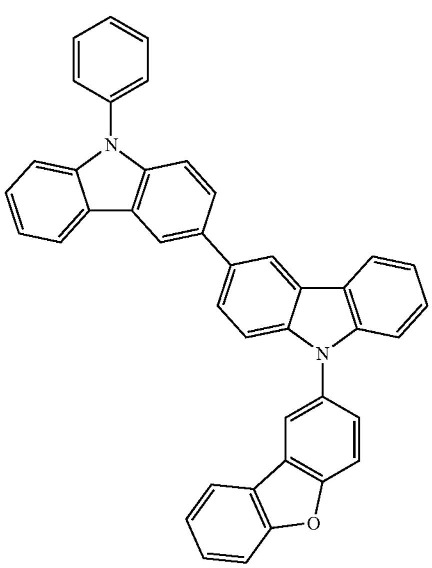
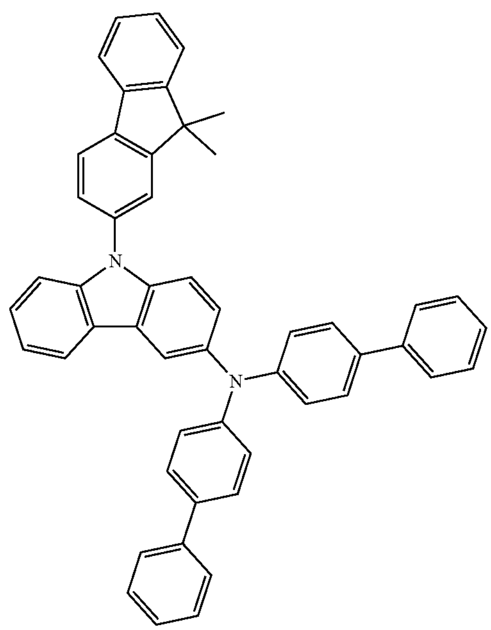

-continued
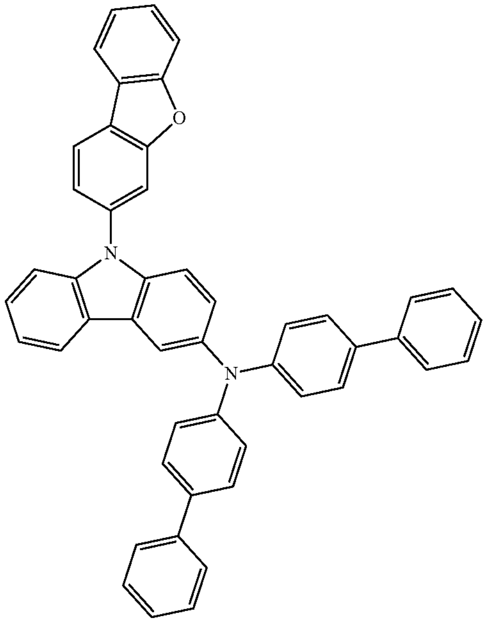
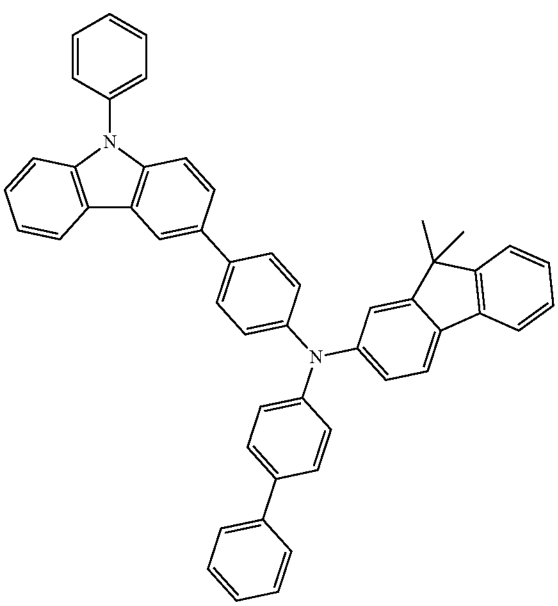
-continued
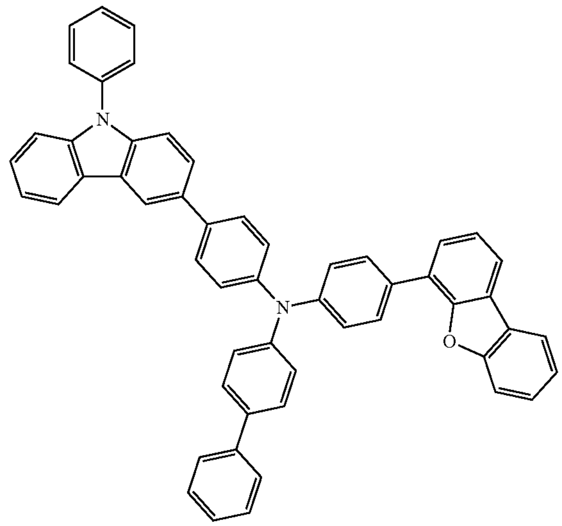
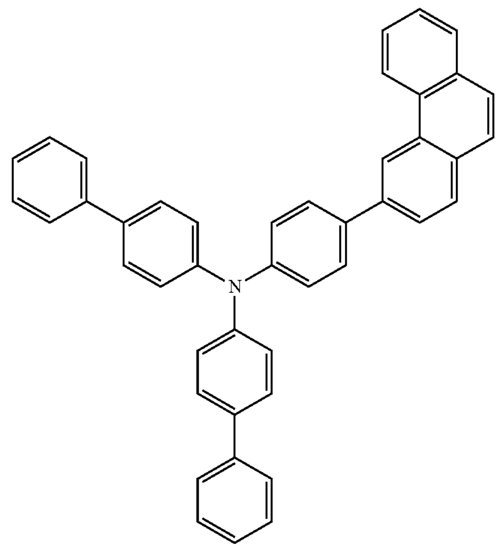
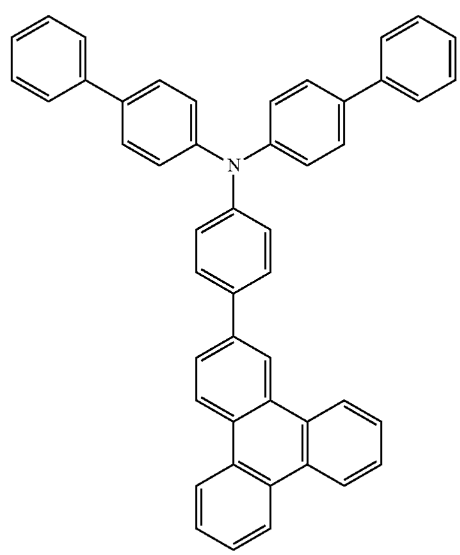

-continued
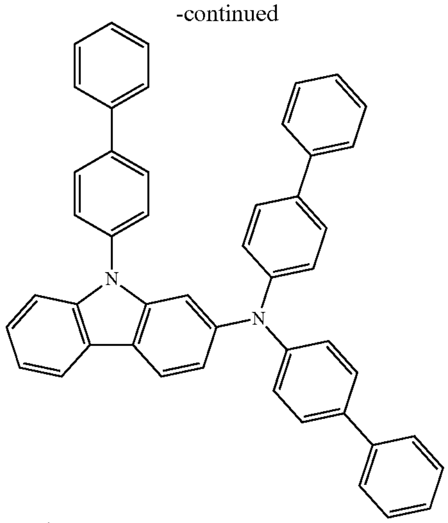
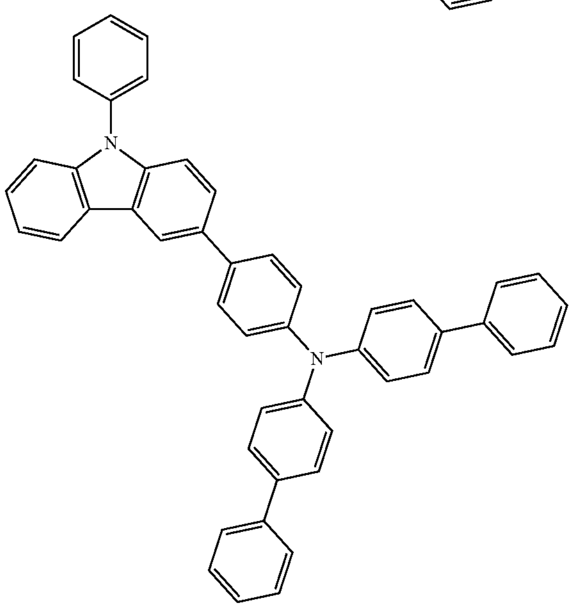
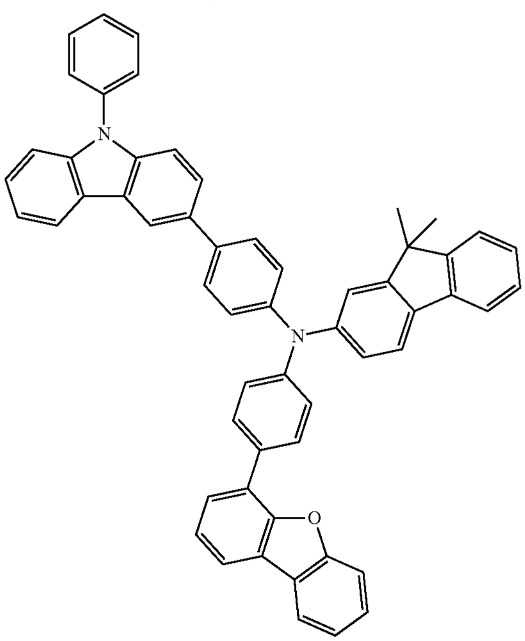
-continued
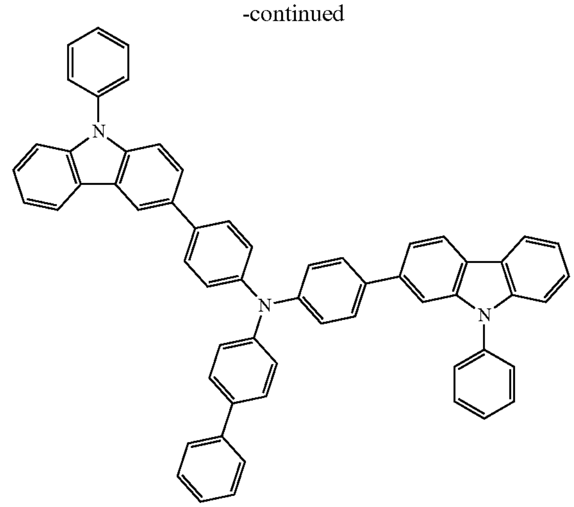
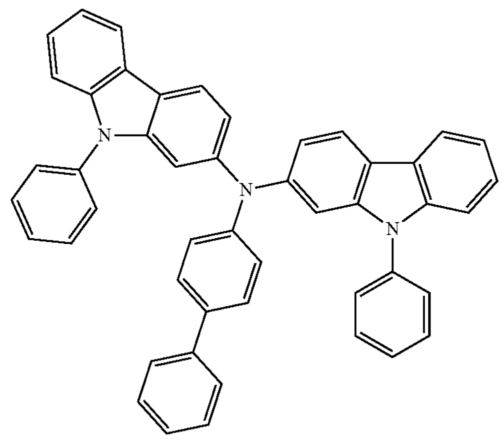
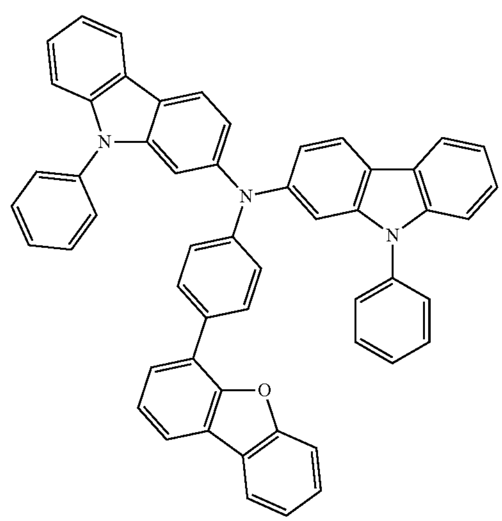

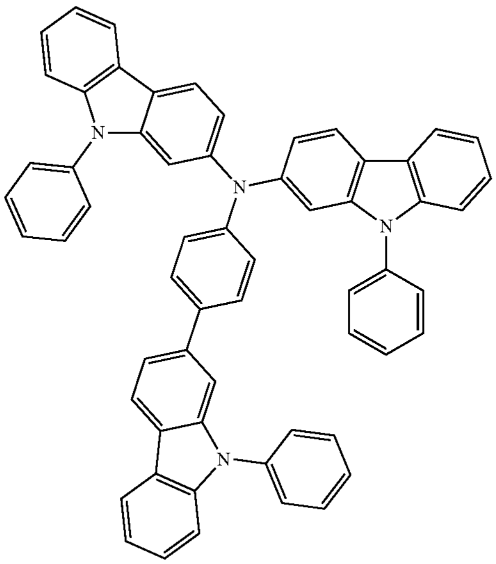
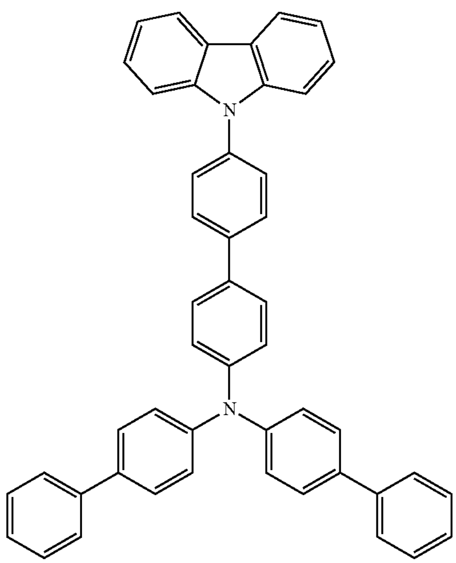
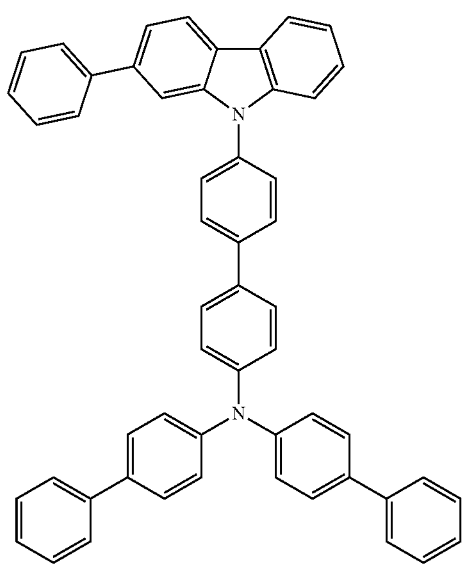
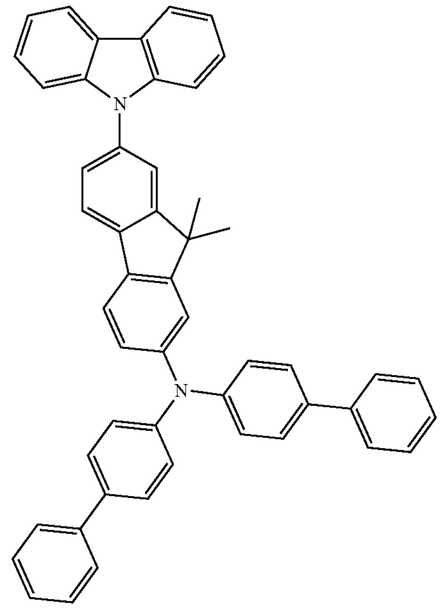
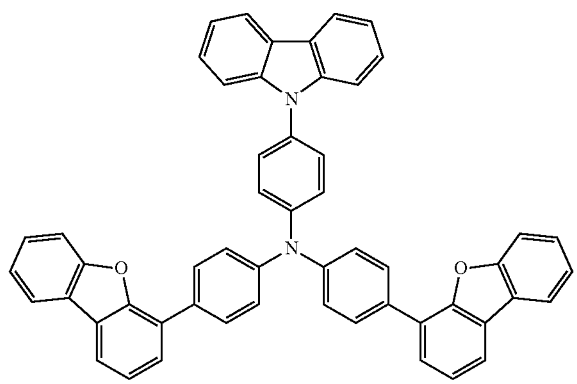
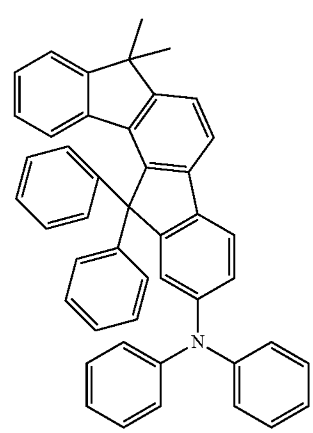

-continued
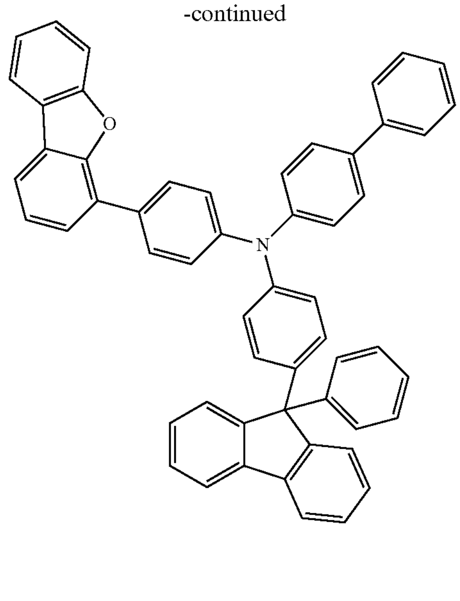
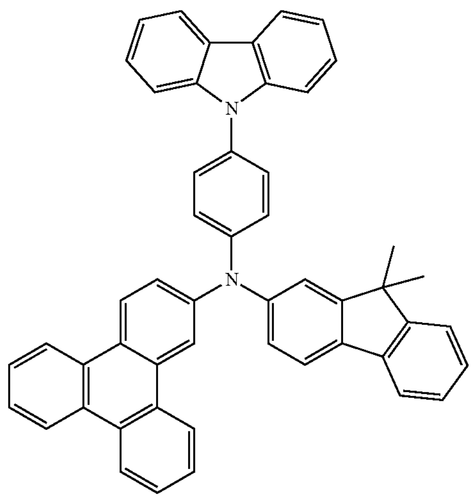
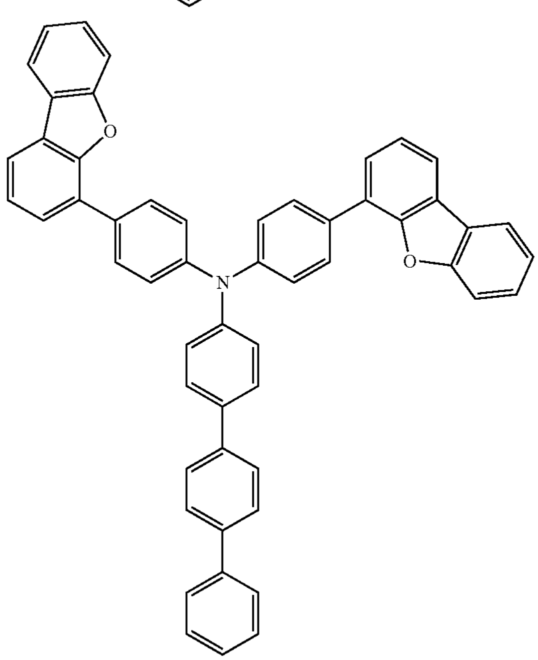
-continued
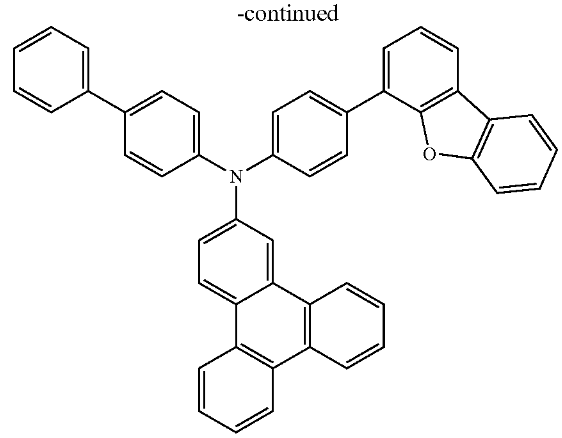
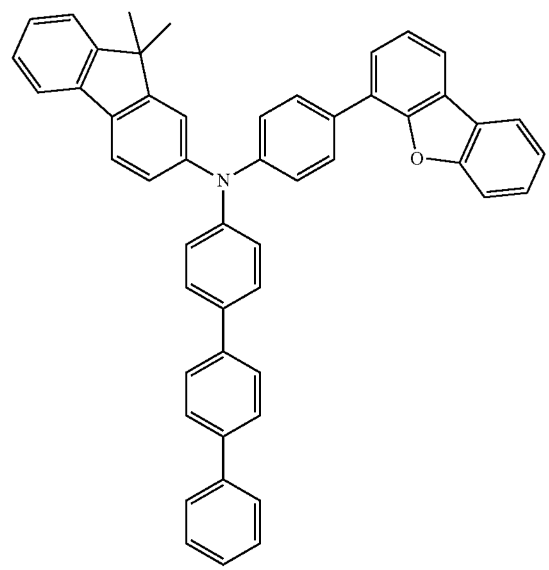
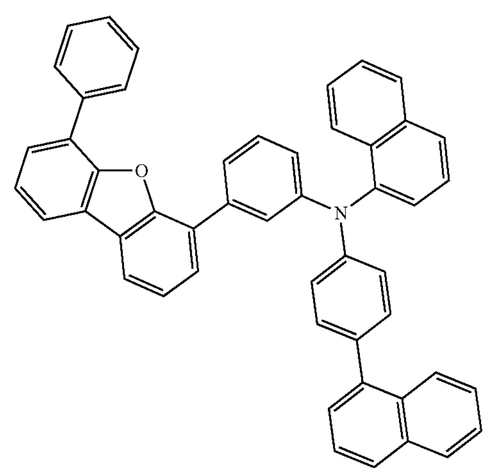

-continued
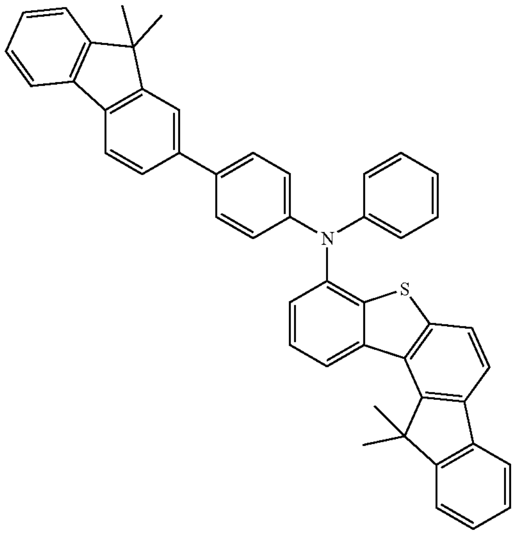
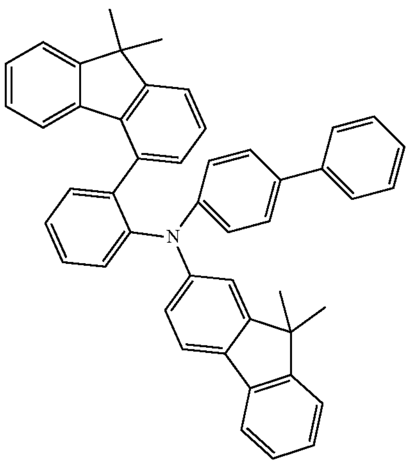
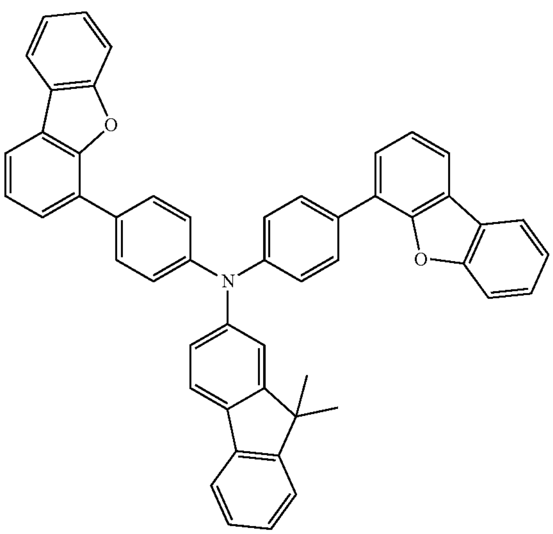
-continued
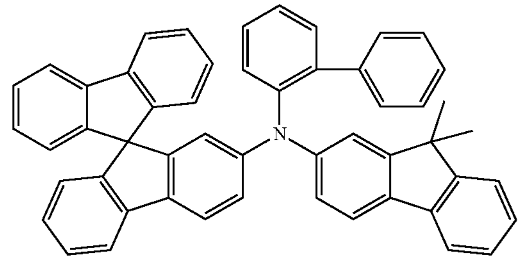
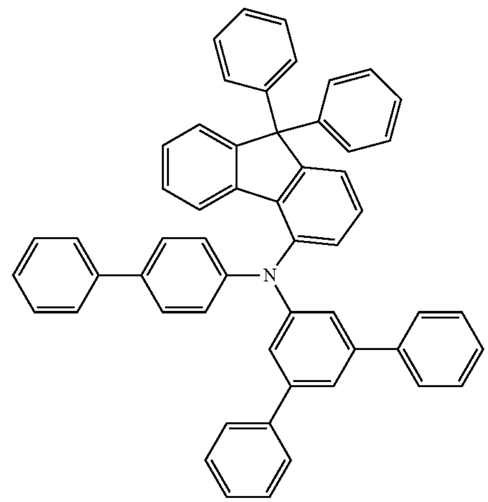
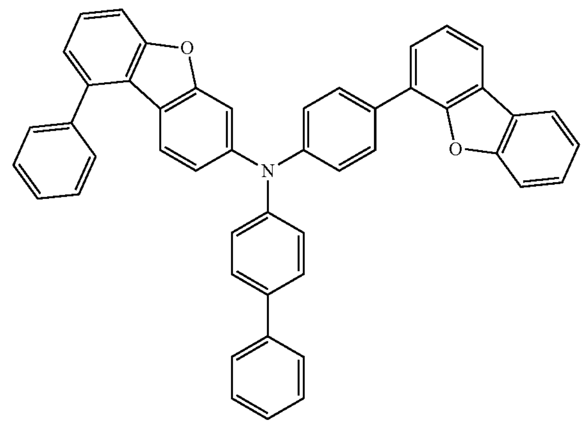
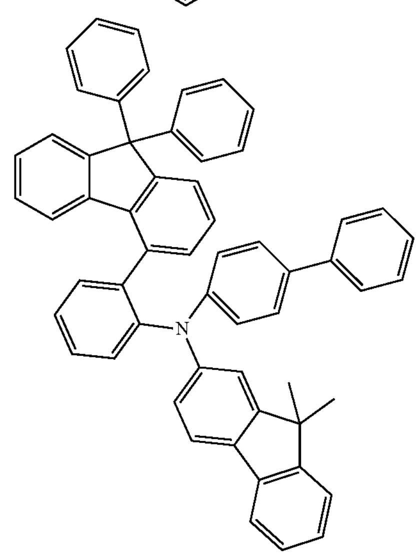

-continued
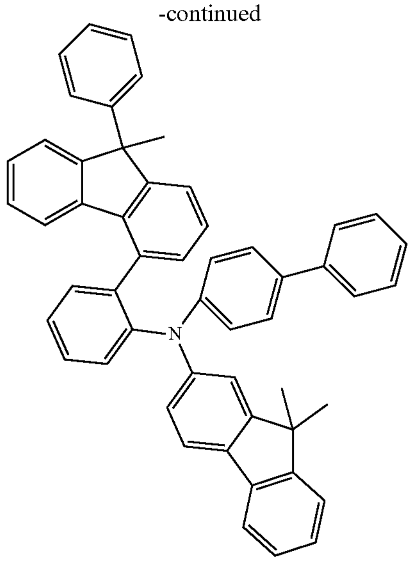
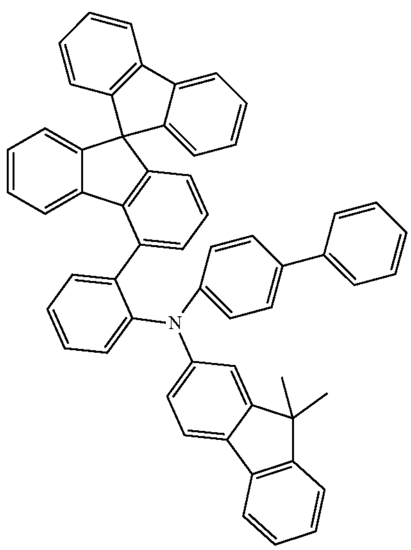
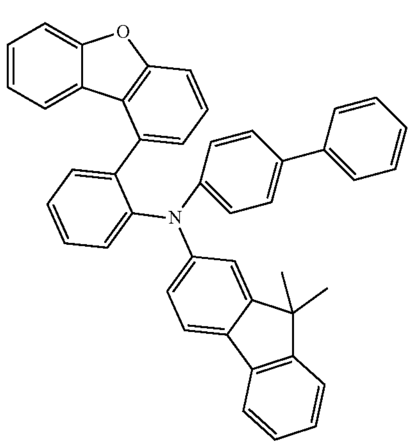
-continued
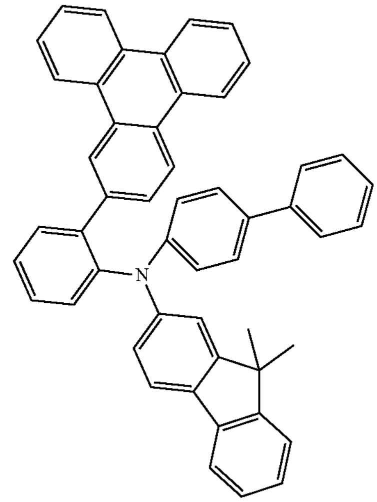
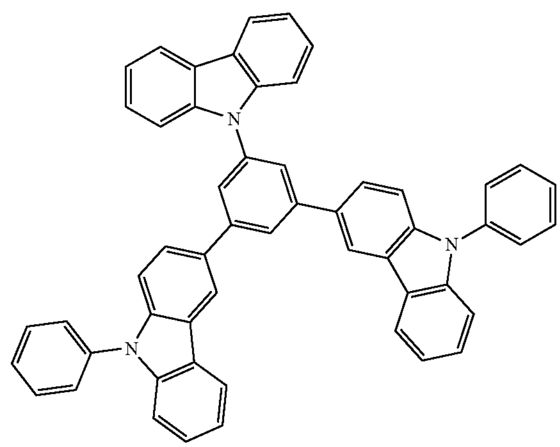
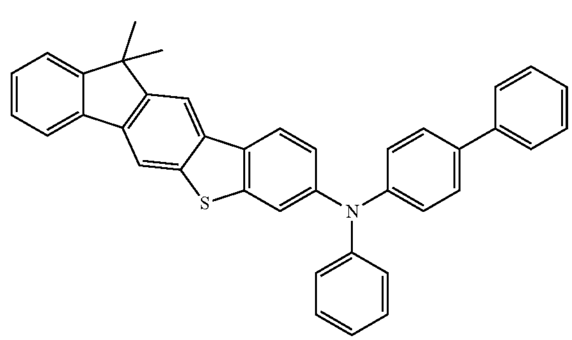

-continued
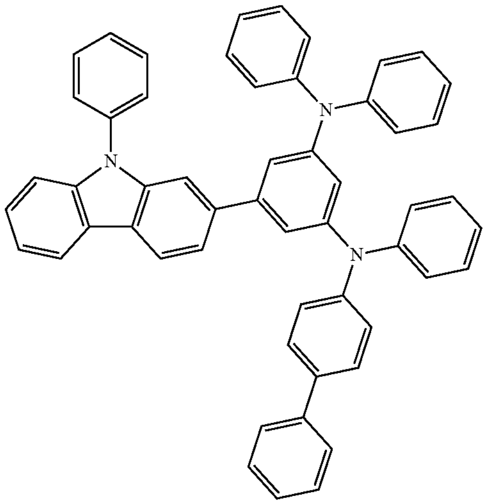
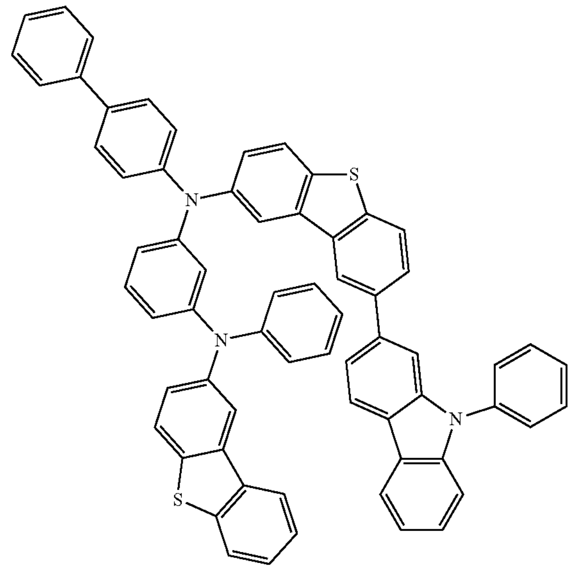
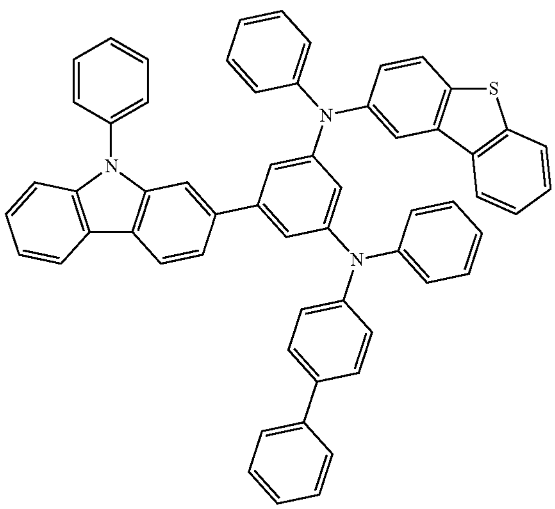
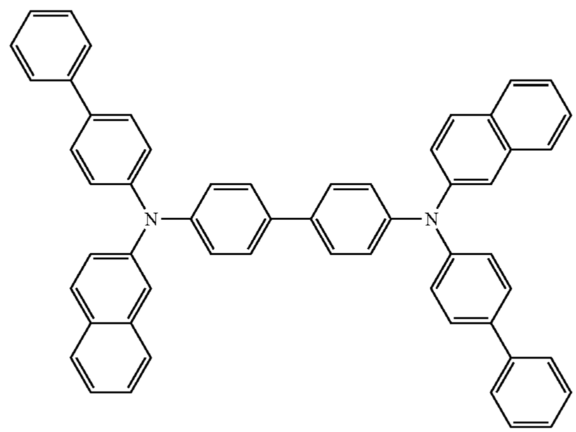
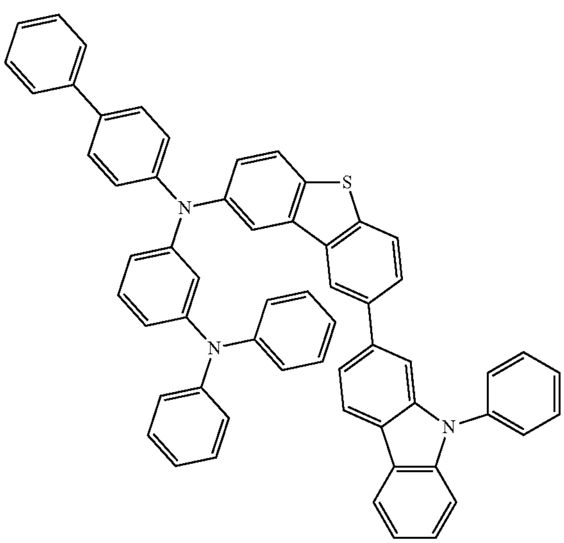
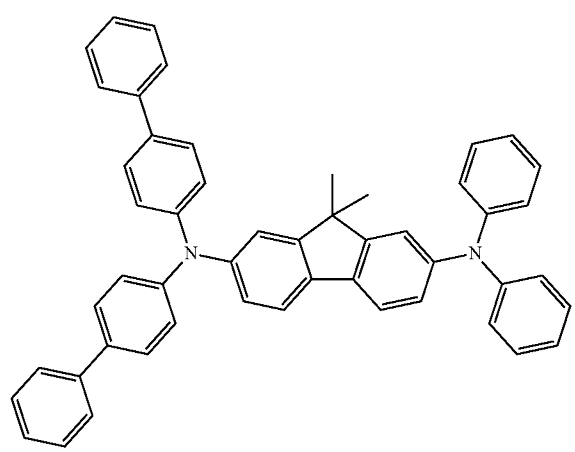
-continued -continued
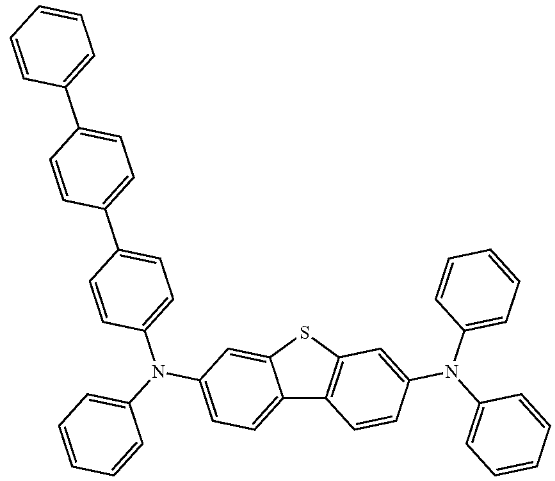
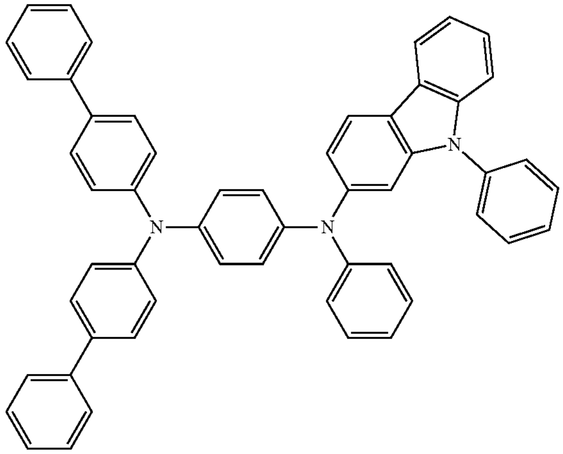
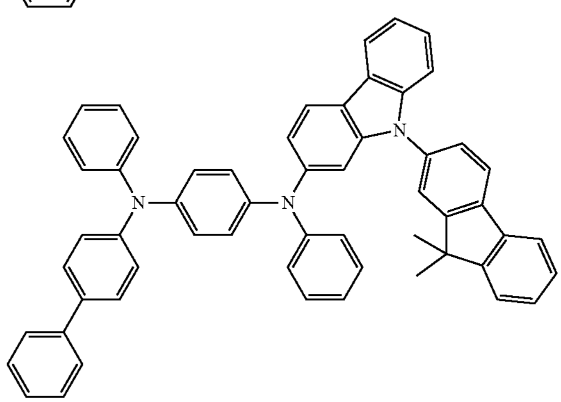
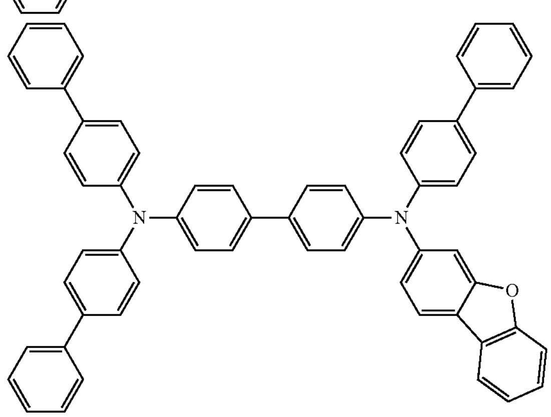
-continued
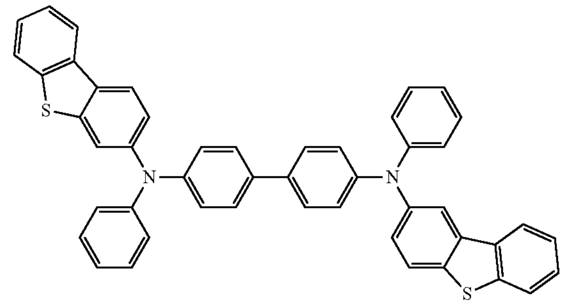
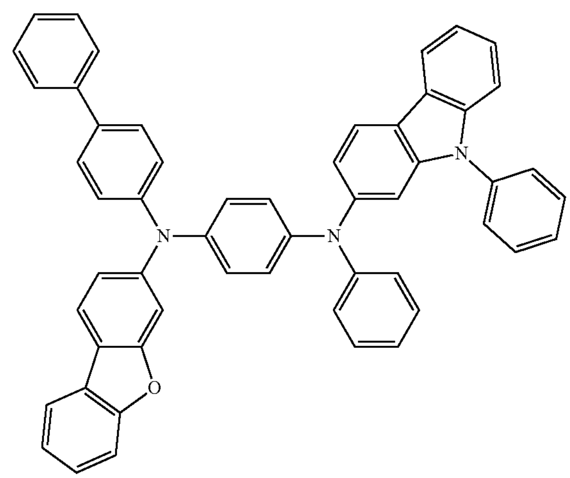
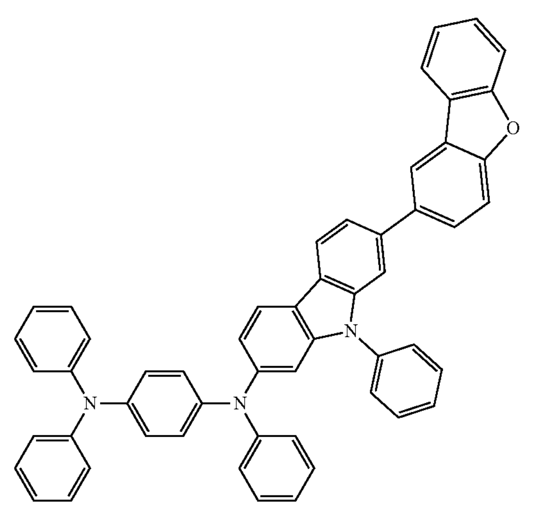

-continued
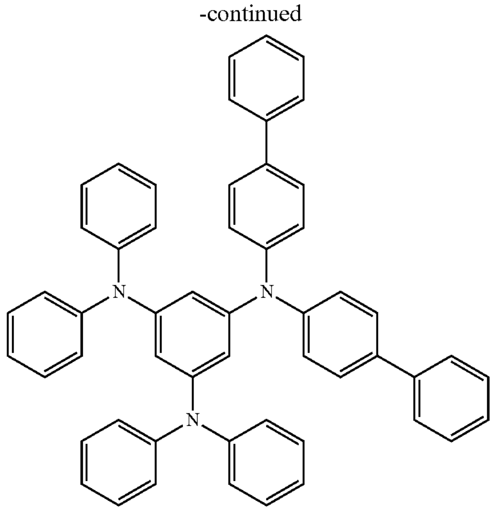
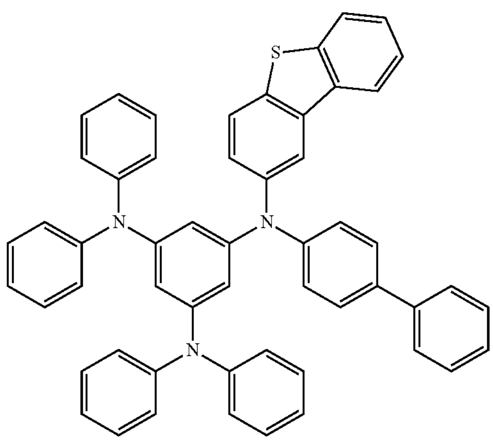
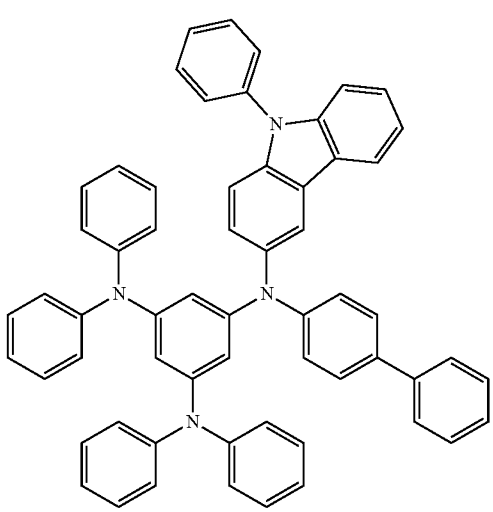
-continued
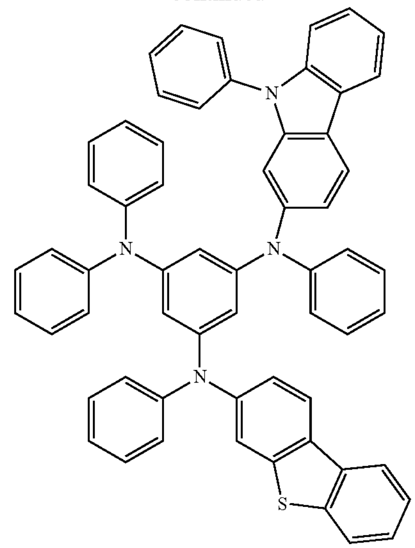
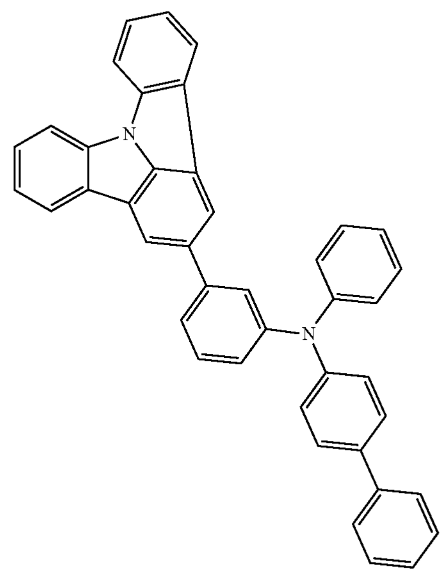
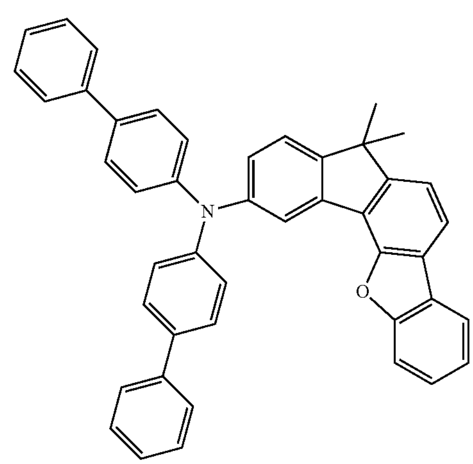

-continued
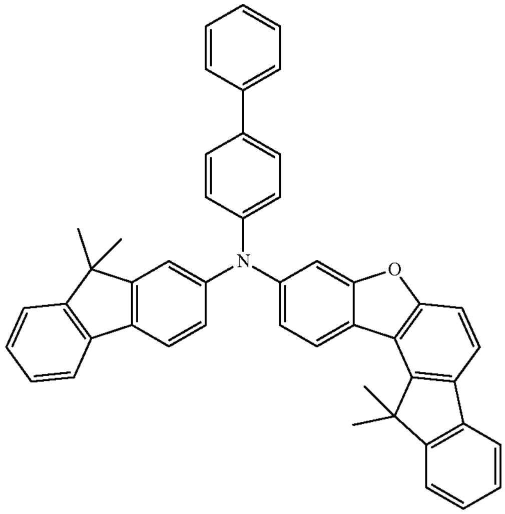
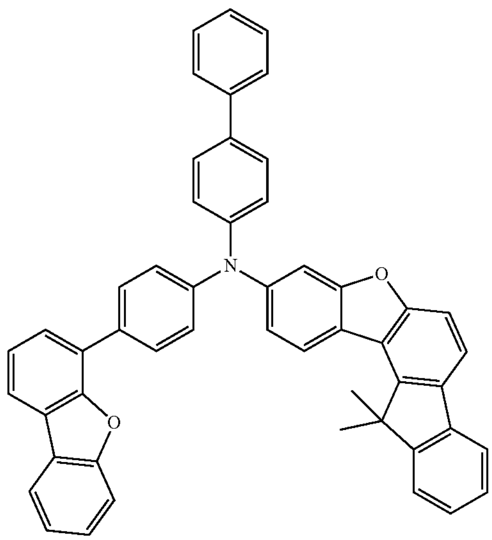
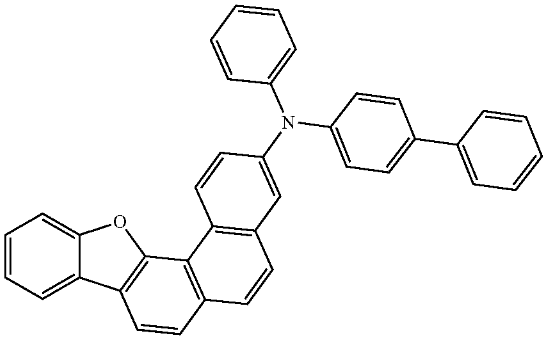
-continued
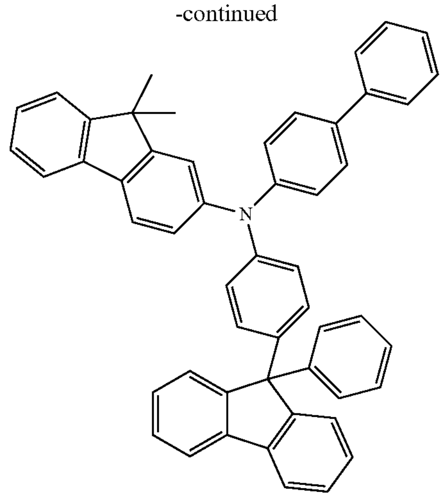
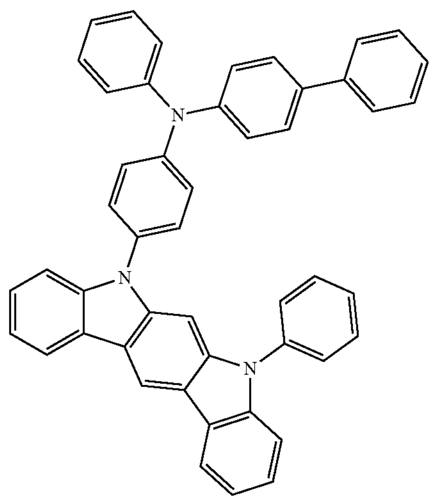
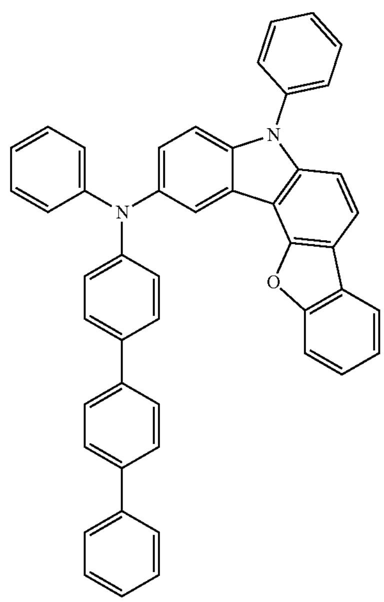

-continued

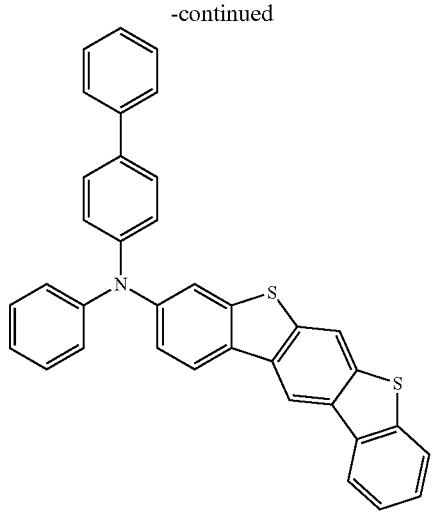

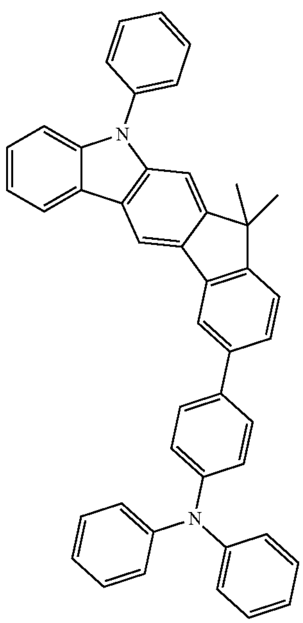

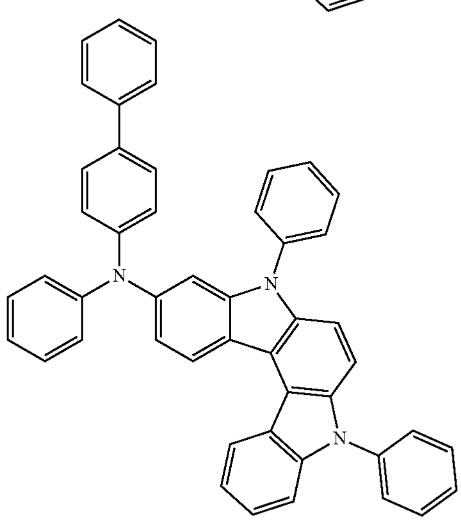

-continued

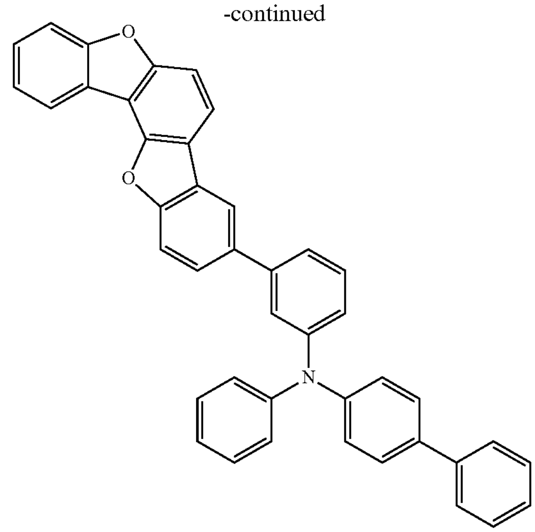

In the hole transport auxiliary layer, other suitable compounds may be used in addition to the compound.

In an implementation, in FIG. 1 or 2, an organic light emitting diode may further include an electron transport layer, an electron injection layer, or a hole injection layer as the organic layer 105.

The organic light emitting diodes 100 and 200 may be produced by forming an anode or a cathode on a substrate, forming an organic layer using a dry film formation method such as a vacuum deposition method (evaporation), sputtering, plasma plating, and ion plating, and forming a cathode or an anode thereon.

The organic light emitting diode may be applied to an organic light emitting display device.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Hereinafter, starting materials and reactants used in examples and synthesis examples were purchased from Sigma-Aldrich Co. Ltd., TCI Inc., Tokyo chemical industry or P&H tech as far as there is no particular comment or were synthesized by suitable methods.

(Preparation of Compound for Organic Optoelectronic Device)

Compounds were synthesized through the following steps.

Synthesis of First Compound

Synthesis Example $_1$: Synthesis of Compound 2

[Reaction Scheme 1]

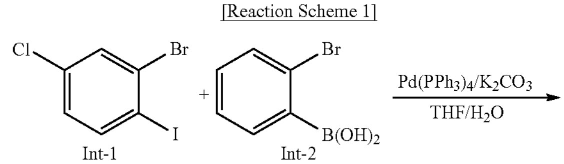

-continued

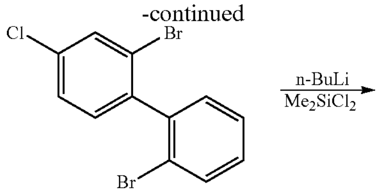

Int-3

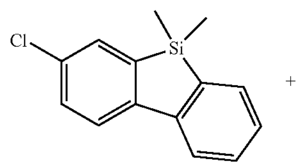

Int-4

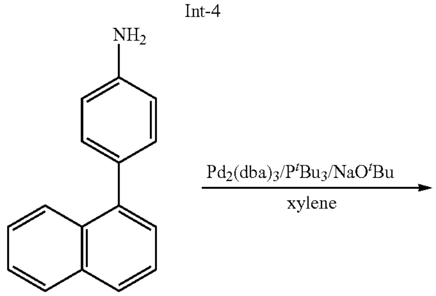

Int-5

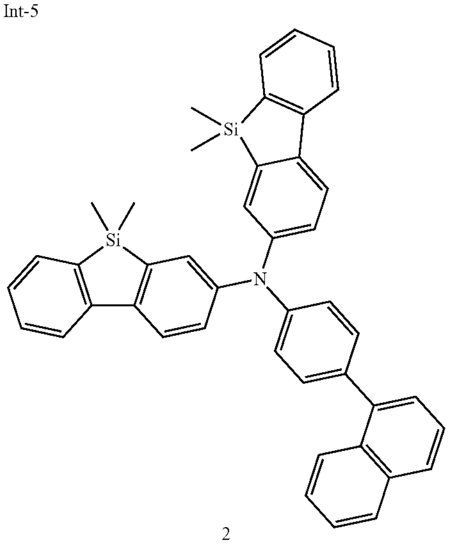

2

1st Step: Synthesis of Int-3

Int-1 (100 g 315.11 mmol) was dissolved in 1.0 L of tetrahydrofuran (THF), and

Int-2 (63.28 g, 315.11 mmol) and tetrakis(triphenylphosphine) palladium (10.92 g, 9.45 mmol) were added thereto and then, stirred. Subsequently, potassium carbonate (108.88 g, 787.77 mmol) saturated in 500 ml of water was added thereto and then, heated and refluxed at 80° C. for 12 hours. When a reaction was completed, water was added to the reaction solution, and the mixture was extracted with ethyl acetate (EA), treated with magnesium sulfate anhydrous to remove moisture, filtered, and concentrated under a reduced pressure. The obtained residue was separated and purified through flash column chromatography to obtain 86.24 g (79%) of Int-3.

2nd Step: Synthesis of Int-4

Int-3 (86.24 g 248.92 mmol) was dissolved in 600 mL of tetrahydrofuran (THF), and an internal temperature thereof was decreased down to −78° C. n-BuLi (288.75 ml, 721.88 mmol) was slowly added thereto in a dropwise fashion, while the internal temperature of −78° C. was maintained, and then, stirred at the temperature for 1 hour.

Subsequently, dichlorodimethylsilane (104.31 ml, 871.24 mmol) was slowly added thereto in a dropwise fashion, while the temperature of −78° C. was maintained, and then, stirred at ambient temperature for 12 hours. When a reaction was completed, water was added to the reaction solution, and the mixture was extracted with ethyl acetate (EA), treated with magnesium sulfate anhydrous to remove moisture, filtered, and concentrated under a reduced pressure. The obtained residue was separated and purified through flash column chromatography to obtain 43.12 g (71%) of Int-4.

3rd Step: Synthesis of Compound 2

1.21 g (5.5 mmol) of Int-5, 2.69 g (11.01 mmol) of Int-4, 1.32 g (13.76 mmol) of sodium t-butoxide, and 0.22 g (0.55 mmol) of tri-tert-butylphosphine were dissolved in 55 ml of xylene, and 0.25 g (0.28 mmol) of $Pd_2(dba)_3$ was added thereto and then, stirred and refluxed under a nitrogen atmosphere for 12 hours. When a reaction was completed, an organic layer was extracted with xylene and distilled water, treated with magnesium sulfate anhydrous to remove moisture, and filtered, and a filtrate therefrom was concentrated under a reduced pressure. The obtained residue was purified with n-hexane/dichloromethane (a volume ratio of 2 :1) through silica gel column chromatography to obtain 2.8 g (Yield: 80%) of Compound 2.

calcd. C44H37NSi2:C, 83.10; H, 5.86; N, 2.20; Si, 8.83; found:C, 83.10; H, 5.86; N, 2.20; Si, 8.83

Synthesis Example 2: Synthesis of Compound 4

[Reaction Scheme 2]

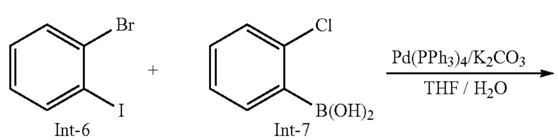

Int-6 Int-7

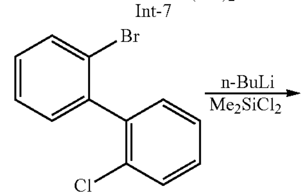

Int-8

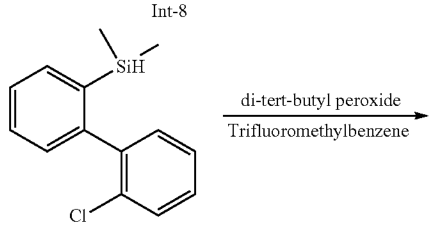

Int-9

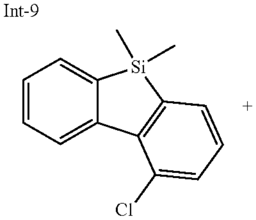

Int-10

-continued

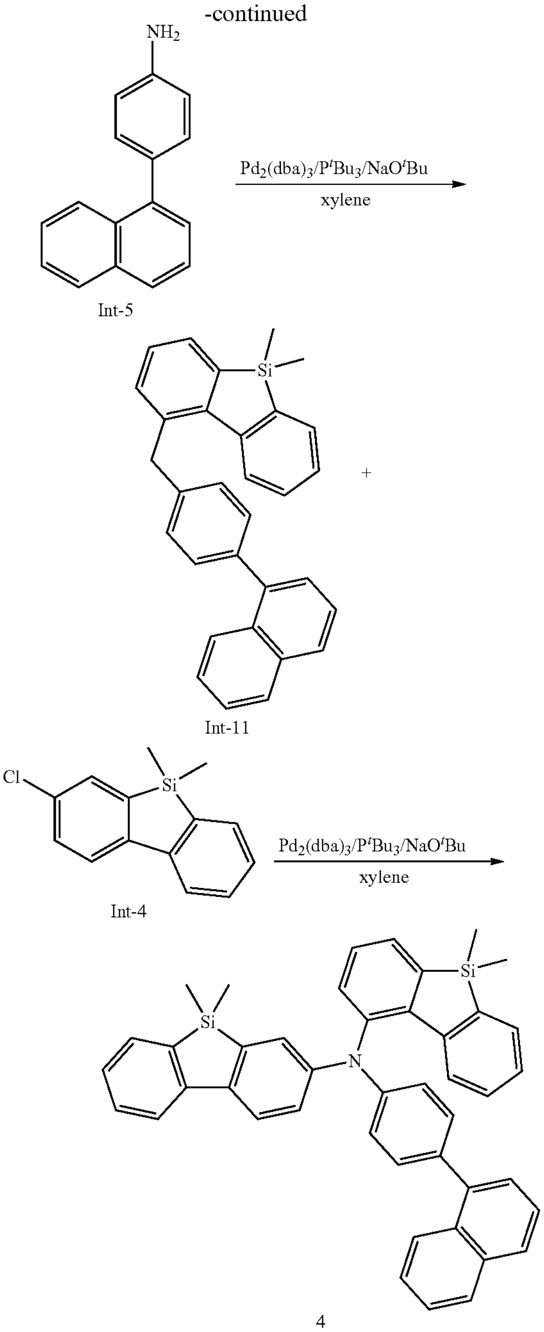

1st Step: Synthesis of Int-8

Int-6 (150 g, 530.2 mmol) was dissolved in 1.8 L of tetrahydrofuran (THF), and Int-7 (82.91 g, 530.02 mmol) and tetrakis(triphenylphosphine) palladium (18.38 g, 15.91 mmol) were added thereto and then, stirred. Subsequently, potassium carbonate (183.20 g, 1325.51 mmol) saturated in 900 ml of water was added thereto and then, heated at 80° C. and refluxed for 12 hours. When a reaction was completed, water was added to the reaction solution, and the mixture was extracted with ethyl acetate (EA), treated with magnesium sulfate anhydrous to remove moisture, filtered, and concentrated under a reduced pressure. The obtained residue was separated and purified through flash column chromatography to obtain 89.37 g (63%) of Int-8.

2nd Step: Synthesis of Int-9

Int-8 (89 g 332.65 mmol) was dissolved in 1 L of tetrahydrofuran (THF), and an internal temperature thereof was decreased down to −78° C. n-BuLi (160 ml, 399.18 mmol) was slowly added thereto in a dropwise fashion, while the internal temperature of −78° C. was maintained, and then, stirred at the temperature for 1 hour.

Subsequently, chlorodimethylsilane (47.66 ml, 415.81 mmol) was slowly added in a dropwise fashion, while the temperature of −78° C. was maintained, and then, stirred at ambient temperature for 12 hours. When a reaction was completed, water was added to the reaction solution, and the mixture was extracted with ethyl acetate (EA), treated with magnesium sulfate anhydrous to remove moisture, filtered, and concentrated under a reduced pressure. The obtained residue was separated and purified through flash column chromatography to obtain 53.37 g (65%) of Int-9.

3rd Step: Synthesis of Int-10

Int-9 (53.0 g 214.74 mmol) was dissolved in 850 mL of trifluoromethylbenzene, and di-tert-butyl peroxide (120 ml, 644.22 mmol) was slowly added thereto in a dropwise fashion. The obtained mixture was heated and refluxed at an internal temperature of 120° C. for 48 hours. When a reaction was completed, the reaction solution was cooled down to ambient temperature, and 400 ml of water was added thereto and then, stirred for 1 hour. The mixture was extracted with ethyl acetate (EA), treated with magnesium sulfate anhydrous to remove moisture, filtered, and concentrated under a reduced pressure. The obtained residue was separated and purified through flash column chromatography to obtain 56.52 g (75%) of Int-10.

4th Step: Synthesis of Int-11

5.72 g (23.4 mmol) of Int-10, 6.67 g (30.40 mmol) of Int-5, 5.62 g (58.46 mmol) of sodium t-butoxide, and 0.95 g (2.34 mmol) of tri-tert-butylphosphine were dissolved in 230 ml of xylene, and 1.07 g (1.17 mmol) of $Pd_2(dba)_3$ was added thereto and then, refluxed and stirred under a nitrogen atmosphere for 12 hours. When a reaction was completed, an organic layer was extracted with xylene and distilled water, treated with magnesium sulfate anhydrous to remove moisture, and filtered, and a filtrate therefrom was concentrated under a reduced pressure. The obtained residue was purified with n-hexane/dichloromethane (a volume ratio of 2:1) through silica gel column chromatography to obtain 6.40 g (64%) of Int-11.

5th step: Synthesis of Compound 4

6.30 g (14.73 mmol) of Int-11, 3.61 g (14.73 mmol) of Int-4, 3.54 g (36.83 mmol) of sodium t-butoxide, and 0.60 g (1.47 mmol) of tri-tert-butylphosphine were dissolved in 120 ml of xylene, and 0.68 g (0.74 mmol) of $Pd_2(dba)_3$ was added thereto and then, refluxed and stirred under a nitrogen atmosphere for 12 hours. When a reaction was completed, an organic layer was extracted therefrom with xylene and distilled water, treated with magnesium sulfate anhydrous to remove moisture, and filtered, and concentrated under a reduced pressure. The obtained residue was purified with n-hexane/dichloromethane (in a volume ratio of 2:1) through silica gel column chromatography to obtain 6.6 g (Yield: 70%) of Compound 4.

calcd. C44H37NSi2:C, 83.10; H, 5.86; N, 2.20; Si, 8.83; found:C, 83.11; H, 5.86; N, 2.20; Si, 8.82

Synthesis Examples 3 to 18

Each compound was synthesized according to the same method as Synthesis Example 1 or 2 except that Int A shown in Table 1 was used instead of Int-4 of Synthesis Example 1 or 2, and Int B shown in Table 1 was used instead of Int-6 of Synthesis Example 1 or Int-11 of Synthesis Example 2.

TABLE 1

| Synthesis Examples | Int A | Int B | Final product | Amount (Yield) | Property data of final product |
|---|---|---|---|---|---|
| Synthesis Example 3 | 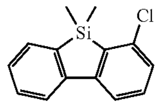<br>Int-12 | 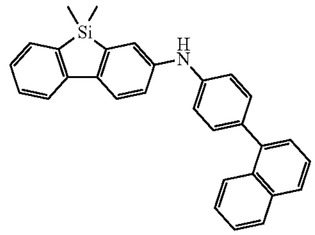<br>Int-13 | Compound 1 | 6.74 g (68%) | calcd. C44H37NSi2: C, 83.10; H, 5.86; N, 2.20; Si, 8.83 found: C, 83.11; H, 5.86; N, 2.19; Si, 8.83 |
| Synthesis Example 4 | 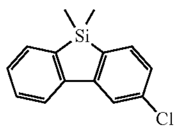<br>Int-14 | Int 13 | Compound 3 | 5.02 g (67%) | calcd. C44H37NSi2: C, 83.10; H, 5.86; N, 2.20; Si, 8.83 found: C, 83.10; H, 5.86; N, 2.20; Si, 8.83 |
| Synthesis Example 5 | Int-14 | 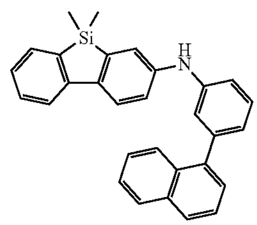<br>Int-15 | Compound 7 | 4.48 g (65%) | calcd. C44H37NSi2: C, 83.10; H, 5.86; N, 2.20; Si, 8.83 found: C, 83.11; H, 5.86; N, 2.20; Si, 8.82 |
| Synthesis Example 6 | Int-4 | 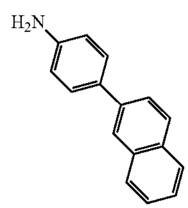<br>Int-16 | Compound 14 | 7.33 g (73%) | calcd. C44H37NSi2: C, 83.10; H, 5.86; N, 2.20; Si, 8.83 found: C, 83.10; H, 5.86; N, 2.20; Si, 8.83 |
| Synthesis Example 7 | Int-14 | 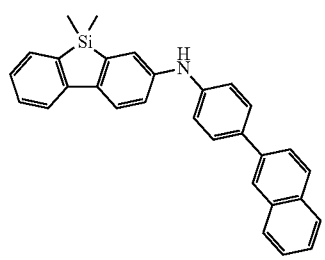<br>Int-17 | Compound 15 | 6.49 g (75%) | calcd. C44H37NSi2: C, 83.10; H, 5.86; N, 2.20; Si, 8.83 found: C, 83.11; H, 5.85; N, 2.20; Si, 8.83 |
| Synthesis Example 8 | Int-10 | Int-17 | Compound 16 | 6.02 g (74%) | calcd. C44H37NSi2: C, 83.10; H, 5.86; N, 2.20; Si, 8.83 found: C, 83.11; H, 5.86; N, 2.19; Si, 8.83 |

TABLE 1-continued

| Synthesis Examples | Int A | Int B | Final product | Amount (Yield) | Property data of final product |
|---|---|---|---|---|---|
| Synthesis Example 9 | Int-14 | 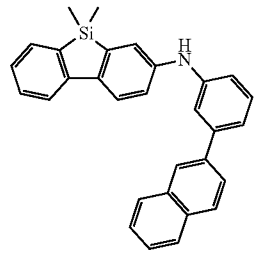 Int-18 | Compound 19 | 4.55 g (70%) | calcd. C44H37NSi2: C, 83.10; H, 5.86; N, 2.20; Si, 8.83 found: C, 83.10; H, 5.86; N, 2.20; Si, 8.83 |
| Synthesis Example 10 | Int-4 | 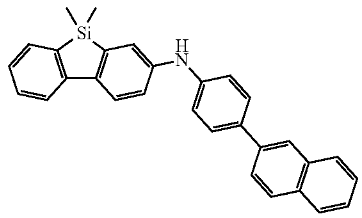 Int-19 | Compound 42 | 5.78 g (66%) | calcd. C50H41NSi2: C, 84.34; H. 5.80; N, 1.97; Si, 7.89 found: C, 84.34; H, 5.80; N, 1.97; Si, 7.89 |
| Synthesis Example 11 | Int-14 | Int-19 | Compound 43 | 4.70 g (68%) | calcd. C50H41NSi2: C, 84.34; H, 5.80; N, 1.97; Si, 7.89 found: C, 84.34; H, 5.80; N, 1.96; Si, 7.80 |
| Synthesis Example 12 | Int-10 | Int-19 | Compound 44 | 5.88 g (70%) | calcd. C50H41NSi2: C, 84.34; H, 5.80; N, 1.97; Si, 7.89 found: C, 84.34; H, 5.80; N, 1.97; Si, 7.89 |
| Synthesis Example 13 | Int-4 | 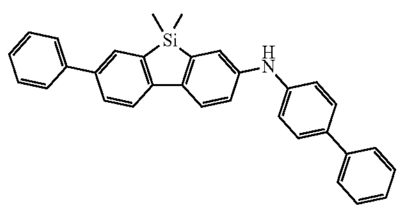 Int-20 | Compound 54 | 4.26 g (72%) | calcd. C46H39NSi2: C, 83.46; H, 5.94; N, 2.12; Si, 8.48 found: C, 83.47; H, 5.94; N, 2.11; Si, 8.48 |
| Synthesis Example 14 | Int-14 | Int-20 | Compound 55 | 4.09 g (75%) | calcd. C46H39NSi2: C, 83.46; H, 5.94; N, 2.12; Si, 8.48 found: C, 83.46; H, 5.95; N, 2.11; Si, 8.48 |
| Synthesis Example 15 | Int-4 | 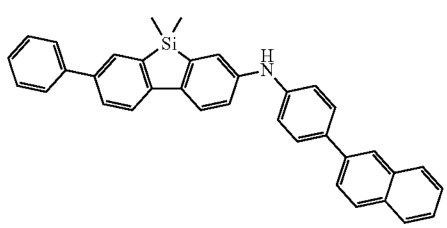 Int-21 | Compound 66 | 4.58 g (67%) | calcd. C50H41NSi2: C, 84.34; H, 5.80; N, 1.97; Si, 7.89 found: C, 84.34; H, 5.80; N, 1.97; Si, 7.89 |

TABLE 1-continued

| Synthesis Examples | Int A | Int B | Final product | Amount (Yield) | Property data of final product |
|---|---|---|---|---|---|
| Synthesis Example 16 | Int-14 | Int-21 | Compound 67 | 5.90 g (69%) | calcd. C50H41NSi2: C, 84.34; H, 5.80; N, 1.97; Si, 7.89 found: C, 84.34; H, 5.80; N, 1.97; Si, 7.89 |
| Synthesis Example 17 | Int-10 | Int-21 | Compound 68 | 5.86 g (67%) | calcd. C50H41NSi2: C, 84.34; H, 5.80; N, 1.97; Si, 7.89 found: C, 84.34; H, 5.80; N, 1.97; Si, 7.89 |
| Synthesis Example 18 | 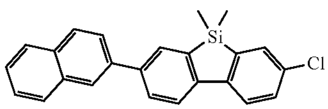 Int-22 | 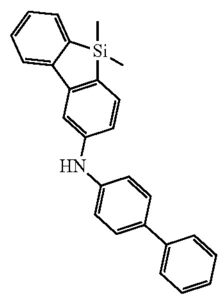 Int-23 | Compound 83 | 6.97 g (76%) | calcd. C50H41NSi2: C, 84.34; H, 5.80; N, 1.97; Si, 7.89 found: C, 84.35; H, 5.79; N, 1.97; Si, 7.89 |

Comparative Synthesis Examples 1 to 4

Each comparative compound was synthesized according to the same method as Synthesis Example 1 or 2 except that Int A shown in Table 2 was used instead of Int-4 of Synthesis Example 1 or 2, and Int B shown in Table 2 was used instead of Int-11.

TABLE 2

| Comparative Synthesis Example | Int A | Int B | Final product | Amount (Yield) | Property data of final product |
|---|---|---|---|---|---|
| Comparative Synthesis Example 1 | 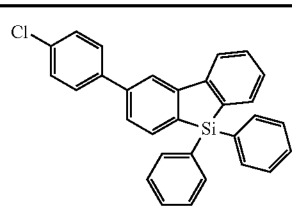 Int-24 | 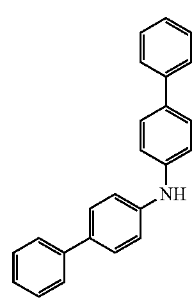 Int-25 | Comparative Compound 1 | 8.26 g (74%) | calcd. C54H39NSi: C, 88.85; H, 5.39; N, 1.92; Si, 3.85 found: C, 88.85; H, 5.39; N, 1.92; Si, 3.85 |
| Comparative Synthesis Example 2 | 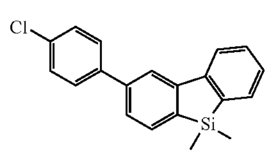 Int-26 | Int-25 | Comparative Compound 2 | 6.85 g (72%) | calcd. C44H35NSi: C, 87.23; H, 5.82; N, 2.31; Si, 4.64 found: C, 87.24; H, 5.82; N, 2.30; Si, 4.64 |

TABLE 2-continued
| Comparative Synthesis Example | Int A | Int B | Final product | Amount (Yield) | Property data of final product |
|---|---|---|---|---|---|
| Comparative Synthesis Example 3 | 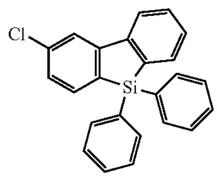 Int-43 | 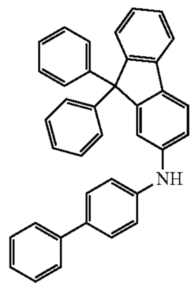 Int-27 | Comparative Compound 3 | 7.20 g (70%) | calcd. C67H47NSi: C, 89.99; H, 5.30; N, 1.57; Si, 3.14 found: C, 89.99; H, 5.30; N, 1.57; Si, 3.14 |
| Comparative Synthesis Example 4 | Int-24 | 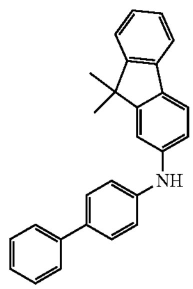 Int-28 | Comparative Compound 4 | 7.07 g (73%) | calcd. C57H43NSi: C, 88.91; H, 5.63; N, 1.82; Si, 3.65 found: C, 88.91; H, 5.63; N, 1.82; Si, 3.65 |
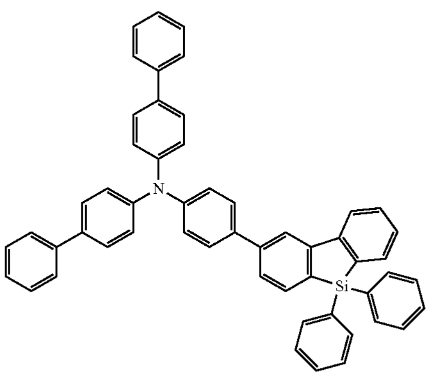
<Comparative Compound 1>
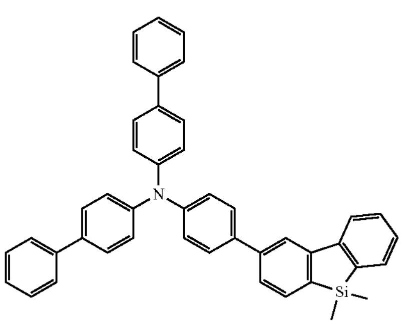
<Comparative Compound 2>

TABLE 2-continued
| Comparative Synthesis Example | Int A | Int B | Final product | Amount (Yield) | Property data of final product |
|---|---|---|---|---|---|
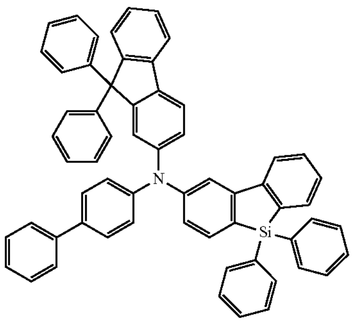
<Comparative Compound 3>
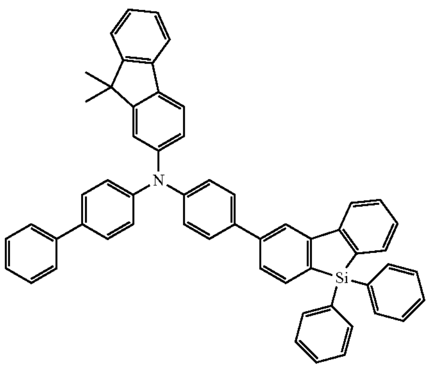
<Comparative Compound 4>
Synthesis of Second Compound
Synthesis Example 19: Synthesis of Compound A-3
[Reaction Scheme 3]
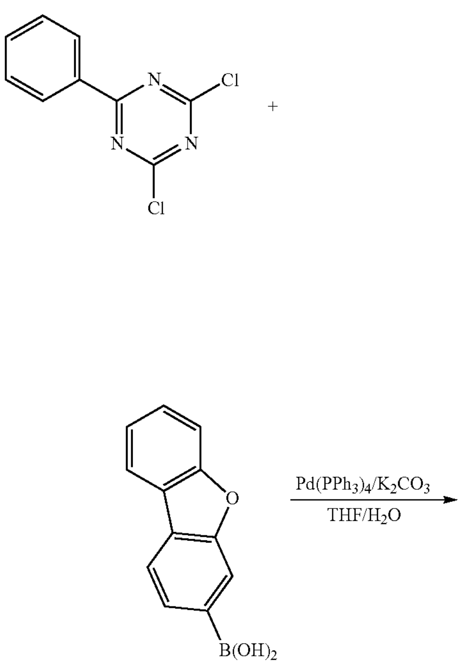
-continued
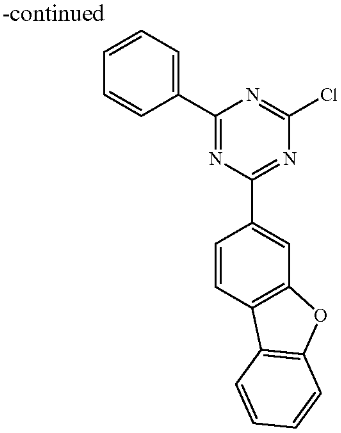
Int-29
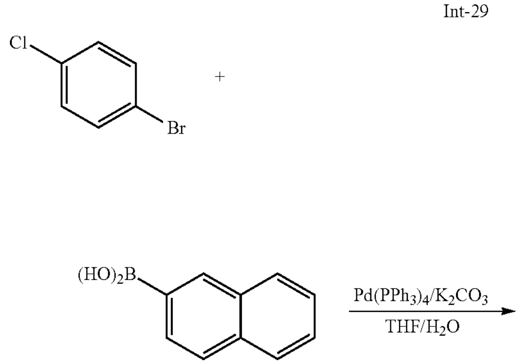

-continued

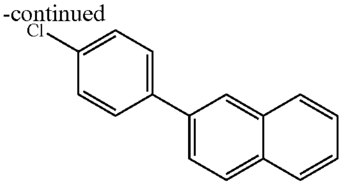

Int-30

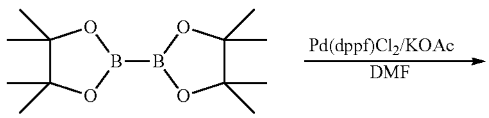

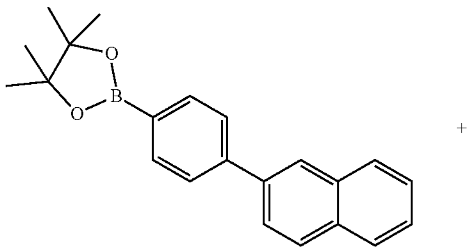

Int-31

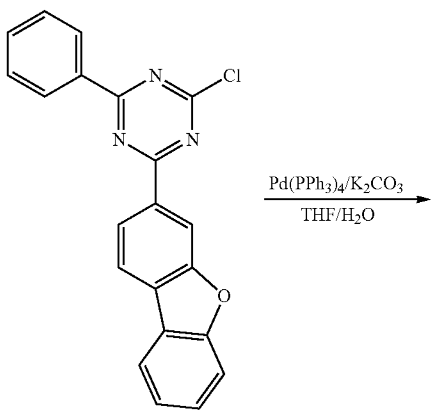

Int-29

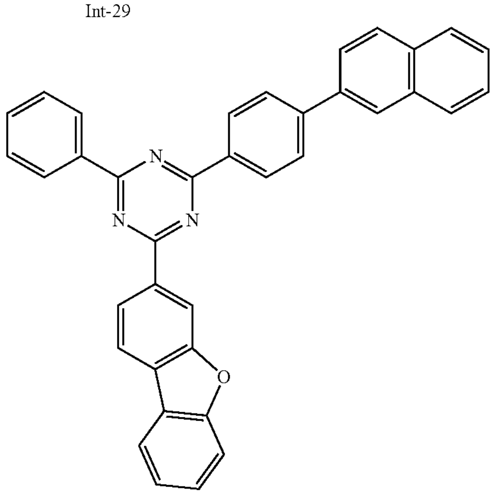

A-3

1st Step: Synthesis of Int-29

22.6 g (100 mmol) of 2,4-dichloro-6-phenyl-1,3,5-triazine was added to 200 mL of tetrahydrofuran and 100 mL of distilled water in a round-bottomed flask, and 0.9 equivalent of dibenzofuran-3-boronic acid (CAS No.: 395087-89-5), 0.03 equivalents of tetrakis(triphenylphosphine) palladium, and 2 equivalents of potassium carbonate were added thereto and then, heated and refluxed under a nitrogen atmosphere. After 6 hours, the reaction solution was cooled down, and an organic layer obtained after removing an aqueous layer therefrom was dried under a reduced pressure. The obtained solid was washed with water and hexane and recrystallized with 200 mL of toluene to obtain 21.4 g (Yield: 60%) of Int-29.

2nd Step: Synthesis of Int-30

50.0 g (261.16 mmol) of 1-bromo-4-chloro-benzene, 44.9 g (261.16 mmol) of 2-naphthalene boronic acid, 9.1 g (7.83 mmol) of tetrakis(triphenylphosphine) palladium, and 71.2 g (522.33 mmol) of potassium carbonate were dissolved in 1,000 mL of tetrahydrofuran and 500 mL of distilled water in a round-bottomed flask and then, heated and refluxed under a nitrogen atmosphere. After 6 hours, the reaction solution was cooled down, and an organic layer obtained after removing an aqueous layer therefrom was dried under a reduced pressure. The obtained solid was washed with water and hexane and recrystallized with 200 mL of toluene to obtain 55.0 g (Yield: 88%) of Int-30.

3rd Step: Synthesis of Int-31

100.0 g (418.92 mmol) of the synthesized Int-30 was added to 1,000 mL of DMF in a round-bottomed flask, and 17.1 g (20.95 mmol) of dichlorodiphenylphosphinoferrocene palladium, 127.7 g (502.70 mmol) of bispinacolato diboron, and 123.3 g (1256.76 mmol) of potassium acetate were added thereto and then, heated and refluxed under a nitrogen atmosphere for 12 hours. The reaction solution was cooled down and added to 2 L of water in a dropwise fashion to catch a solid. The obtained solid was dissolved in boiling toluene and filtered in silica gel, and a filtrate therefrom was concentrated. The concentrated solid was stirred with a small amount of hexane and then, filtered to obtain 28.5 g (Yield: 70%) of Int-31.

4th Step: Synthesis of Compound A-3

10.0 g (27.95 mmol) of Int-31, 11.1 g (33.54 mmol) of Int-29, 1.0 g (0.84 mmol) of tetrakis(triphenylphosphine) palladium, and 7.7 g (55.90 mmol) of potassium carbonate were dissolved in 150 mL of tetrahydrofuran and 75 mL of distilled water in a round-bottomed flask and then, heated and refluxed under a nitrogen atmosphere. After 12 hours, the reaction solution was cooled down, and an organic layer obtained after removing an aqueous layer therefrom was dried under a reduced pressure. The obtained solid was washed with water and methanol and then, recrystallized with 200 mL of toluene to obtain 13.4 g (Yield: 91%) of Compound A-3.

calcd. C37H23N3O:C, 84.55; H, 4.41; N, 7.99; O, 3.04; found : C, 84.55; H, 4.41; N, 8.00; O, 3.03

Synthesis Example 20: Synthesis of Compound A-71

[Reaction Scheme 4]

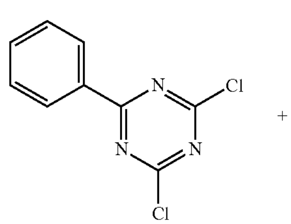

-continued

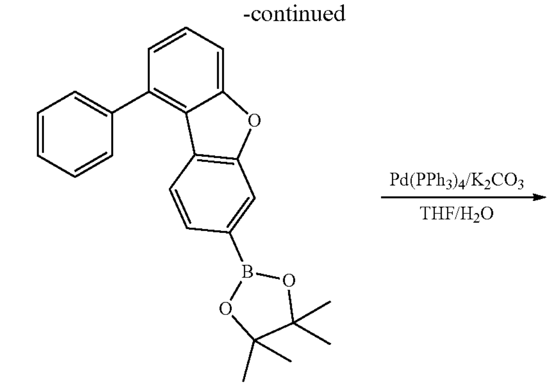

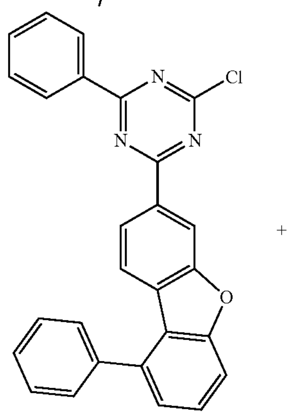

Int-32

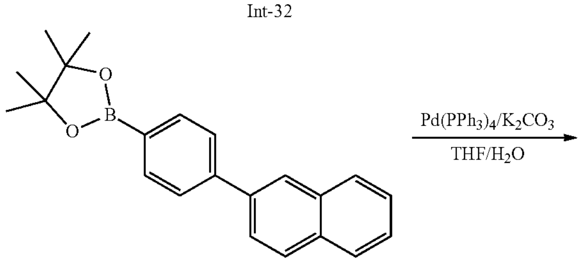

Int-31

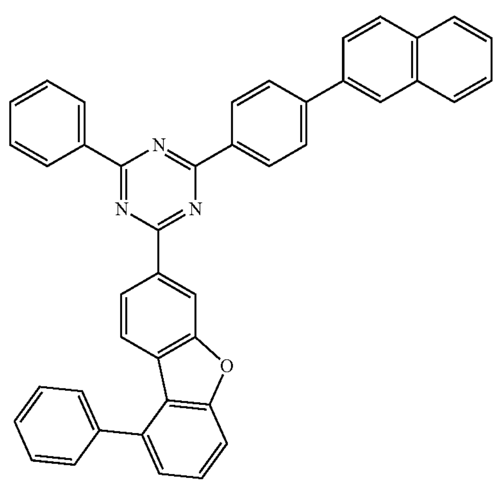

A-71

1st Step: Synthesis of Int-32

Int-32 was synthesized according to the same method as Int-29 of Synthesis Example 19 except that 2,4-dichloro-6-phenyl-1,3,5-triazine and 1-phenyl-7-(4,4,5,5-tetramethyl-[1,3,2]dioxaborolan-2-yl)-dibenzofuran were each used in 1.0 equivalent.

2nd Step: Synthesis of Compound A-71

Compound A-71 was synthesized according to the same method as the 4th step of Synthesis Example 19 except that Int-32 and Int-31 were each used in 1.0 equivalent.

calcd. C43H27N3O:C, 85.83; H, 4.52; N, 6.98; O, 2.66; found : C, 85.83; H, 4.52; N, 6.98; O, 2.66

Synthesis Example 21: Synthesis of Compound A-61

[Reaction Scheme 5]

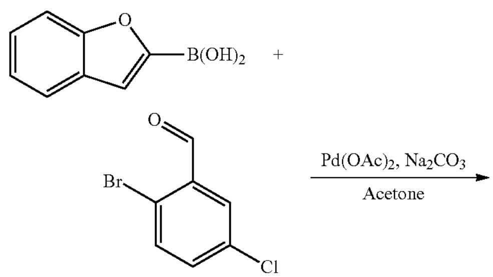

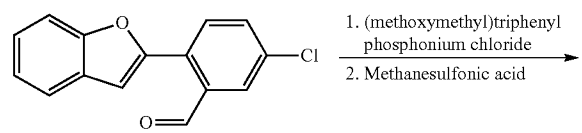

Int-33

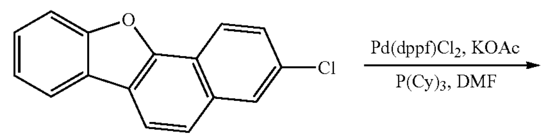

Int-34

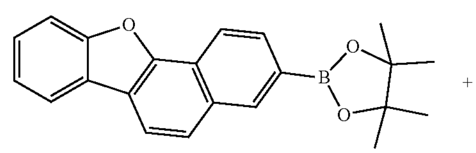

Int-35

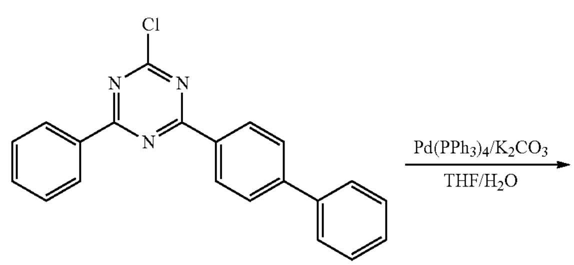

Int-36

-continued

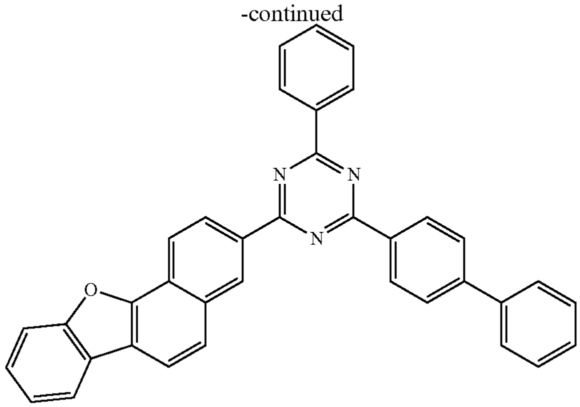

A-61

1st Step: Synthesis of Int-33

21.95 g (135.53 mmol) of 2-benzofuranylboronic acid, 26.77 g (121.98 mmol) of 2-bromo-5-chlorobenzaldehyde, 2.74 g (12.20 mmol) of $Pd(OAc)_2$, and 25.86 g (243.96 mmol) of $Na_2CO_3$ were suspended in 200 ml of acetone/220 ml of distilled water in a round-bottomed flask and then, stirred for 12 hours at ambient temperature. When a reaction was completed, the resultant was concentrated and extracted with methylene chloride, and an organic layer therefrom was silica gel-columned to obtain 21.4 g (Yield: 68%) of Int-33.

2nd Step: Synthesis of Int-34

20.4 g (79.47 mmol) of Int-33 and 29.97 g (87.42 mmol) of (methoxymethyl)triphenyl phosphonium chloride were suspended in 400 ml of THF, and 10.70 g (95.37 mmol) of potassium tert-butoxide was added thereto and then, stirred for 12 hours at ambient temperature. When a reaction was completed, 400 ml of distilled water was added thereto and then, extracted, an organic layer obtained therefrom was concentrated and reextracted with methylene chloride, then, magnesium sulfate was added thereto and then, stirred for 30 minutes and filtered, and a filtrate therefrom was concentrated. Subsequently, 100 ml of methylene chloride was added to the concentrated filtrate, and 10 ml of methanesulfonic acid was added thereto and then, stirred for 1 hour.

When a reaction was completed, a solid produced therein was filtered and washed with distilled water and methyl alcohol to obtain 21.4 g (Yield: 65%) of Int-34.

3rd Step: Synthesis of Int-35

12.55 g (49.66 mmol) of Int-34, 2.43 g (2.98 mmol) of $Pd(dppf)Cl_2$, 15.13 g (59.60 mmol) of bis(pinacolato)diboron, 14.62 g (148.99 mmol) of KOAc, and 3.34 g (11.92 mmol) of $P(Cy)_3$ were suspended in 200 ml of DMF and then, refluxed and stirred 12 hours. When a reaction was completed, 200 ml of distilled water was added thereto, and a solid produced therein was filtered and extracted with methylene chloride, and an organic layer therefrom was columned with Hexane:EA=4:1(v/v) to obtain 13 g (Yield: 76%) of Int-35.

4th Step: Synthesis of Compound A-61

Compound A-61 was synthesized according to the same method as the 4th step of Synthesis Example 19 except that Int-35 and Int-36 were each used by 1.0 equivalent.

calcd. C37H23N3O:C, 84.55; H, 4.41; N, 7.99; O, 3.04; found:C, 84.55; H, 4.41; N, 7.99; O, 3.04

Synthesis Example 22: Synthesis of Compound A-17

[Reaction Scheme 6]

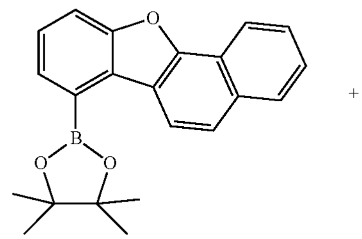

Int-37

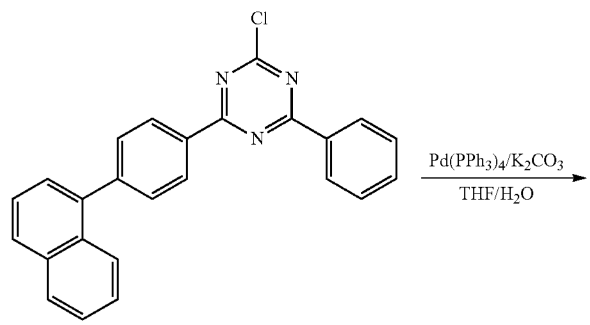

Int-38

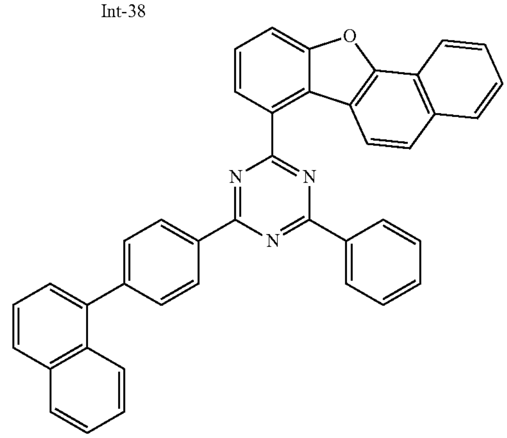

A-17

Compound A-17 was synthesized according to the same method as the 4th step of Synthesis Example 19 except that Int-37 and Int-38 were each used by 1.0 equivalent.

calcd. C41H25N3O:C, 85.54; H, 4.38; N, 7.30; O, 2.78; found:C, 85.53; H, 4.38; N, 7.30; O, 2.77

Synthesis Example 23: Synthesis of Compound A-37

[Reaction Scheme 7]

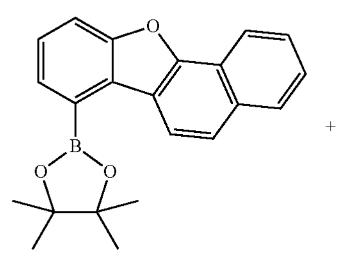

Int-37

-continued

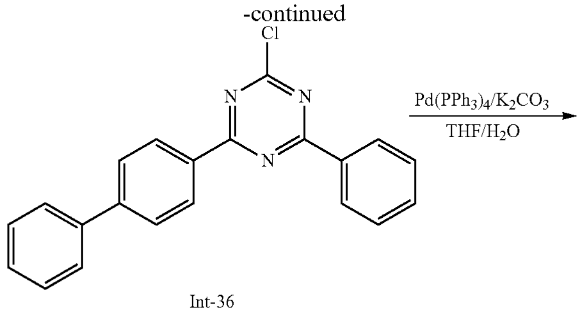

Int-36

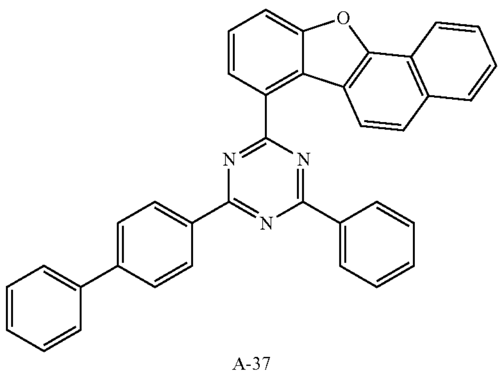

A-37

Compound A-37 was synthesized according to the same method as the 4th step of Synthesis Example 19 except that Int-37 and Int-36 were each used by 1.0 equivalent.

calcd. C37H23N3O:C, 84.55; H, 4.41; N, 7.99; O, 3.04; found: C, 84.57; H, 4.40; N, 7.99; O, 3.03

Synthesis of Synthesis Examples 24 to 26

Each compound was synthesized according to the same method as the 4th step of Synthesis Example 19 except that Int C of Table 3 was used instead of Int-31 of Synthesis Example 19, and Int D of Table 3 was used instead of Int-29.

TABLE 3

| Synthesis Examples | Int C | Int D | Final product | Amount (Yield) | Property data of final product |
|---|---|---|---|---|---|
| Synthesis Example 24 | 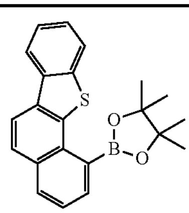 Int-39 | Int-38 | Compound A-24 | 8.33 g (74%) | calcd. C41H25N35: C, 83.22; H, 4.26; N, 7.10; S, 5.42 found: C, 83.22; H, 4.26; N, 7.10; S, 5.42 |
| Synthesis Example 25 | 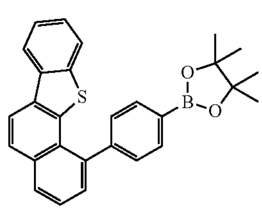 Int-44 | 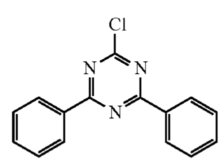 Int-40 | Compound A-77 | 6.29 g (71%) | calcd. C37H23N3S: C, 82.04; H, 4.28; N, 7.76; S, 5.92 found : C, 82.04; H, 4.28; N, 7.76; S, 5.92 |
| Synthesis Example 26 | 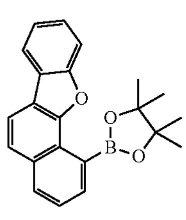 Int-41 | 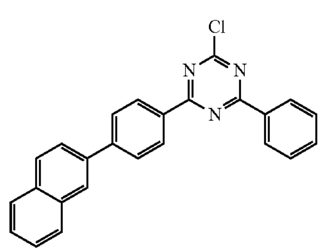 Int-42 | Compound A-35 | 7.67 g (71%) | calcd. C41H25N30: C, 85.54; H, 4.38; N, 7.30; 0, 2.78 found: C, 85.55; H, 4.38; N, 7.29; 0, 2.7 |

(Manufacture of Organic Light Emitting Diode)

EXAMPLE 1

The glass substrate coated with ITO (Indium tin oxide) was washed with distilled water and ultrasonic waves. After washing with the distilled water, the glass substrate was ultrasonically washed with isopropyl alcohol, acetone, or methanol, and dried and then, moved to a plasma cleaner, cleaned by using oxygen plasma for 10 minutes, and moved to a vacuum depositor. This obtained ITO transparent electrode was used as an anode, Compound A doped with 1% NDP-9 (available from Novaled) was vacuum-deposited on the ITO substrate to form a 1,400 Å-thick hole transport layer, and Compound B was deposited on the hole transport layer to form a 600 Å-thick hole transport auxiliary layer. On the hole transport auxiliary layer, a 400 Å-thick light emitting layer was formed by vacuum-depositing Compound 2 obtained in Synthesis Example 1 and Compound A-17 obtained in Synthesis Example 19 as a host simultaneously and doping 2 wt % of [$Ir(piq)_2acac$] as a dopant. Herein, Compound 2 and Compound A-17 were used with a weight ratio of 5:5. Subsequently, Compound C was deposited on the light emitting layer to form a 50 Å-thick electron transport auxiliary layer, and Compound D and LiQ were simultaneously vacuum-deposited at a weight ratio of 1:1 to form a 300 Å-thick electron transport layer. On the electron transport layer, Liq and Al were sequentially vacuum-deposited to be 15 Å thick and 1,200 Å thick, manufacturing an organic light emitting diode having the following structure.

ITO/Compound A (1% NDP-9 doping, 1,400 Å)/Compound B (600 Å)/EML [98 wt % of host (Compound 2:Compound A-17=50:50 (wt %):2 wt % of [$Ir(piq)_2acac$]] (400 Å)/Compound C (50 Å)/Compound D:Liq (300 Å)/LiQ (15 Å)/Al (1,200 Å).

Compound A: N-(biphenyl-4-yl)-9,9-dimethyl-N-(4-(9-phenyl-9H-carbazol-3-yl)phenyl)-9H-fluoren-2-amine Compound B: N,N-di ([1,1'-biphenyl]-4-yl)-7,7-dimethyl-7H-fluoreno[4,3-b]benzofuran-10-amine Compound C: 2-(3-(3-(9,9-dimethyl-9H-fluoren-2-yl) phenyl)phenyl)-4,6-diphenyl-1,3,5-triazine Compound D: 8-(4-(4,6-di(naphthalen-2-yl)-1,3,5-triazin-2-yl)phenyl)quinoline

EXAMPLES 2 TO 27 AND COMPARATIVE EXAMPLES 1 TO 4

Diodes of Examples 2 to 27 and Comparative Examples 1 to 4 were manufactured in the same manner as in Example 1, except that the host was changed as described in Table 4.

Evaluation: Effect of Life-Span Synergy Effect (1) Measurement of Current Density Change Depending on Voltage Change The obtained organic light emitting diodes were measured regarding a current value flowing in the unit diode, while increasing the voltage from 0 V to 10 V using a current-voltage meter (Keithley 2400), and the measured current value was divided by area to provide the results.

(2) Measurement of Luminance Change Depending on Voltage Change

Luminance was measured by using a luminance meter (Minolta Cs-1000A), while the voltage of the organic light emitting diodes was increased from 0 V to 10 V.

(3) Measurement of Luminous Efficiency

The luminous efficiency (cd/A) of the same current density (10 mA/cm$^2$) was calculated using the luminance and current density measured from the (1) and (2).

(4) Measurement of Life-span

While maintaining the luminance (cd/m$^2$) at 5,000 cd/m$^2$, the time for the luminous efficiency (cd/A) to decrease to 90% was measured to obtain the results.

(5) Measurement of Driving Voltage

The driving voltage of each diode at 15 mA/cm$^2$ using a current-voltmeter (Keithley 2400) was measured to obtain the results.

(6) T90 Life-span Ratio (%)

T90 (h) of Comparative Example 4 in Table 4 as a reference value was used to calculate a relative value of each T90 (h), and the results are shown in Table 4.

(7) Driving Voltage Ratio (%)

A driving voltage of Comparative Example 4 in Table 4 was used as a reference value to calculate a relative value of each driving voltage, and the results are shown in Table 4.

(8) Luminous Efficiency Ratio (%)

Luminous efficiency (cd/A) of Comparative Example 4 in Table 4 was used as a reference value to calculate a relative value of each luminous efficiency (cd/A), and the results are shown in Table 4.

TABLE 4

| | First host | Second host | Driving voltage (V) | Luminous efficiency (cd/A) | Life-span T90 (h) |
|---|---|---|---|---|---|
| Example 1 | 1 | A-17 | 95% | 110% | 128% |
| Example 2 | 2 | | 91% | 115% | 133% |
| Example 3 | 3 | | 92% | 119% | 137% |
| Example 4 | 4 | | 94% | 117% | 135% |
| Example 5 | 7 | | 94% | 117% | 134% |
| Example 6 | 14 | | 89% | 118% | 137% |
| Example 7 | 15 | | 90% | 121% | 142% |
| Example 8 | 16 | | 92% | 117% | 139% |
| Example 9 | 19 | | 93% | 118% | 137% |
| Example 10 | 42 | | 91% | 115% | 132% |
| Example 11 | 43 | | 93% | 117% | 136% |
| Example 12 | 44 | | 94% | 115% | 133% |
| Example 13 | 54 | | 91% | 116% | 135% |
| Example 14 | 55 | | 93% | 118% | 137% |
| Example 15 | 66 | | 89% | 118% | 137% |
| Example 16 | 67 | | 90% | 121% | 143% |
| Example 17 | 68 | | 92% | 119% | 140% |
| Example 18 | 83 | | 90% | 117% | 137% |
| Example 19 | 3 | A-3 | 94% | 118% | 135% |
| Example 20 | 15 | | 91% | 120% | 139% |
| Example 21 | 55 | | 95% | 119% | 135% |
| Example 22 | 67 | | 91% | 121% | 140% |
| Example 23 | 83 | | 92% | 118% | 134% |
| Example 24 | 15 | A-35 | 94% | 119% | 139% |
| Example 25 | | A-37 | 92% | 117% | 136% |
| Example 26 | 67 | A-77 | 92% | 117% | 138% |
| Example 27 | | A-24 | 92% | 119% | 137% |
| Comparative Example 1 | Comparative Compound 1 | A-17 | 118% | 94% | 83% |
| Comparative Example 2 | Comparative Compound 2 | | 114% | 95% | 86% |
| Comparative Example 3 | Comparative Compound 3 | | 105% | 99% | 96% |
| Comparative Example 4 | Comparative Compound 4 | | 100% | 100% | 100% |

Referring to Table 4, the devices of the Examples exhibited greatly improved driving voltage, efficiency, and life-span compared with the Comparative Examples.

By way of summation and review, organic light emitting diodes (OLEDs) are attracting much attention in recent years due to increasing demands for flat panel display devices. The organic light emitting diode is a device that converts electrical energy into light, and the performance of the organic light emitting diode may be influenced by an organic material between electrodes.

One or more embodiments may provide a composition for an organic optoelectronic device having high efficiency and a long life-span.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A composition for an organic optoelectronic device, the composition comprising:

a first compound represented by Chemical Formula 1B; and a second compound represented by one of Chemical Formula 2A, Chemical Formula 2C, and Chemical Formula 2F,

[Chemical Formula 1B]

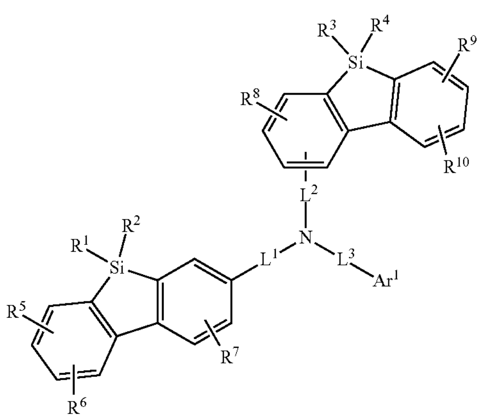

wherein, in Chemical Formula 1B, $Ar^1$ is a substituted or unsubstituted phenyl group, a substituted or unsubstituted biphenyl group, or a substituted or unsubstituted naphthyl group, $L^1$ to $L^3$ are each independently a single bond or a substituted or unsubstituted phenylene group, $R^1$ to $R^4$ are each independently a substituted or unsubstituted C1 to C10 alkyl group or a substituted or unsubstituted C6 to C20 aryl group, and $R^5$ to $R^{10}$ are each independently hydrogen, deuterium, a cyano group, a halogen, a substituted or unsubstituted amine group, a substituted or unsubstituted C1 to C10 alkyl group, or a substituted or unsubstituted C6 to C12 aryl group;

[Chemical Formula 2A]

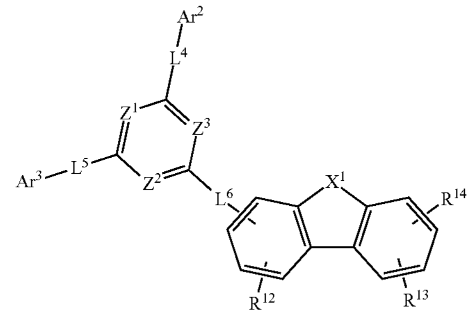

[Chemical Formula 2C]

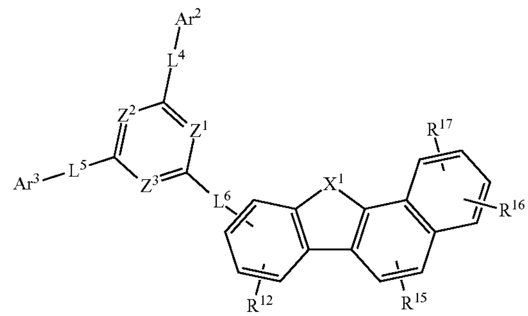

[Chemical Formula 2F]

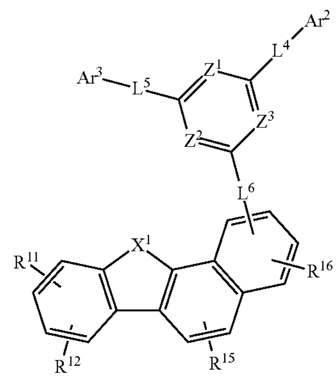

wherein, in Chemical Formula 2A, Chemical Formula 2C and Chemical Formula 2F, $X^1$ is O or S, $Z^1$ to $Z^3$ are each independently N or $CR^f$, at least two of $Z^1$ to $Z^3$ being N, $R^f$ and $R^{11}$ to $R^{17}$ are each independently hydrogen, deuterium, a cyano group, a substituted or unsubstituted C1 to C10 alkyl group, or a substituted or unsubstituted C6 to C12 aryl group, $L^4$ to $L^6$ are each independently a single bond or a substituted or unsubstituted phenylene group, $Ar^2$ and $Ar^3$ are each independently a substituted or unsubstituted phenyl group, a substituted or unsubstituted biphenyl group, a substituted or unsubstituted naphthyl group, a substituted or unsubstituted phenanthrenyl group, a substituted or unsubstituted triphenylene group, a substituted or unsubstituted dibenzofuranyl group, a substituted or unsubstituted dibenzothiophenyl group or a substituted or unsubstituted dibenzosilolyl group,

* is a linking point, and

"substituted" refers to replacement of at least one hydrogen of a substituent or a compound by deuterium, a C1 to C20 alkyl group, a C6 to C30 aryl group, or a cyano group.

2. The composition as claimed in claim 1, wherein the first compound is represented by Chemical Formula 1B-1, Chemical Formula 1B-2, or Chemical Formula 1B-3:

[Chemical Formula 1B-1]

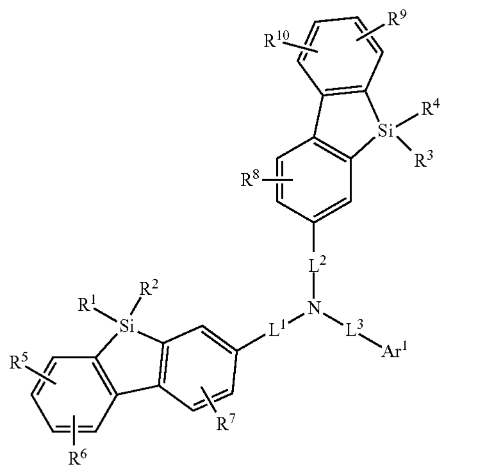

[Chemical Formula 1B-2]

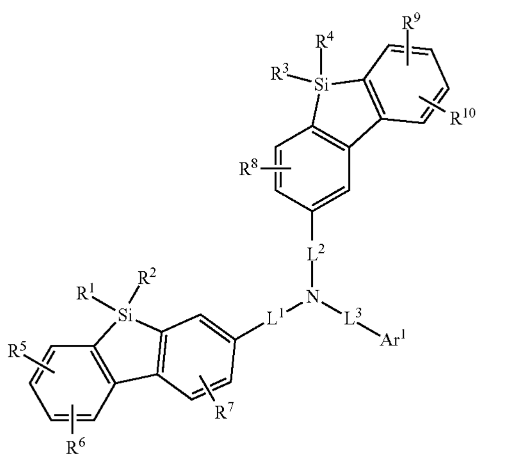

[Chemical Formula 1B-3]

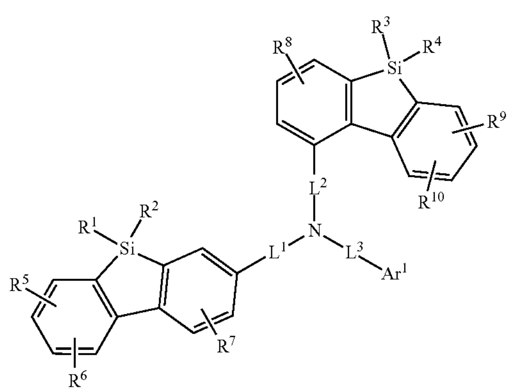

wherein, in Chemical Formula 1B-1, Chemical Formula 1B-2, and Chemical Formula 1B-3, $Ar^1$, $L^1$ to $L^3$, and $R^1$ to $R^{10}$ are defined the same as those of Chemical Formula 1B.

3. The composition as claimed in claim 2, wherein the first compound is represented by Chemical Formula 1B-1a, Chemical Formula 1B-2a, or Chemical Formula 1B-3a:

[Chemical Formula 1B-1a]

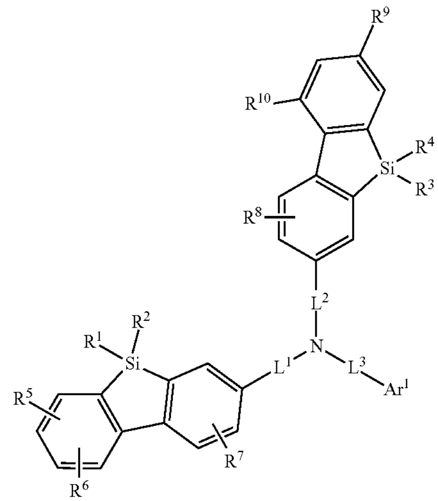

[Chemical Formula 1B-2a]

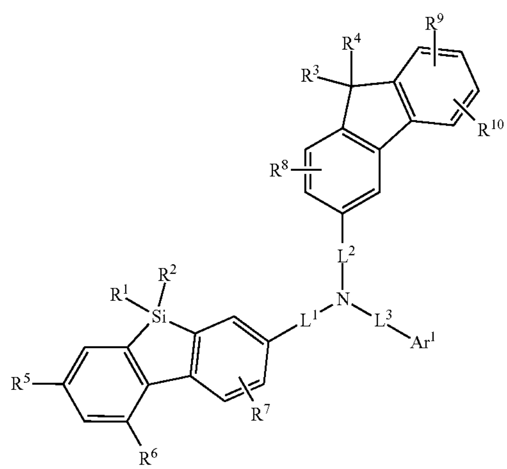

[Chemical Formula 1B-3a]

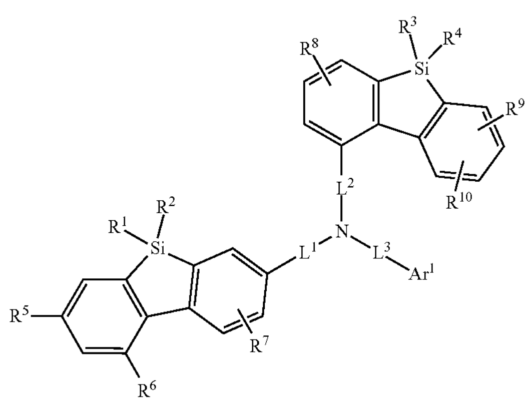

wherein, in Chemical Formula 1B-1a to Chemical Formula 1B-3a, $Ar^1$, $L^1$ to $L^3$, and $R^1$ to $R^{10}$ are defined the same as those of Chemical Formula 1B.

4. The composition as claimed in claim 1, wherein $Ar^1$ is substituted with a C6 to C12 aryl group.

5. The composition as claimed in claim 1, wherein:

$Ar^1$ is a group of Group II:

[Group II]

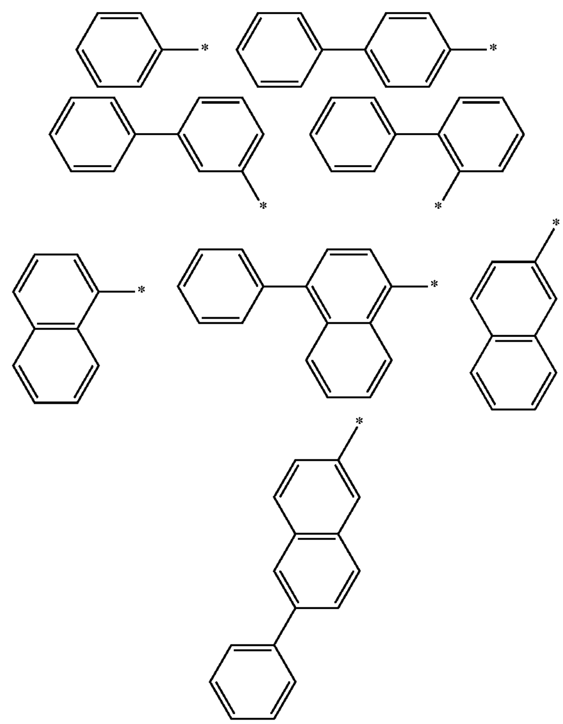

in Group II, * is a linking point.

6. The composition as claimed in claim 1, wherein the first compound is a compound of Group 1:

[Group 1]

1

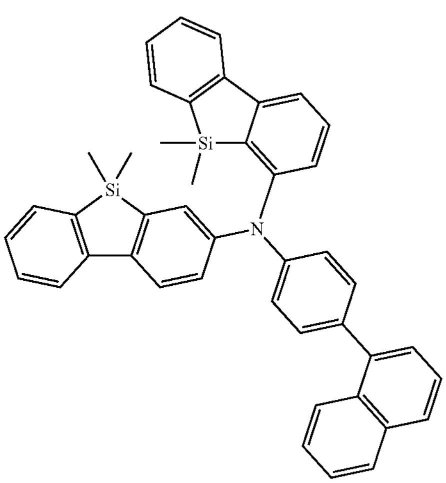

-continued

2

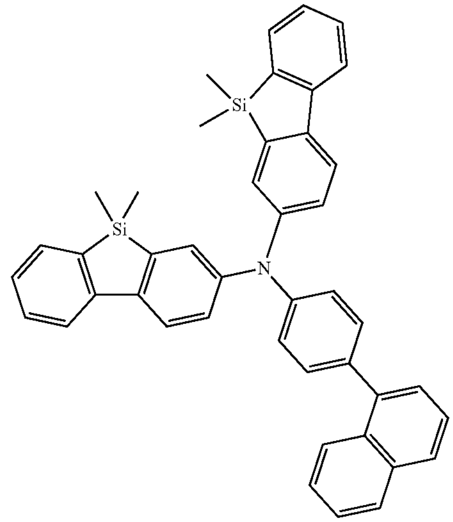

3

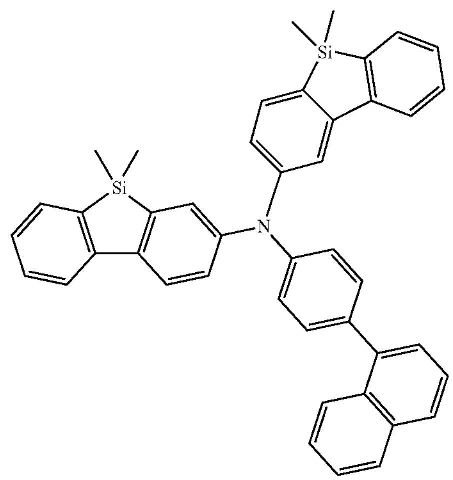

4

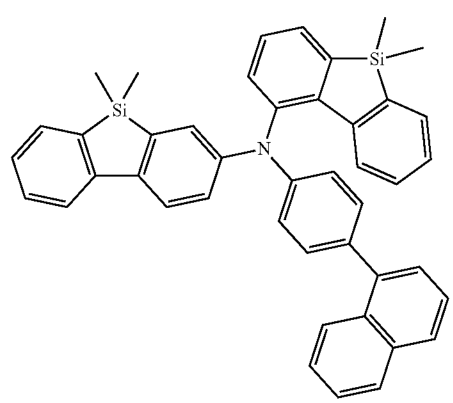

-continued
5
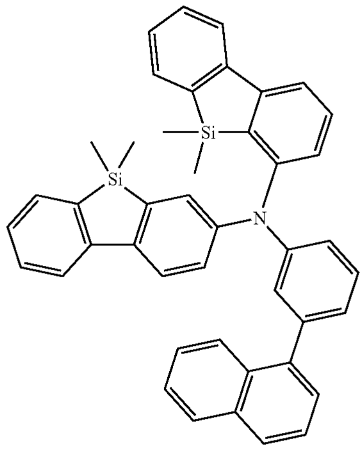
6
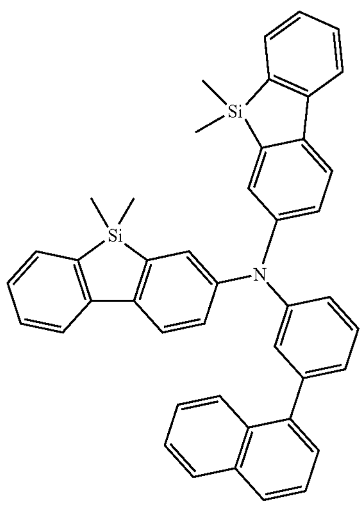
7
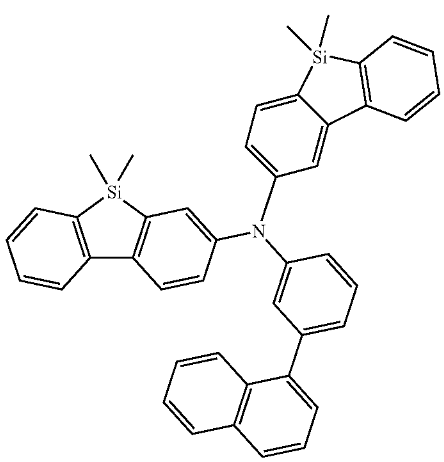
-continued
8
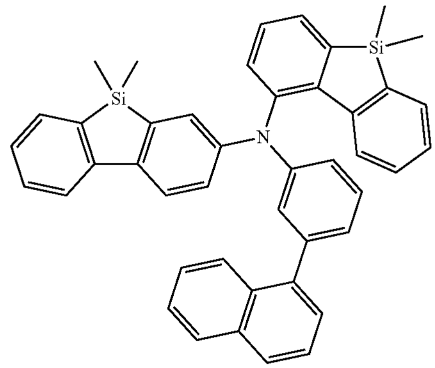
9
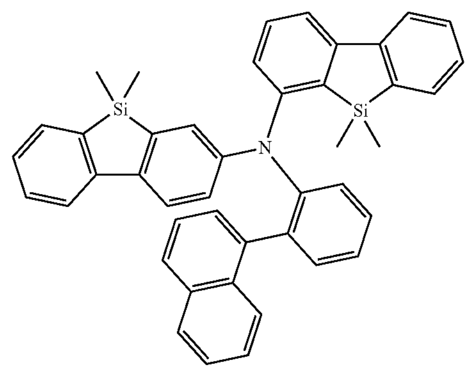
10
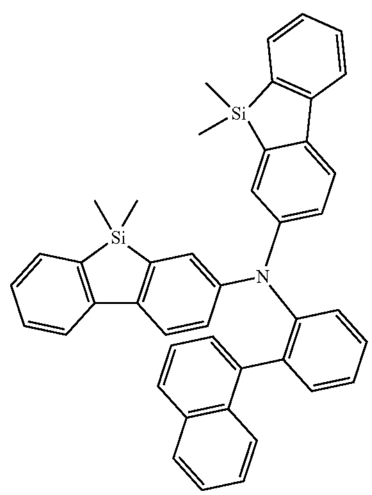

-continued
11
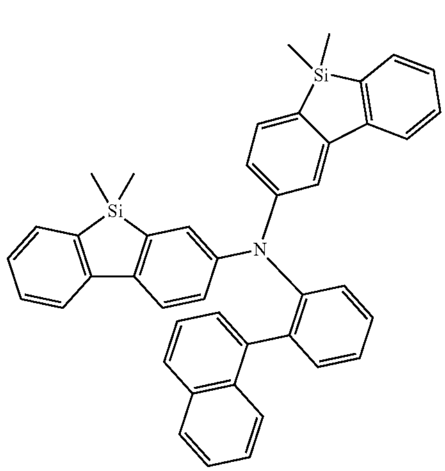
12
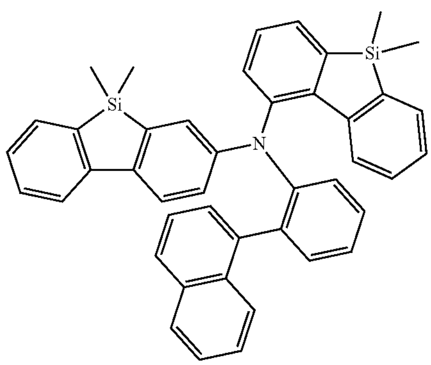
13
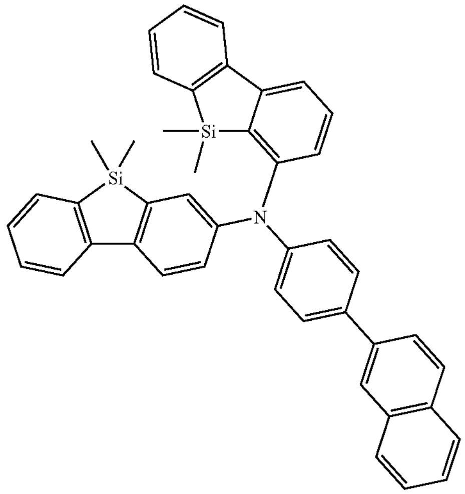
-continued
14
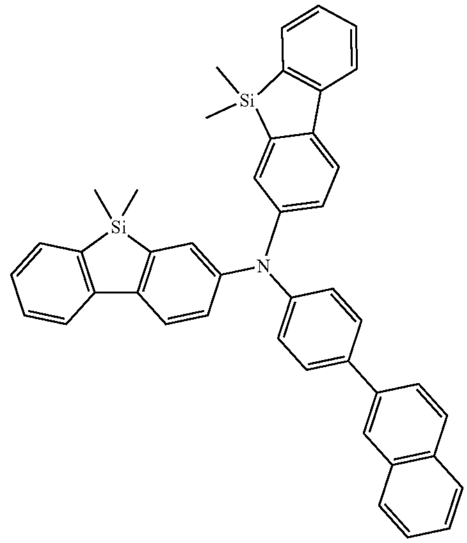
15
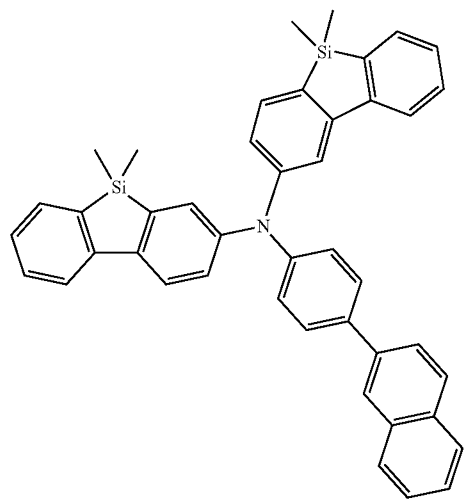
16
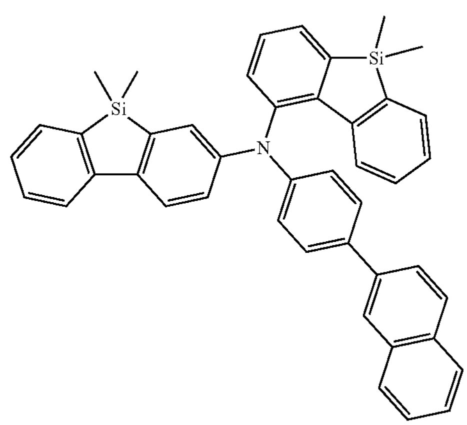

17
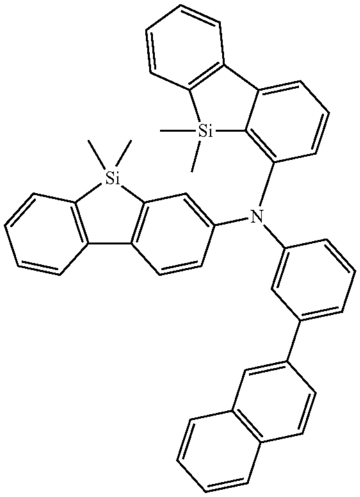
18
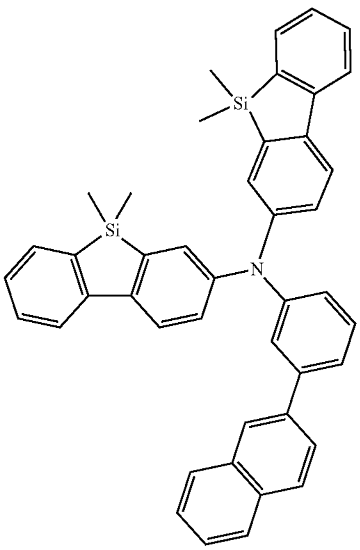
19
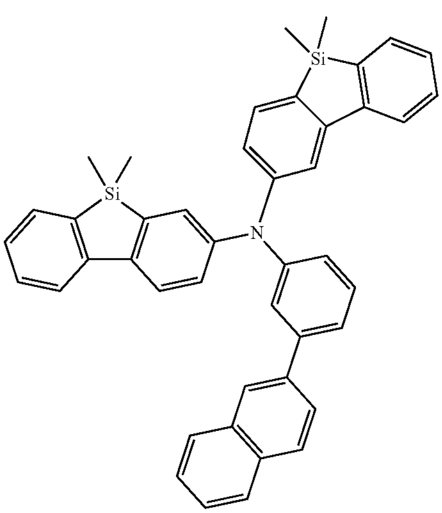
20
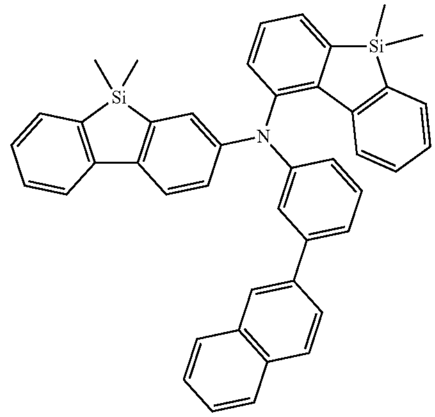
21
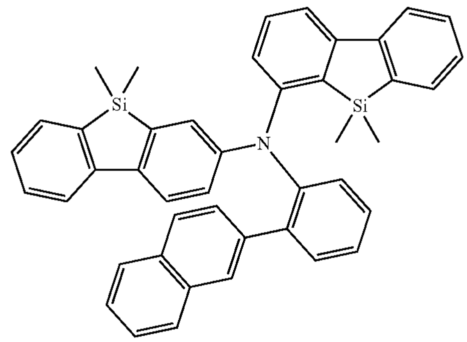
22
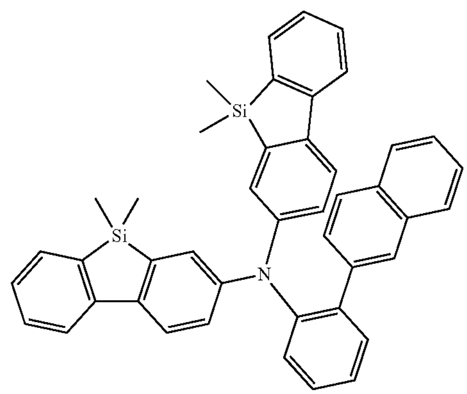
23
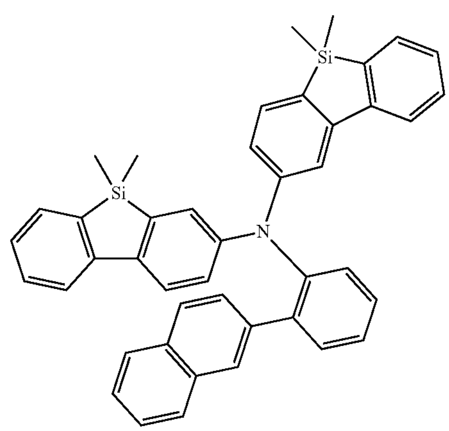

24
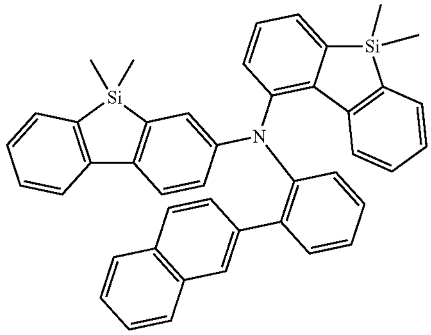
25
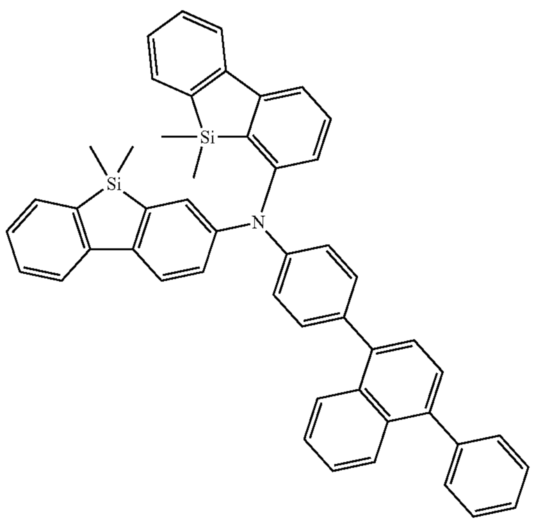
26
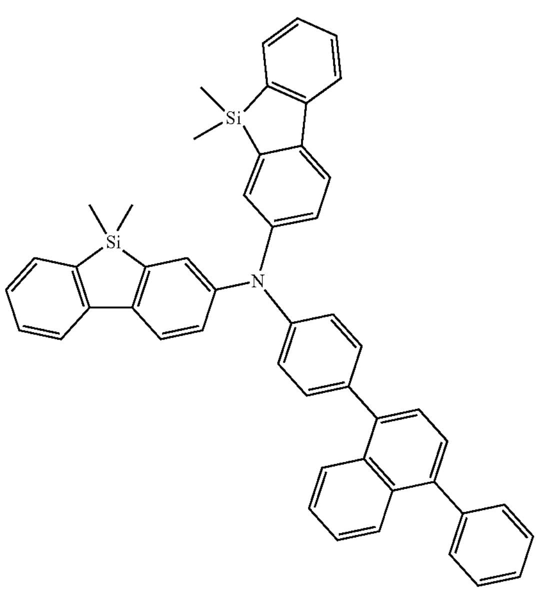
27
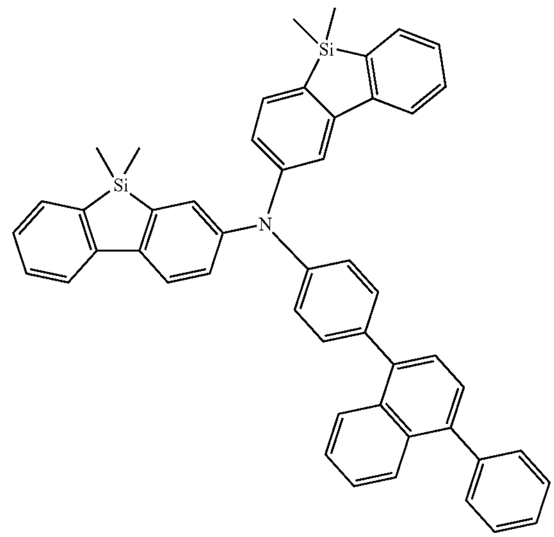
28
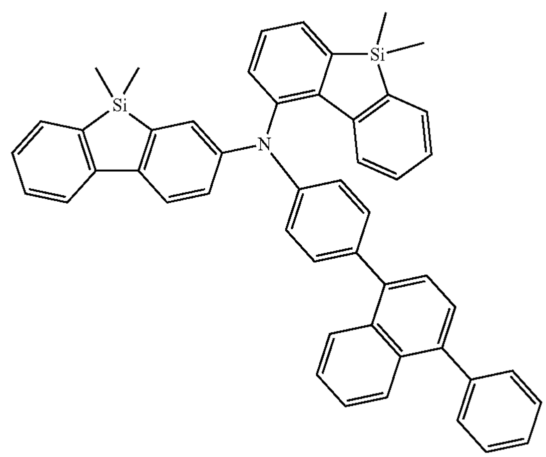
29
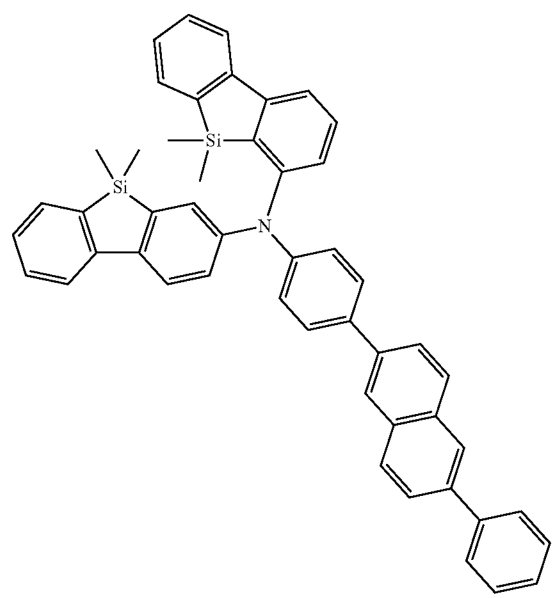

-continued
30
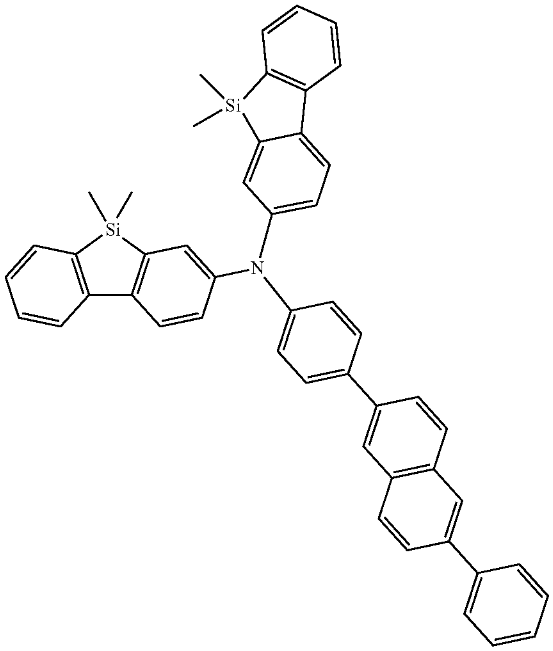
31
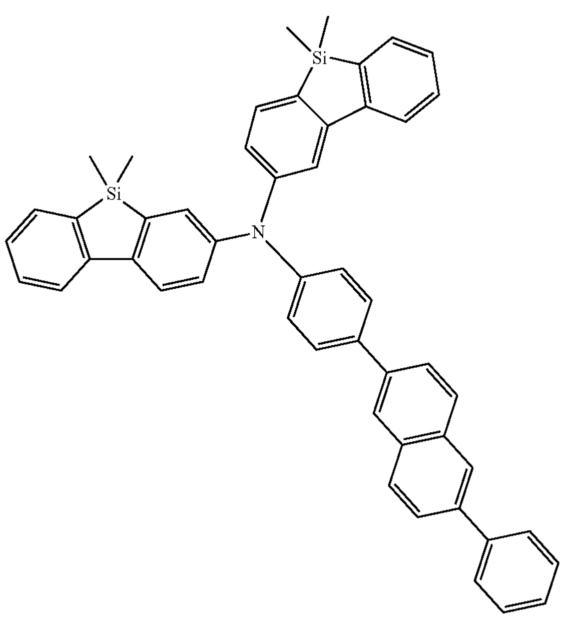
-continued
32
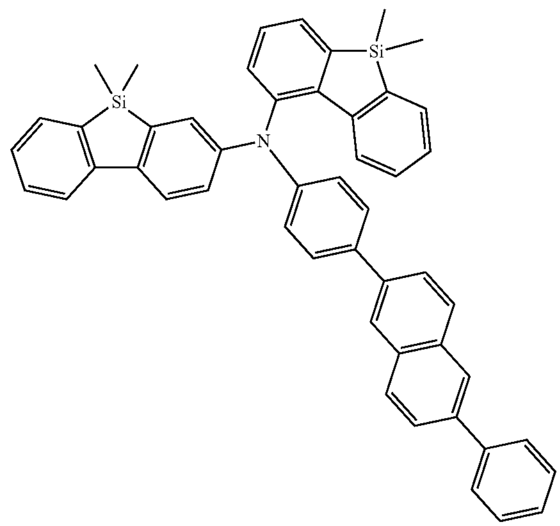
33
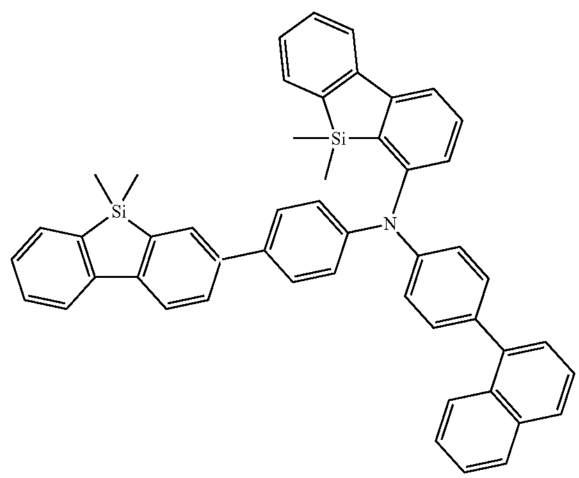
34
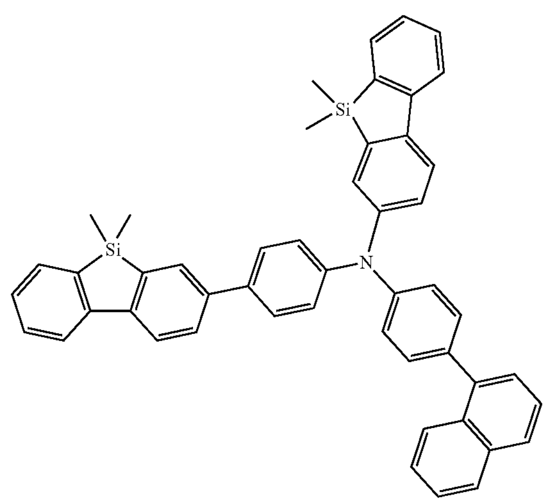

35
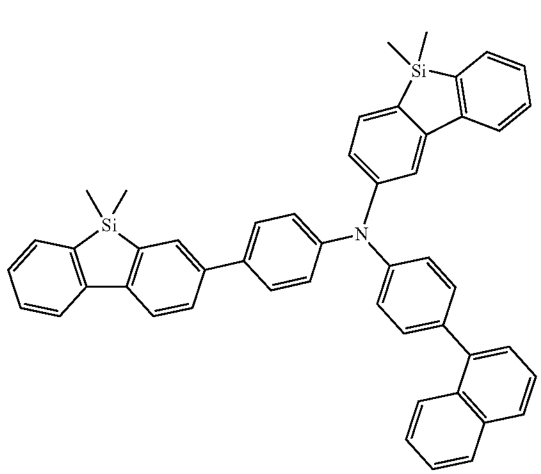
36
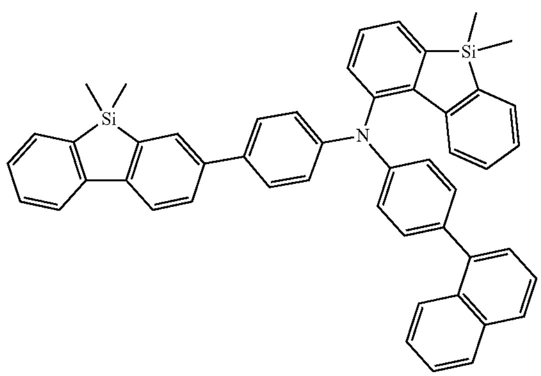
37
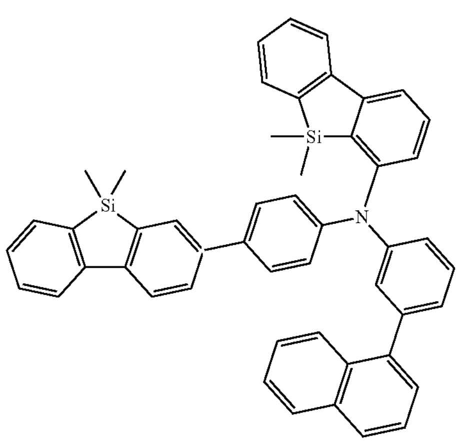
38
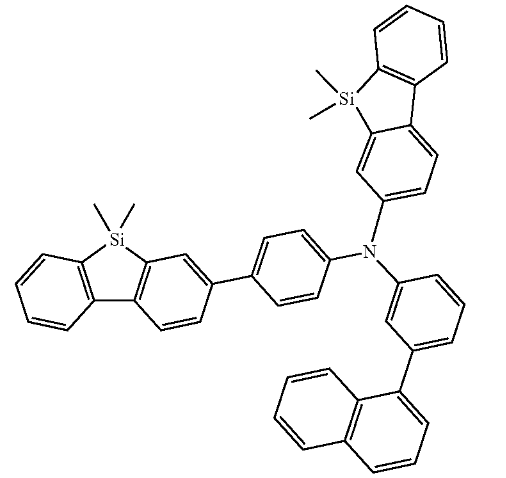
39
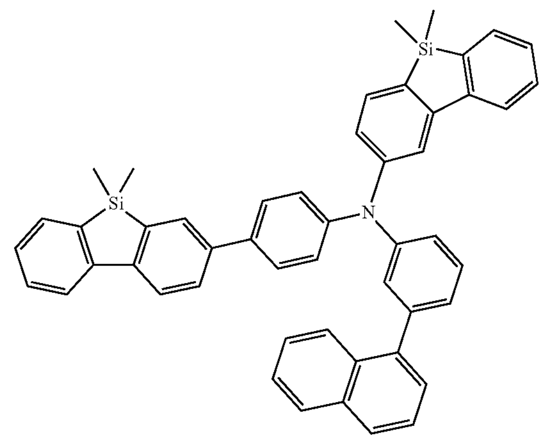
40
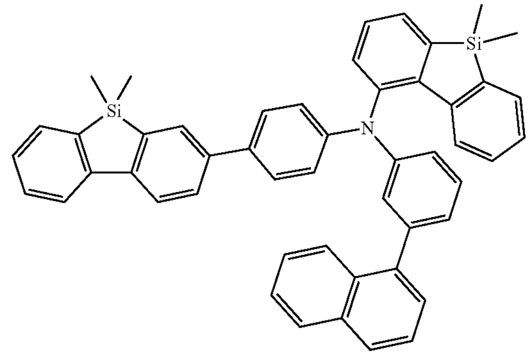

-continued
41
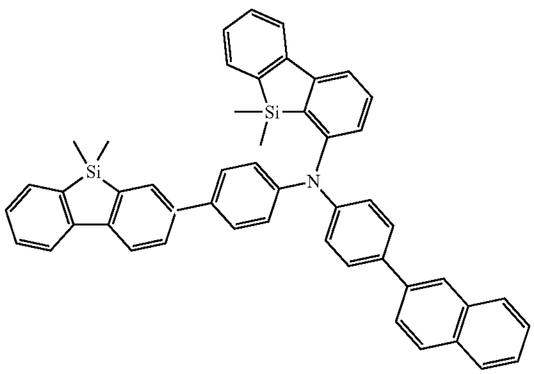
42
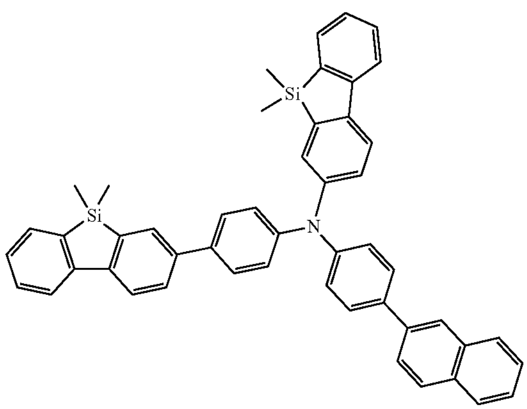
43
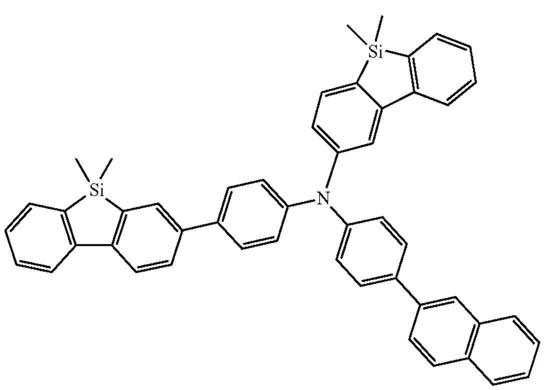
44
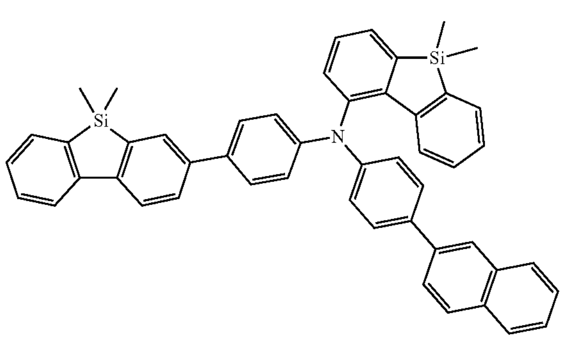
-continued
45
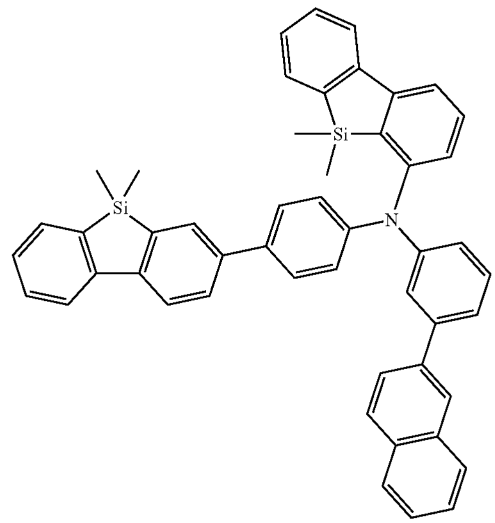
46
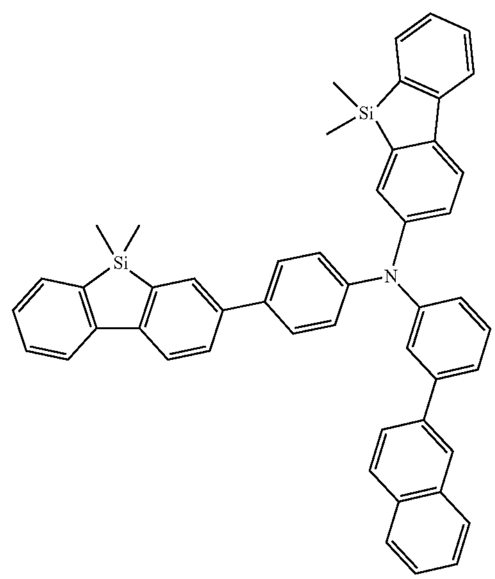
47
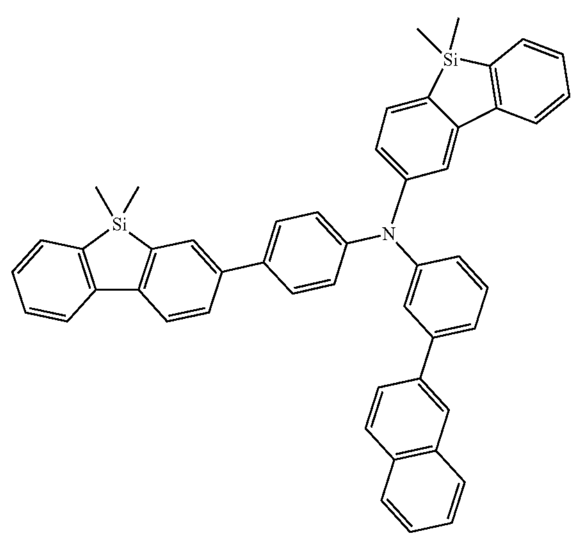

-continued
48
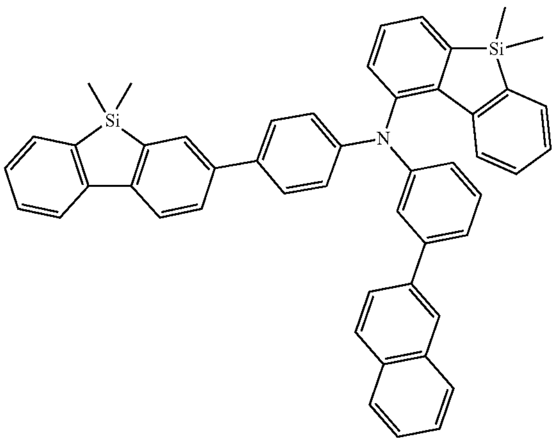
49
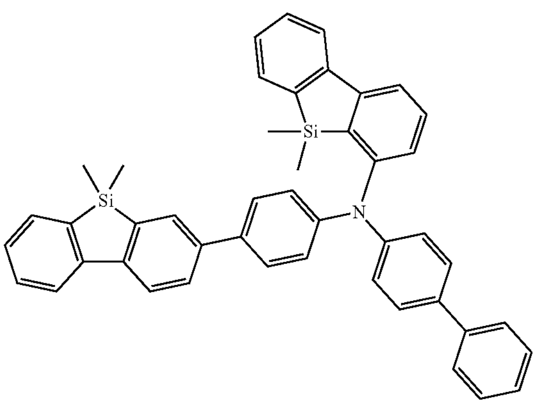
50
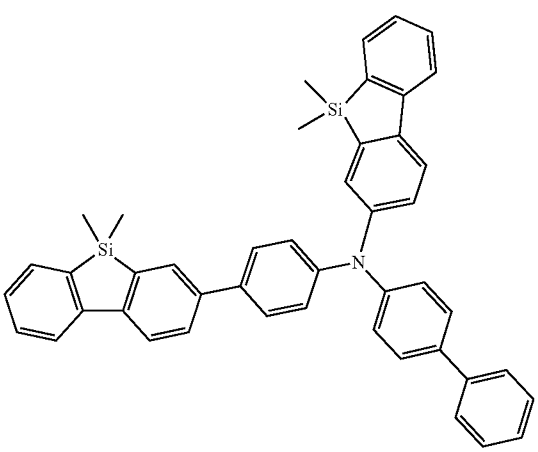
-continued
51
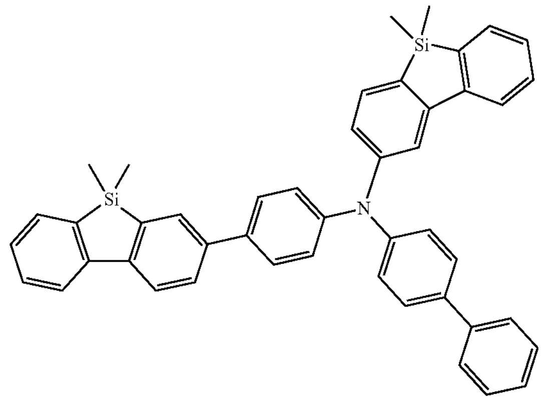
52
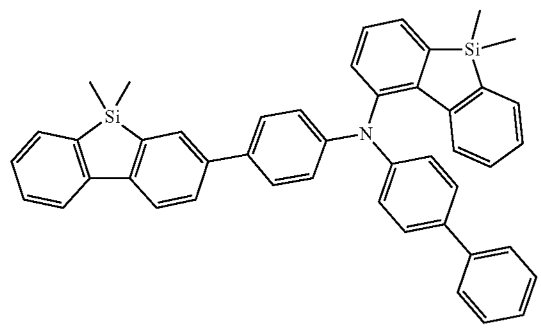
53
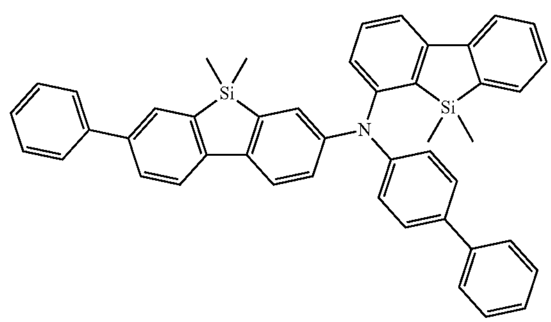
54
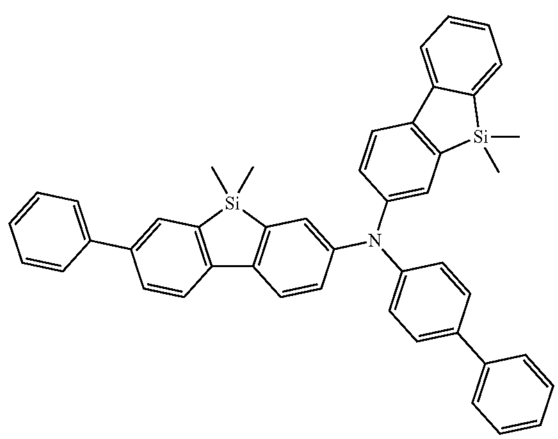

-continued
55
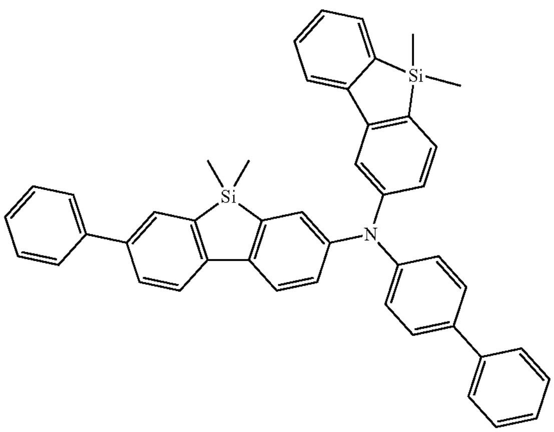
56
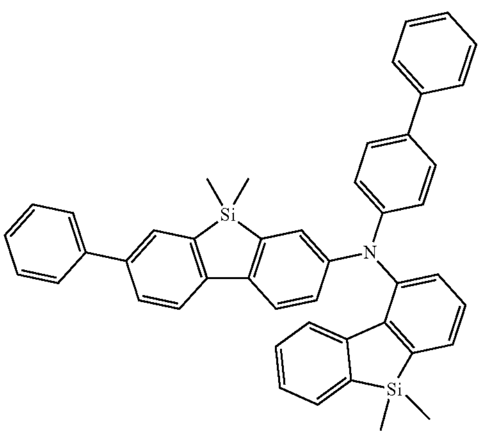
57
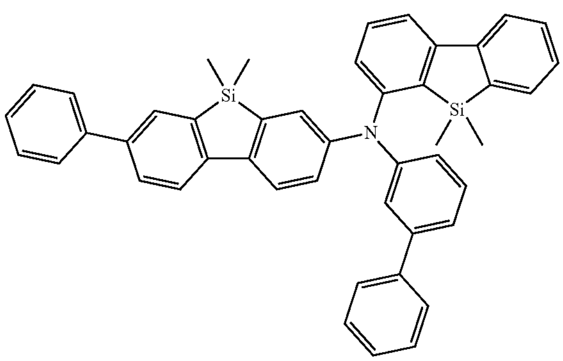
-continued
58
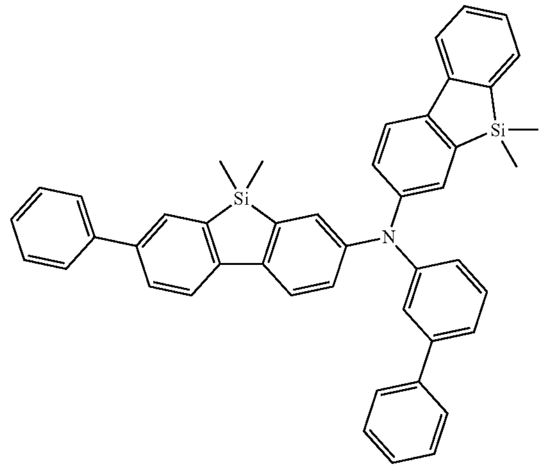
59
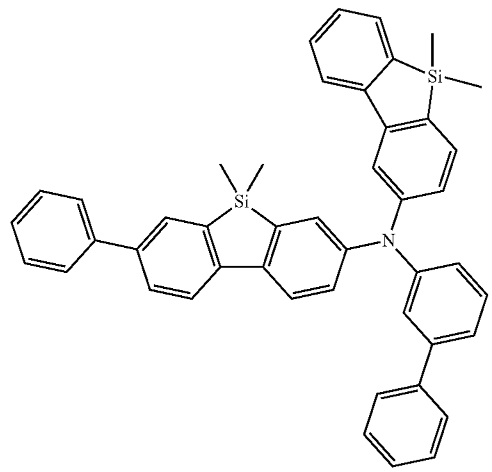
60
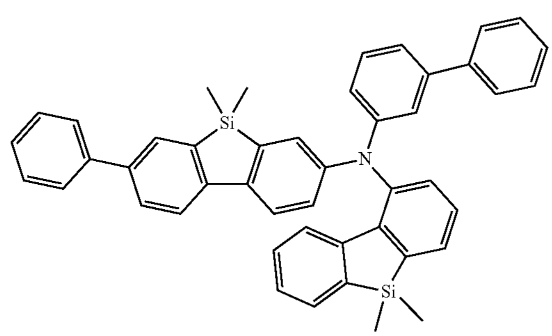
61
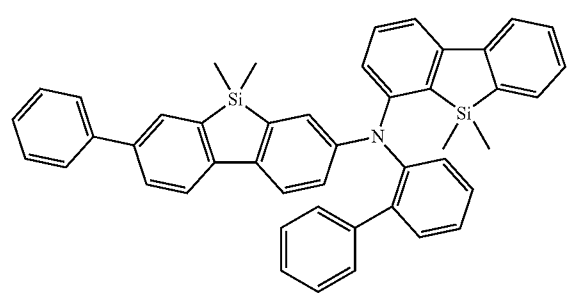

-continued
62
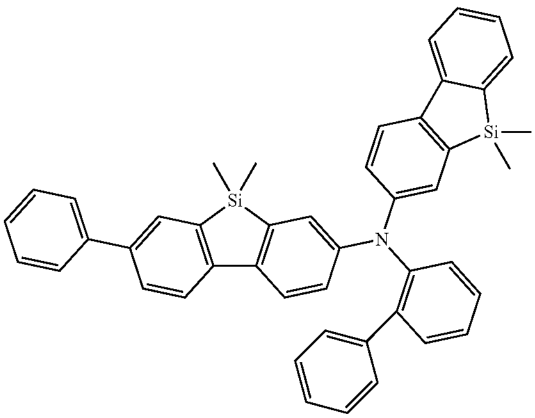
63
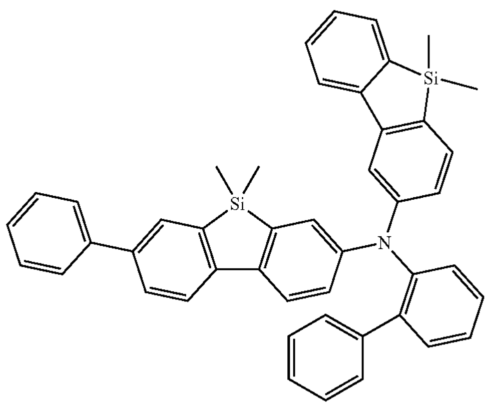
64
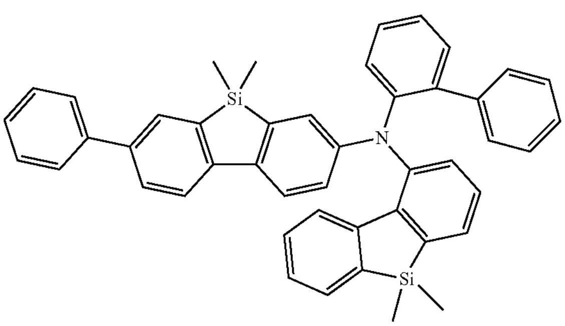
65
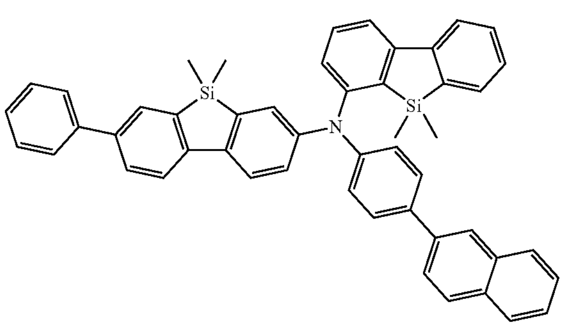
-continued
66
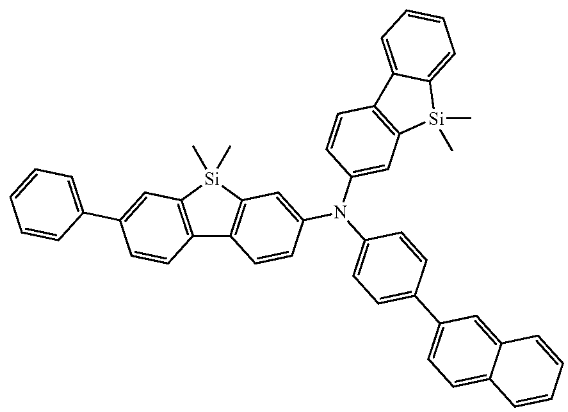
67
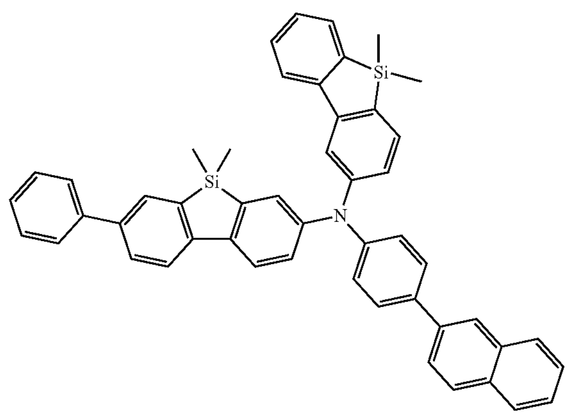
68
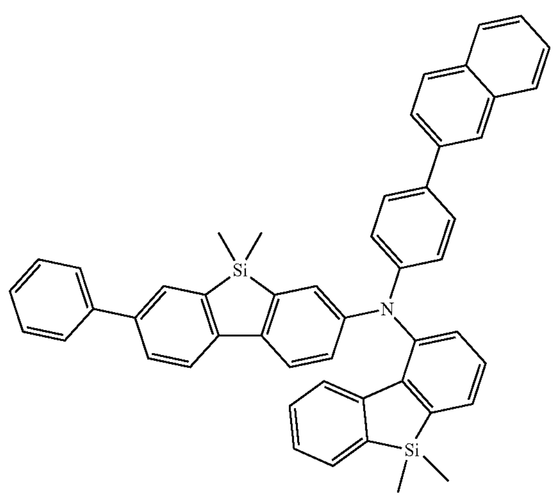

-continued
69
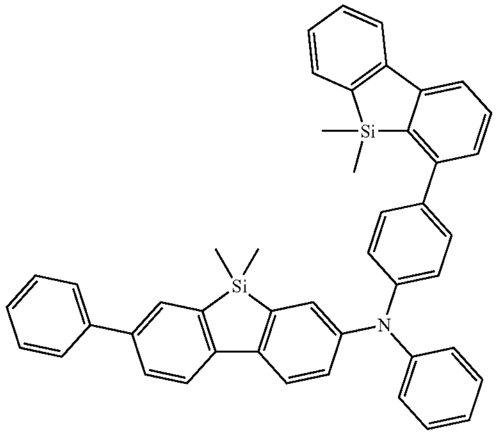
70
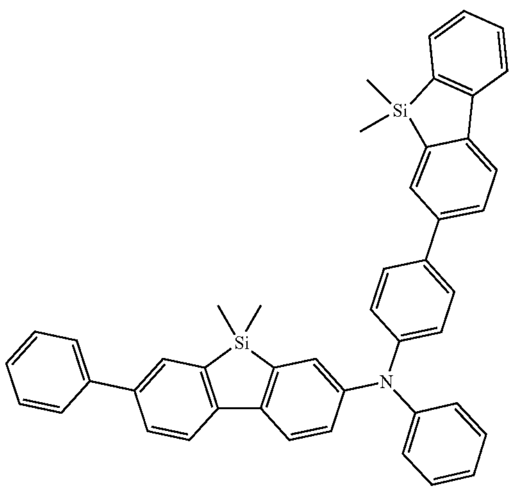
71
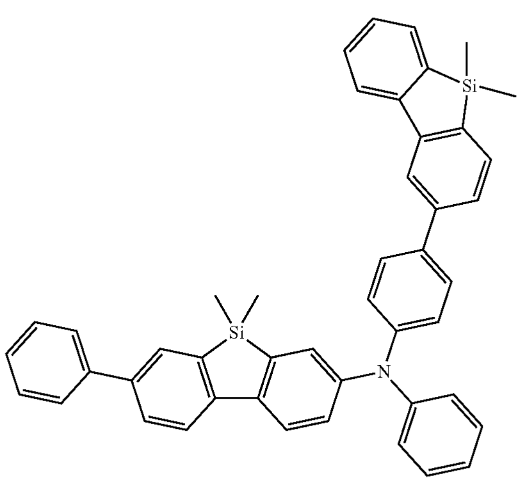
-continued
72
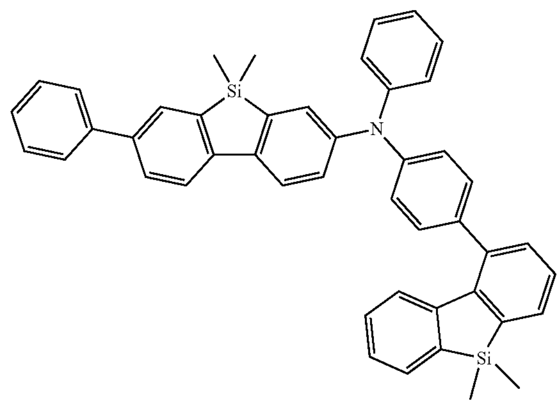
77
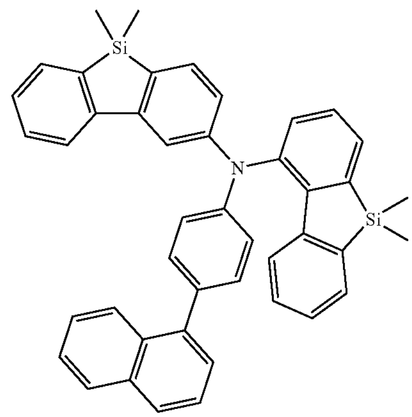
78
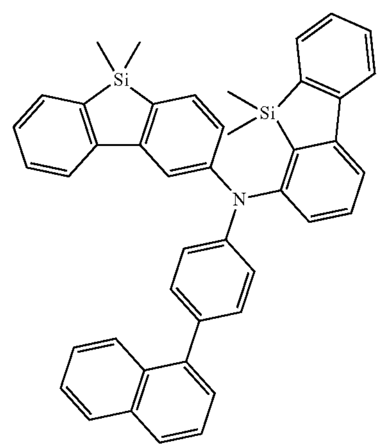
79
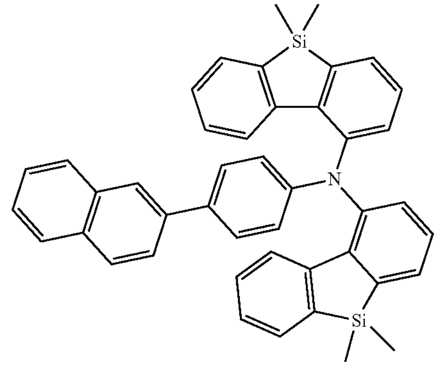

-continued
80
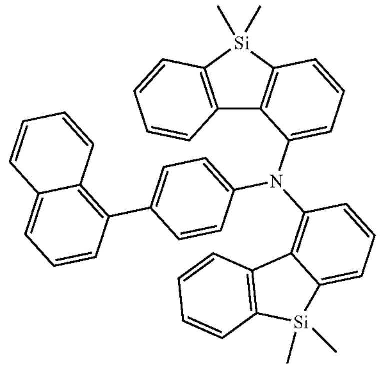
81
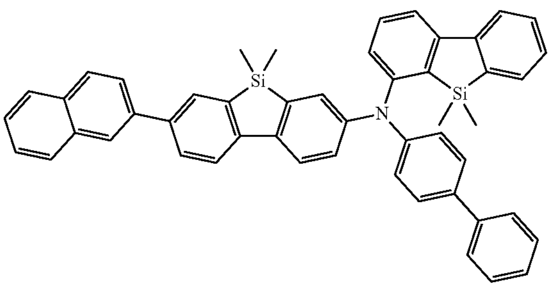
82
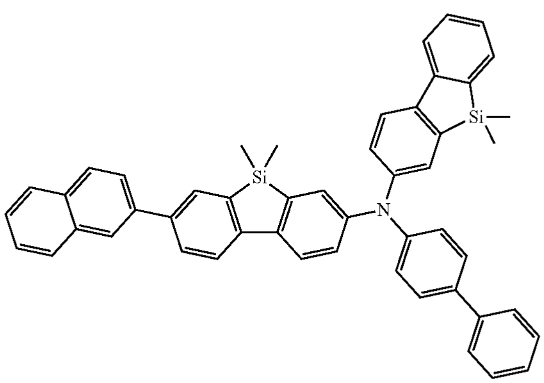
83
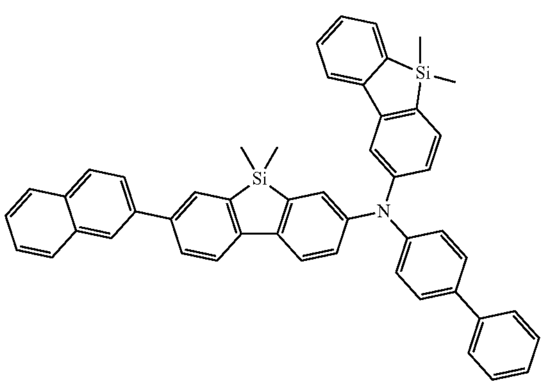
-continued
84
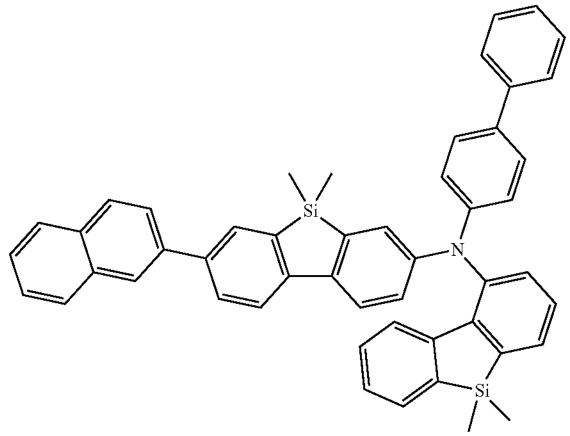
85
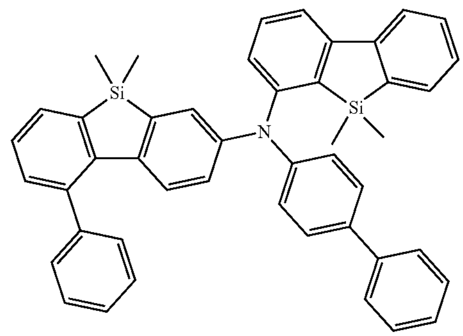
86
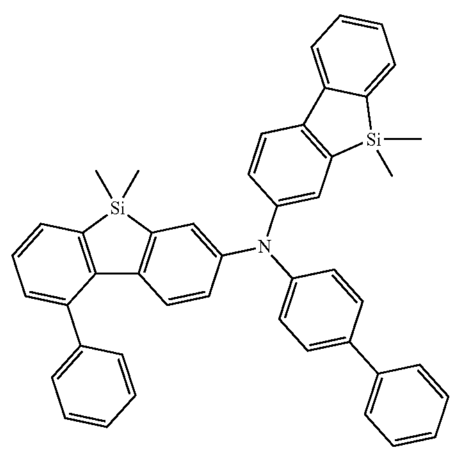

-continued
87
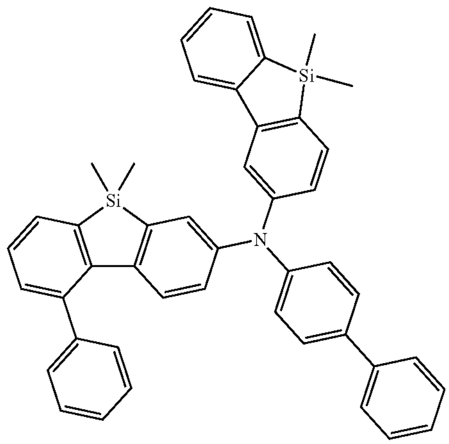
88
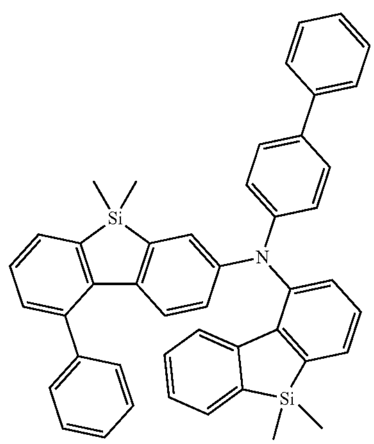
89
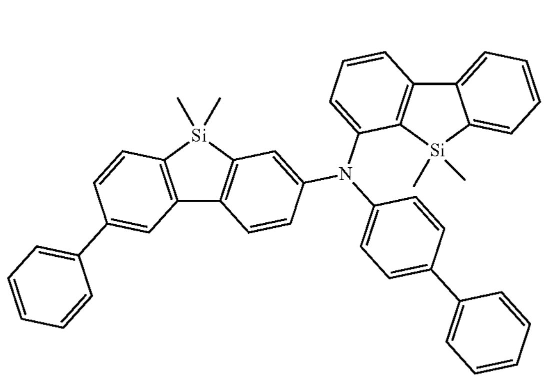
-continued
90
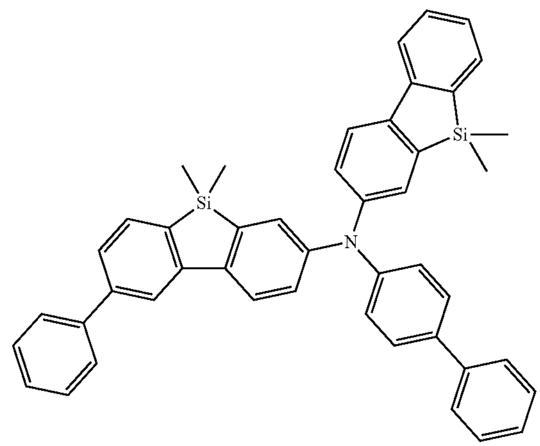
91
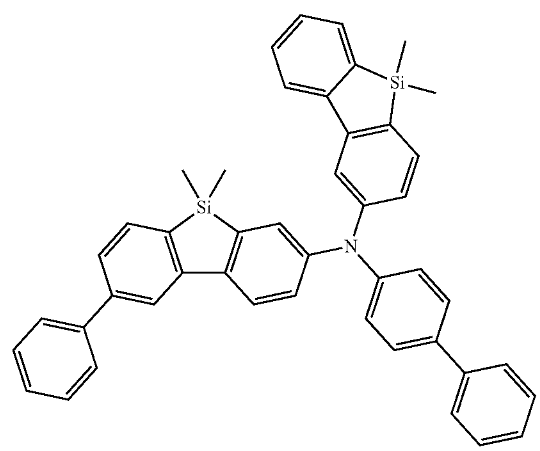
92
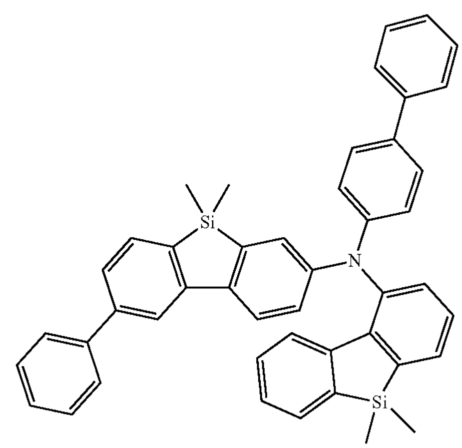

-continued
93
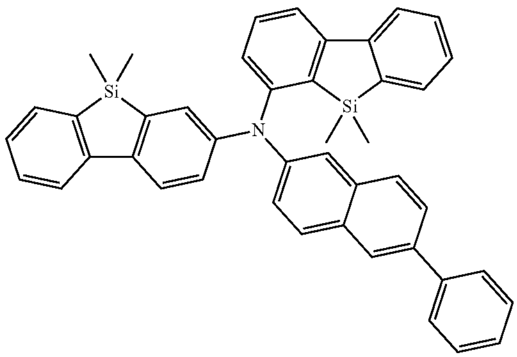
94
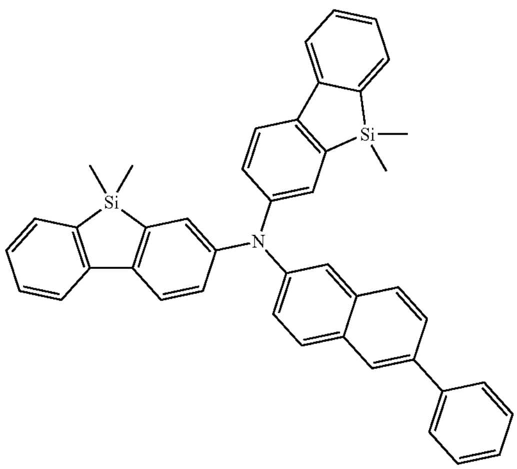
95
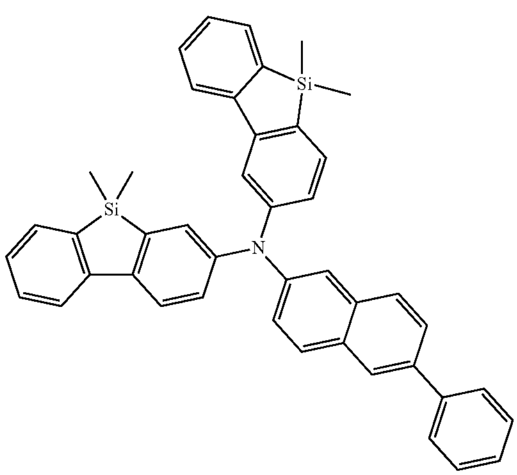
-continued
96
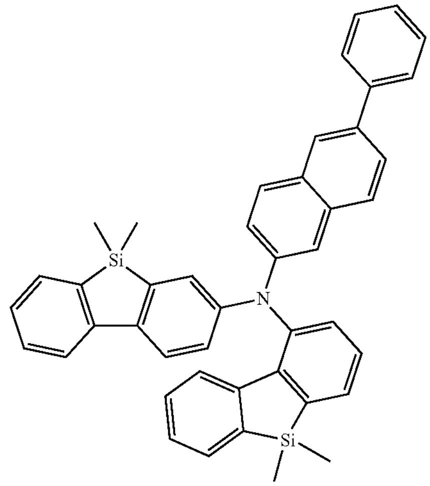
97
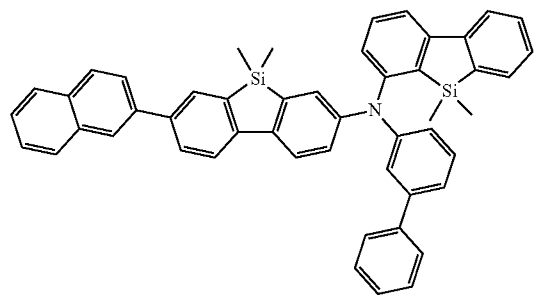
98
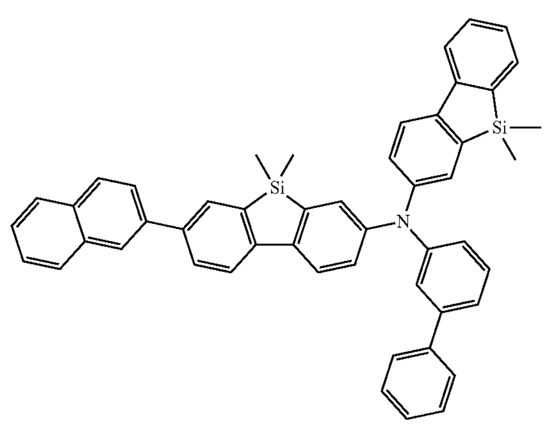

-continued
99
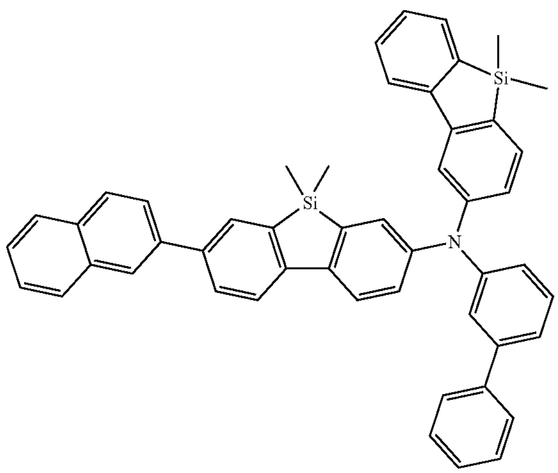
100
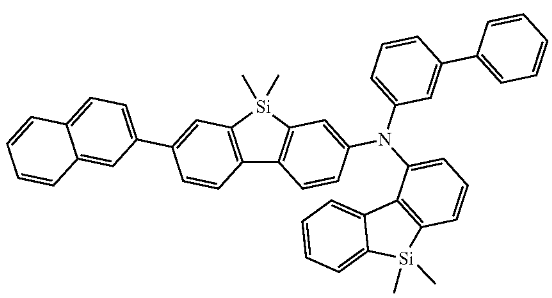
101
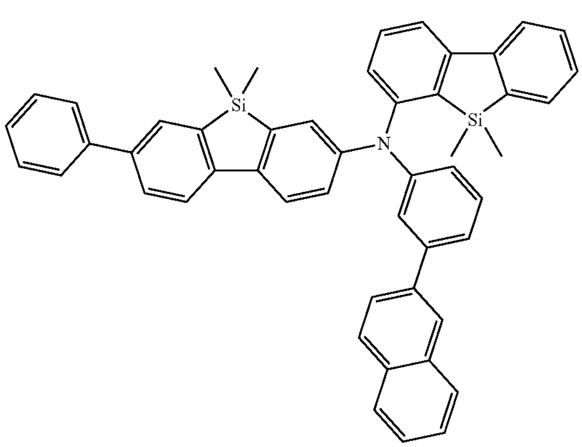
-continued
102
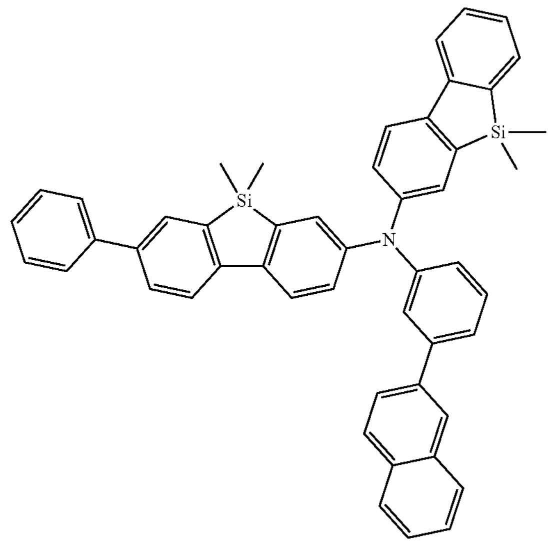
103
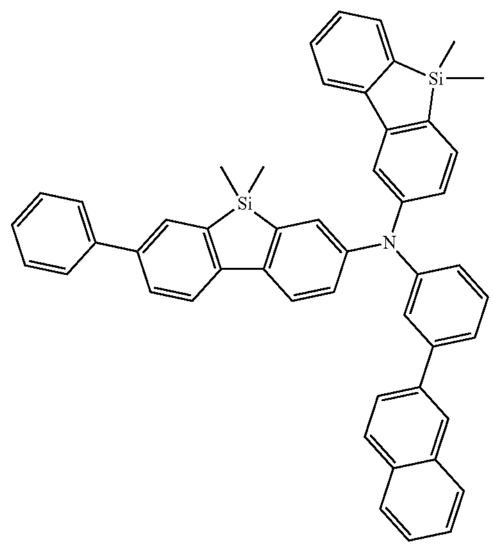
104
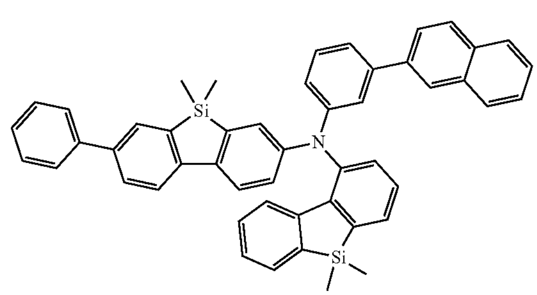
105
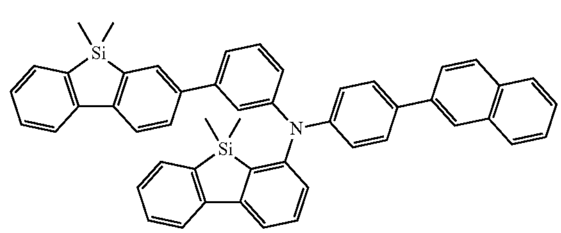

-continued

106

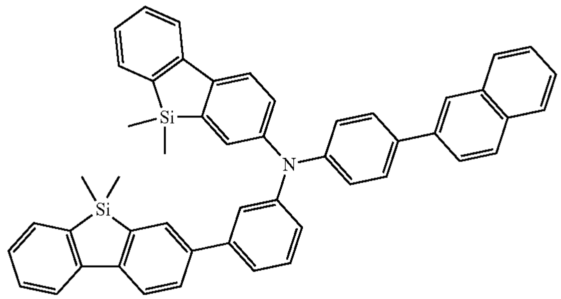

107

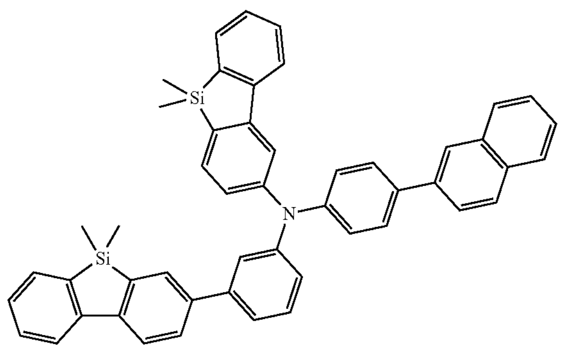

108

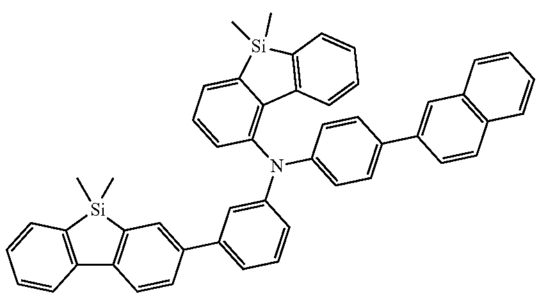

7. The composition as claimed in claim 1, wherein the second compound is represented by Chemical Formula 2A-3, Chemical Formula 2C-1, Chemical Formula 2F-1, or Chemical Formula 2F-3:

[Chemical Formula 2A-3]

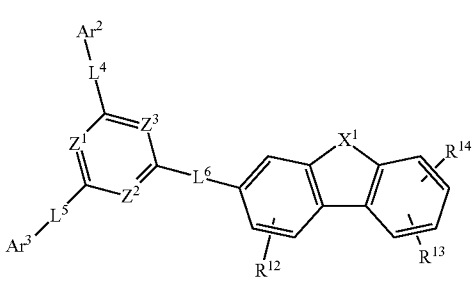

-continued

[Chemical Formula 2C-1]

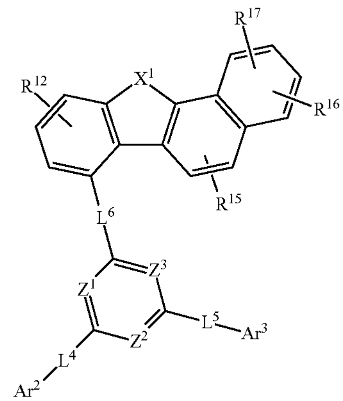

[Chemical Formula 2F-1]

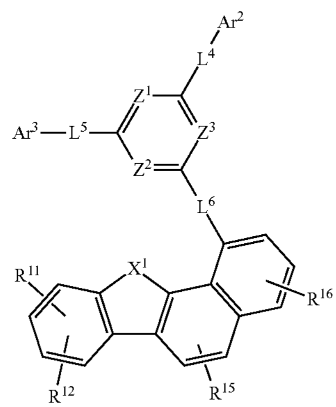

[Chemical Formula 2F-3]

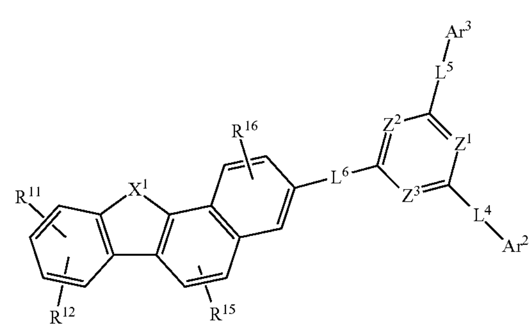

wherein, in Chemical Formula 2A-3, Chemical Formula 2C-1, Chemical Formula 2F-1, and Chemical Formula 2F-3, $X^1$, $Z^1$ to $Z^3$, $R^{11}$ to $R^{17}$, $L^4$ to $L^6$, $Ar^2$, and $Ar^3$ are defined the same as those of Chemical Formula 2.

8. The composition as claimed in claim 1, wherein the second compound is a compound of Group 2:
[Group 2]
A-2
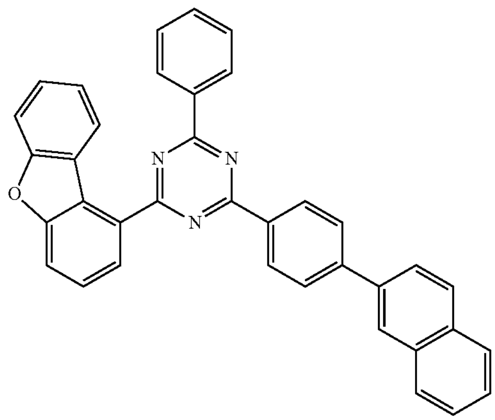
A-3
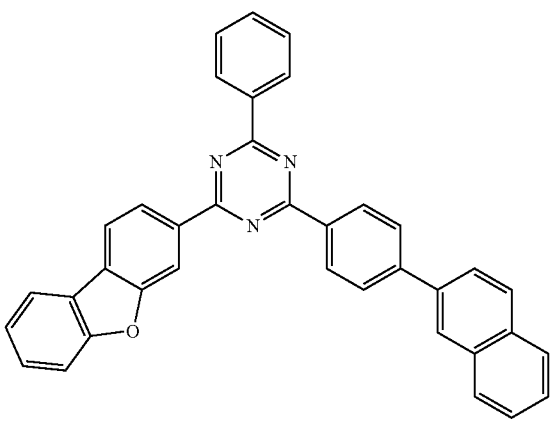
A-9
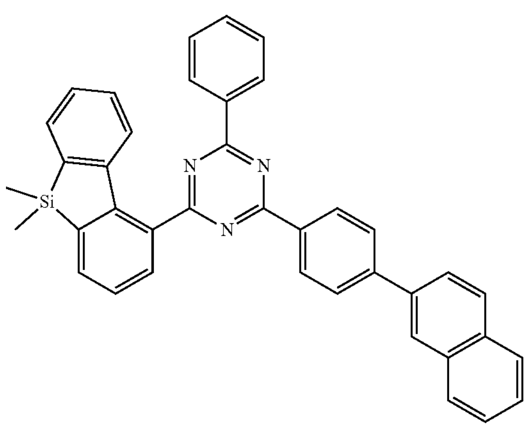
-continued
A-10
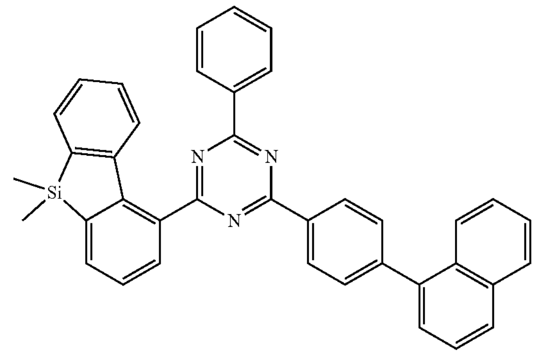
A-11
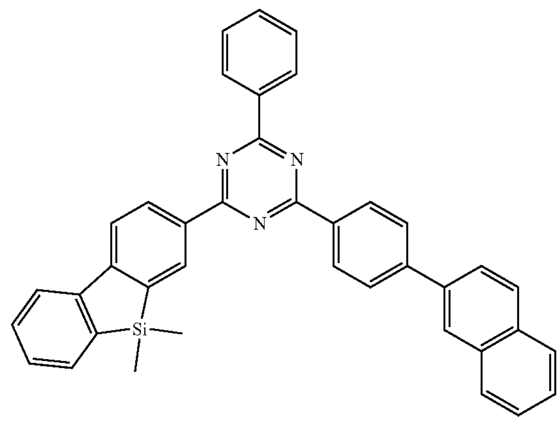
A-12
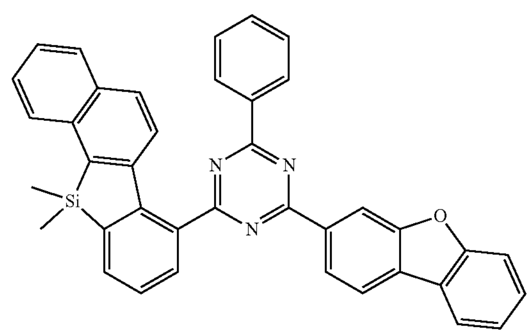
A-13
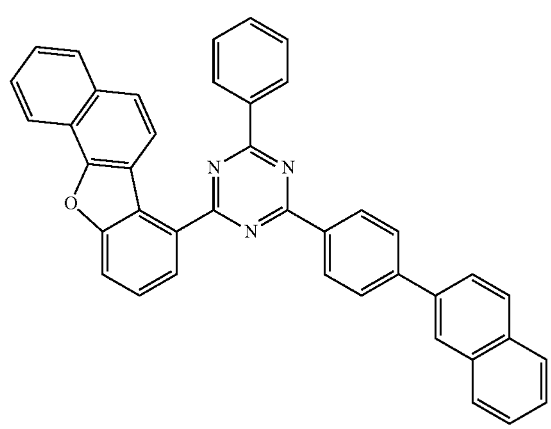

-continued
A-14
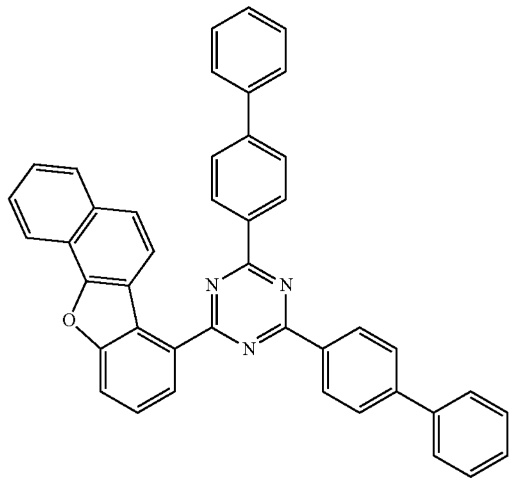
A-15
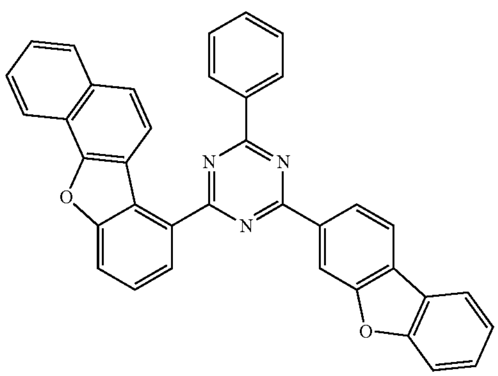
A-16
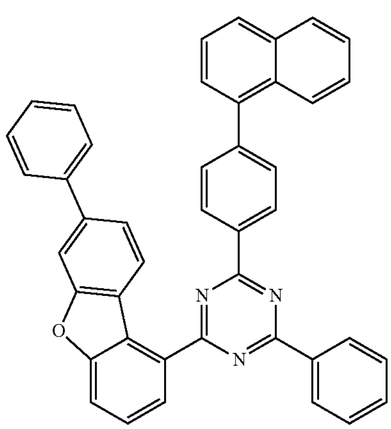
-continued
A-17
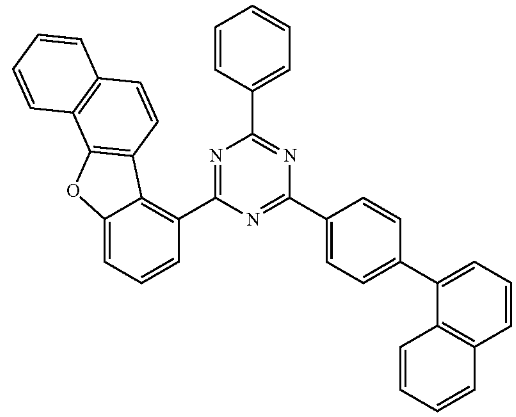
A-18
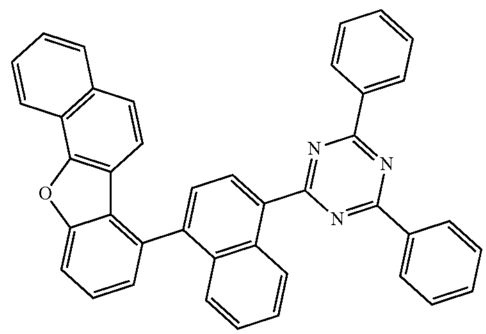
A-19
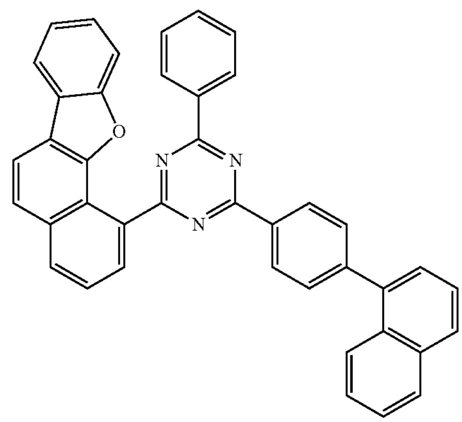
A-20
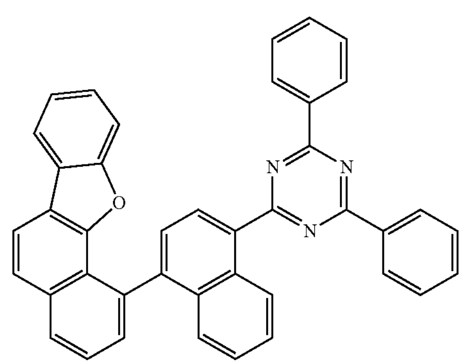

-continued
A-21
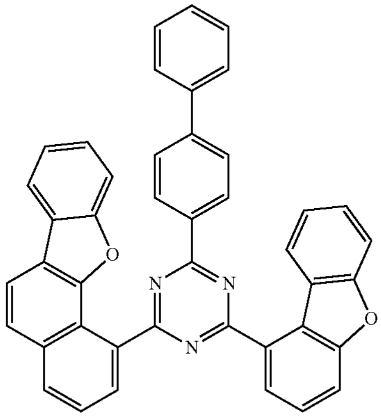
A-22
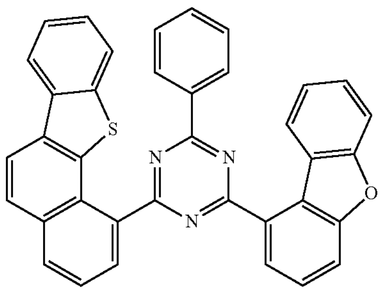
A-23
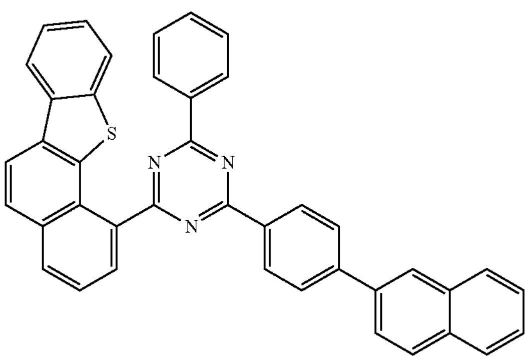
A-24
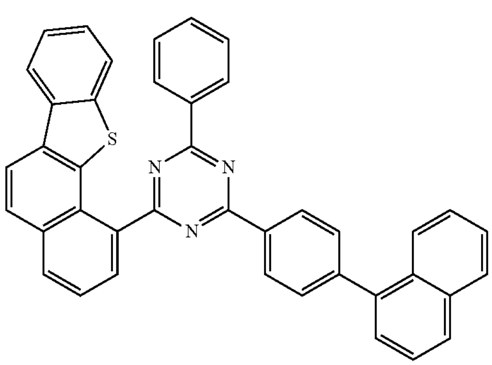
-continued
A-25
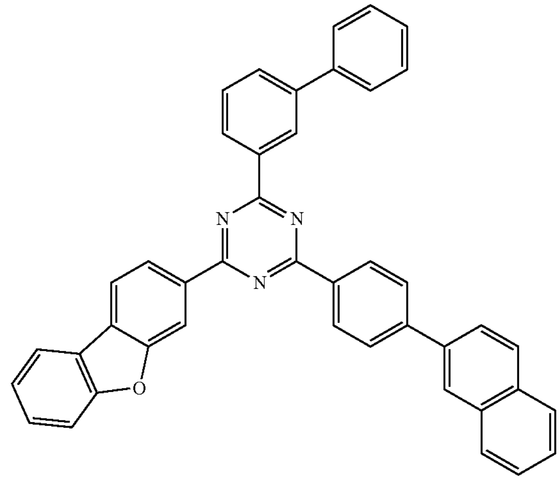
A-26
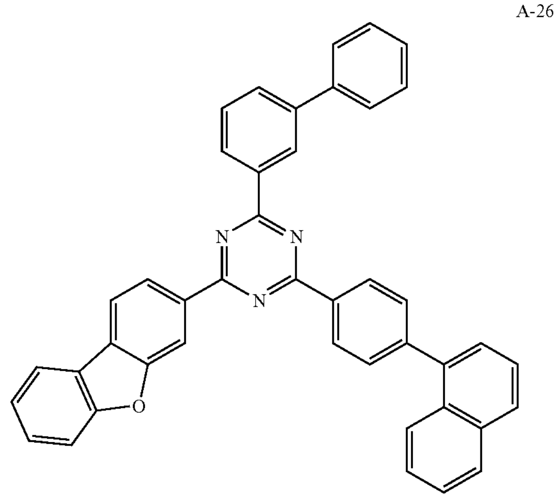
A-27
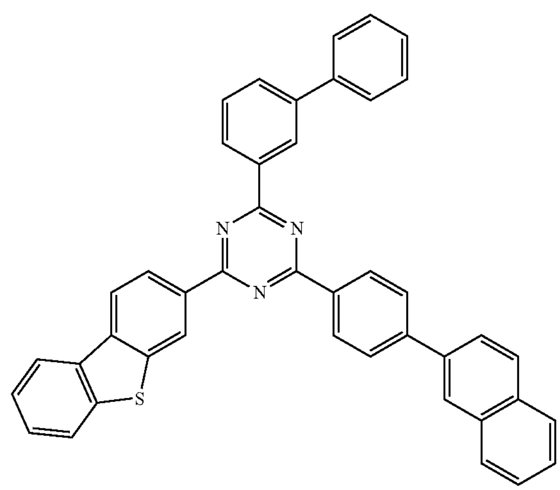

-continued
A-28
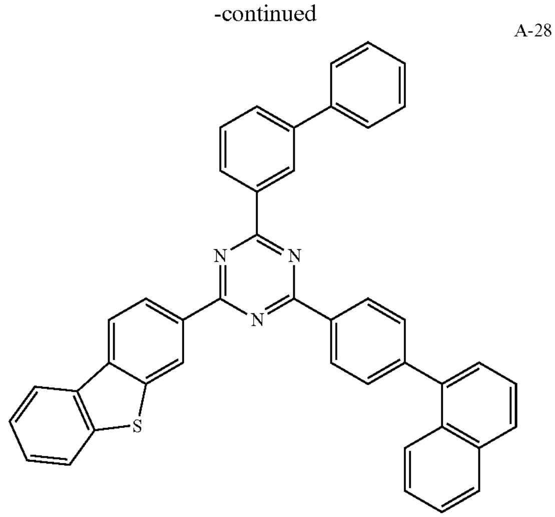
A-29
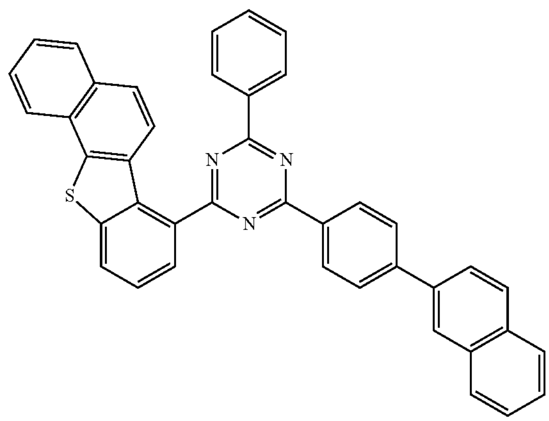
A-30
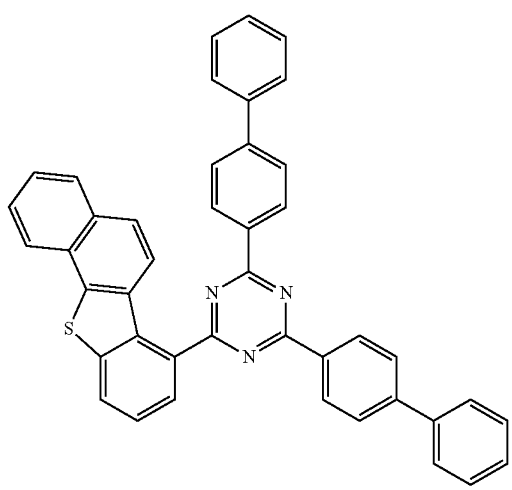
-continued
A-31
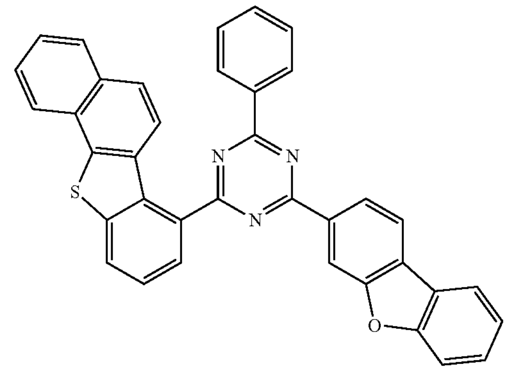
A-32
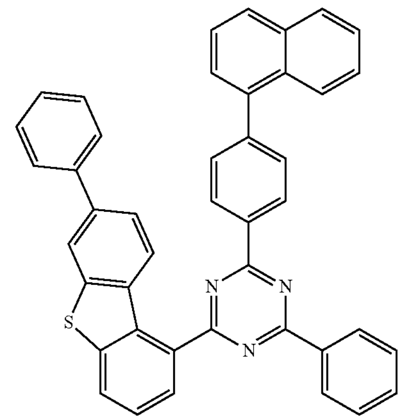
A-33
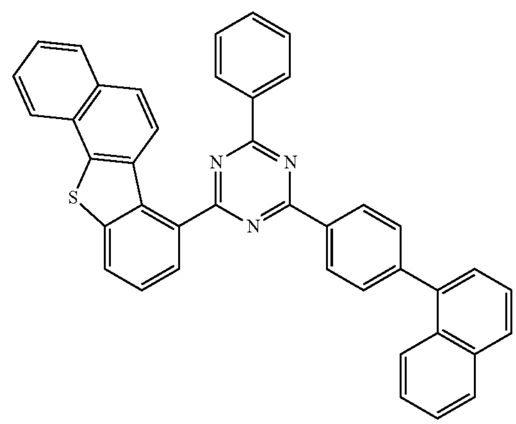
A-34
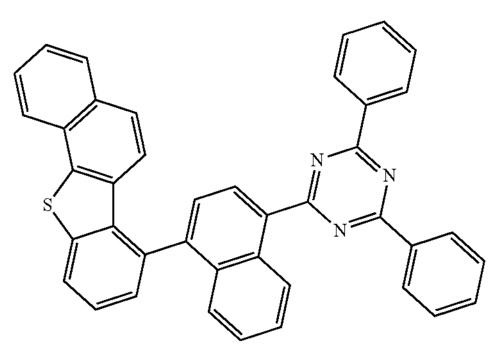

-continued
A-35
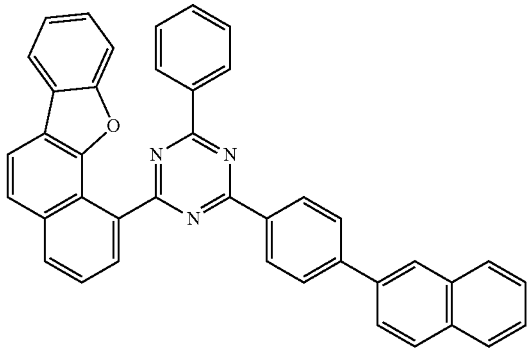
A-36
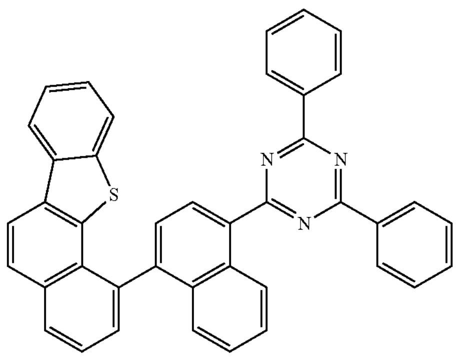
A-37
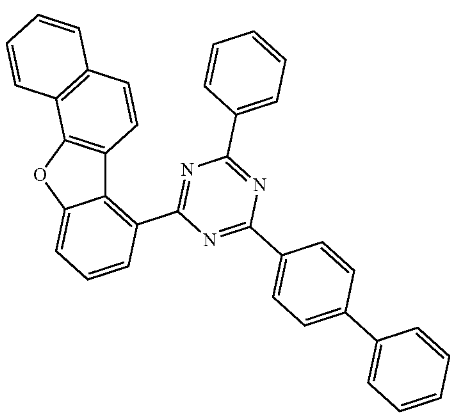
A-38
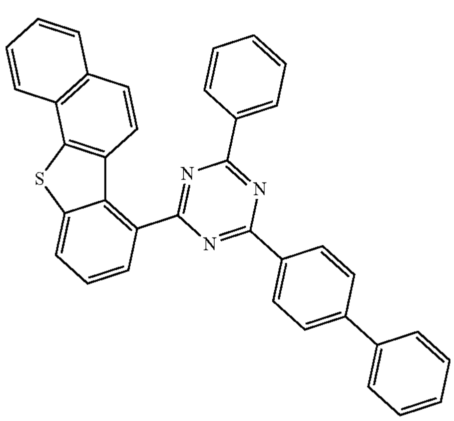
-continued
A-40
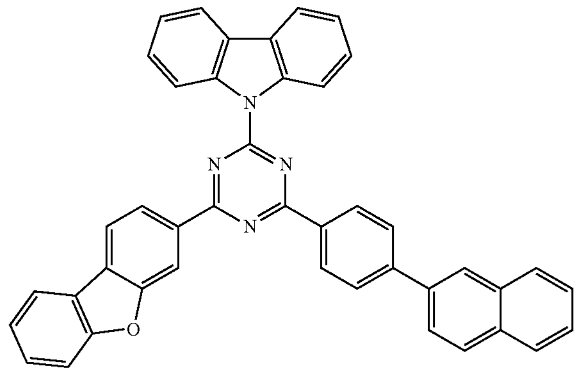
A-41
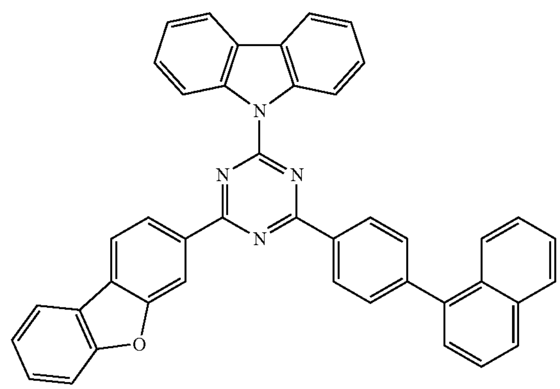
A-42
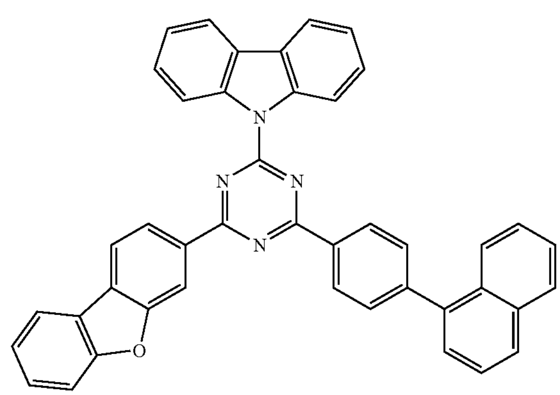

-continued
A-43
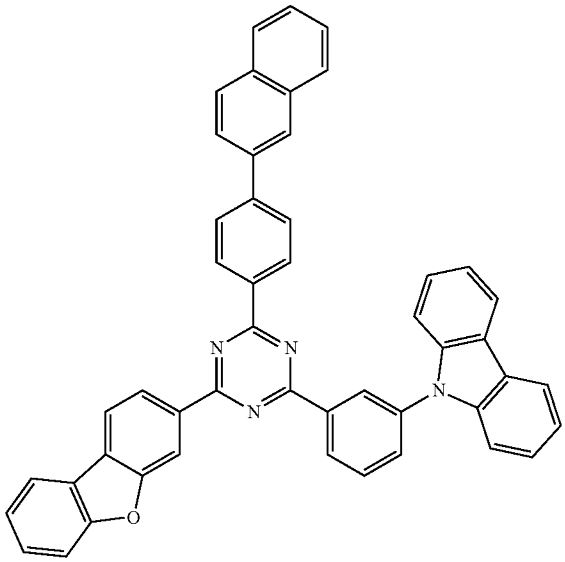
A-44
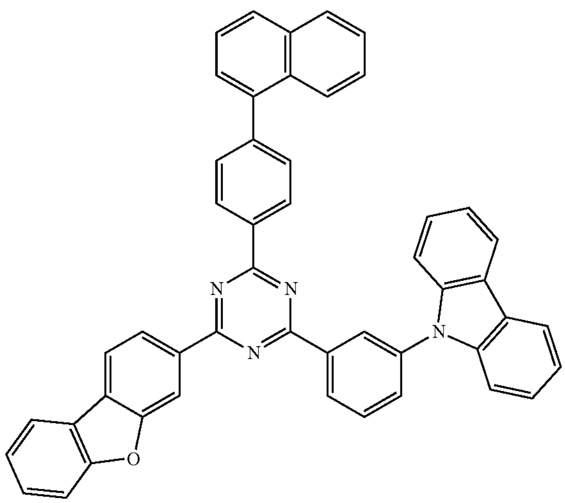
A-45
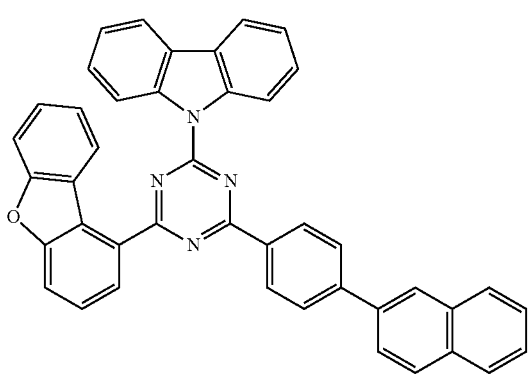
-continued
A-46
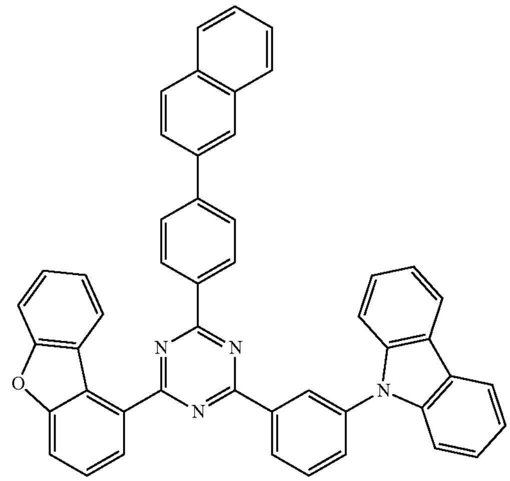
A-47
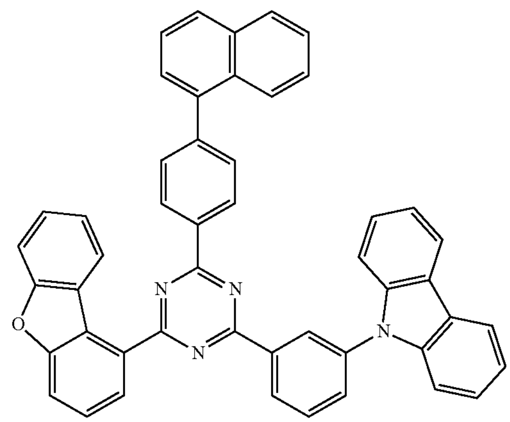
A-48
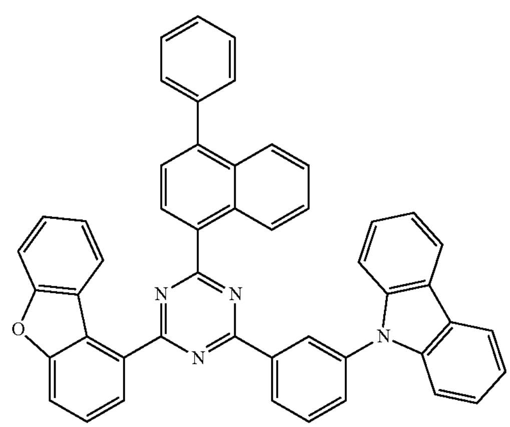

-continued
A-49
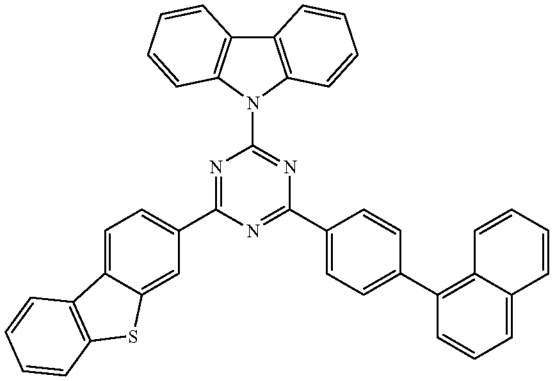
A-50
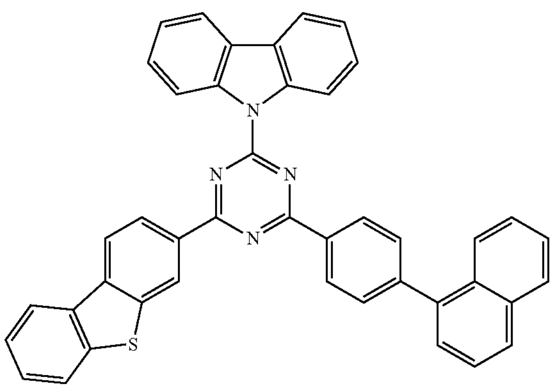
A-51
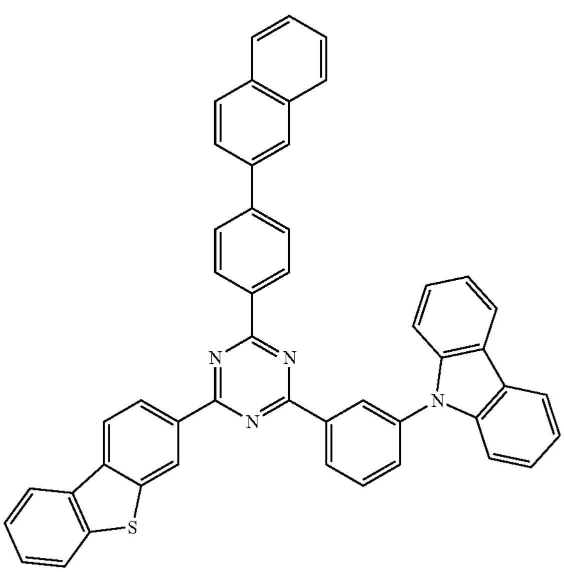
-continued
A-52
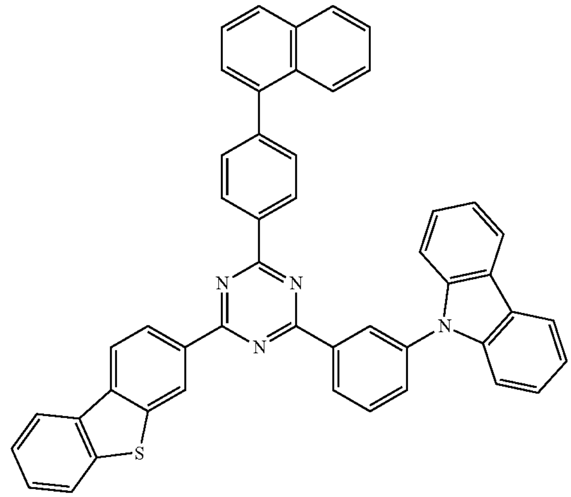
A-53
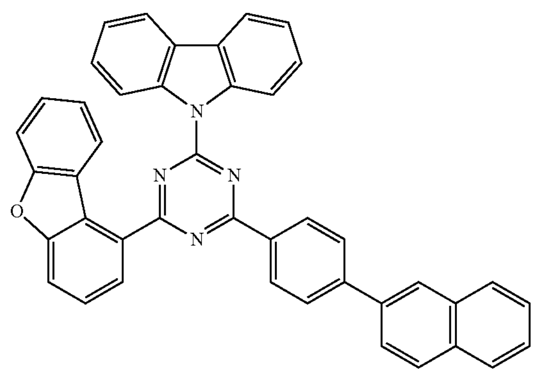
A-54
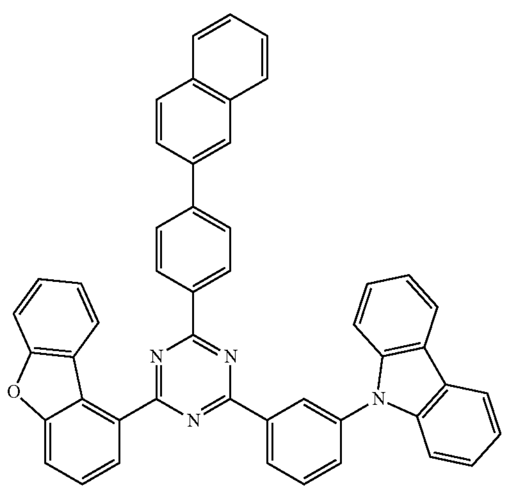

-continued
A-55
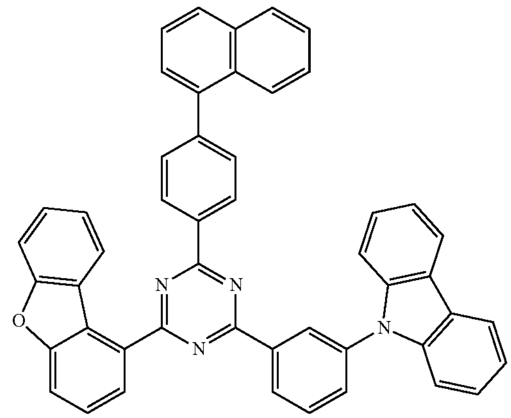
A-56
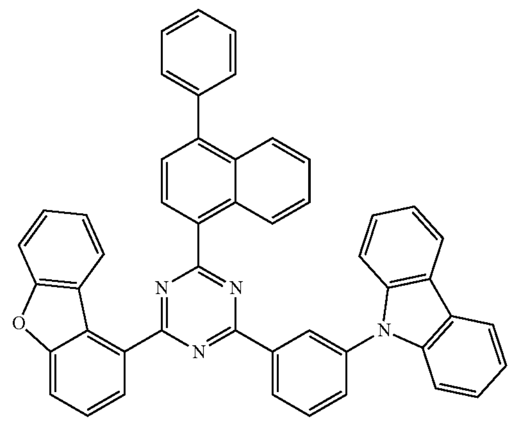
A-57
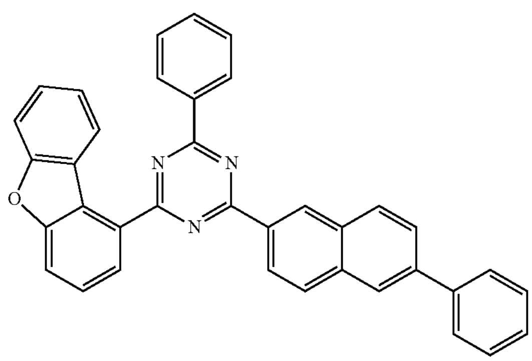
A-58
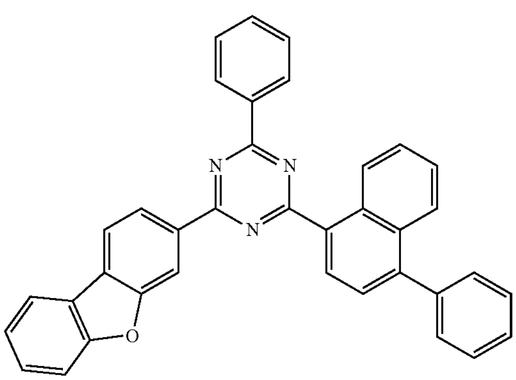
-continued
A-59
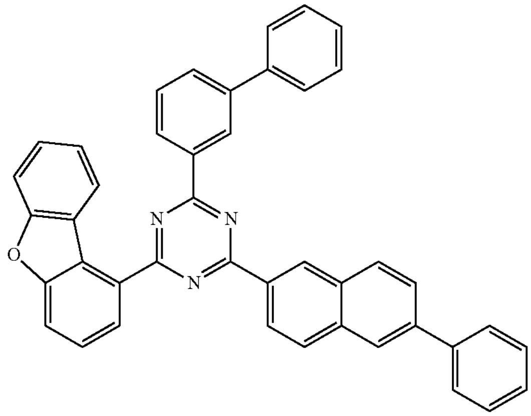
A-60
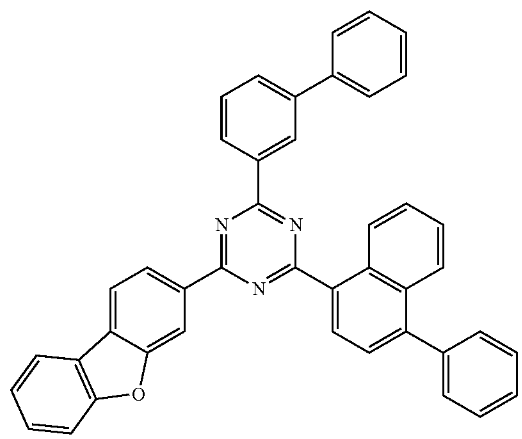
A-61
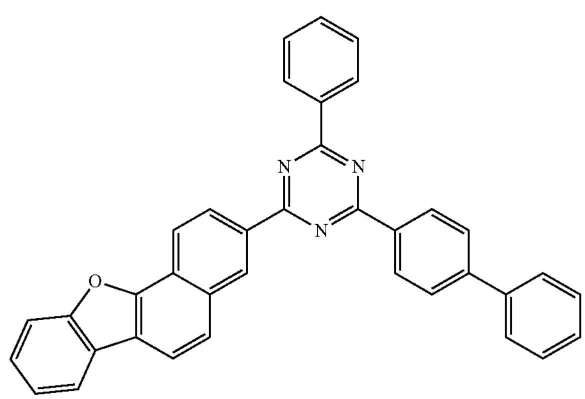

-continued
A-62
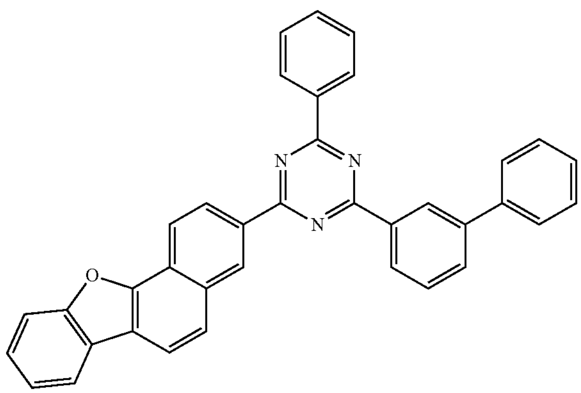
A-63
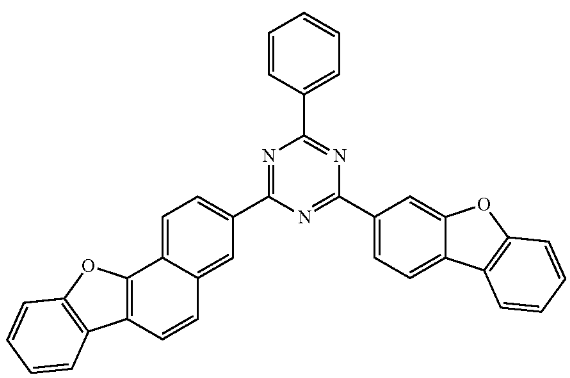
A-64
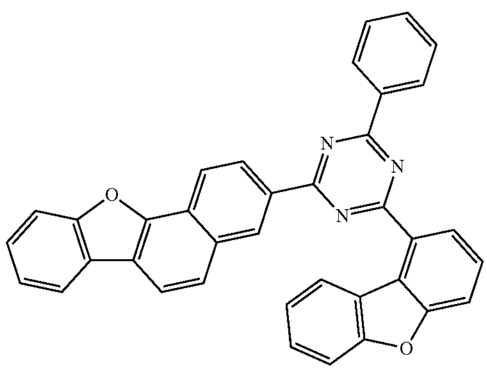
A-65
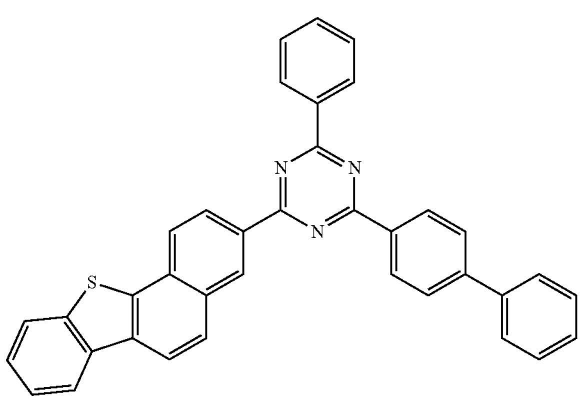
-continued
A-66
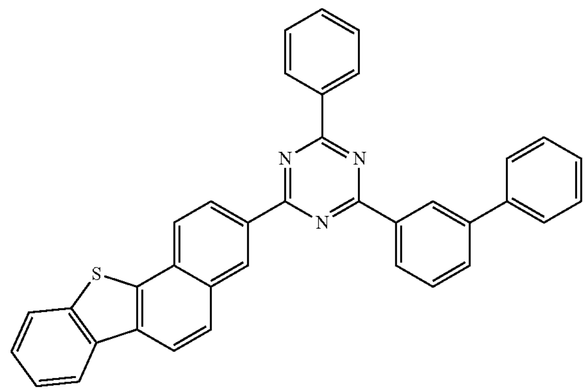
A-67
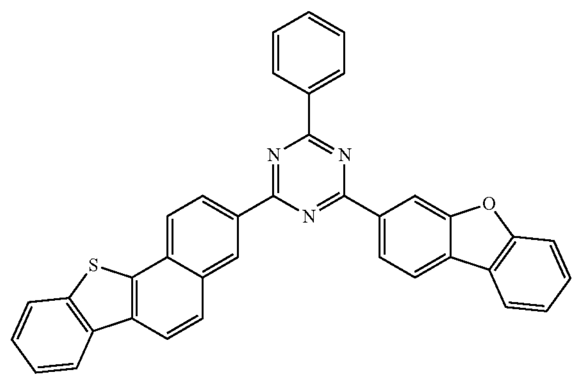
A-68
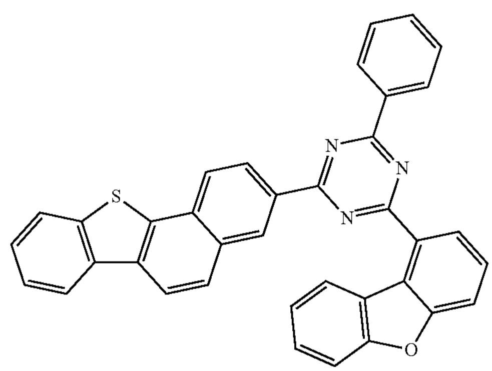
A-71
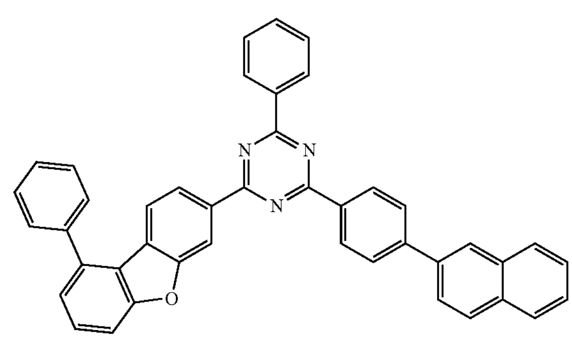

-continued
A-72
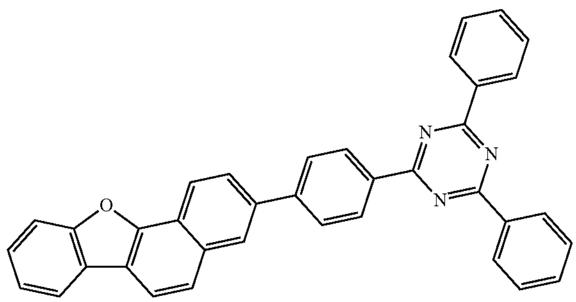
A-74
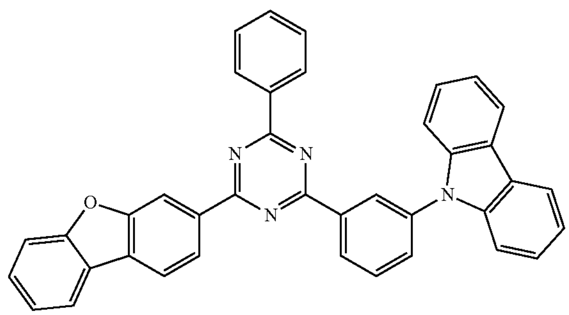
A-75
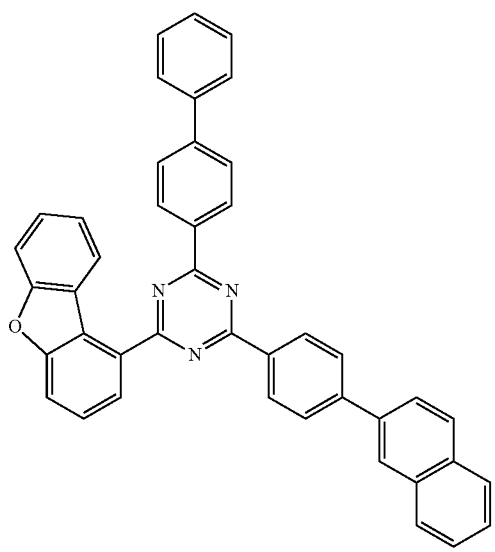
A-76
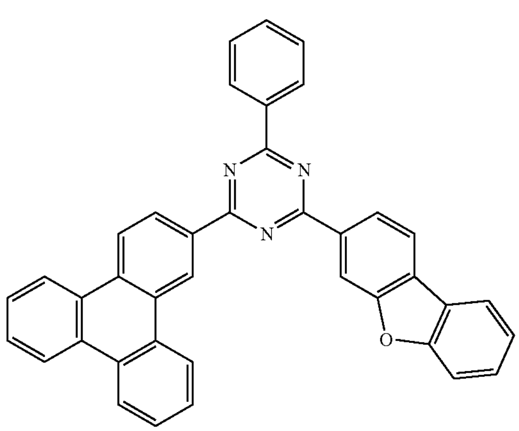
-continued
A-77
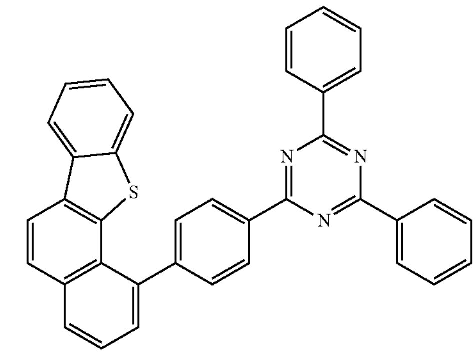
A-81
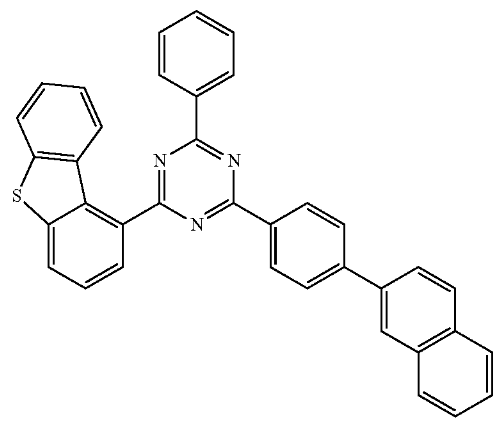
A-82
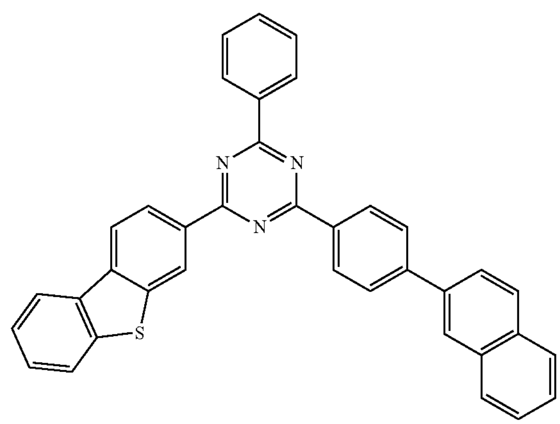
A-83
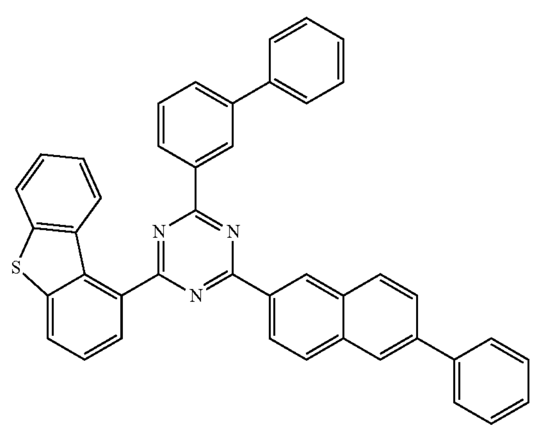

-continued
A-84
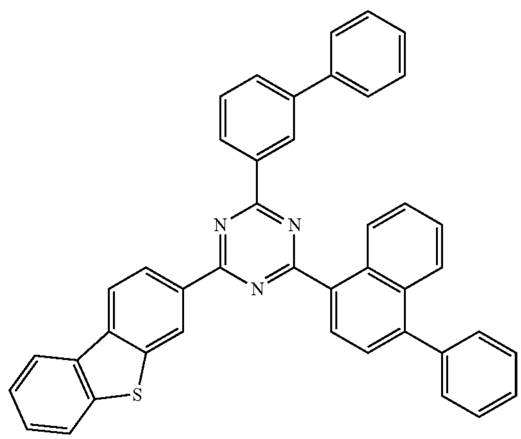
A-85
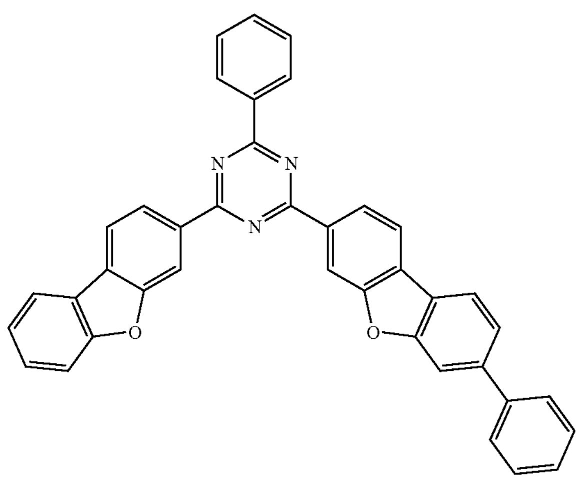
A-86
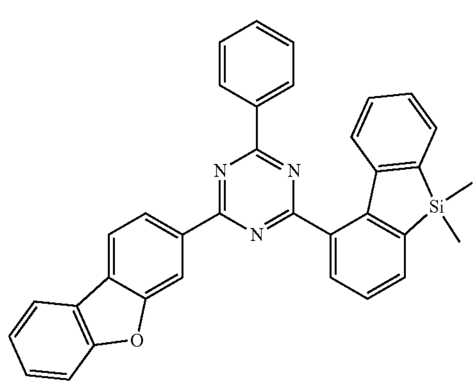
-continued
A-87
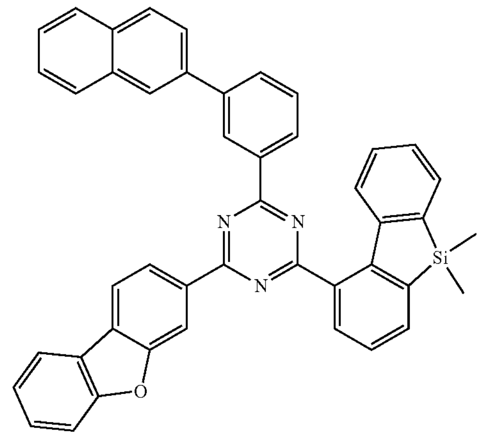
A-88
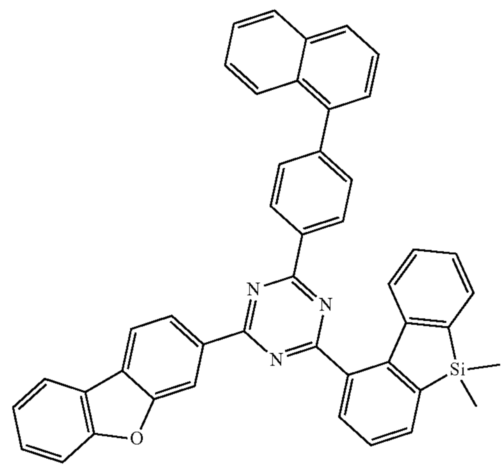
A-89
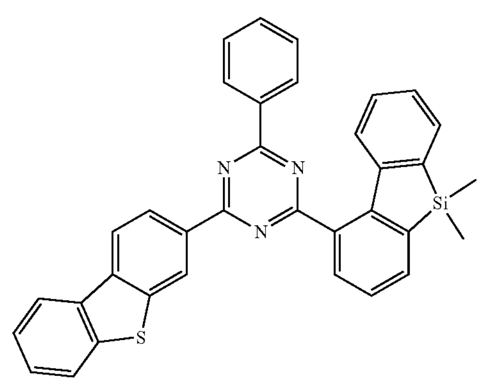

-continued
A-90
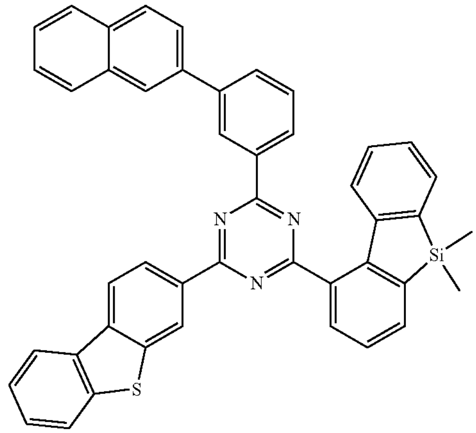
A-91
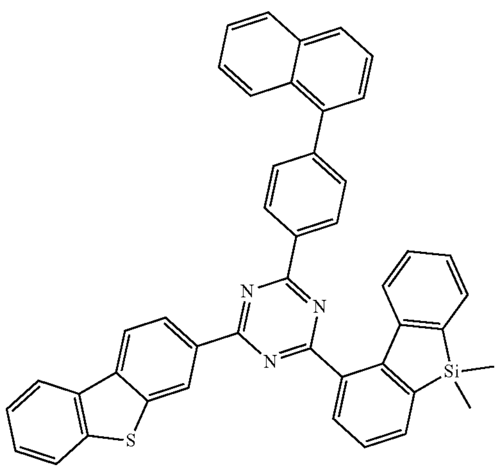
A-92
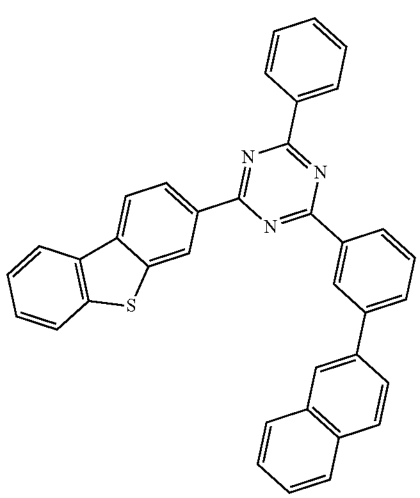
-continued
A-96
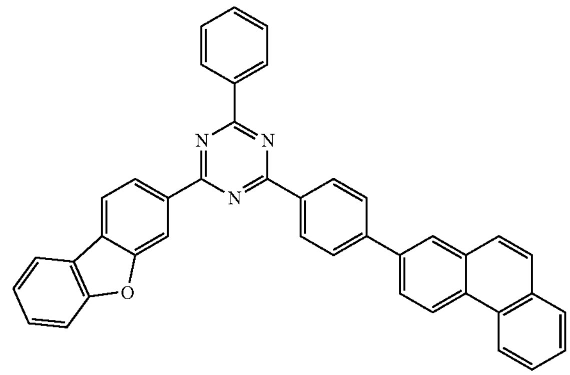
A-97
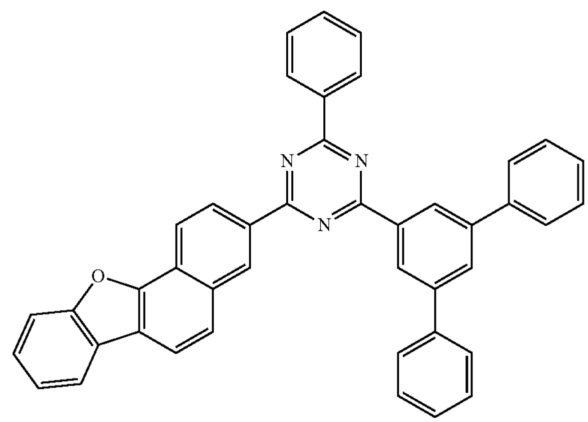
A-98
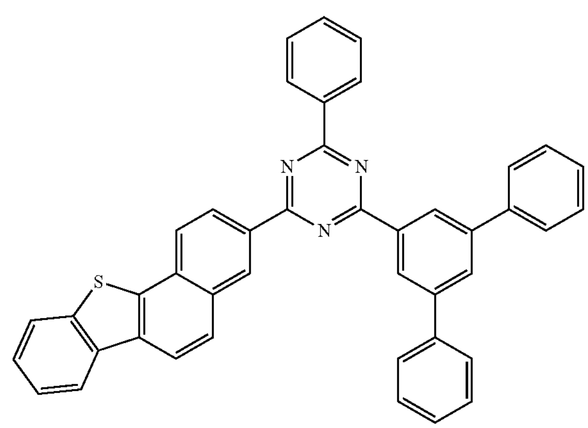

A-99
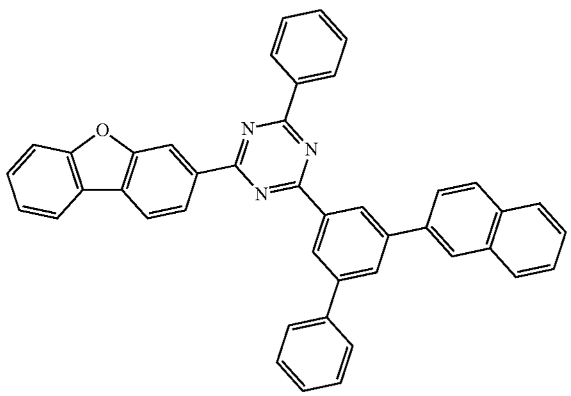
A-100
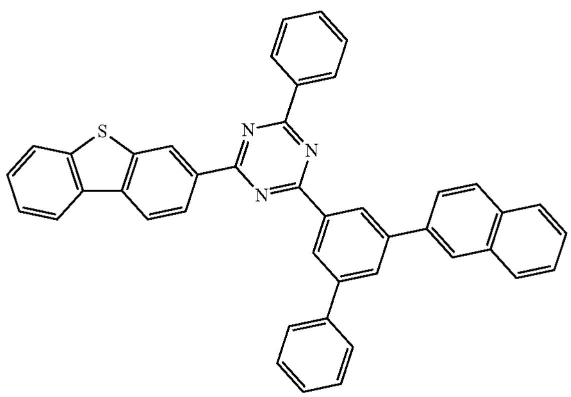
A-103
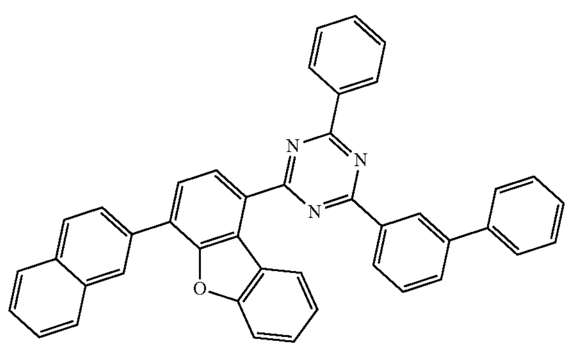
A-104
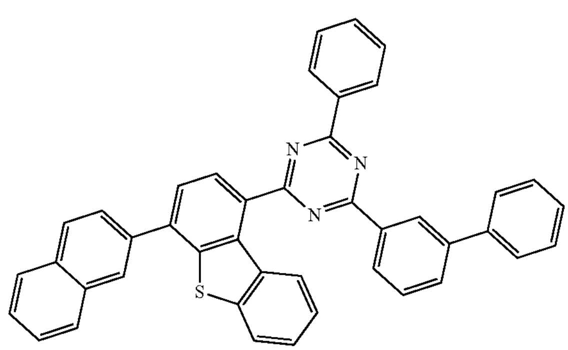
A-105
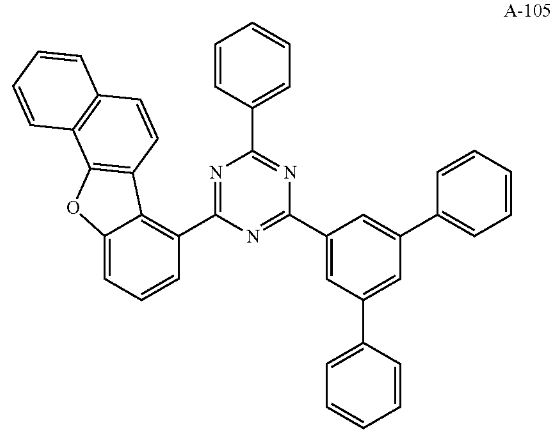
A-106
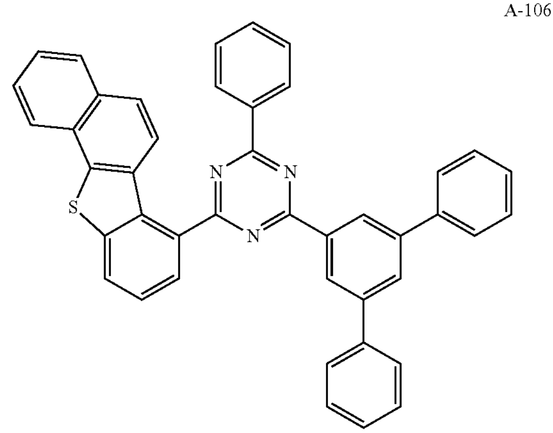
A-107
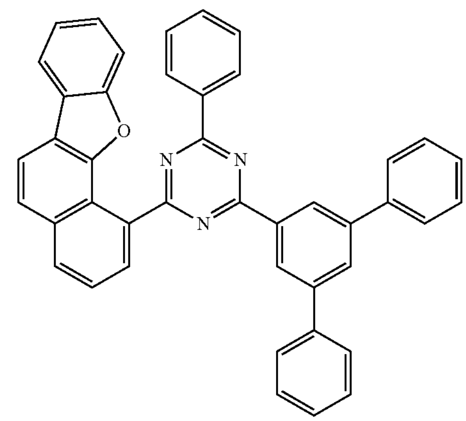

-continued

A-108

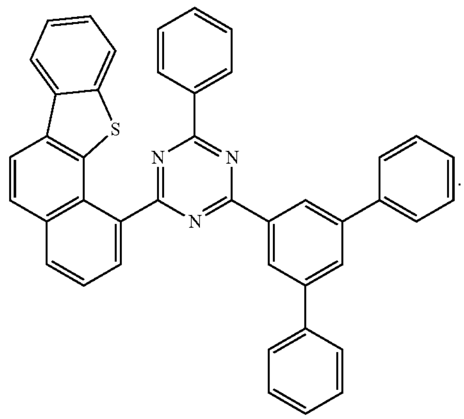

9. The composition as claimed in claim 1, wherein:

the first compound is represented by Chemical Formula 1B-1a, Chemical Formula 1B-2a, or Chemical Formula 1B-3a, and the second compound is represented by Chemical Formula 2A-3a, Chemical Formula 2C-1a, or Chemical Formula 2F-1a:

[Chemical Formula 1B-1a]

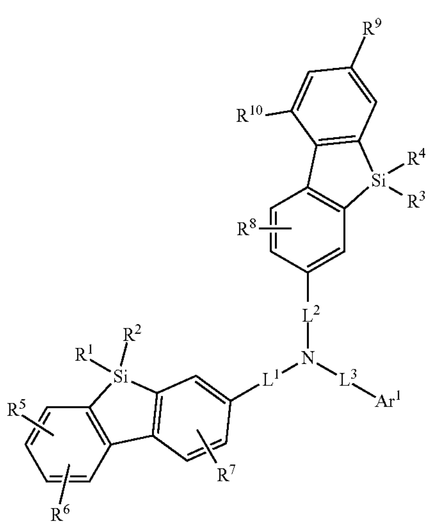

-continued

[Chemical Formula 1B-2a]

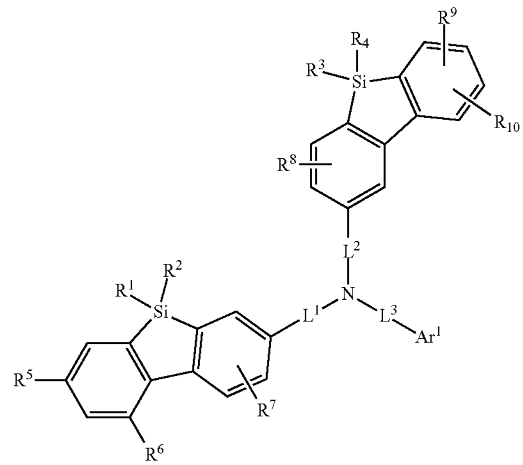

[Chemical Formula 1B-3a]

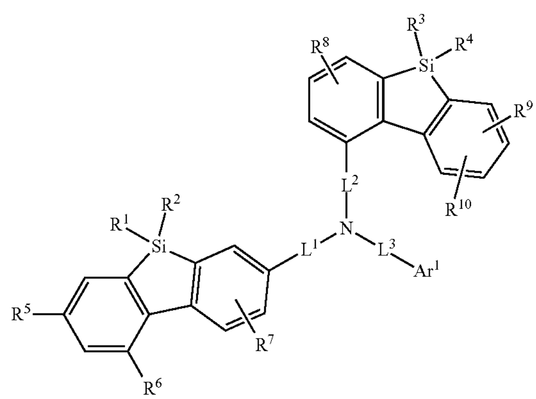

wherein, in Chemical Formula 1B-1a to Chemical Formula 1B-3a, $Ar^1$ is an unsubstituted phenyl group, a phenyl group substituted with a C6 to C12 aryl group, an unsubstituted biphenyl group, a biphenyl group substituted with a C6 to C12 aryl group, an unsubstituted naphthyl group or a naphthyl group substituted with a C6 to C12 aryl group, $L^1$ to $L^3$ are each independently a single bond or a substituted or unsubstituted phenylene group, $R^1$ to $R^4$ are each independently a substituted or unsubstituted C1 to C10 alkyl group or a substituted or unsubstituted C6 to C12 aryl group, and $R^5$ to $R^{10}$ are each independently hydrogen, deuterium, a substituted or unsubstituted phenyl group, or a substituted or unsubstituted naphthyl group;

[Chemical Formula 2A-3a]

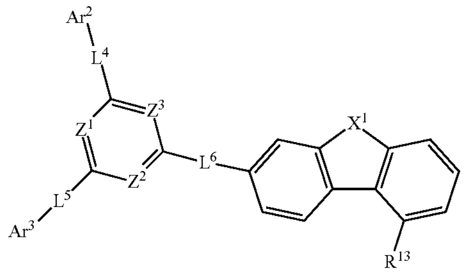

[Chemical Formula 2C-1a]

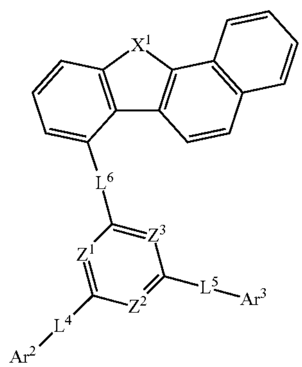

[Chemical Formula 2F-1a]

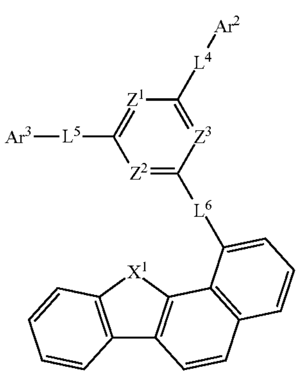

wherein, in Chemical Formula 2A-3a, Chemical Formula 2C-1a, and Chemical Formula 2F-1a, $X^1$ is O or S, $Z^1$ to $Z^3$ are each N, $R^{13}$ is hydrogen, deuterium, or a substituted or unsubstituted phenyl group, $L^4$ to $L^6$ are each independently a single bond or a substituted or unsubstituted phenylene group, and $Ar^2$ and $Ar^3$ are each independently a substituted or unsubstituted phenyl group, a substituted or unsubstituted biphenyl group, or a substituted or unsubstituted naphthyl group.

10. The composition as claimed in claim 9, wherein: the first compound is a compound of Group 1-1, and the second compound is a compound of Group 2-1:

[Group 1-1]

1

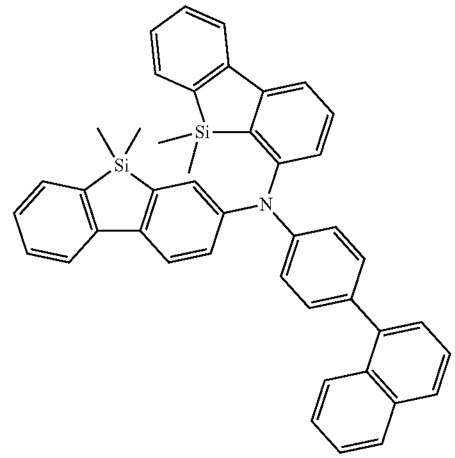

2

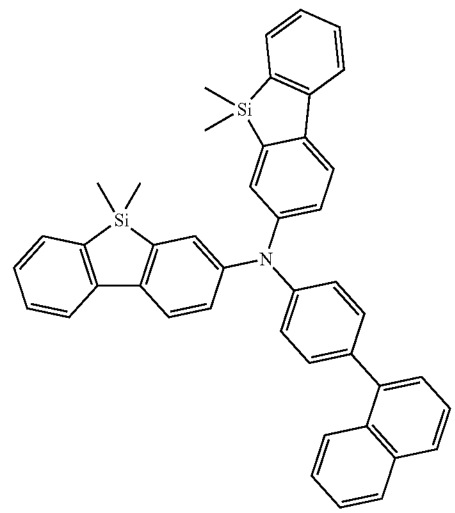

3

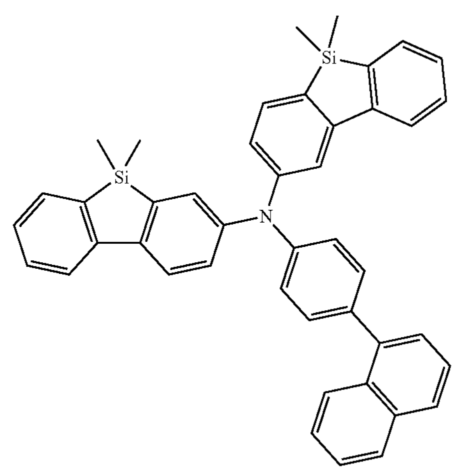

4
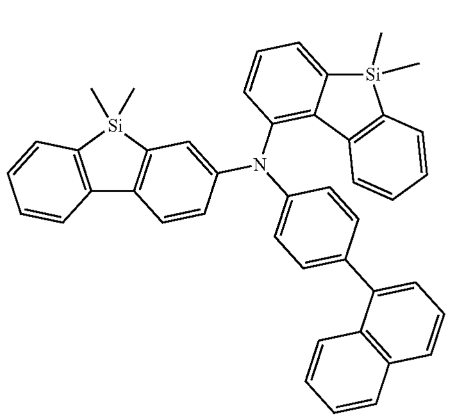
7
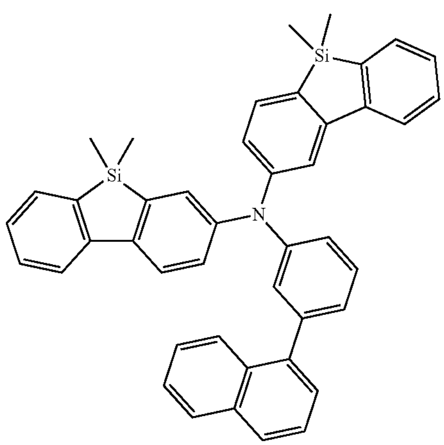
14
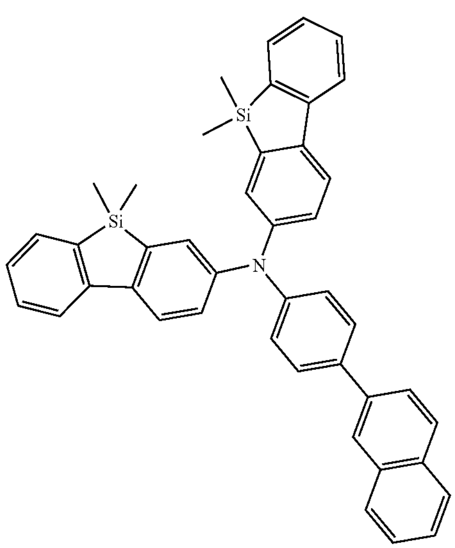
15
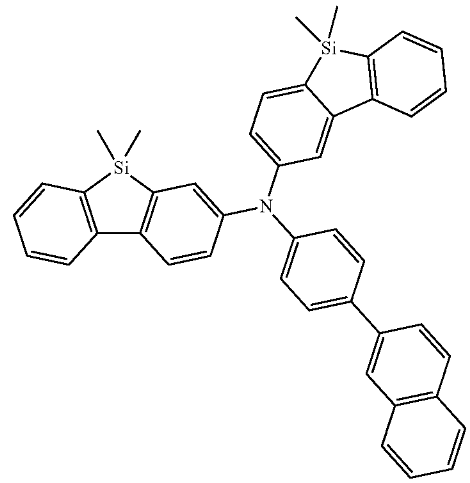
16
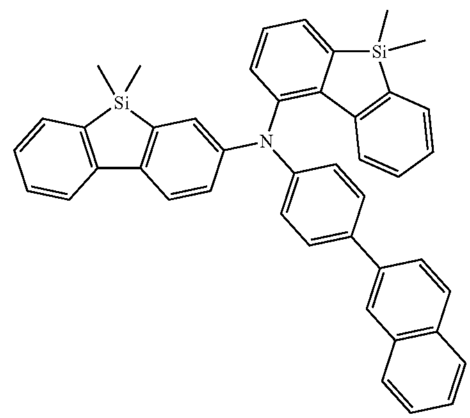
19
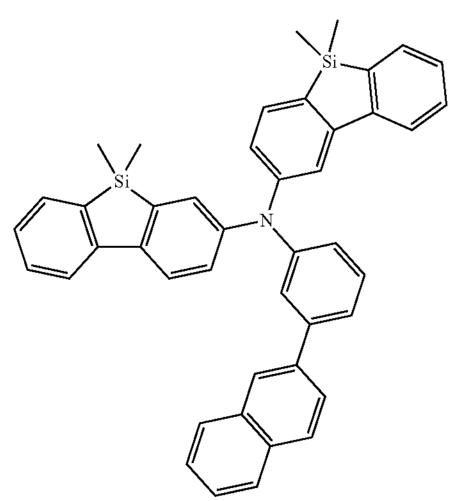

-continued
42
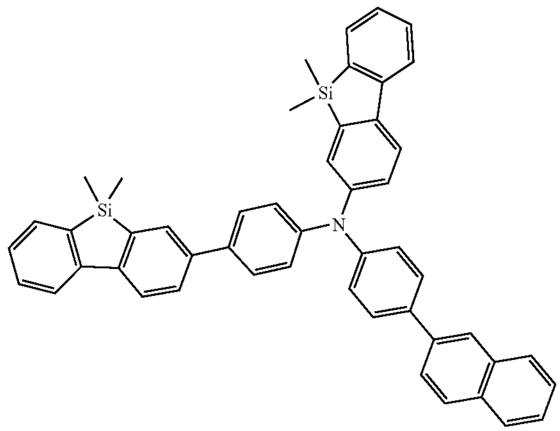
43
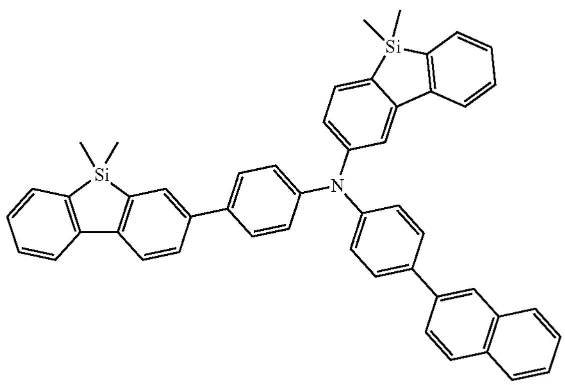
44
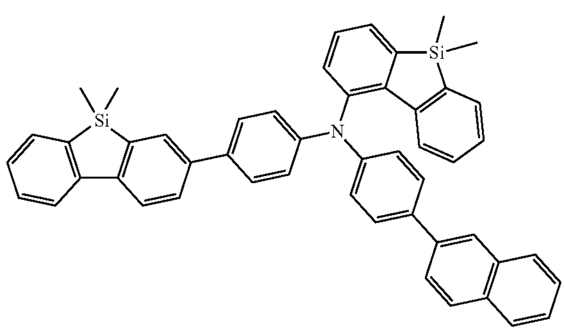
54
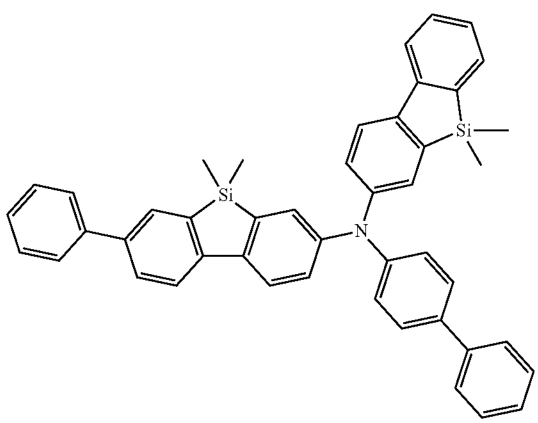
-continued
55
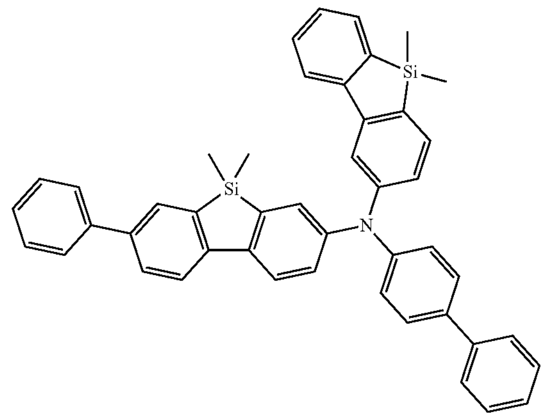
66
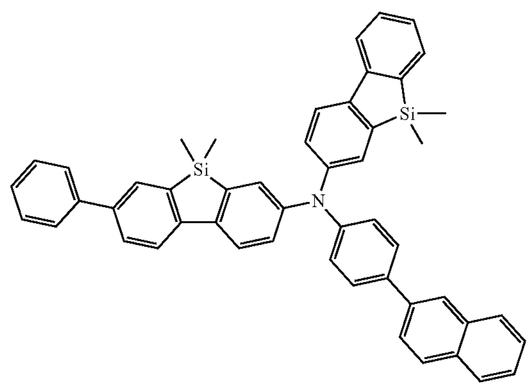
67
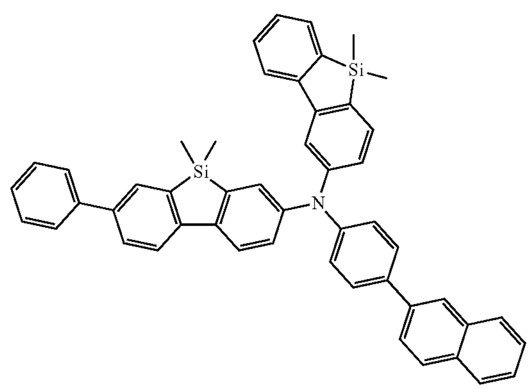

-continued
68
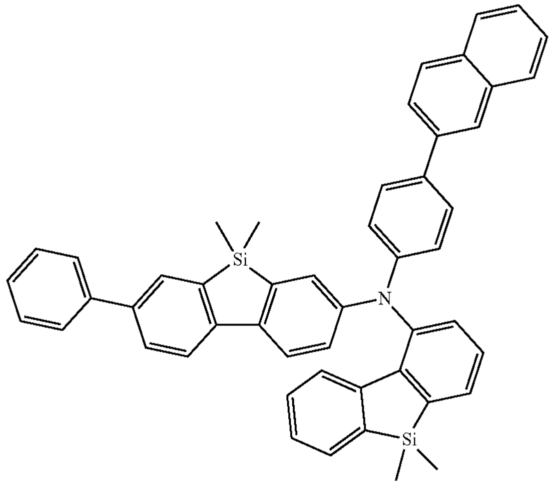
83
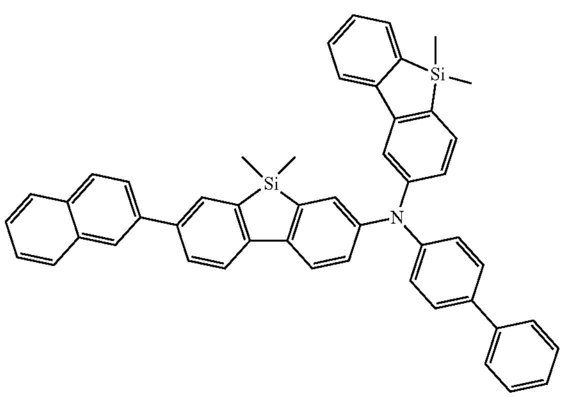
[Group 2-1]
A-3
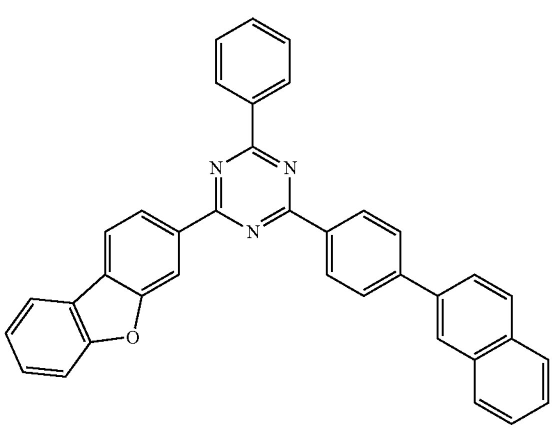
-continued
A-17
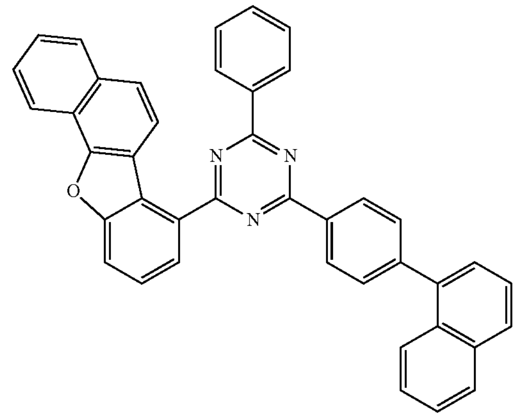
A-24
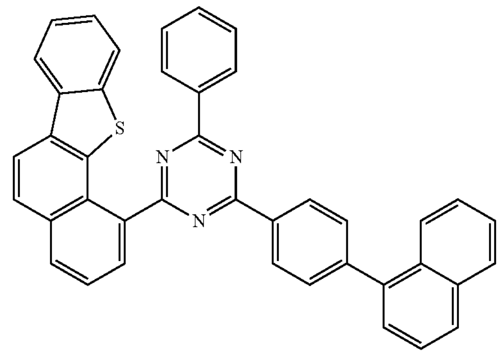
A-35
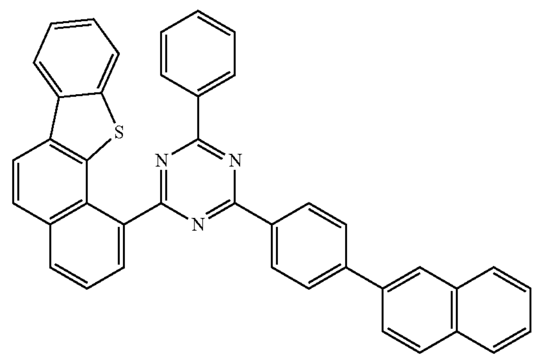
A-37
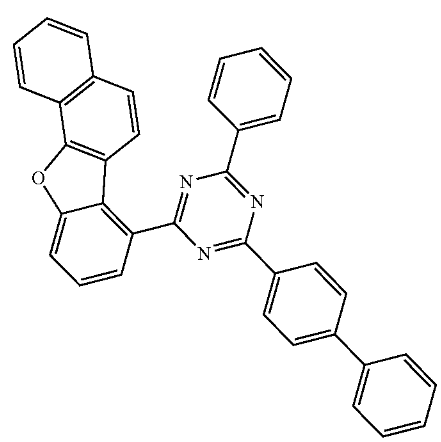

-continued

A-61

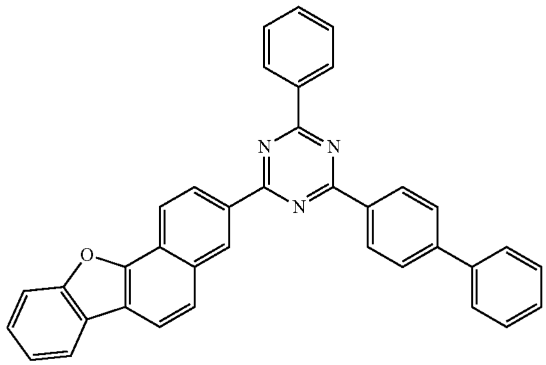

A-71

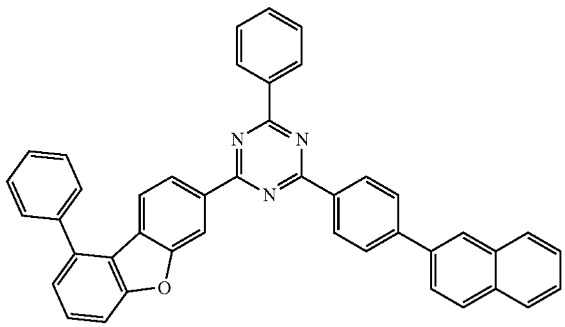

A-77

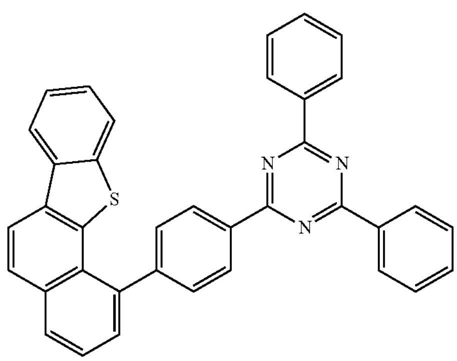

11. An organic optoelectronic device, comprising:

an anode and a cathode facing each other, and at least one organic layer between the anode and the cathode, wherein:

the at least one organic layer includes a light emitting layer, and the light emitting layer includes the composition for an organic optoelectronic device as claimed in claim 1.

12. The organic optoelectronic device as claimed in claim 11, wherein the composition for an organic optoelectronic device is a host in the light emitting layer.

13. The organic optoelectronic device as claimed in claim 12, wherein the composition for an organic optoelectronic device includes the first compound and the second compound in a weight ratio of about 60:40 to about 30:70.

14. A display device comprising the organic optoelectronic device as claimed in claim 11.

15. An organic optoelectronic device, comprising:

an anode and a cathode facing each other, and at least one organic layer between the anode and the cathode, wherein:

the at least one organic layer includes a light emitting layer, and the light emitting layer includes the composition for an organic optoelectronic device as claimed in claim 1, the first compound of the composition is a compound of Group 1-1', the second compound of the composition is a compound of Group 2-1', and a weight ratio of the first compound to the second compound is 5:5,

[Group 1-1']

1

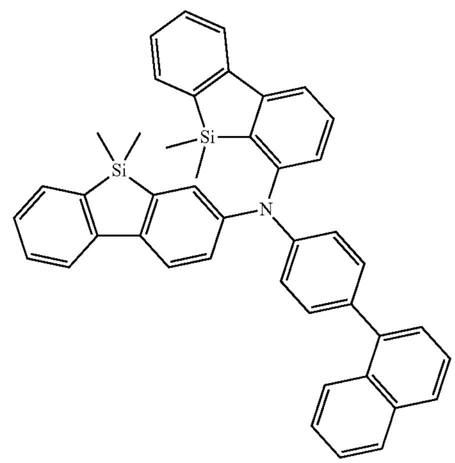

2

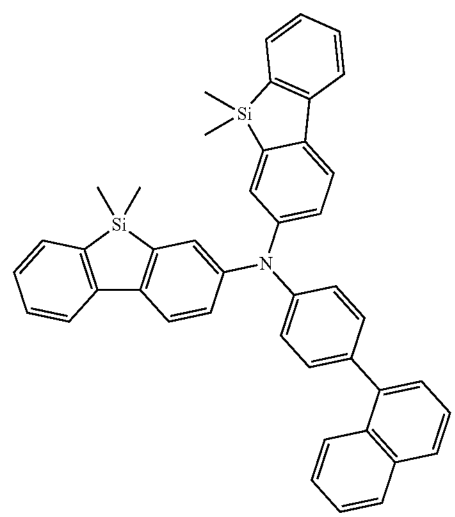

-continued
3
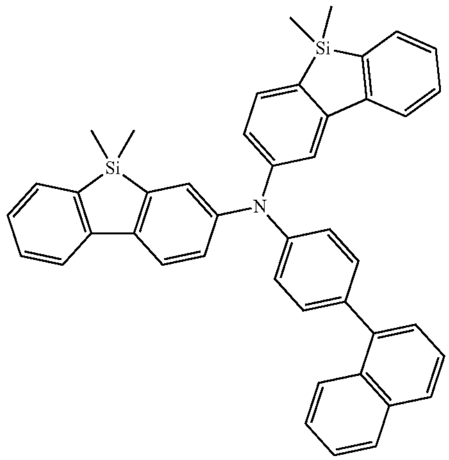
4
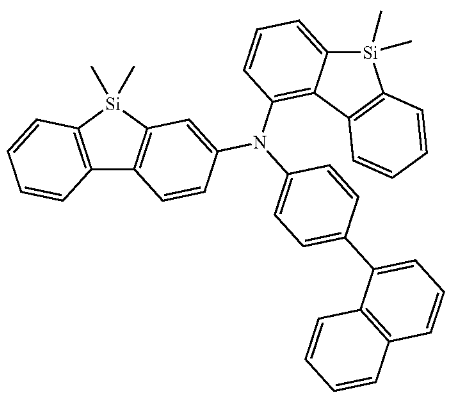
7
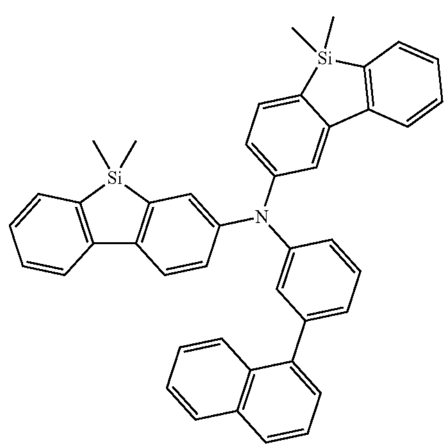
-continued
14
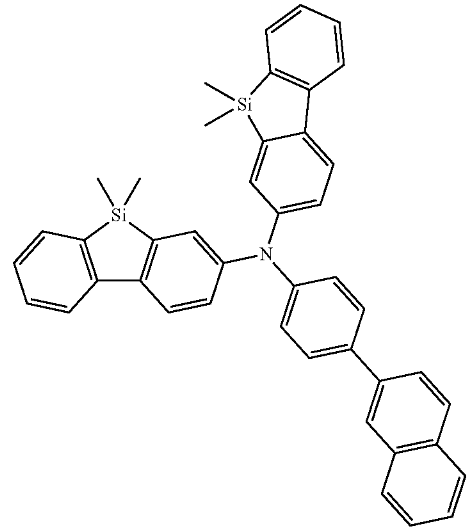
15
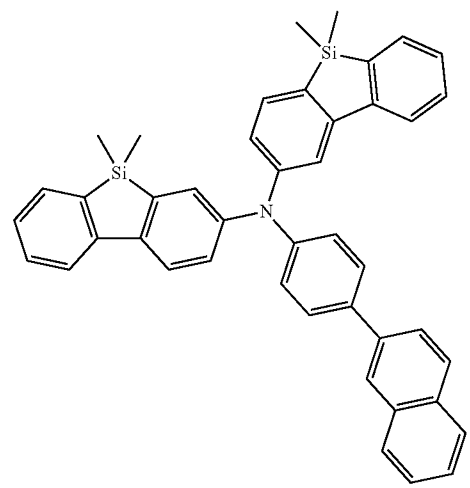
16
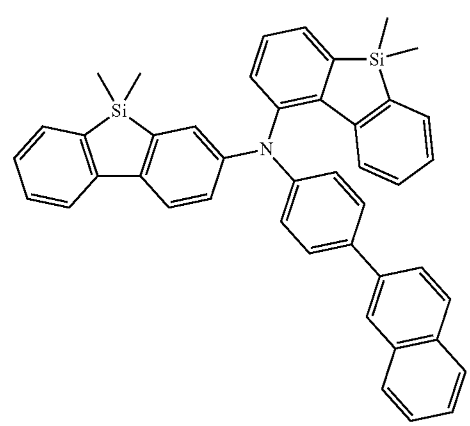

-continued
19
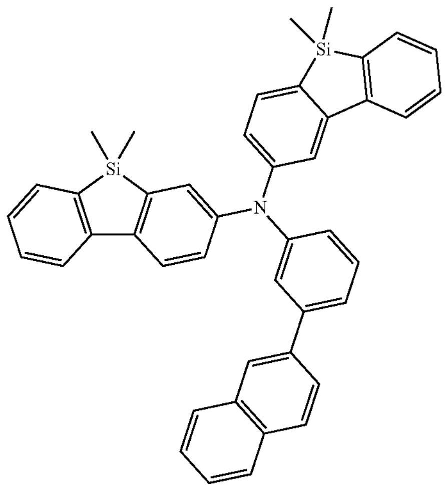
42
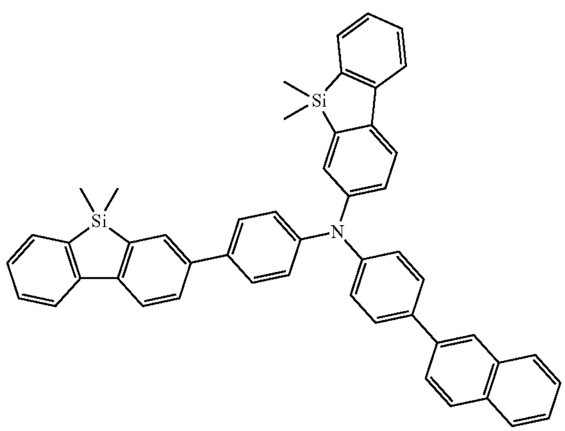
43
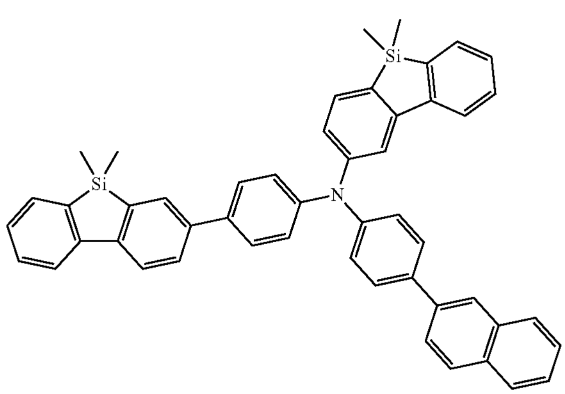
-continued
44
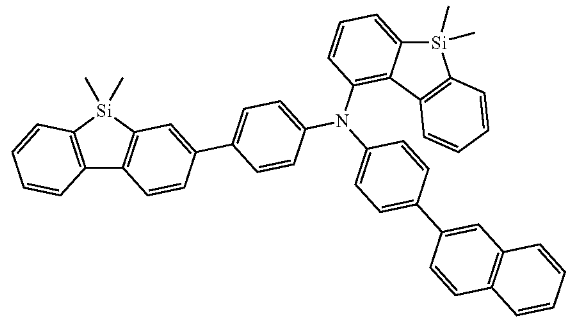
54
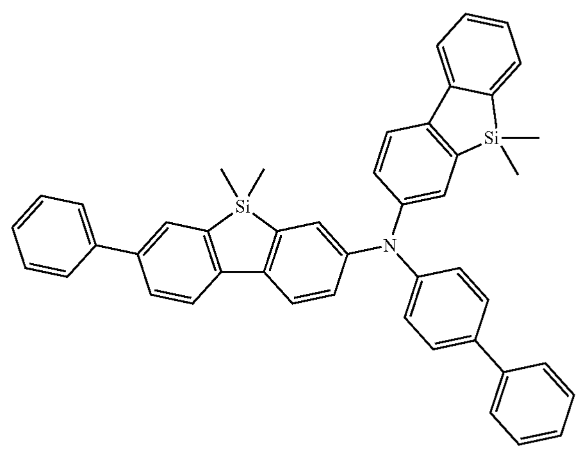
55
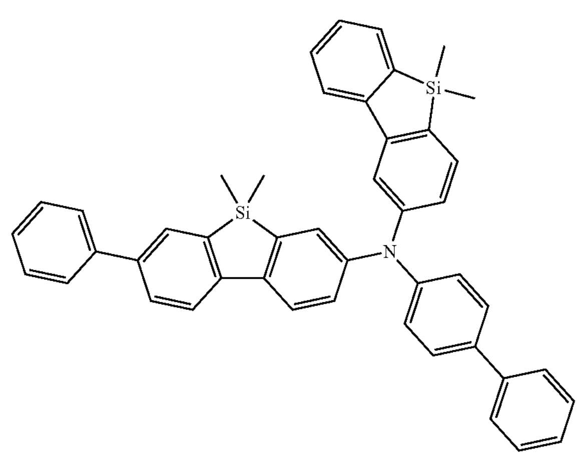

-continued
66
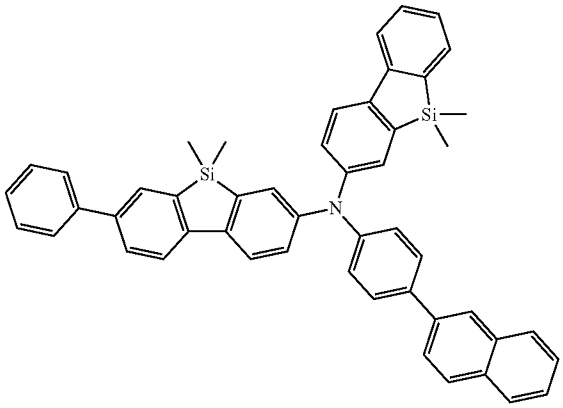
67
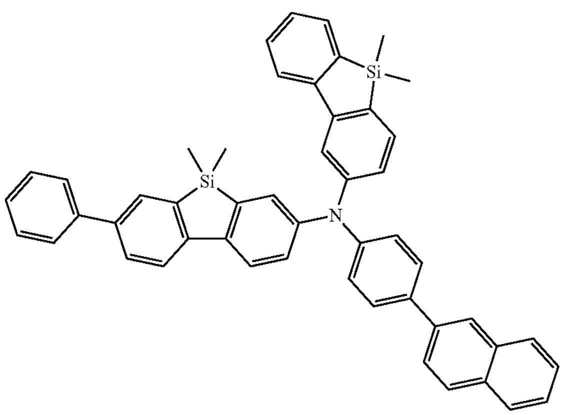
68
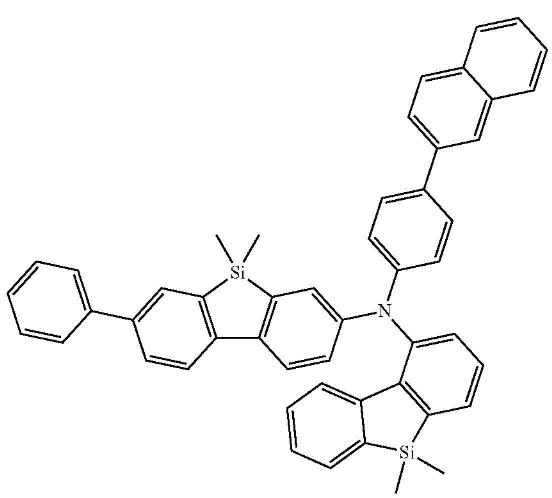
-continued
83
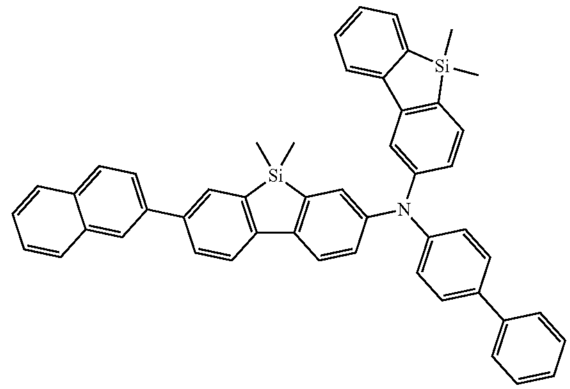
[Group 2-1′]
A-3
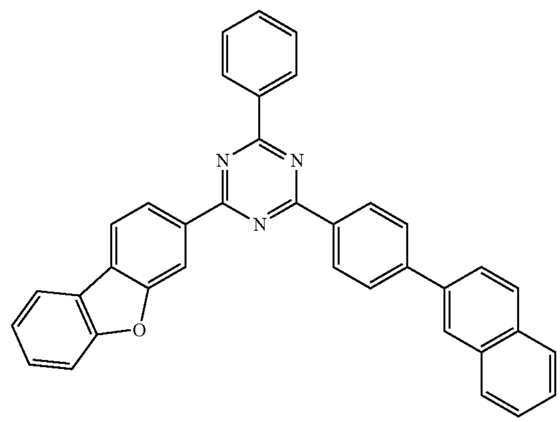
A-17
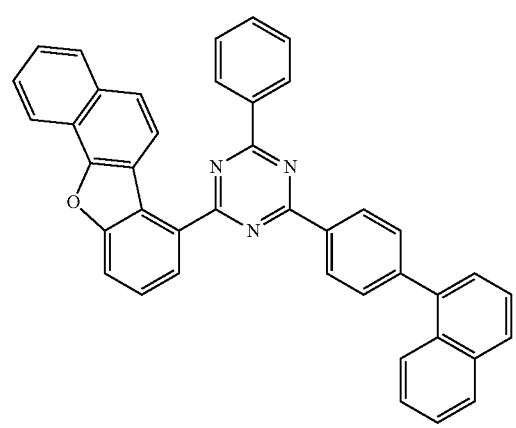

-continued
A-24
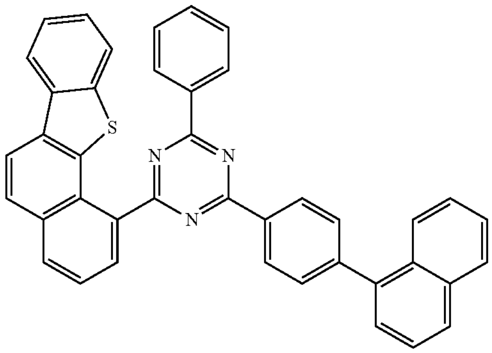
A-35
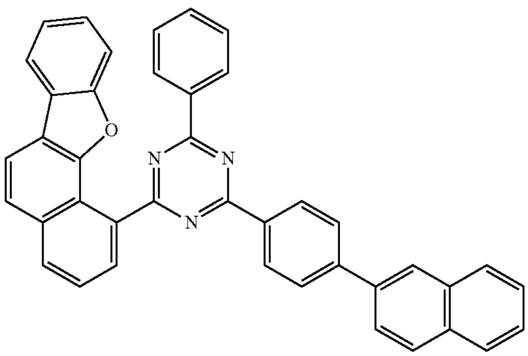
-continued
A-37
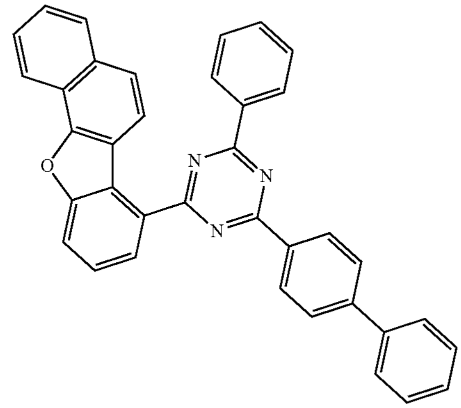
A-77
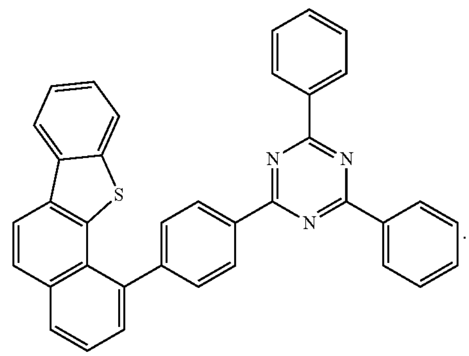
* * * * *